(12) United States Patent
Vaughan et al.

(10) Patent No.: US 7,800,368 B2
(45) Date of Patent: Sep. 21, 2010

(54) HIGH FIELD MAGNETIC RESONANCE

(75) Inventors: J. Thomas Vaughan, Stillwater, MN (US); Pierre-Francois Van de Moortele, Minneapolis, MN (US); Lance DelaBarre, St. Anthony, MN (US); Christopher C. Olson, Minneapols, MN (US); Heather Orser, Farmington, MN (US); Anand Gopinath, Wayzata, MN (US); Kamil Ugurbil, Minneapolis, MN (US); Carl Snyder, Minneapolis, MN (US); Gregor Adiany, Minneapolis, MN (US); Can E. Akgun, Woodbury, MN (US); Jinfeng Tian, Minneapolis, MN (US); John Strupp, Coon Rapids, MN (US); Peter M. Andersen, Maple Plain, MN (US); Xiaoping Wu, St. Paul, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 227 days.

(21) Appl. No.: 11/707,560

(22) Filed: Feb. 17, 2007

(65) Prior Publication Data
US 2008/0129298 A1 Jun. 5, 2008

Related U.S. Application Data

(60) Provisional application No. 60/774,297, filed on Feb. 17, 2006.

(51) Int. Cl.
*G01V 3/00* (2006.01)

(52) U.S. Cl. ................................ 324/318; 324/322
(58) Field of Classification Search ................ 324/318, 324/322
See application file for complete search history.

(56) References Cited

U.S. PATENT DOCUMENTS

| 5,311,132 | A   |   5/1994 | Noll |
|-----------|-----|----------|------|
| 5,614,827 | A   |   3/1997 | Heid |
| 6,696,838 | B2  |   2/2004 | Raftery et al. |
| 6,900,636 | B2* |   5/2005 | Leussler .................... 324/318 |
| 6,969,992 | B2* |  11/2005 | Vaughan et al. ............. 324/318 |
| 6,977,502 | B1  |  12/2005 | Hertz |
| 6,982,554 | B2* |   1/2006 | Kurpad et al. .............. 324/318 |
| 6,995,561 | B2* |   2/2006 | Boskamp et al. ............ 324/318 |

* cited by examiner

Primary Examiner—Louis M Arana
(74) *Attorney, Agent, or Firm*—Crompton, Seager & Tufte LLC

(57) ABSTRACT

A magnetic resonance system is disclosed. The system includes a transceiver having a multichannel receiver and a multichannel transmitter, where each channel of the transmitter is configured for independent selection of frequency, phase, time, space, and magnitude, and each channel of the receiver is configured for independent selection of space, time, frequency, phase and gain. The system also includes a magnetic resonance coil having a plurality of current elements, with each element coupled in one to one relation with a channel of the receiver and a channel of the transmitter. The system further includes a processor coupled to the transceiver, such that the processor is configured to execute instructions to control a current in each element and to perform a non-linear algorithm to shim the coil.

10 Claims, 70 Drawing Sheets

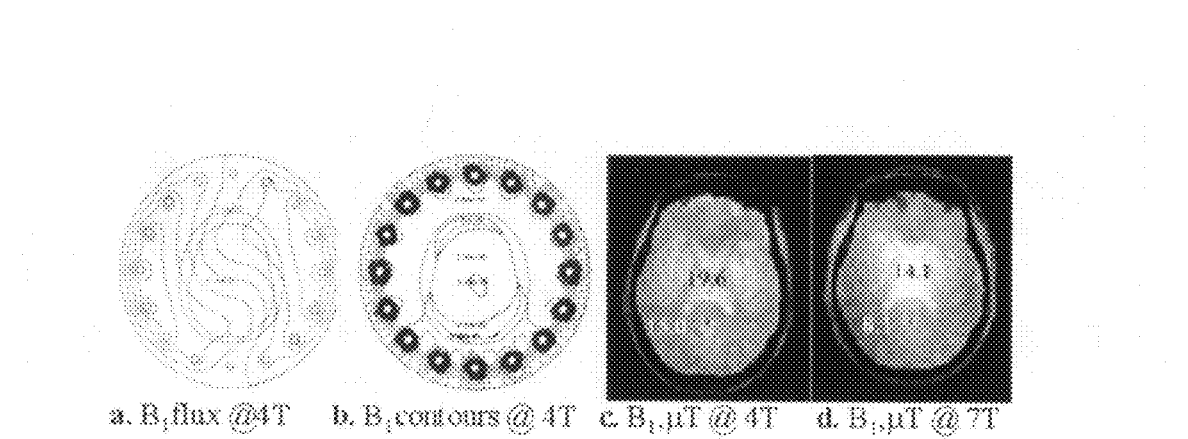
Fig. A1
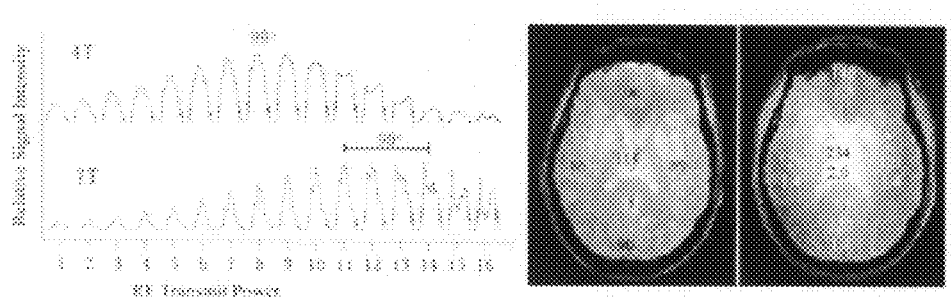
Fig. A2a, Fig. A2b

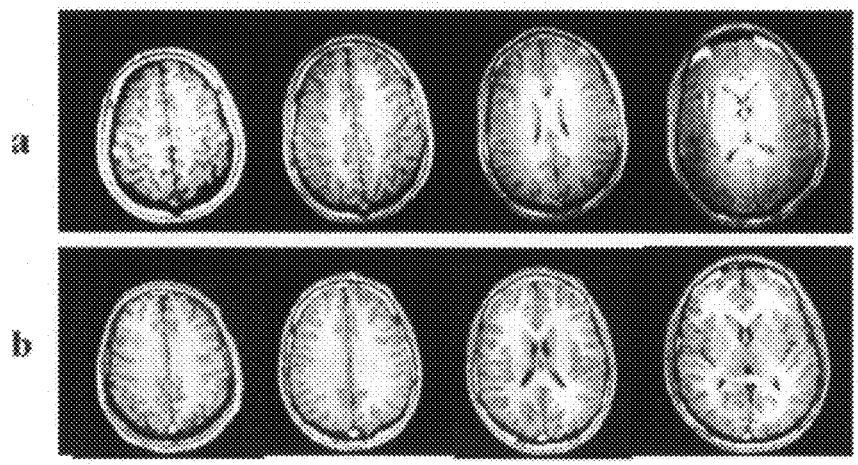
Fig. A3a, Fig. A3b
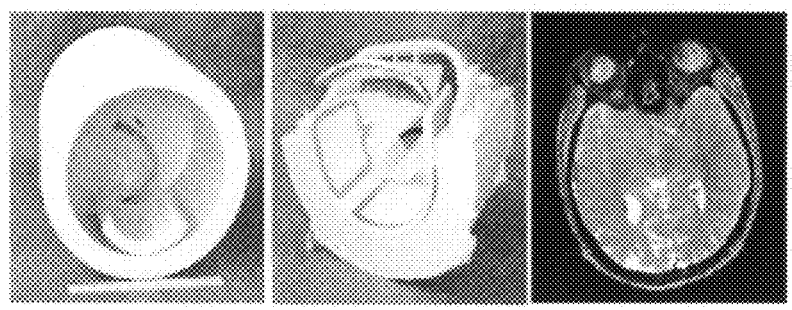
a. Transmit coil   b. Receive coil   c. 4T image
Fig. A3c Fig. A4
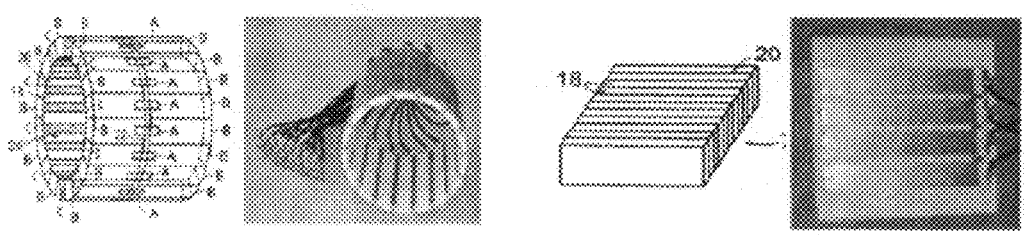
Fig. A5
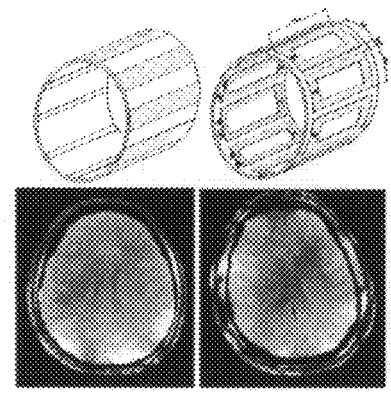
Fig. A6
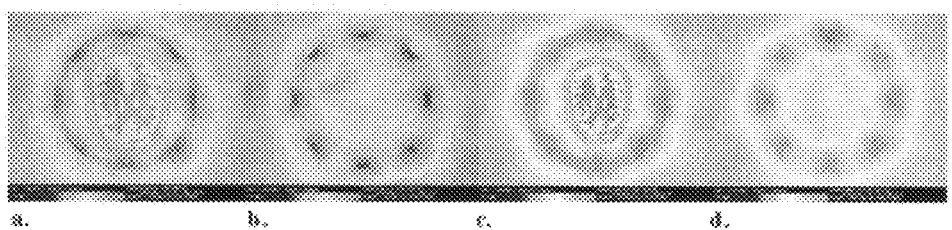
a.   b.   c.   d.
Fig. A7

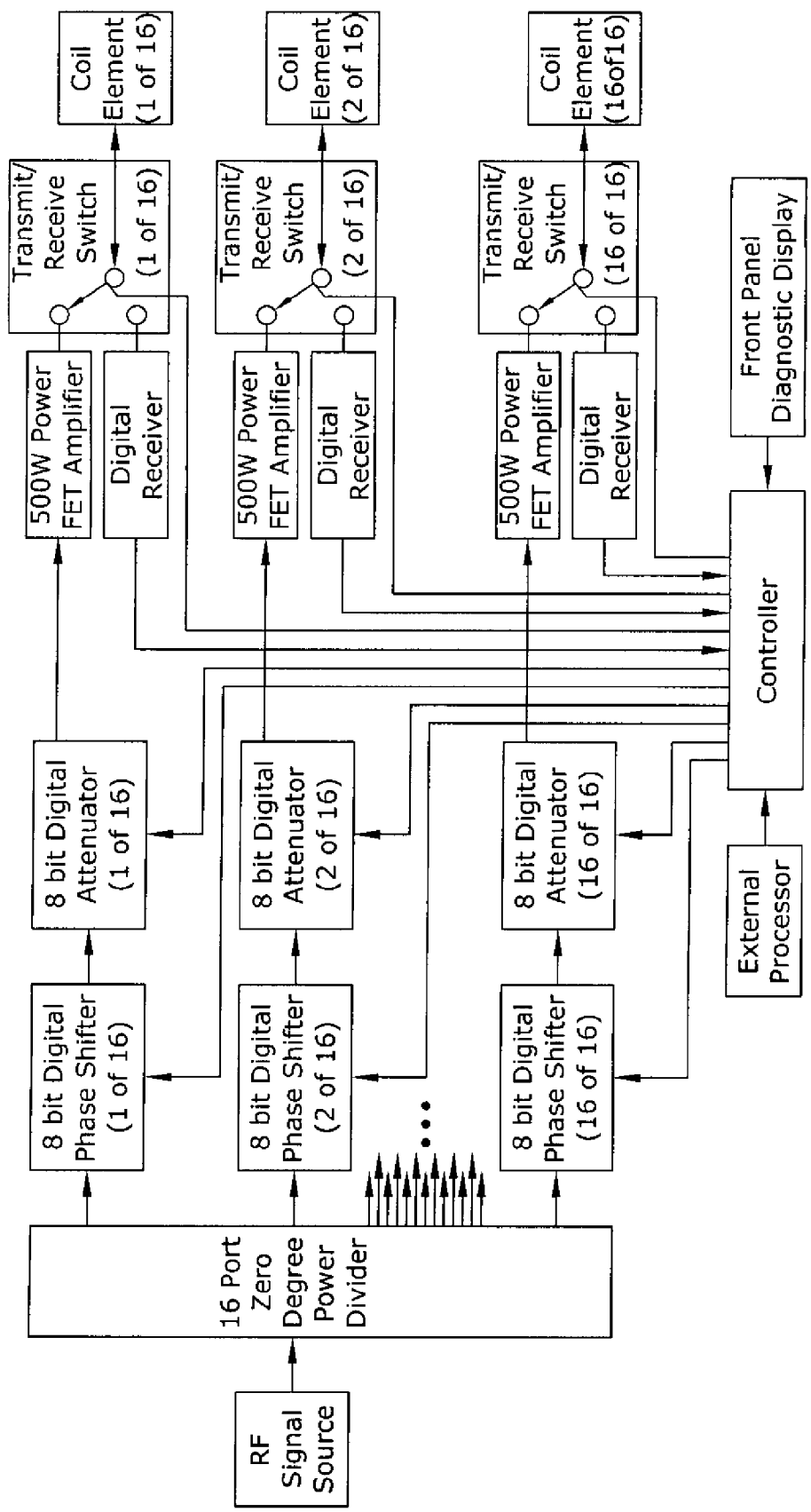
Fig. A8

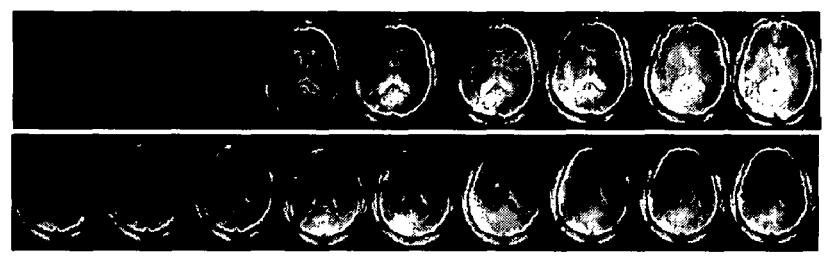
Fig. A9
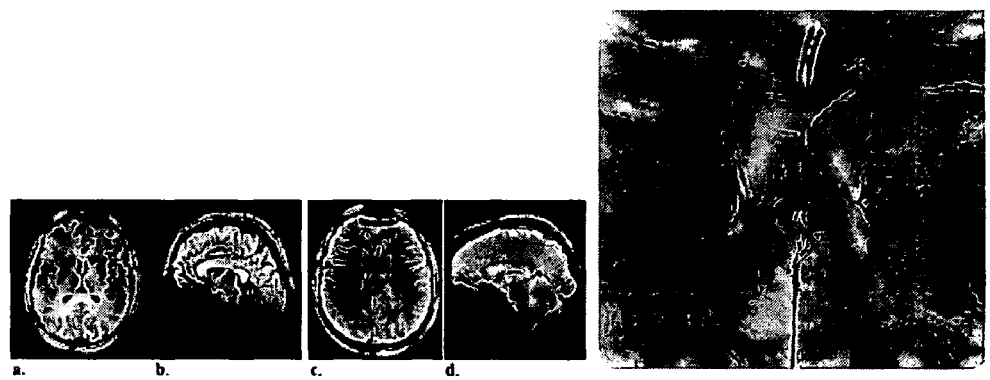
Fig. A10

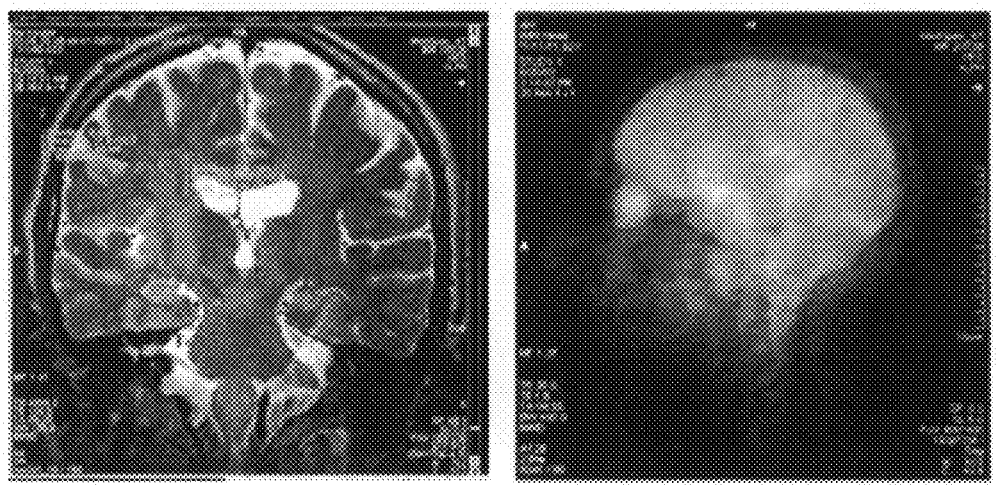
Fig. A11
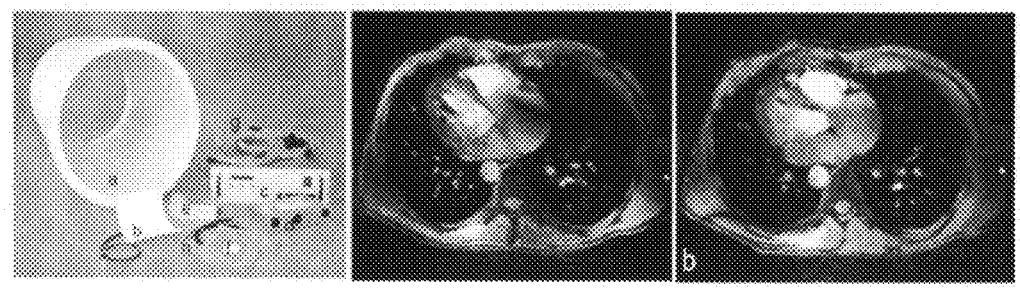
Fig. A12

Fig. A13

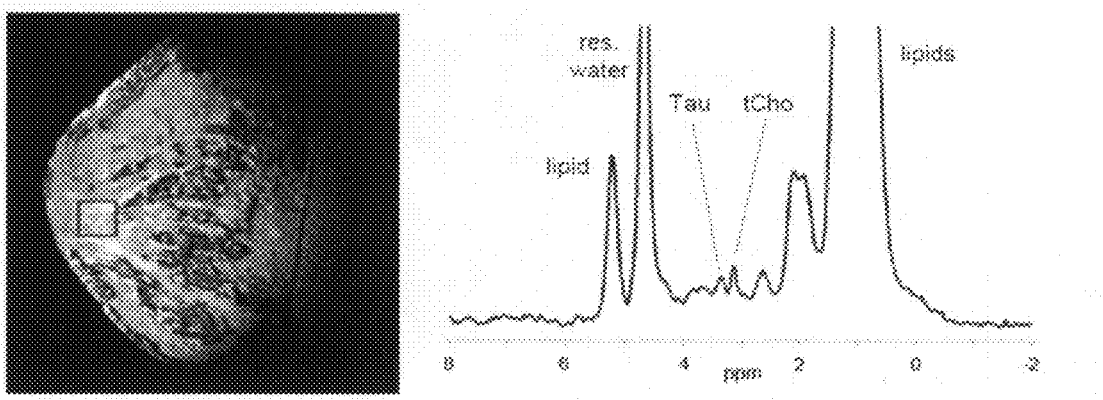
Fig. A14
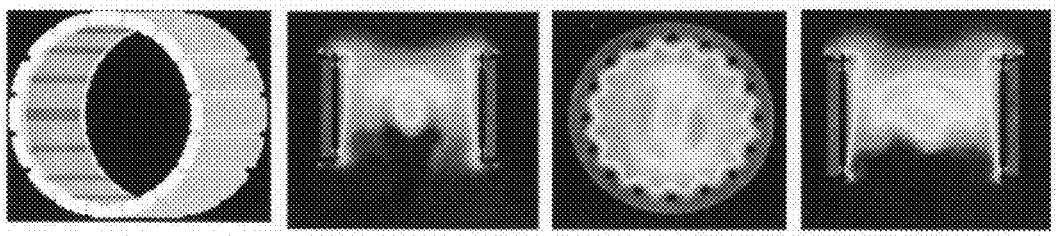
Fig. A15
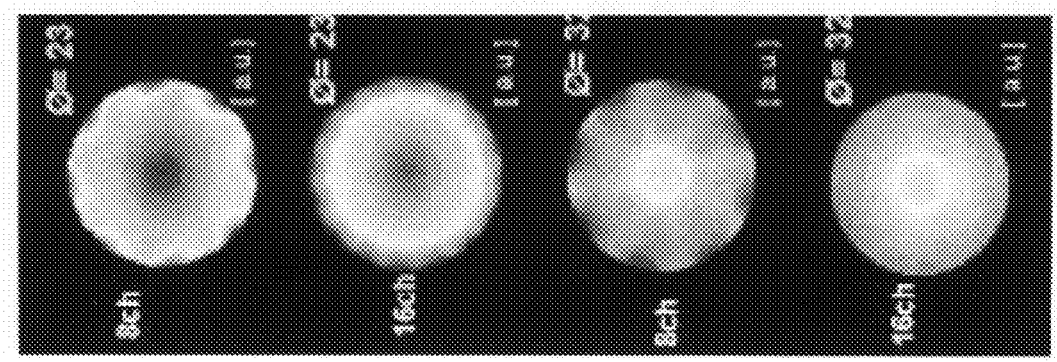
Fig. A16

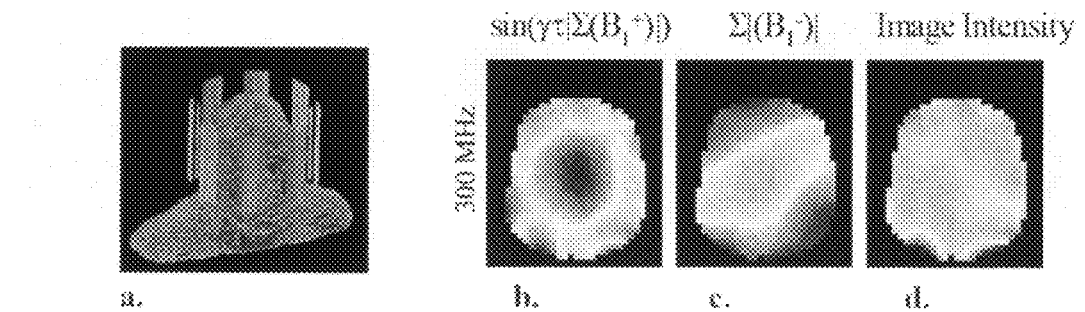
Fig. A17
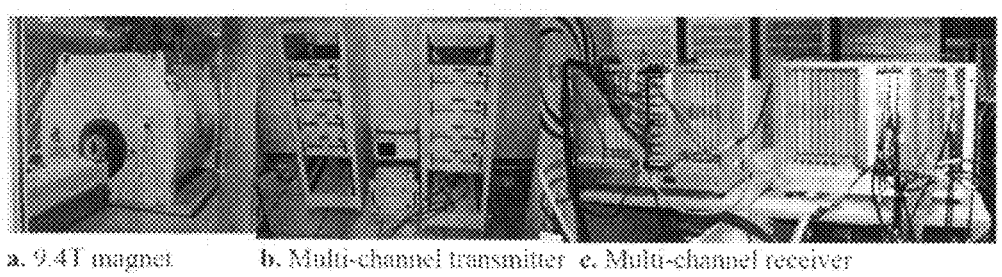
Fig. A18
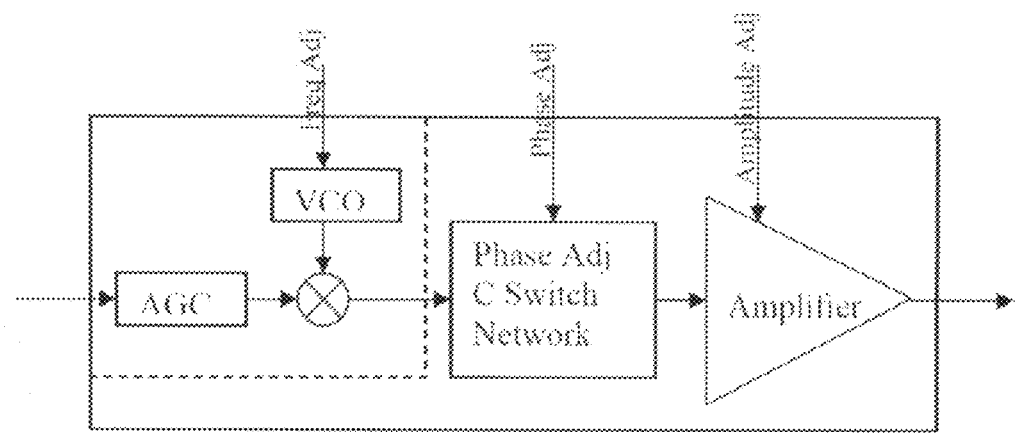
Fig. A19

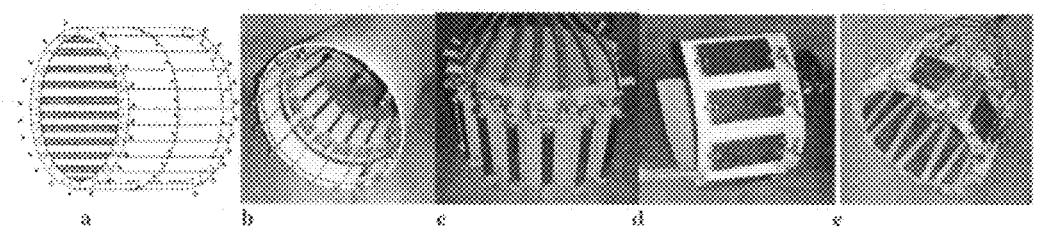
Fig. A20
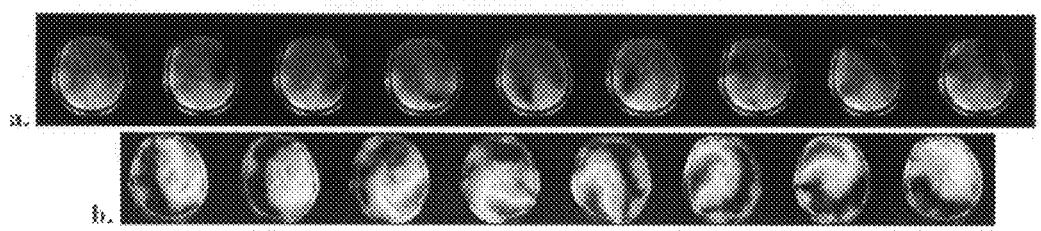
Fig. A21a, b

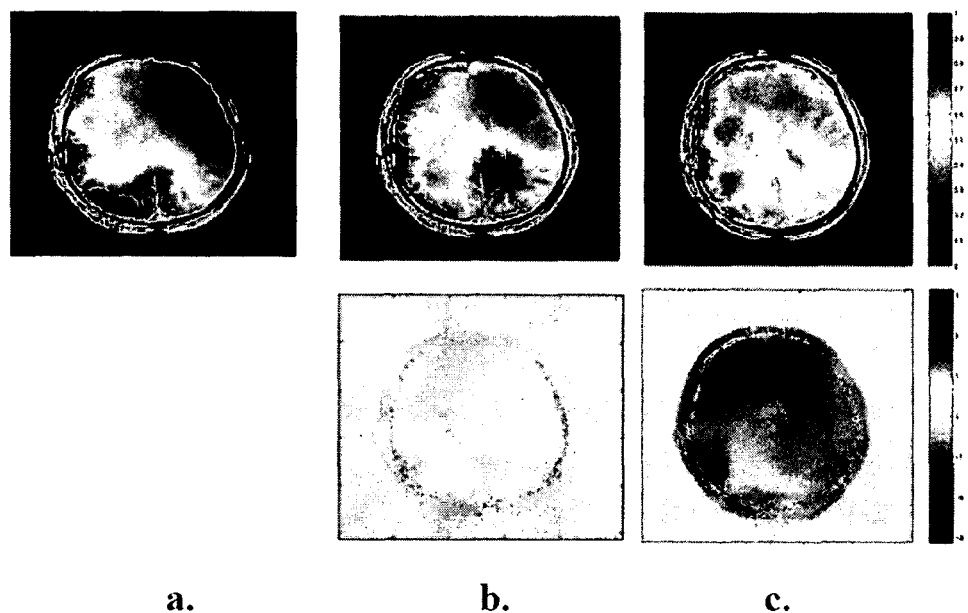
a. b. c.
Fig. A22
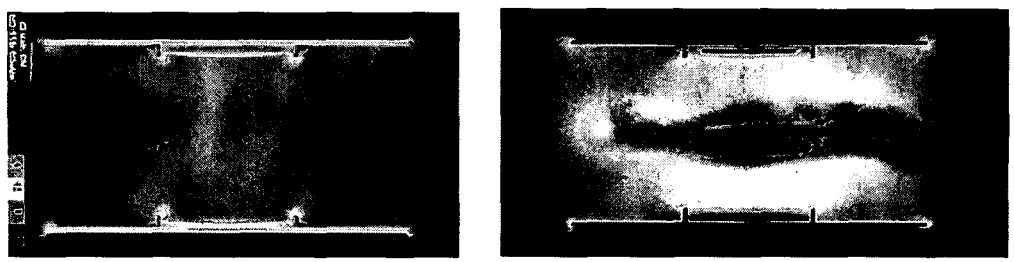
Fig. A24

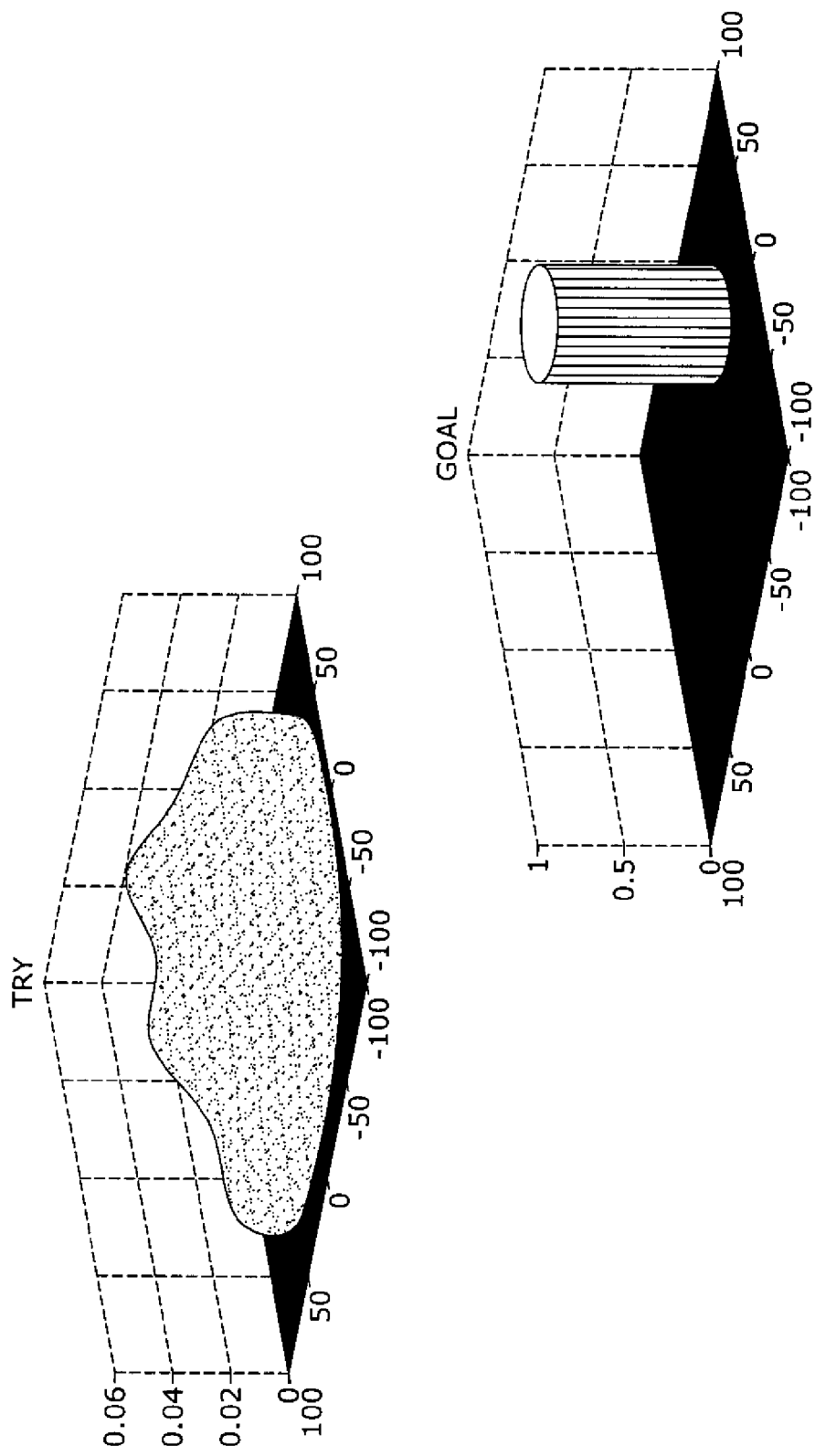
Fig. A23

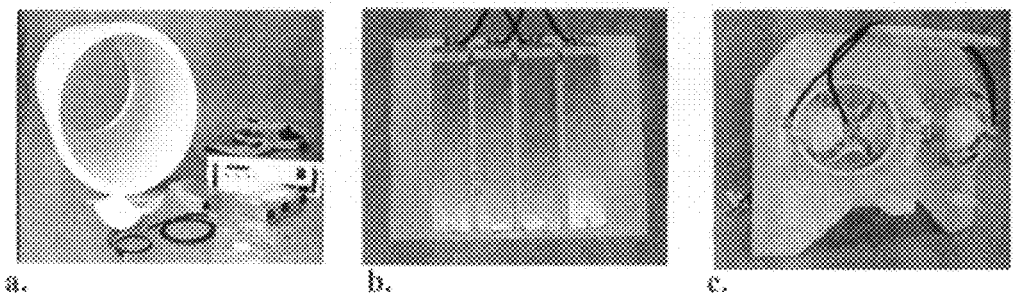
Fig. A25
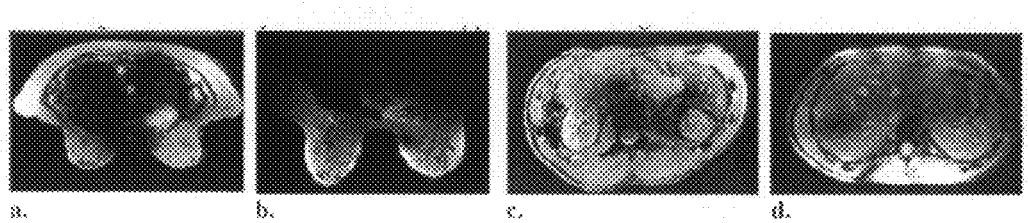
Fig. A26
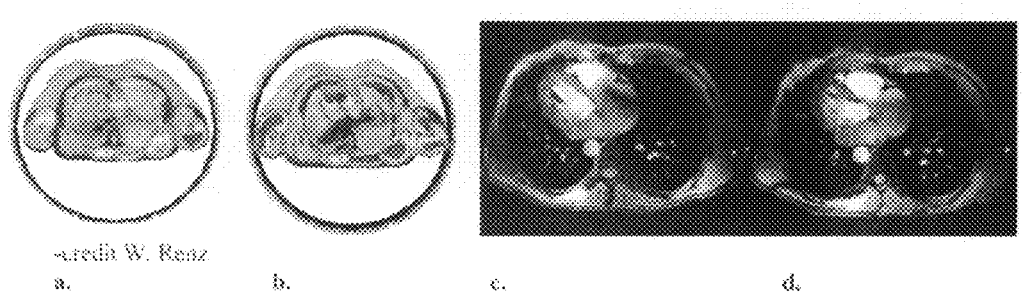
Fig. A27
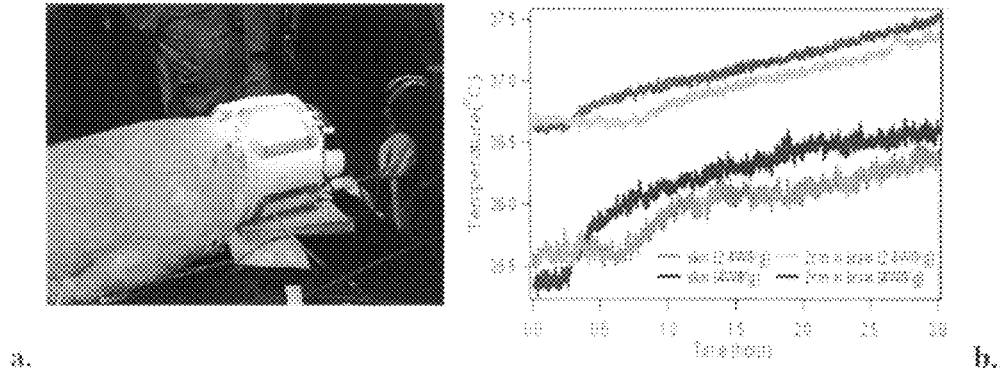
Fig. A28

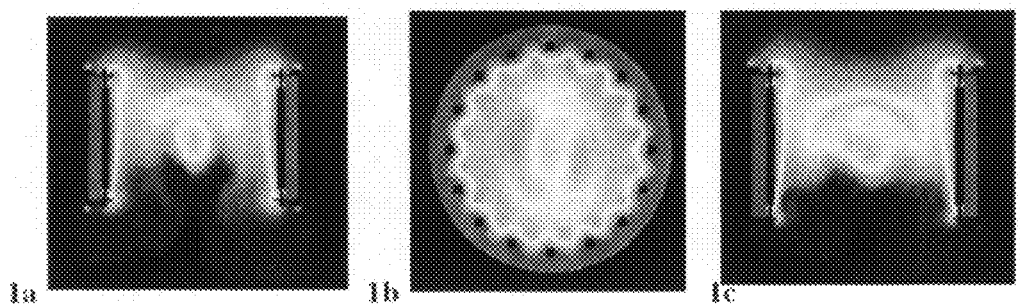
Fig. B1A, B, C
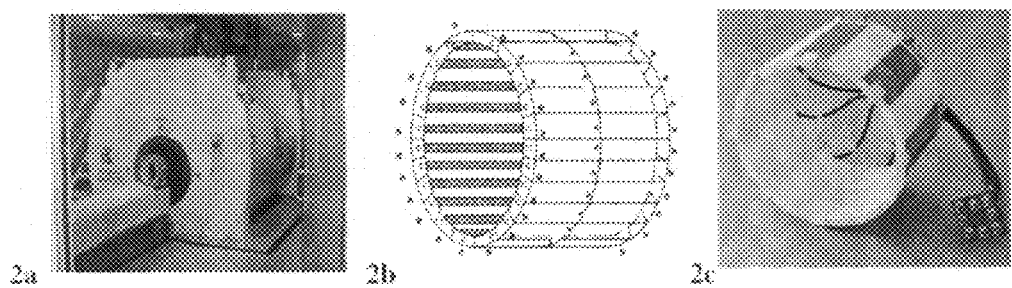
Fig. B2A, B, C
Fig. B3A, B

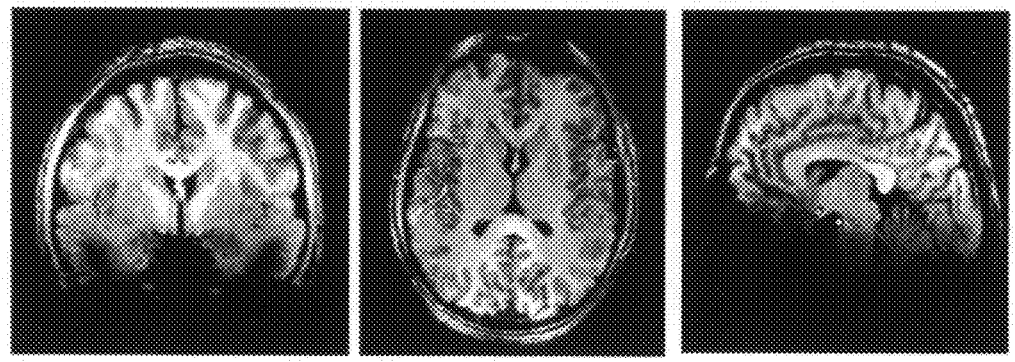
Fig. B4A, B, C
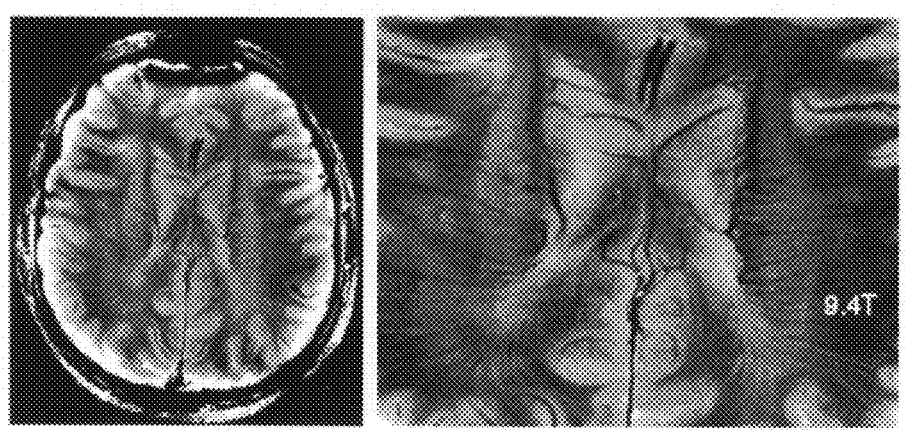
Fig. B5A, B

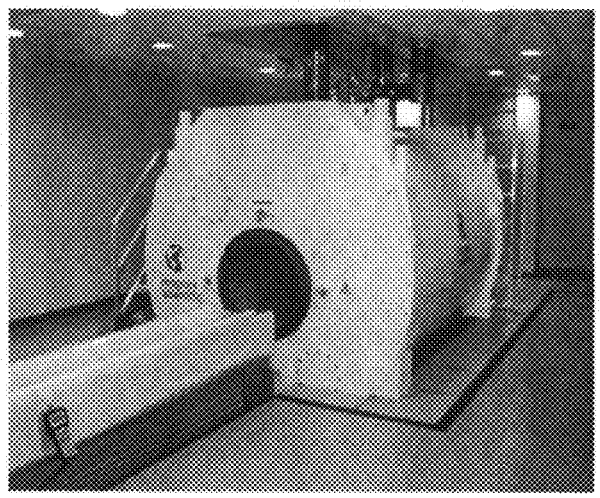
Fig. C1
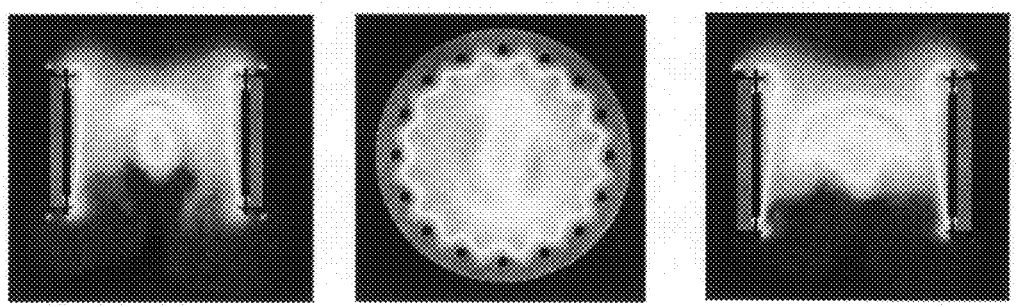
Fig. C2

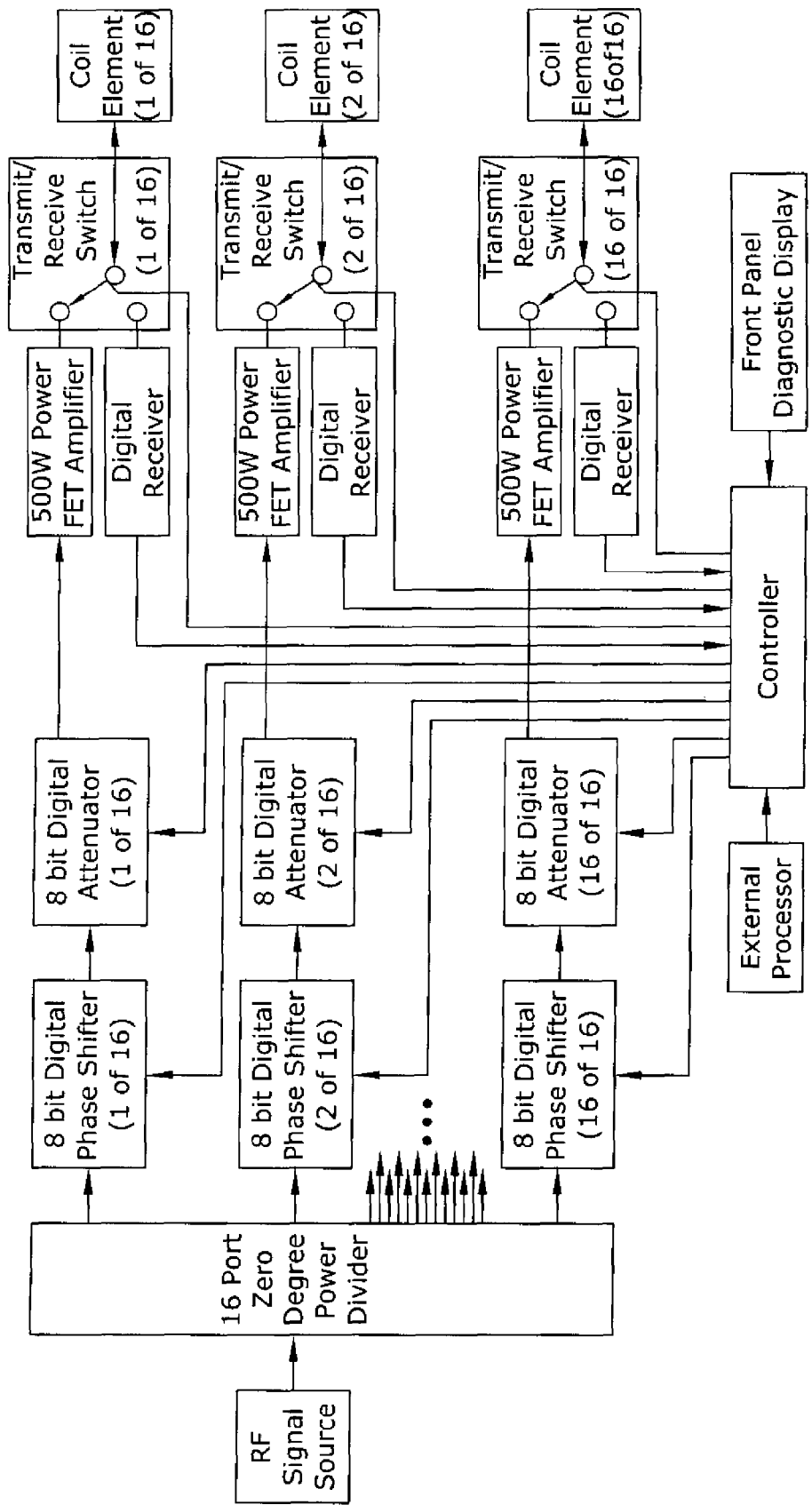
Fig. C3

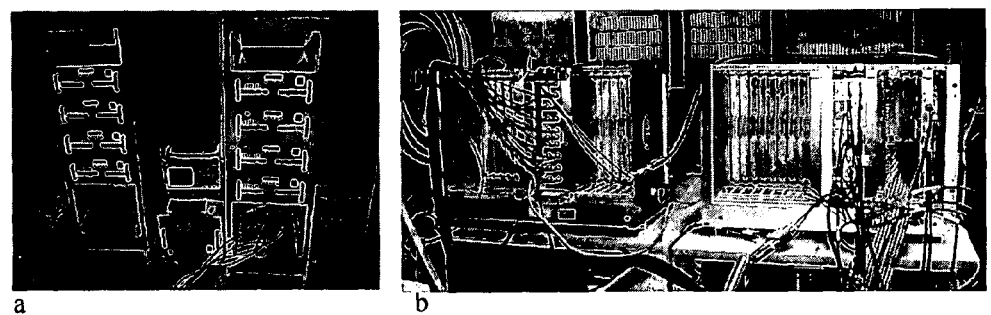
Fig. C4

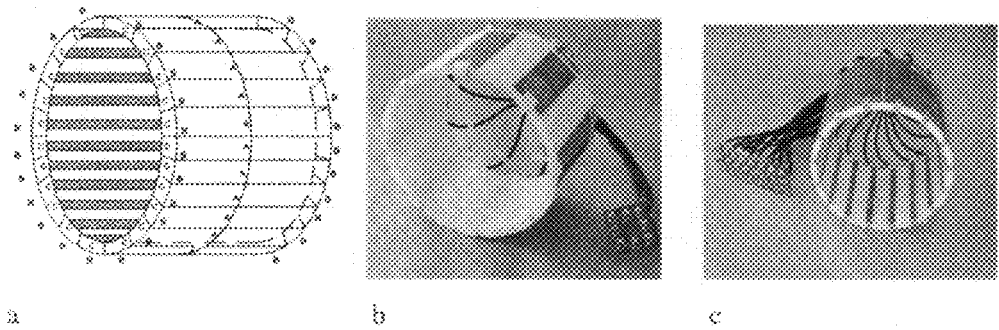
a          b          c
Fig. C5
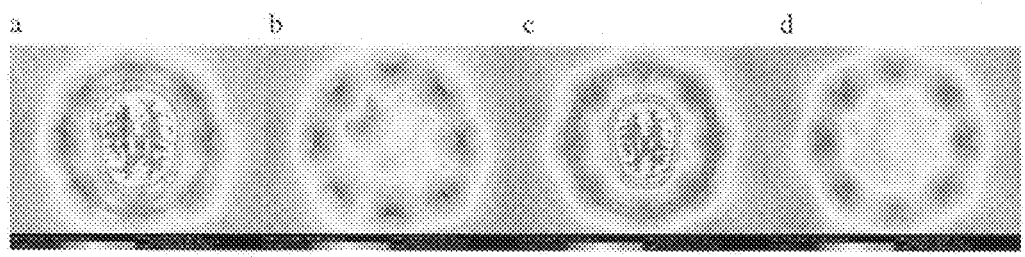
a        b        c        d
Fig. C6

C7a
C7b
Fig. C7
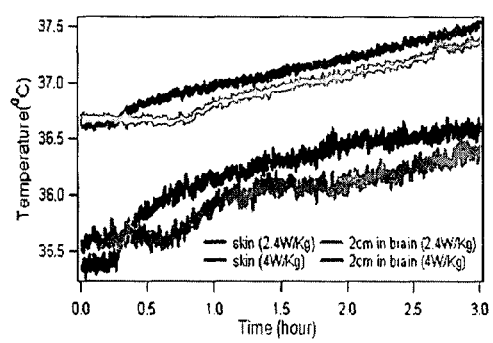
| Sleepiness | 10 |
| --- | --- |
| Vertigo / Dizziness | 5 |
| Metallic Taste | 4 |
| Lightheadedness | 3 |
| Cold | 2 |
| Warmth | 1 |
| Body numbness | 1 |
Fig. C9

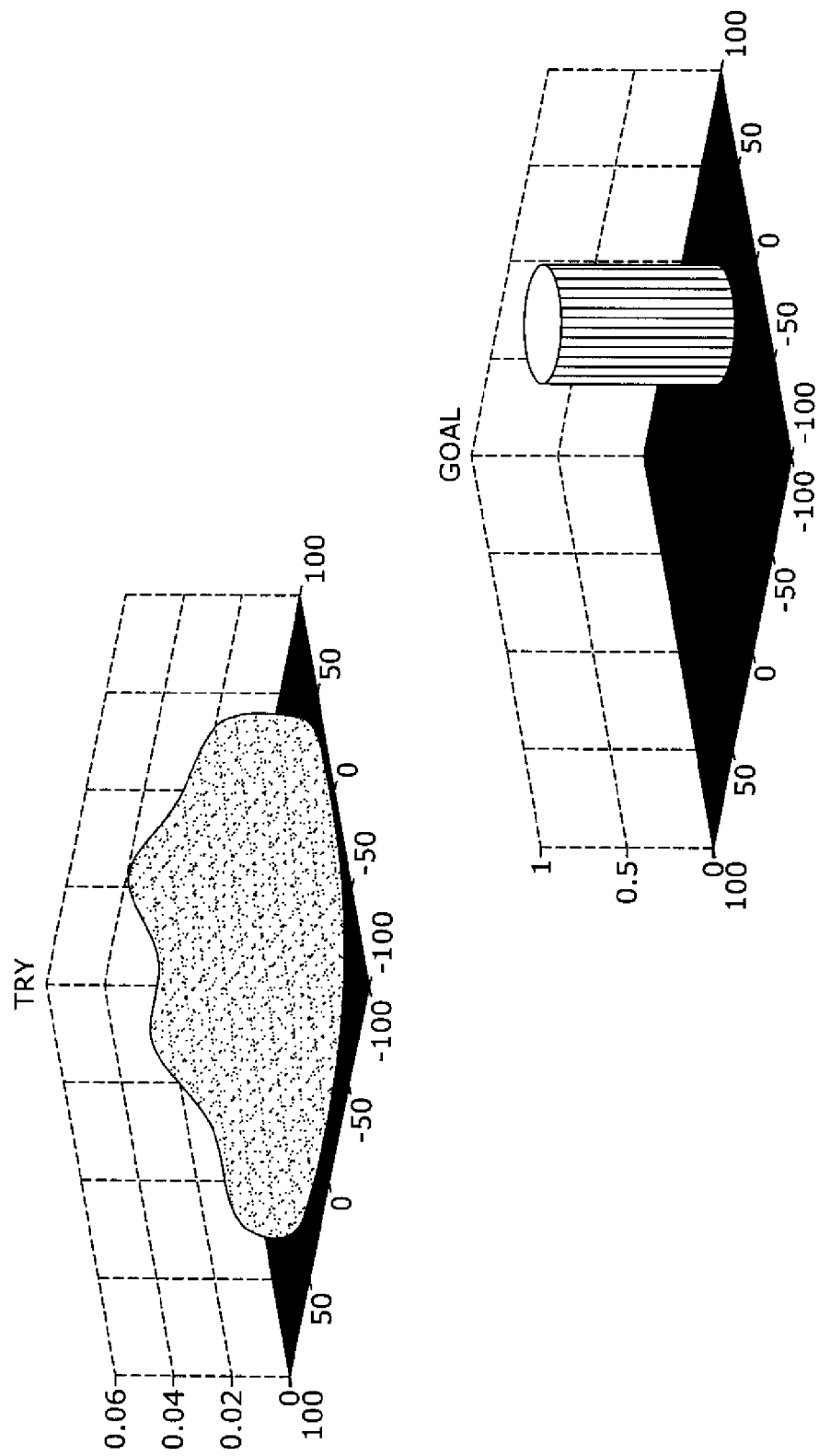
Fig. C8

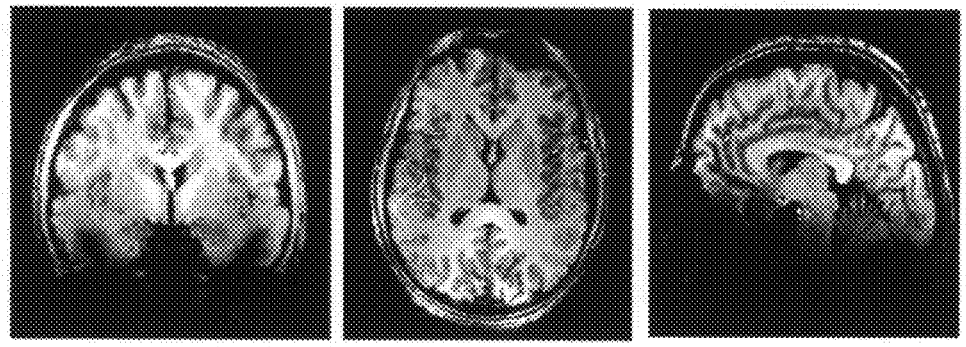
Fig. C10
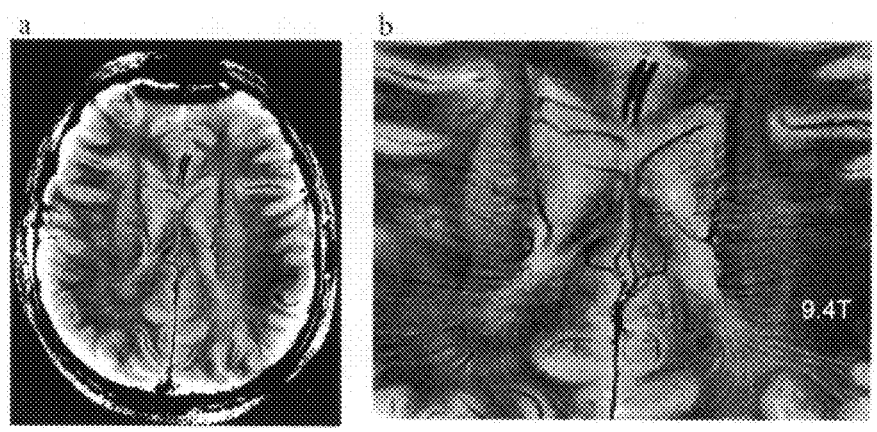
Fig. C11

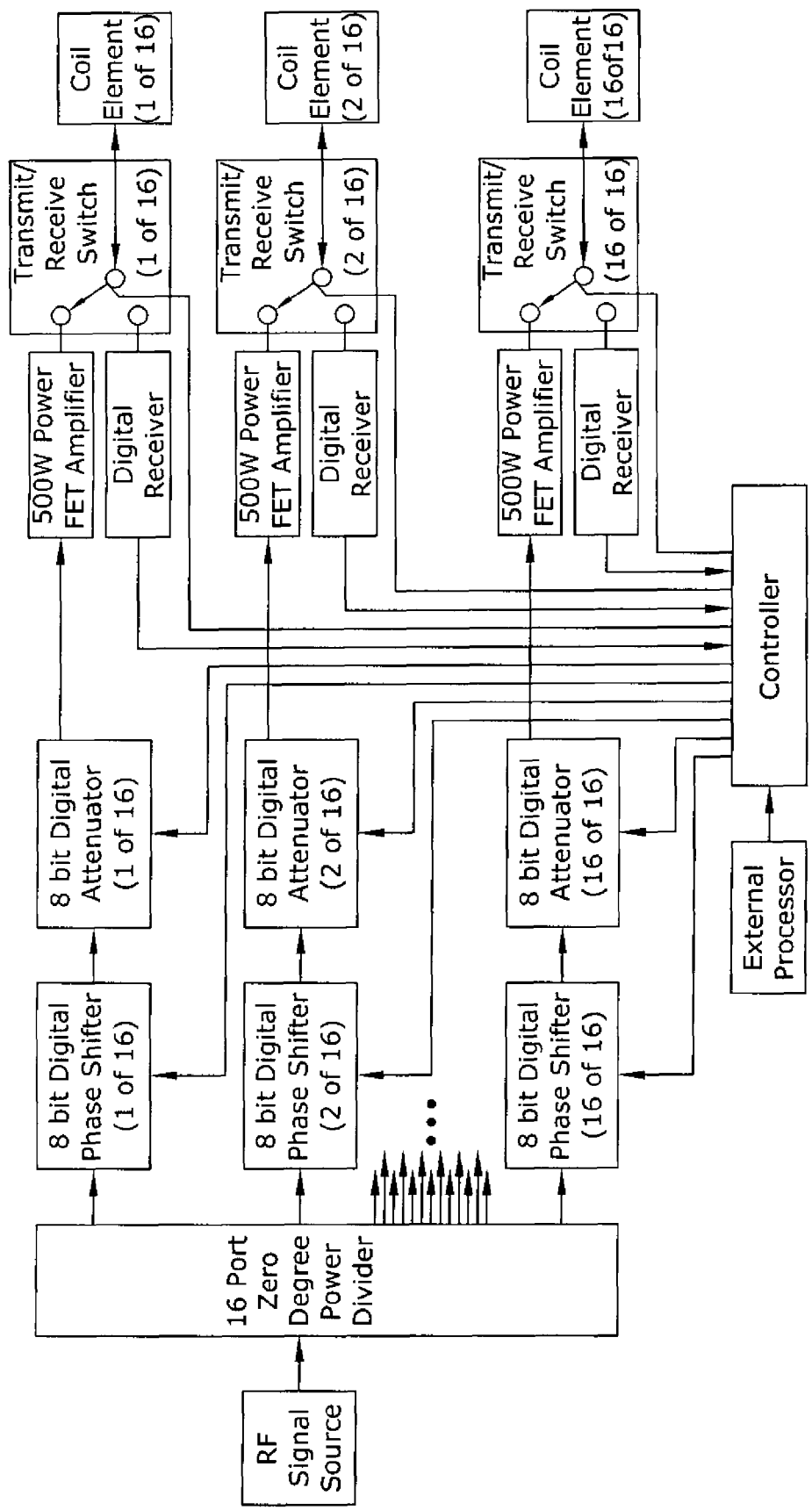
Fig. D1

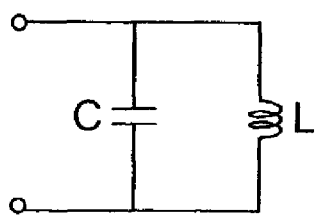
Fig. E1a
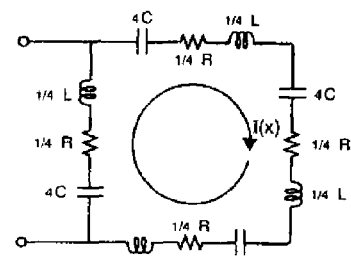
Fig. E1b
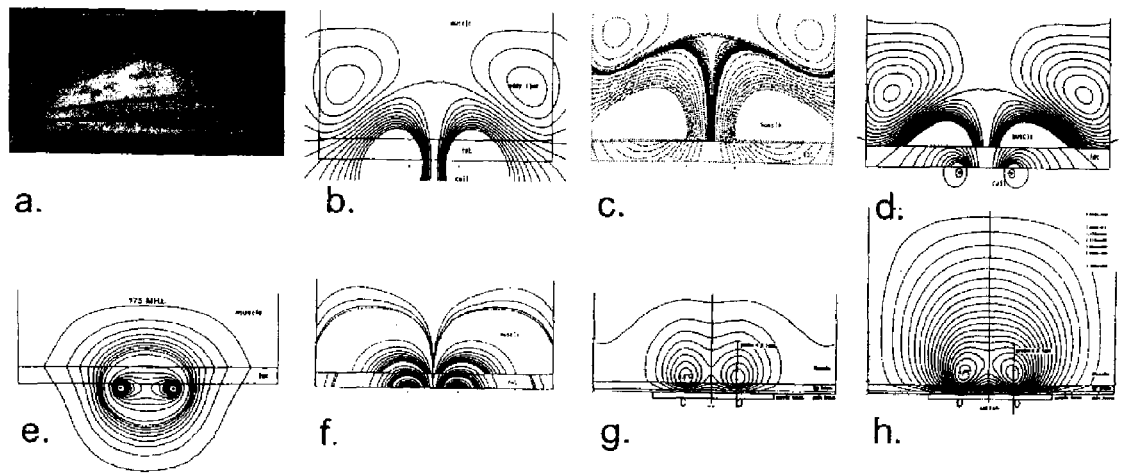
a. b. c. d.
e. f. g. h.
Fig. E2
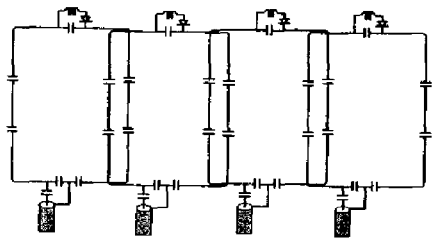
Fig. E3a.
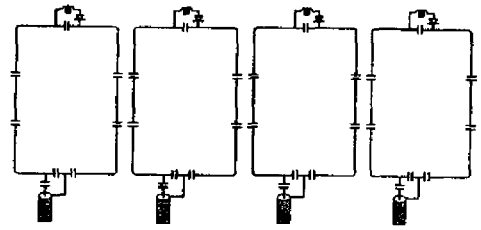
Fig. E3b.

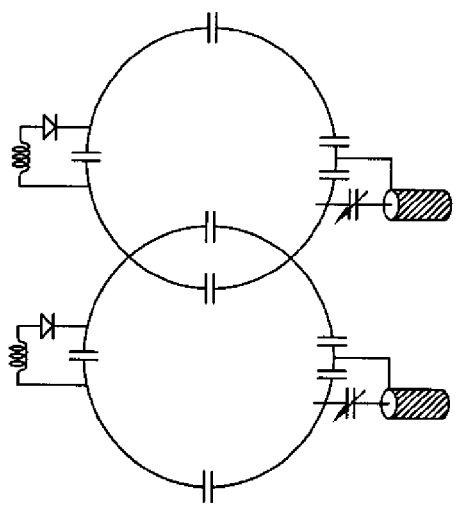
Fig. E4a.
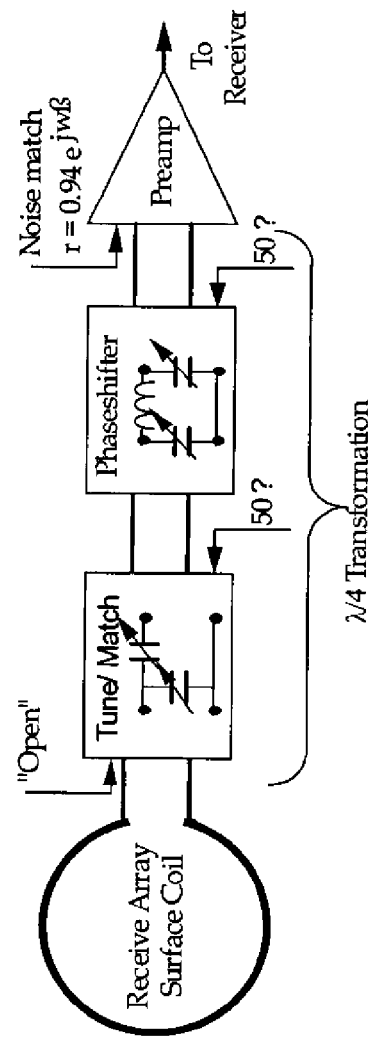
Fig. E4b.

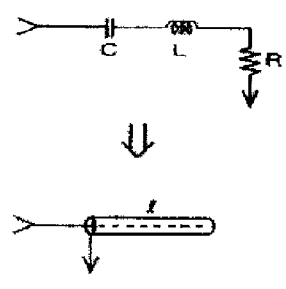 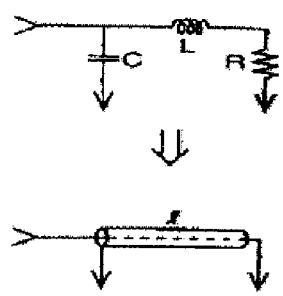
Fig. E5a.  Fig. E5b.
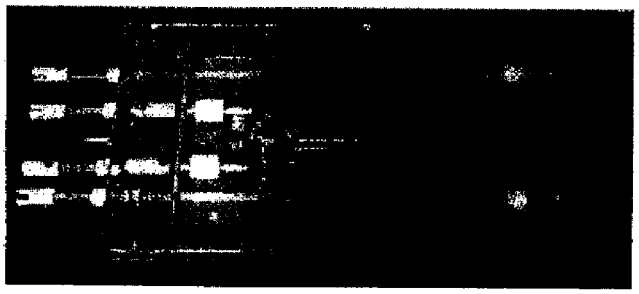 
Fig. E6a.  Fig. E6b.

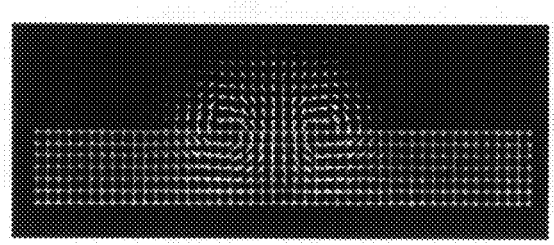
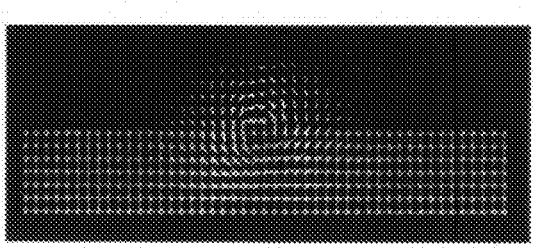
Fig. E7a.  Fig. E7b.
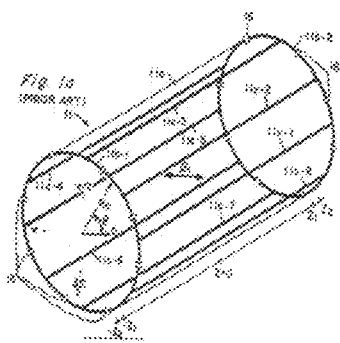
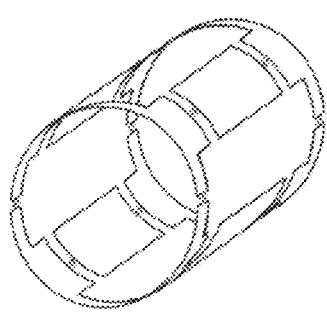
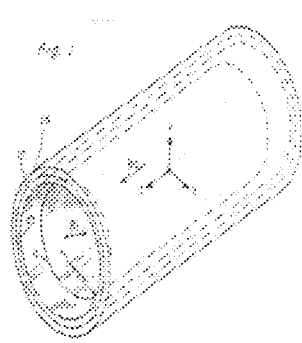
Fig. E8a.  Fig. E8b.  Fig. E8c.
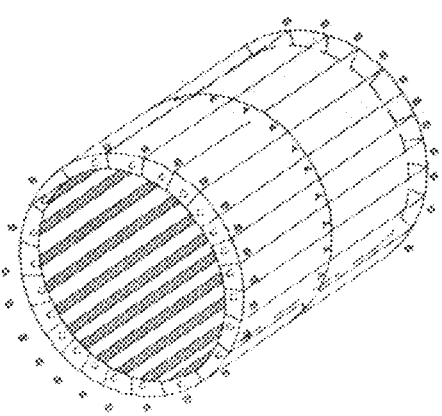
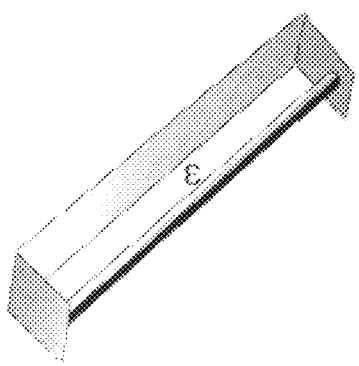
Fig. E9a.  Fig. E9b.

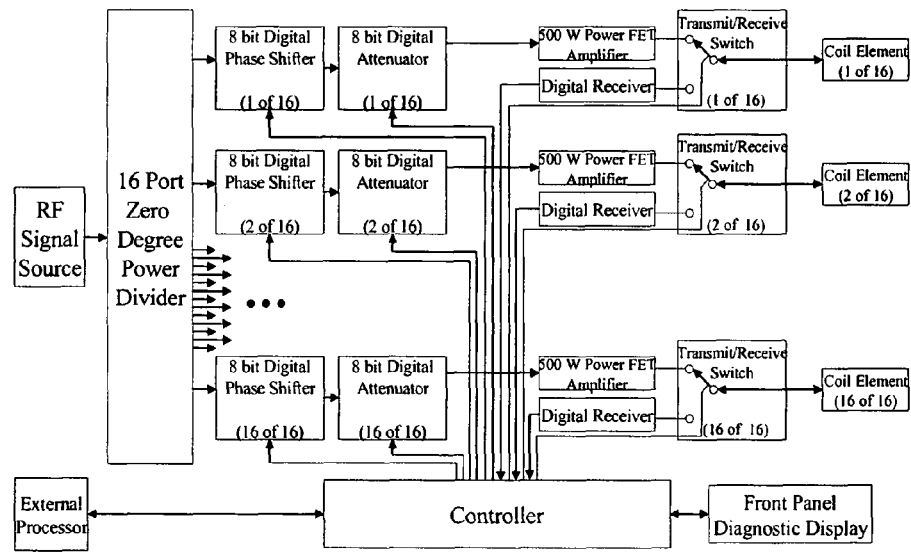
Fig. E10
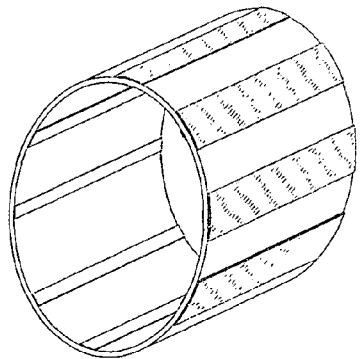
Fig. E11a
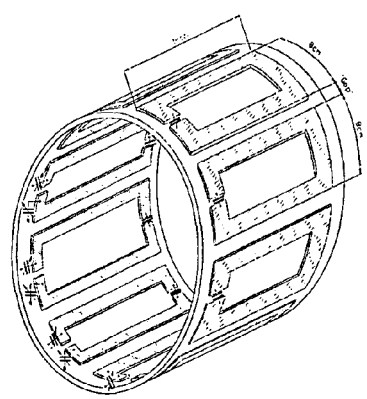
Fig. E11b

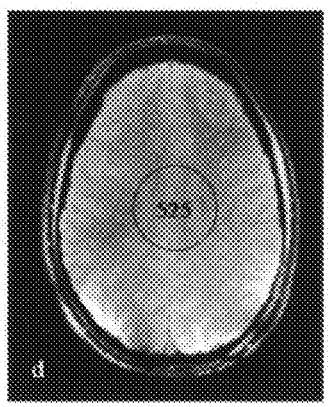
Fig. E12a
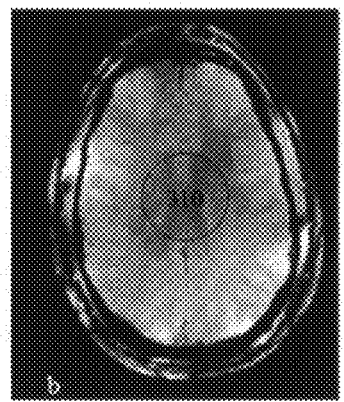
Fig. E12b
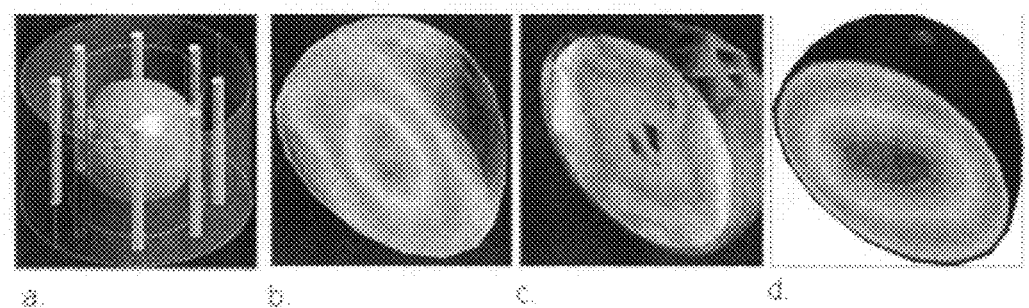
Fig. E13
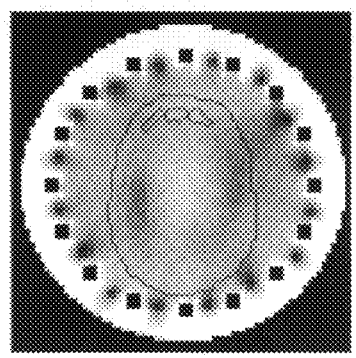
Fig. E14

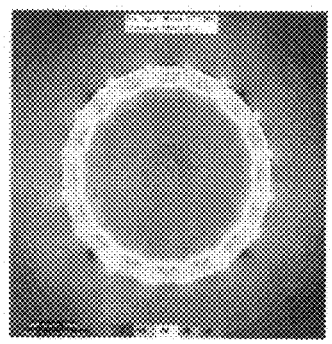
a.
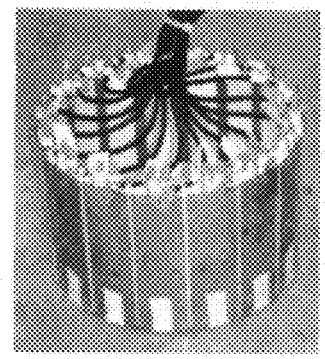
b.
Fig. E15
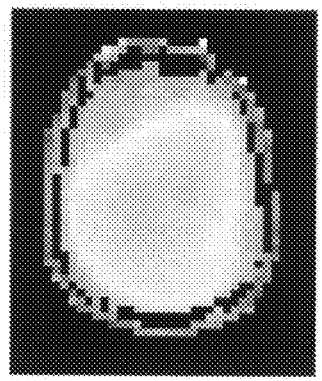
a.
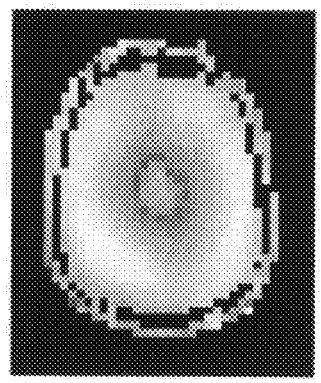
b.
Fig. E16

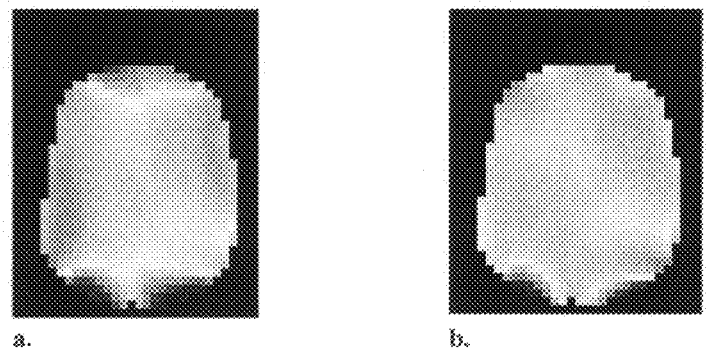
Fig. E17
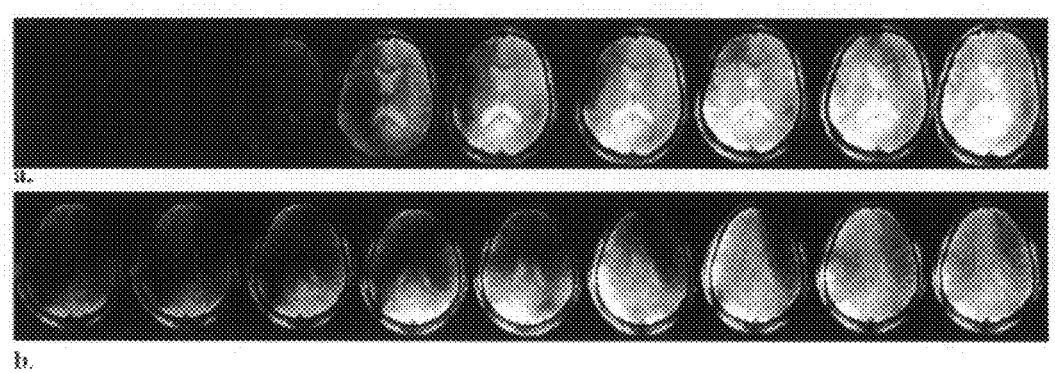
Fig. E18
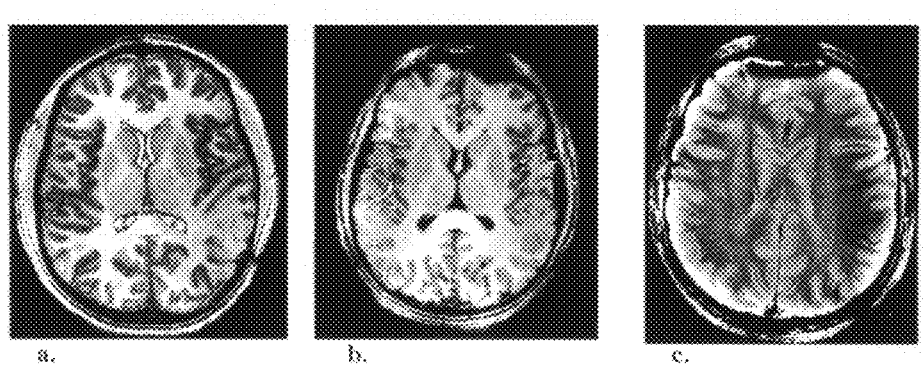
Fig. E19

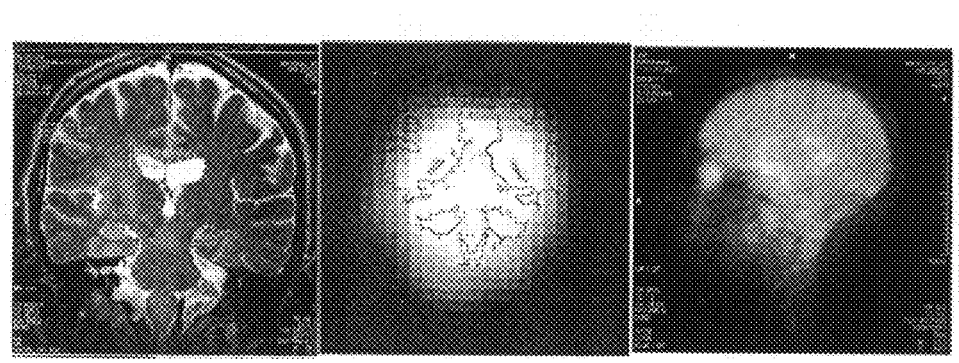
a.  b.  c.
Fig. E20
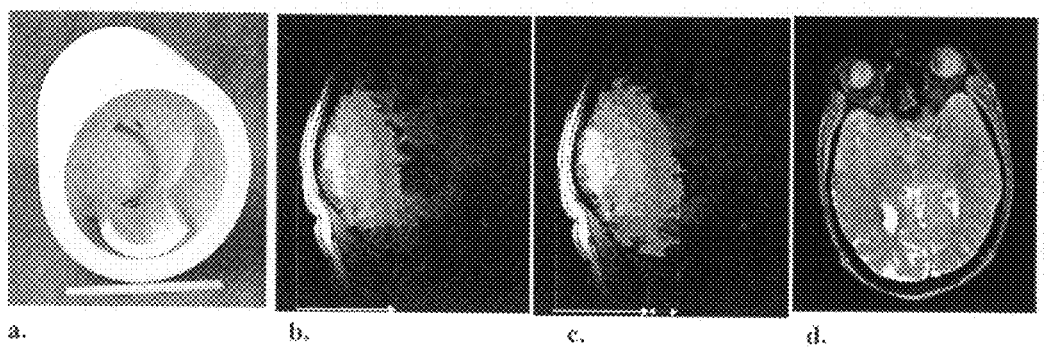
a.  b.  c.  d.
Fig. E21

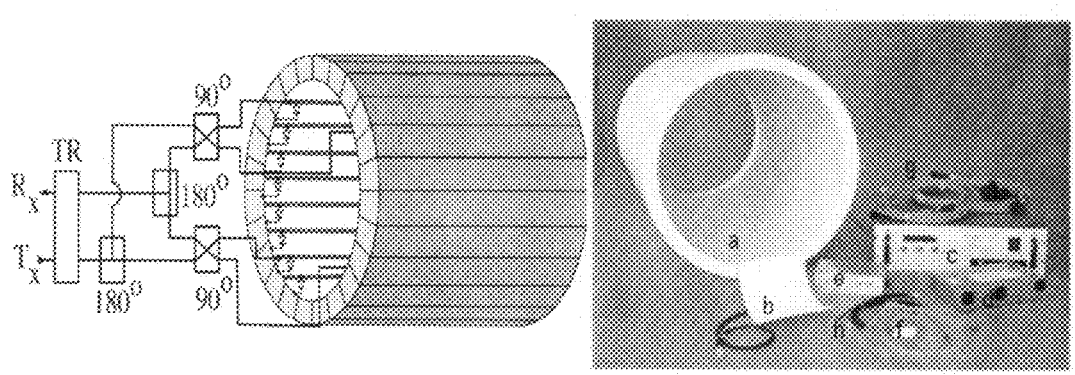
Fig. E22
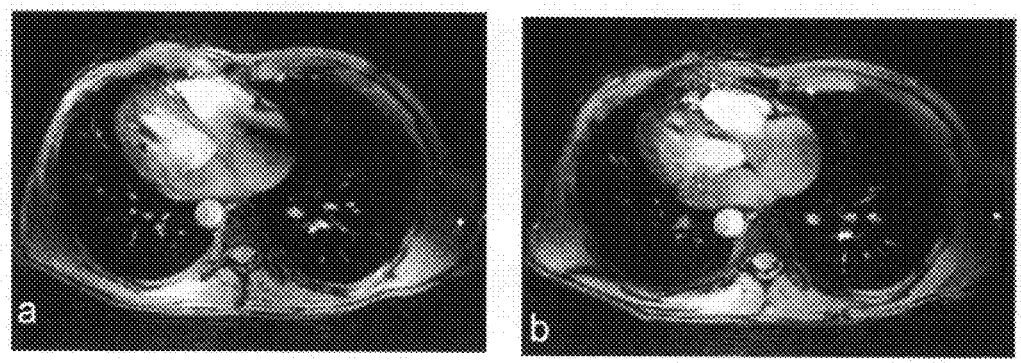
Fig. E23

Fig. E24

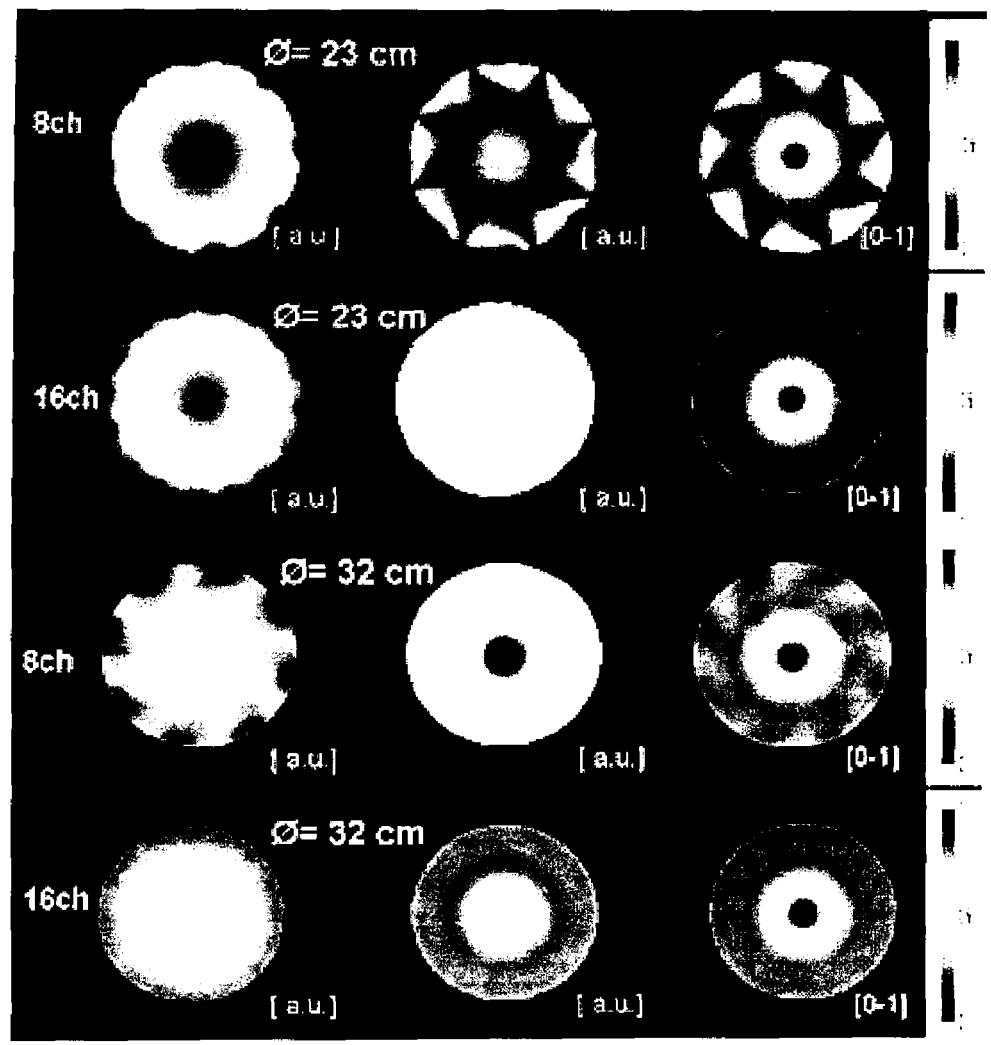
Fig. F1

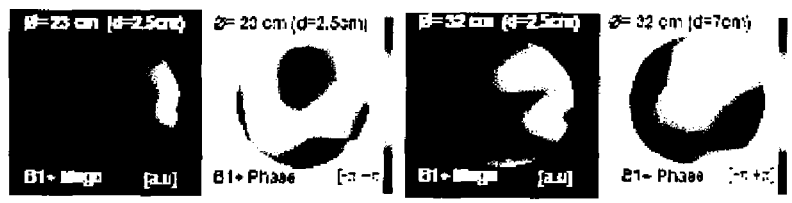
Fig 2 Simulated B1+ for one stripline element
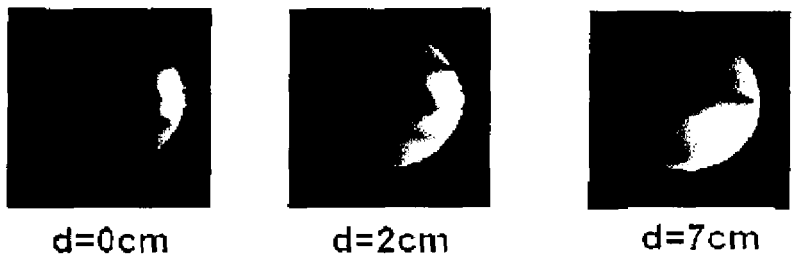
Fig 3. Flash images acquired with one stripline
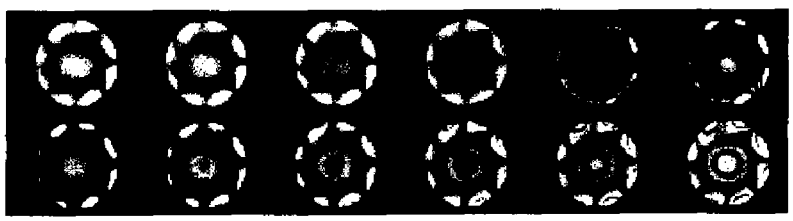
Fig 4. B1− calibration. 8 stripline. 23cm O
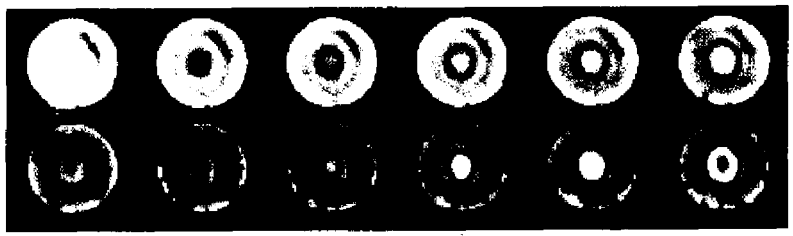
Fig 5. B1+ calibration. 16 striplines 23cm O
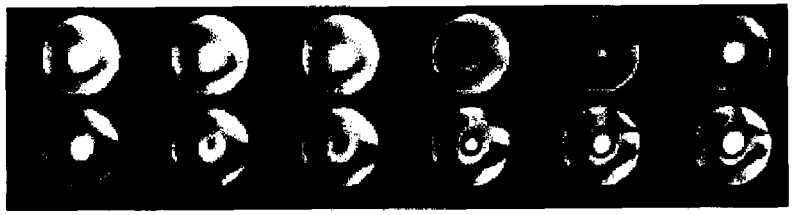
Fig 6. B1− calibration. 16 striplines 32cm O
Fig. F2-6

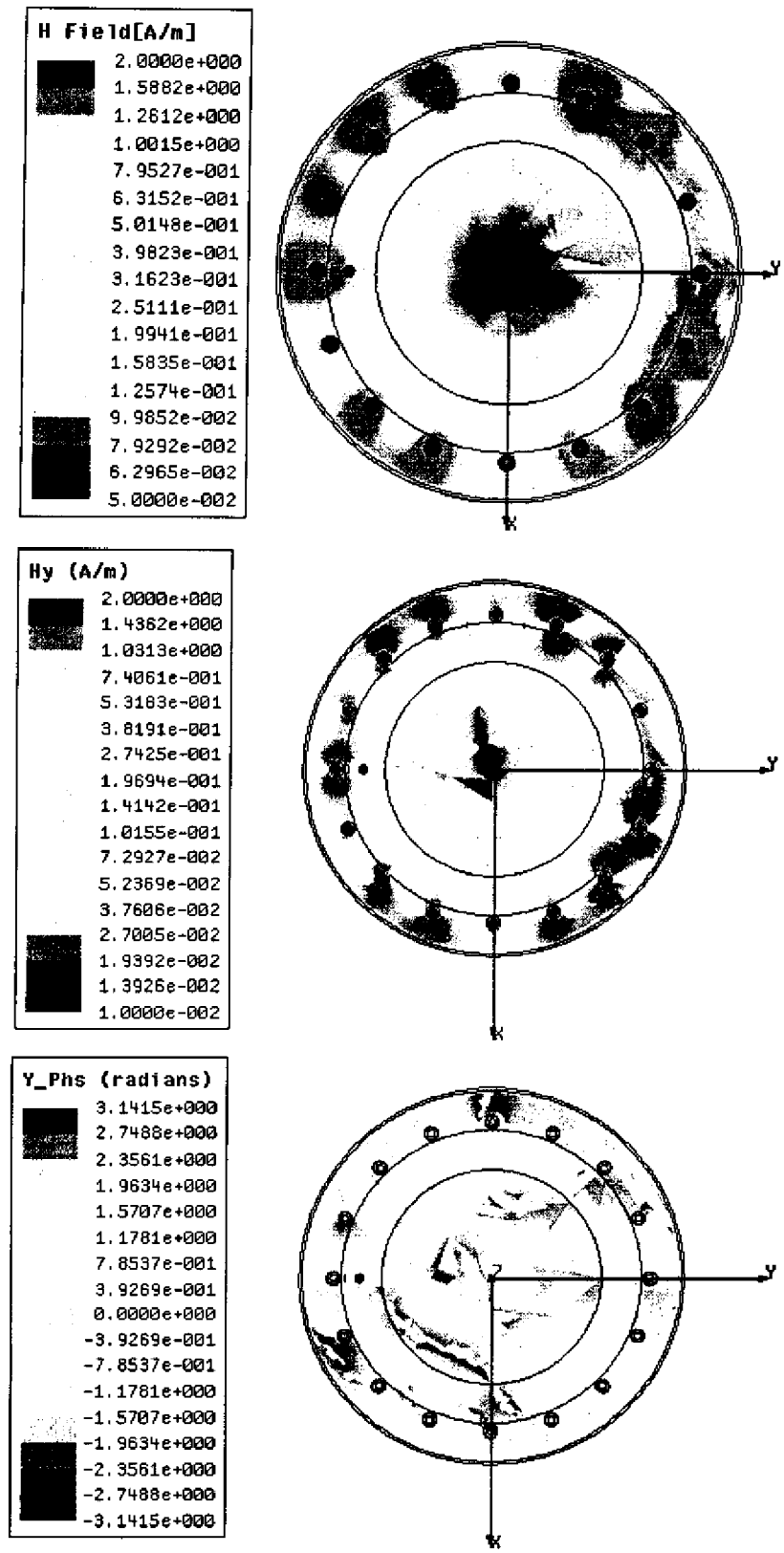
Fig.G1

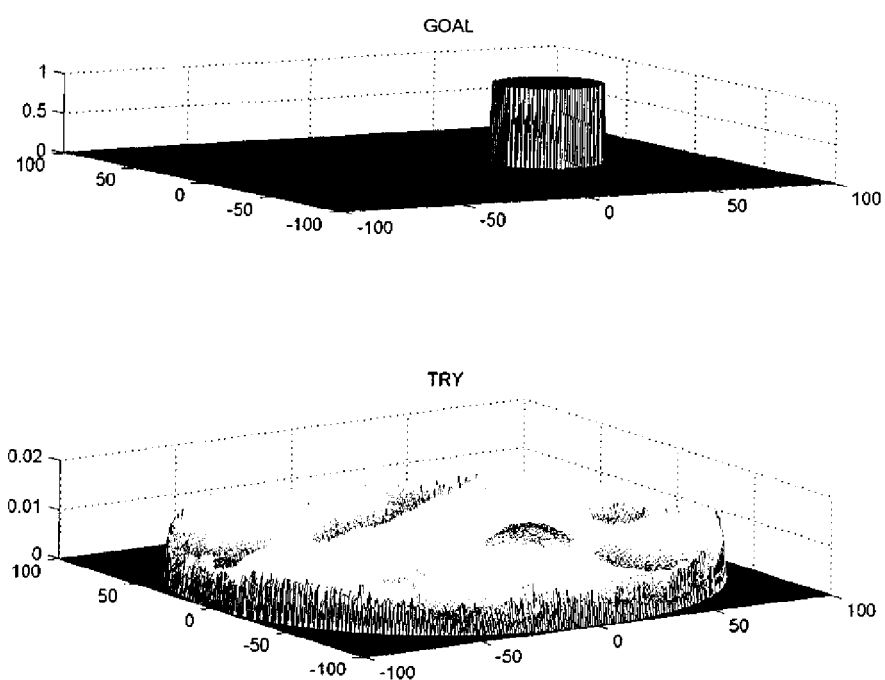
Fig.G2.1

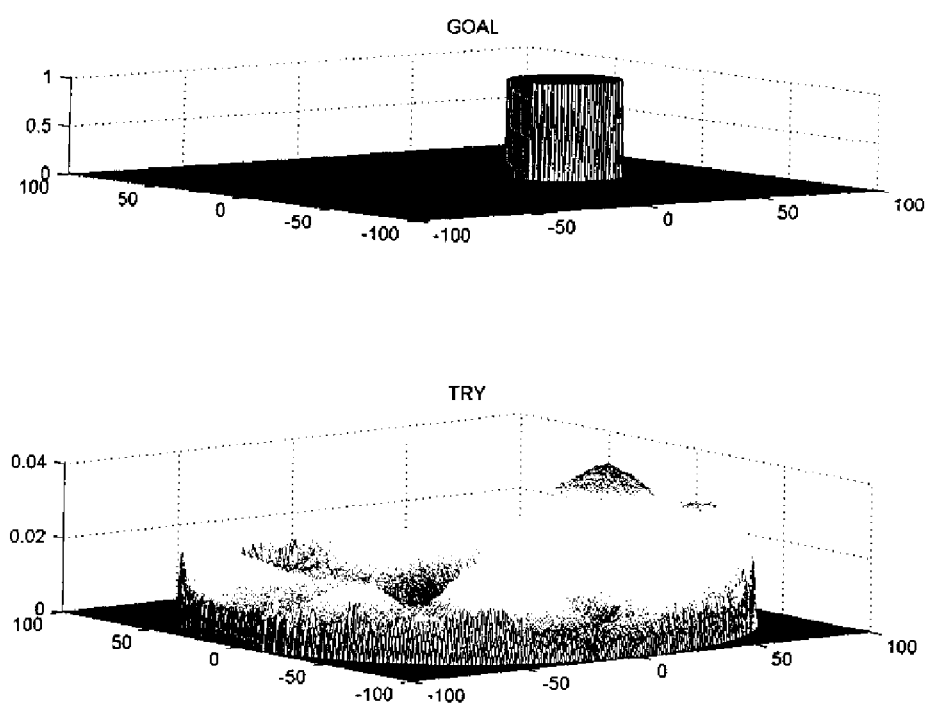
Fig.G2.2

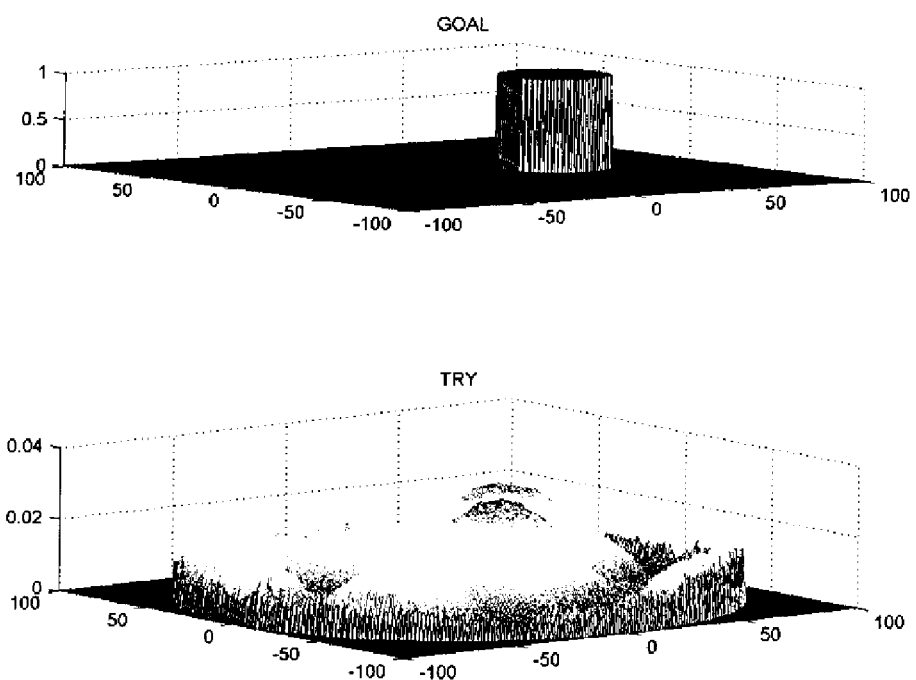
Fig.G2.3

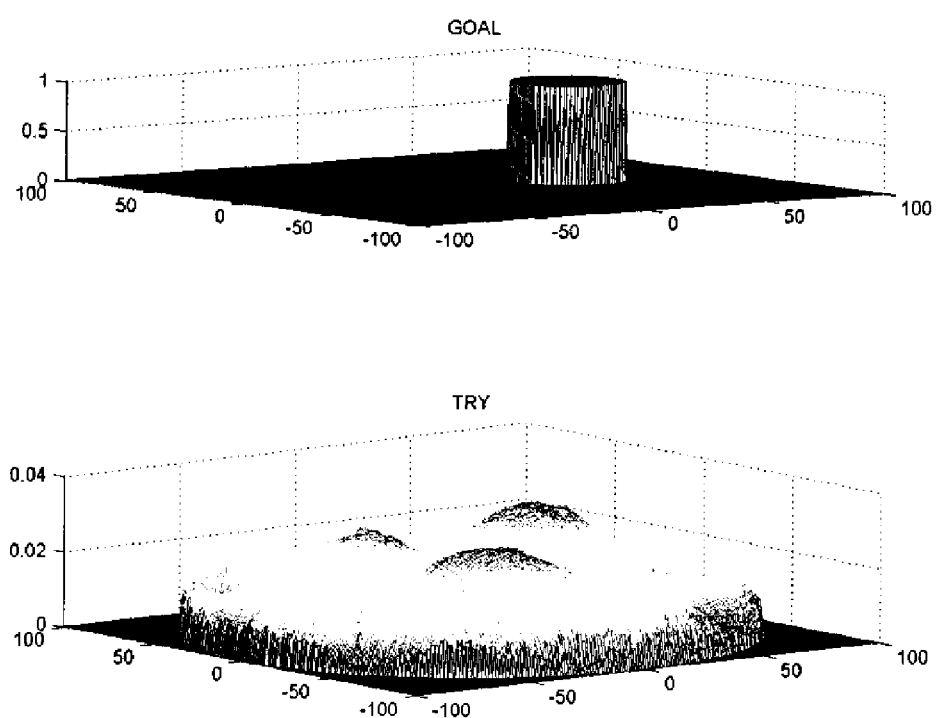
Fig.G2.4

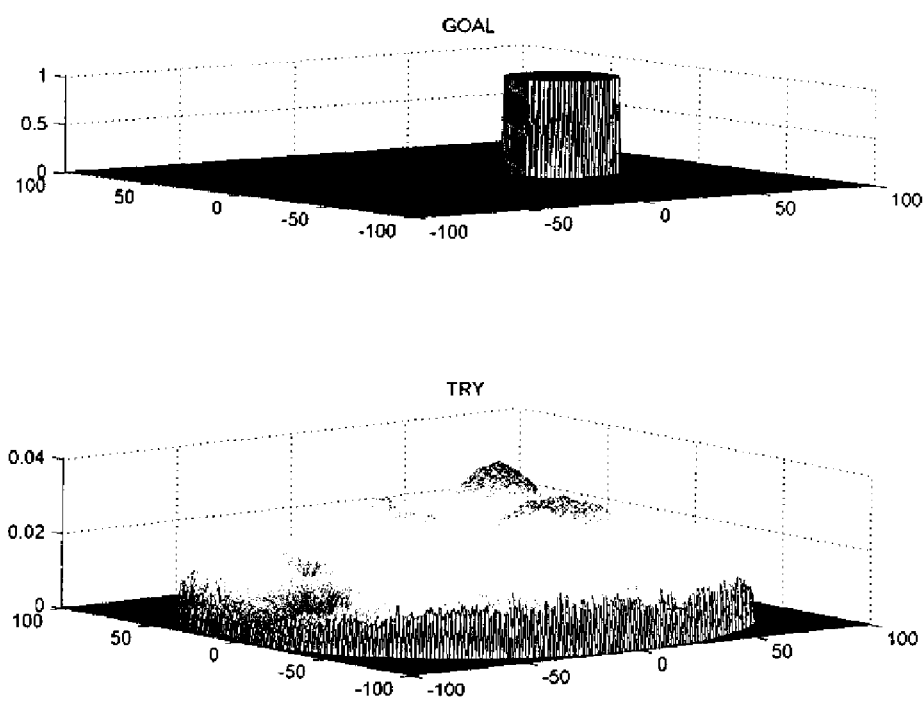
Fig.G2.5

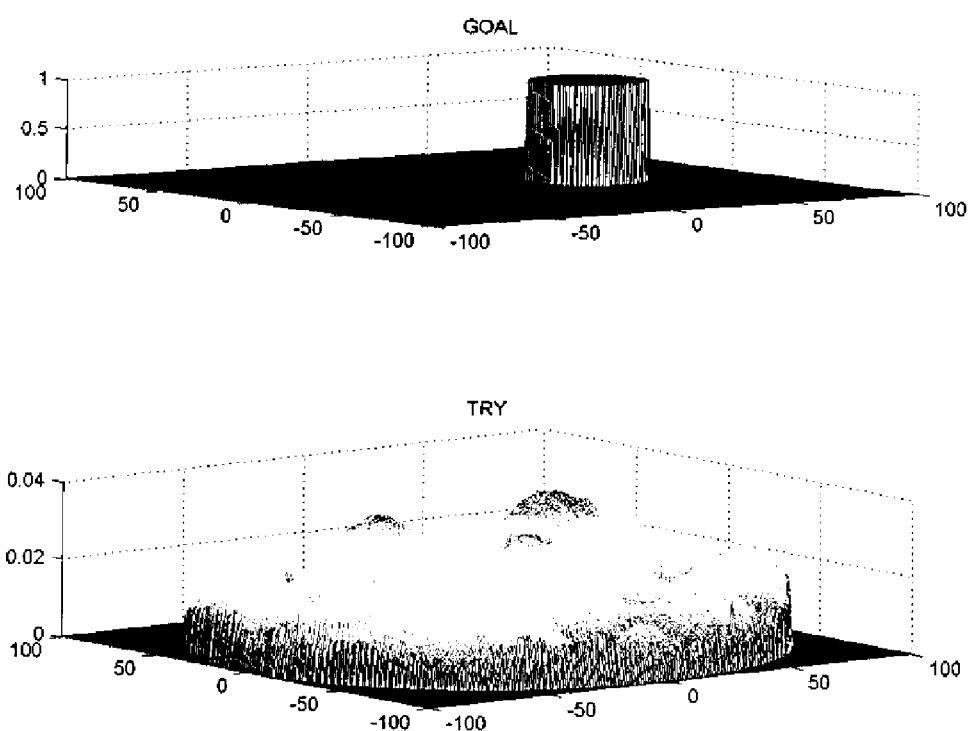
Fig.G2.6

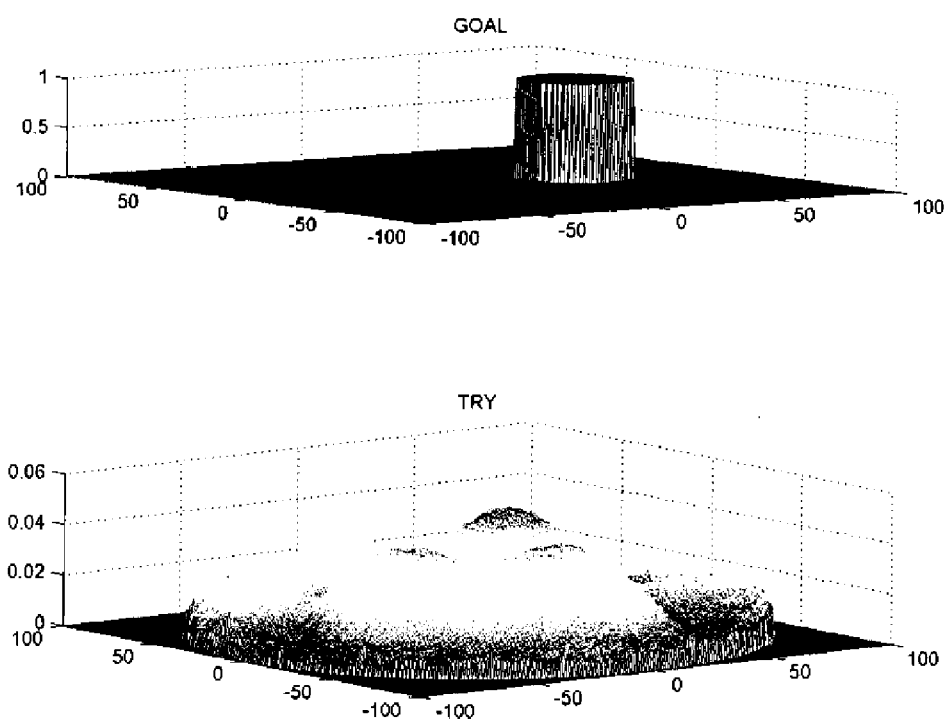
Fig.G2.7

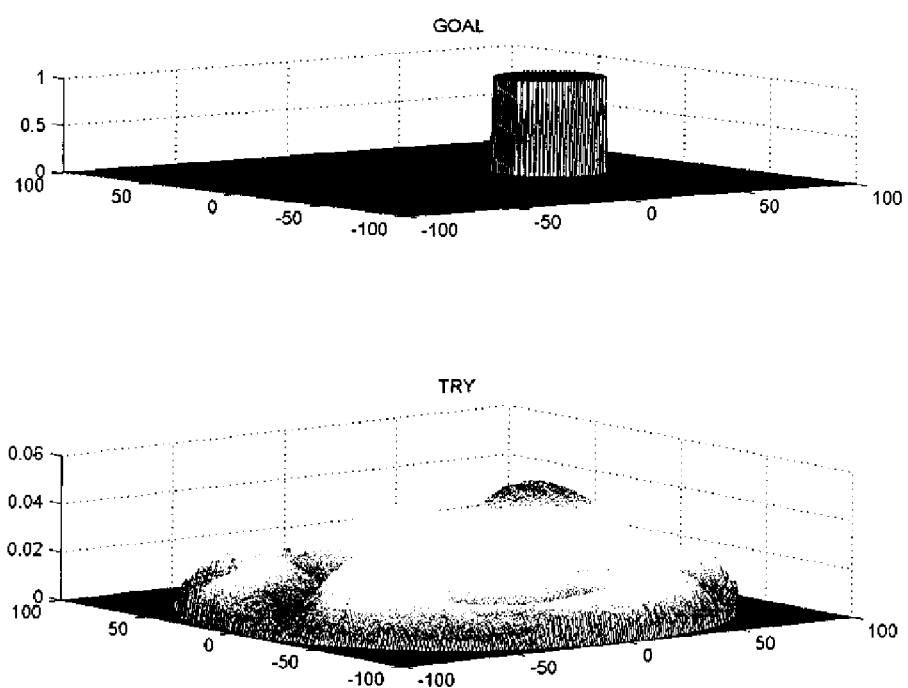
Fig.G2.8

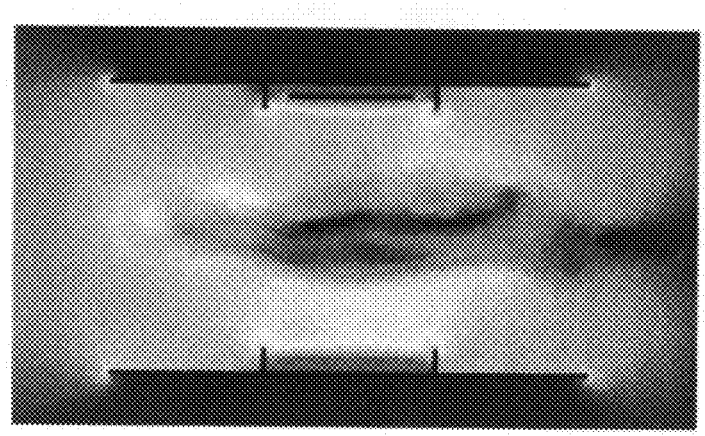
Fig.J1

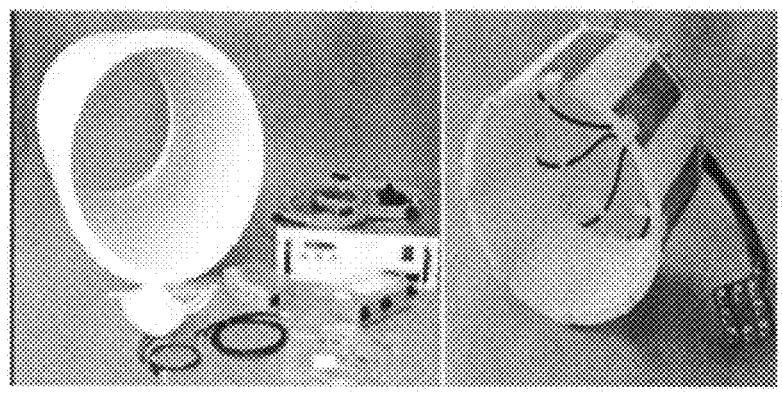
Fig. J2

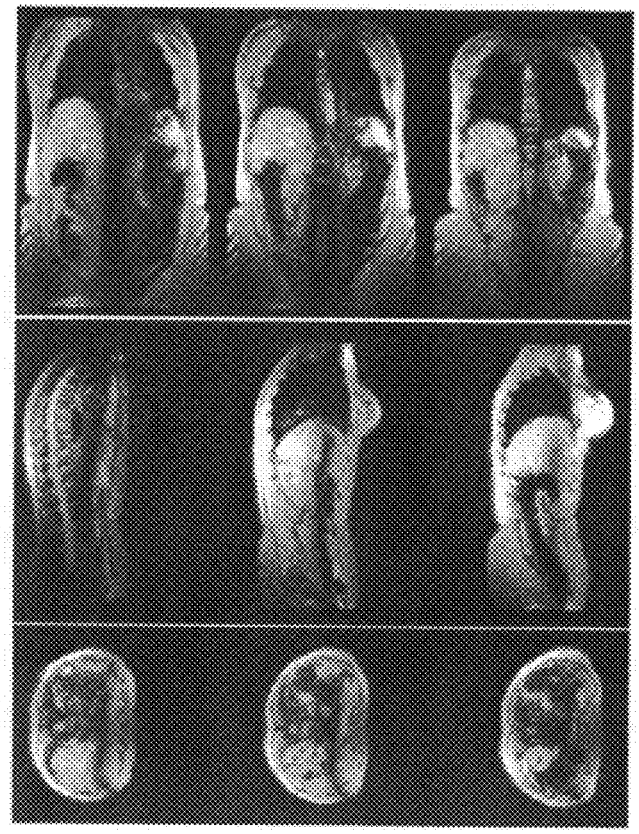
Fig. J3

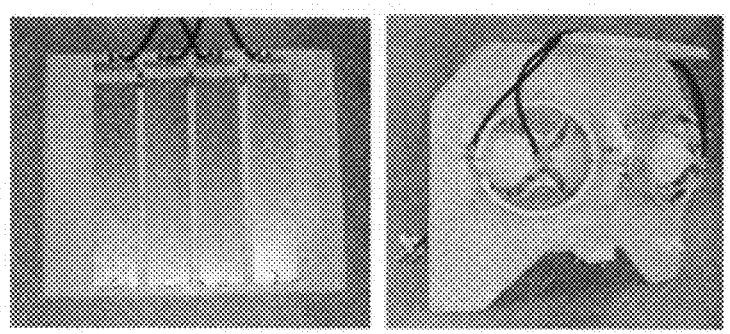
Fig. J4

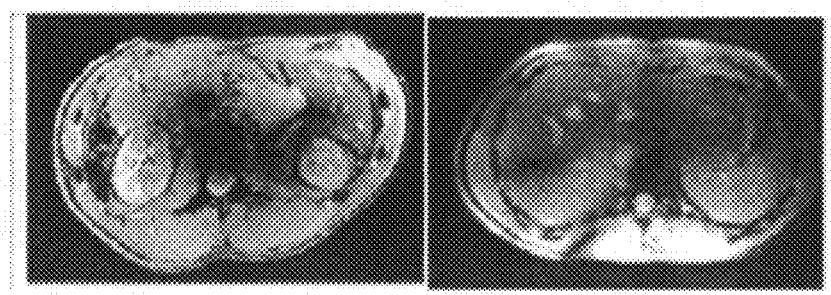
Fig. J5

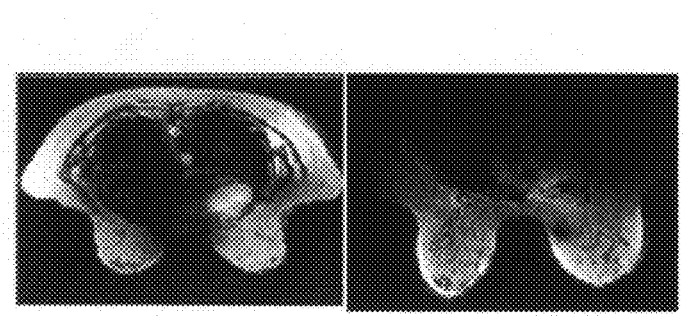
Fig. J6
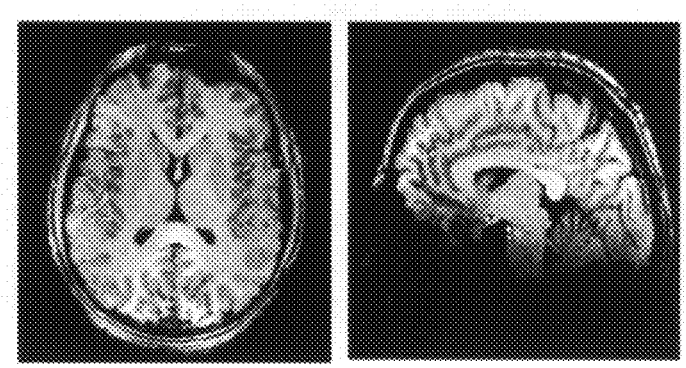
Fig. J7

Figs. L1, L2, L3, and L4a-c
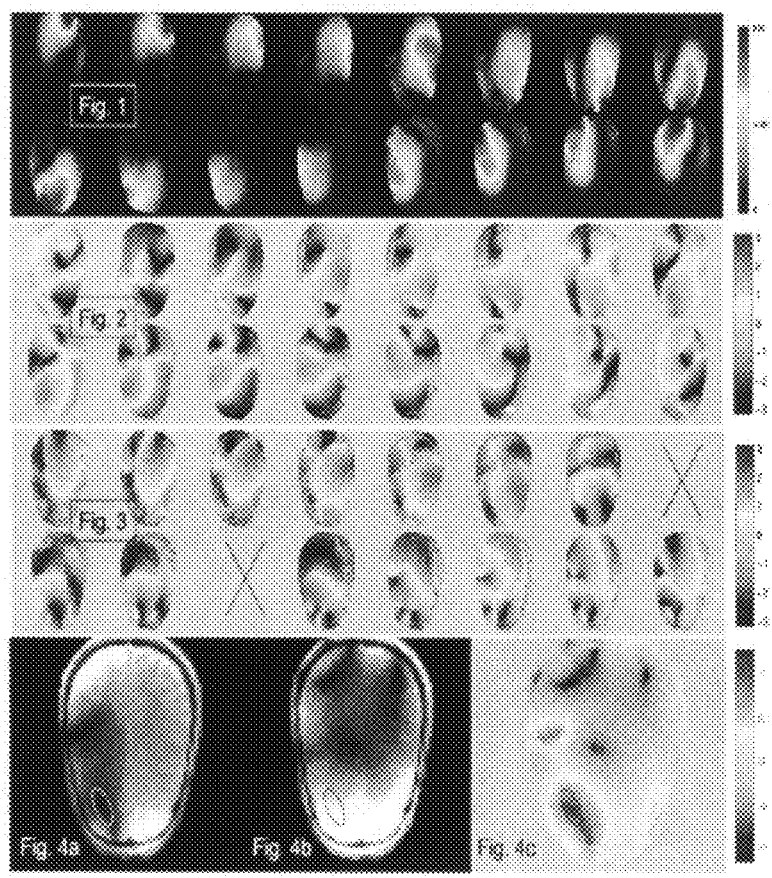

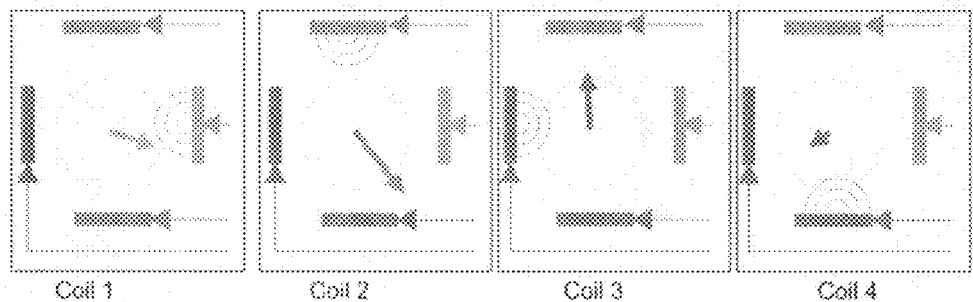
FIG. M1
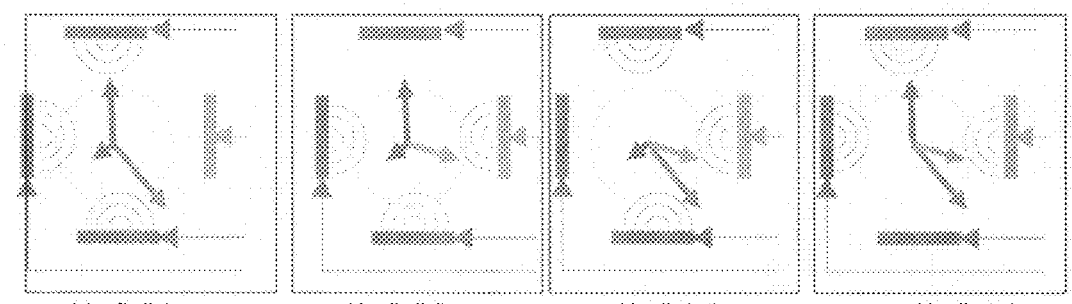
FIG. M2
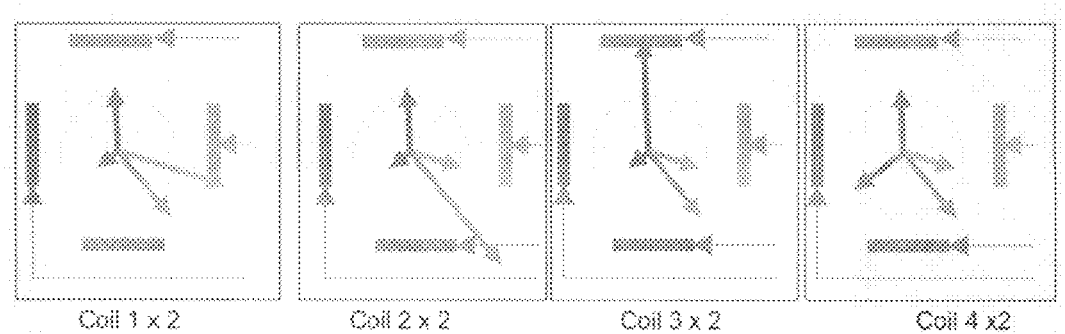
FIG. M3

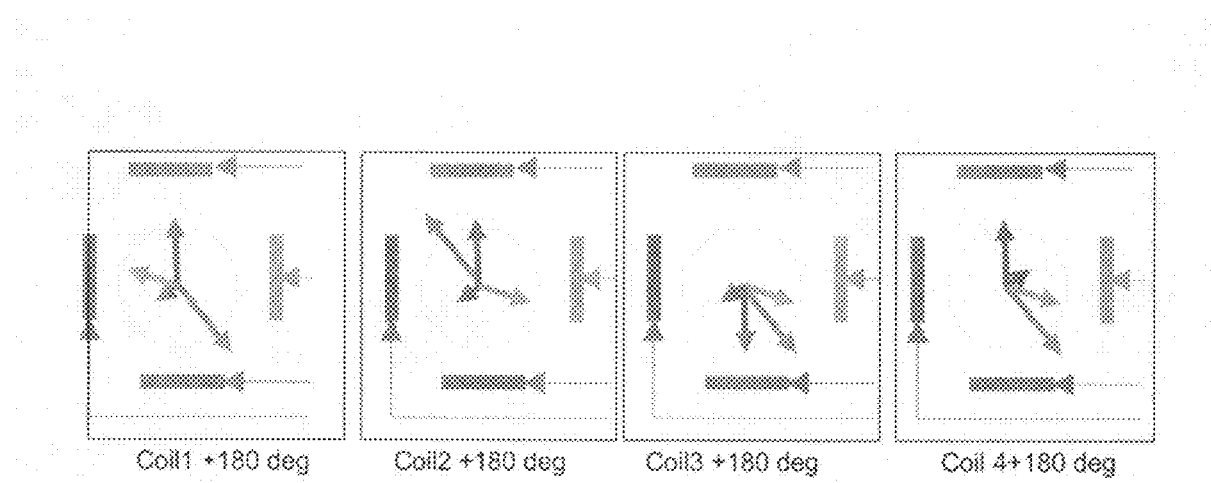
FIG. M4

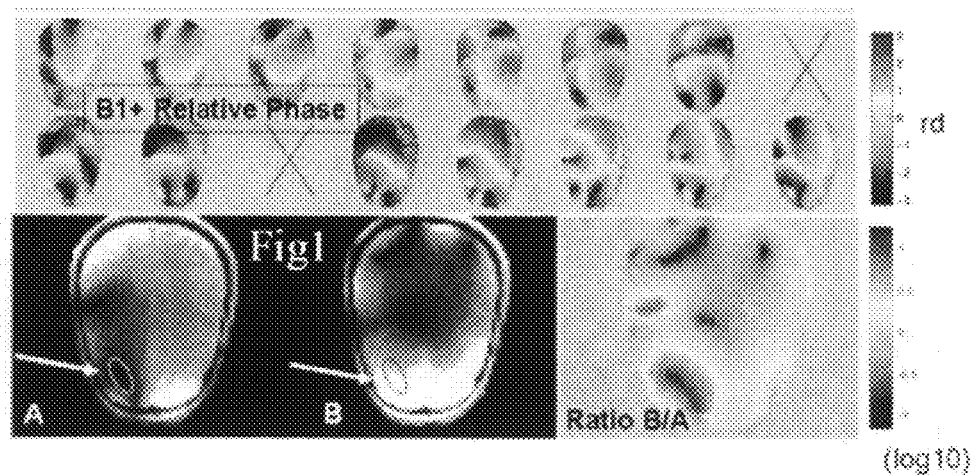
Fig. N1
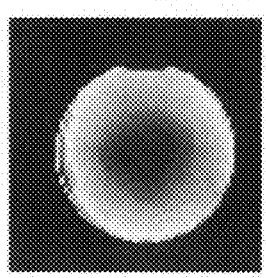
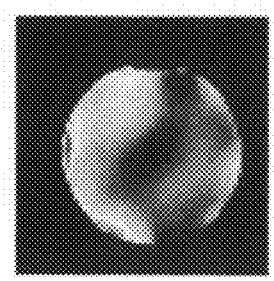
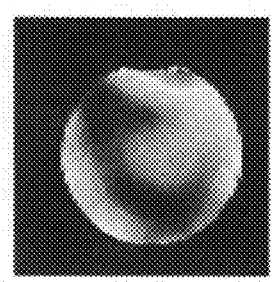
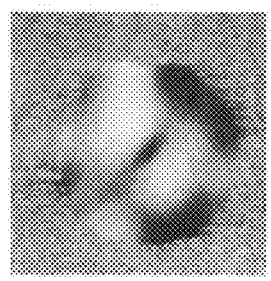
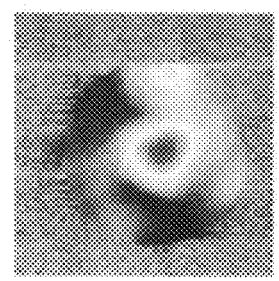
RELATIVE B1 TRANSMIT
Fig. N2

Fig. O1A, Fig. O1B, Fig. O1C, Fig. O1D, Fig. O1E
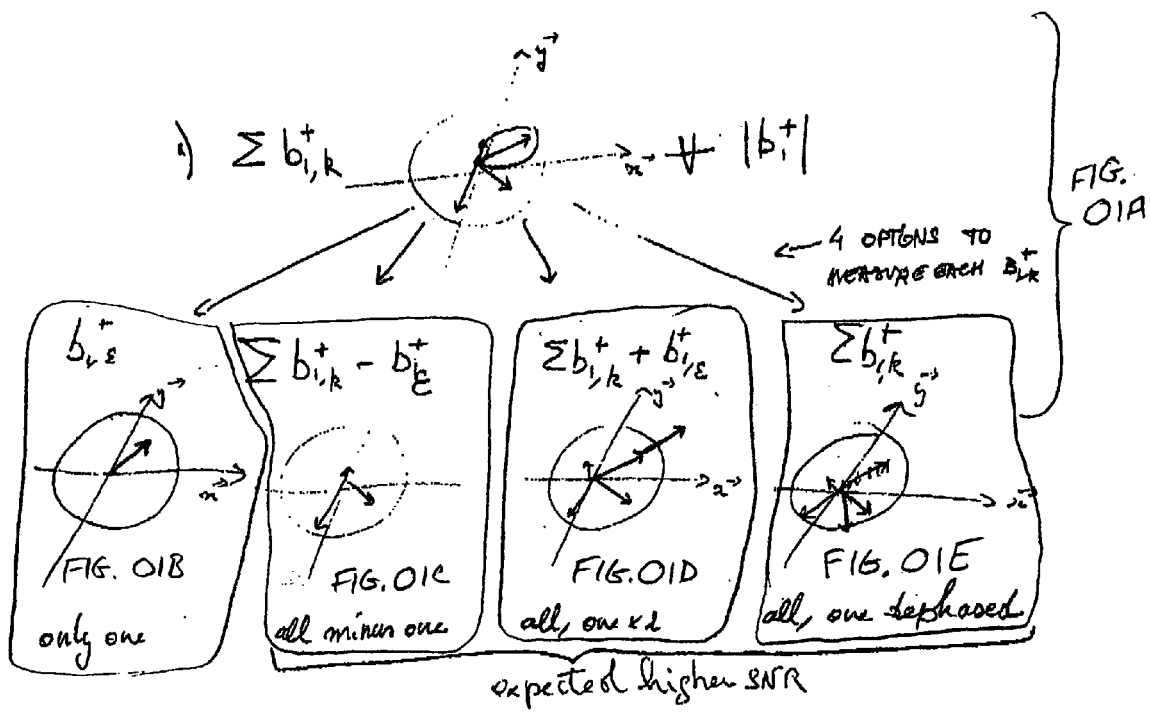

Fig. O2
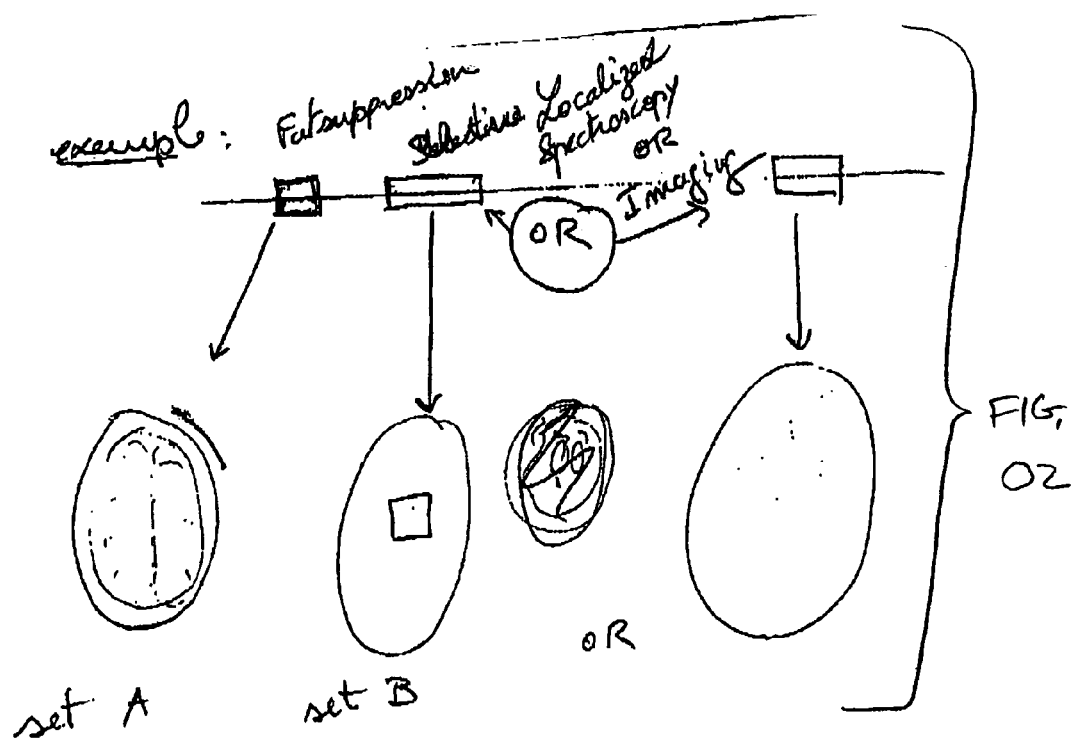

Fig. O3
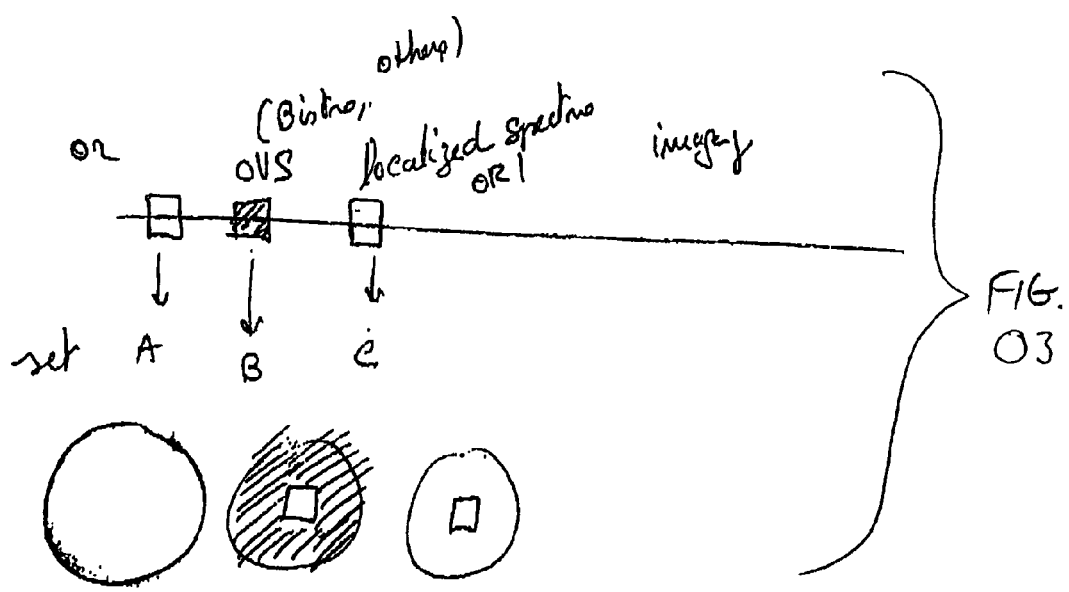
FIG. O3

Fig. O4
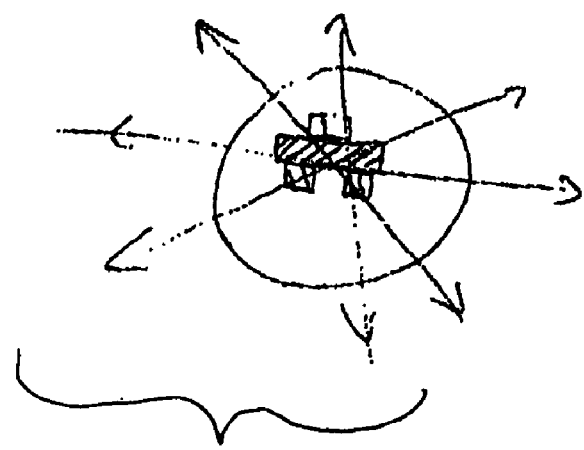

HIGH FIELD MAGNETIC RESONANCE

CROSS-REFERENCE TO RELATED PATENT DOCUMENTS

This document claims the benefit of priority, under 35 U.S.C. Section 119(e), to J. Thomas Vaughan et. al, U.S. Provisional Patent Application Ser. No. 60/774,297, entitled MULTICHANNEL MAGNETIC RESONANCE IMAGING AT HIGH FIELDS, filed on Feb. 17, 2006, all of which is hereby incorporated by reference.

The invention described herein was made with government support under Grant Numbers EB000895, R01 EB000895, R01 EB000895-04, P41 RR08079, P41 RR0807954, BTRR P41 008079, RR008079, RR08079, S10 RR139850, R33 CA94318, R01 CA94200, R42 RR13230, PAR 02-010, R01 EB000331, and RO1MH55346, awarded by the National Institutes of Health. The United States Government has certain rights in the invention.

TECHNICAL FIELD

This document pertains generally to magnetic resonance, and more particularly, but not by way of limitation, to high field magnetic resonance.

BACKGROUND

Magnetic resonance using low fields does not produce adequate signal to noise ratio, imaging speed and other performance.

SUMMARY OF THE INVENTION

The present subject matter provides a system comprising a transceiver having a multichannel receiver and a multichannel transmitter, wherein each channel of the transmitter is configured for independent selection of frequency, phase, time, space, and magnitude, and each channel of the receiver is configured for independent selection of space, time, frequency, phase and gain; a magnetic resonance coil having a plurality of current elements, each element coupled in one to one relation with a channel of the receiver and a channel of the transmitter; and a processor coupled to the transceiver, wherein the processor is configured to execute instructions to control a current in each element.

Optionally, the coil of the system of the present subject matter includes at least one of a transverse electromagnetic volume coil and a transverse electromagnetic surface coil.

The processor of the system of the present subject matter also optionally executes instructions to perform dynamic RF field control of the coil.

The processor of the system of the present subject matter also optionally executes instructions to perform a non-linear algorithm to shim the coil.

The system of the present subject matter further provides the inclusion of a user input console coupled to the processor. Optionally, the user input console may be configured to receive a user selection for RF field optimization.

Additionally, the coil of the system of the present subject matter may optionally be configured for use with a coil of at least 3 T.

The present subject matter also provides a method, comprising receiving a user selected criteria for optimization; executing instructions using a processor to configure a multichannel transmitter and a multichannel receiver based on the criteria, wherein the transmitter and the receiver each are coupled to a multichannel coil, wherein each channel of the coil includes a current element and each channel of the coil is coupled in one to one relation with a channel of the transmitter and a channel of the receiver; and acquiring magnetic resonance data based on a signal received from the coil.

Optionally, the methods of the present subject matter provides that the executing instructions include performing an iterative algorithm.

The methods of the present subject matter also provides executing instructions which include configuring the coil for predetermined homogeneity within a particular region of the coil.

The methods of the present subject matter also optionally provides executing instructions which include controlling a current in a transmission line as to at least one of magnitude, phase, frequency, space and time.

BRIEF DESCRIPTION OF THE DRAWINGS

In the drawings, which are not necessarily drawn to scale, like numerals may describe substantially similar components in different views. Like numerals having different letter suffixes may represent different instances of substantially similar components. The drawings illustrate generally, by way of example, but not by way of limitation, various embodiments discussed in the present document.

FIG. A1a. B1flux @ 4 T b. B1 contours @ 4 T c. B1, μT @ 4 T d. B1, μT @ 7 T FIG. A1. A1a shows the calculated RF magnetic vector potential, Webers and A1b shows RF flux density (Webers/mm2). FIGS. A1c and A1d show B1, μT in images at 4 T and 7 T.

Figure 11:
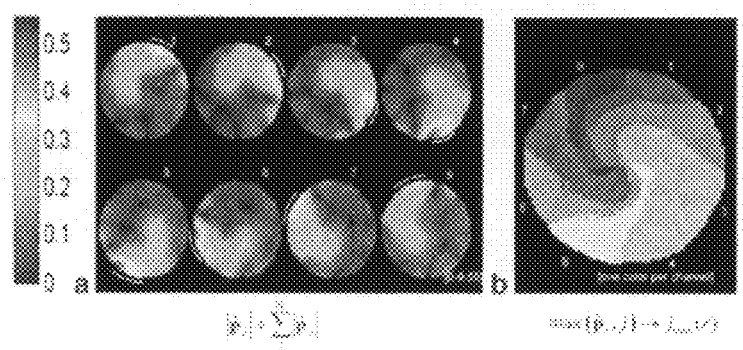
Figure 12:
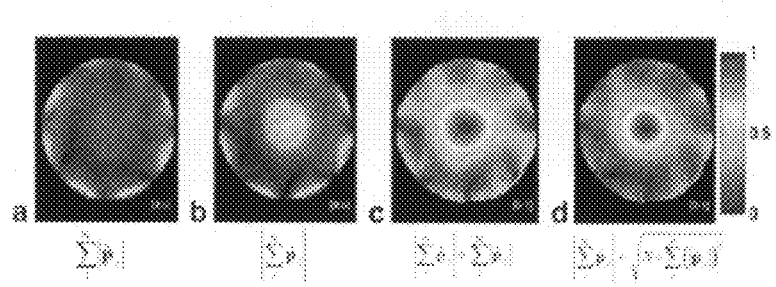
Figure 13:
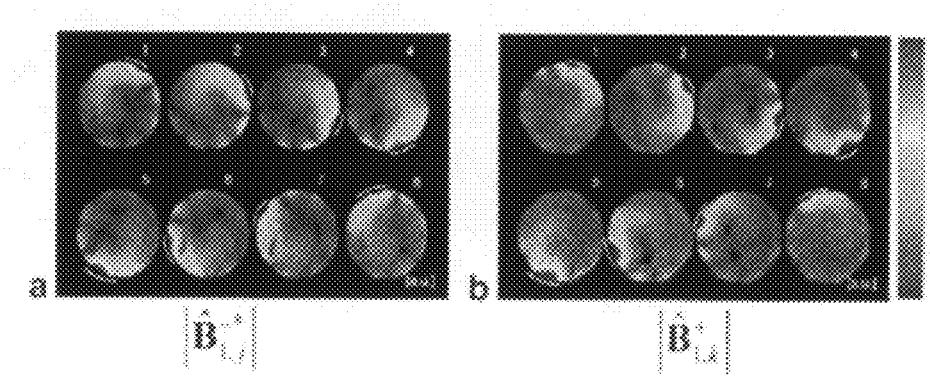
Figure 14:
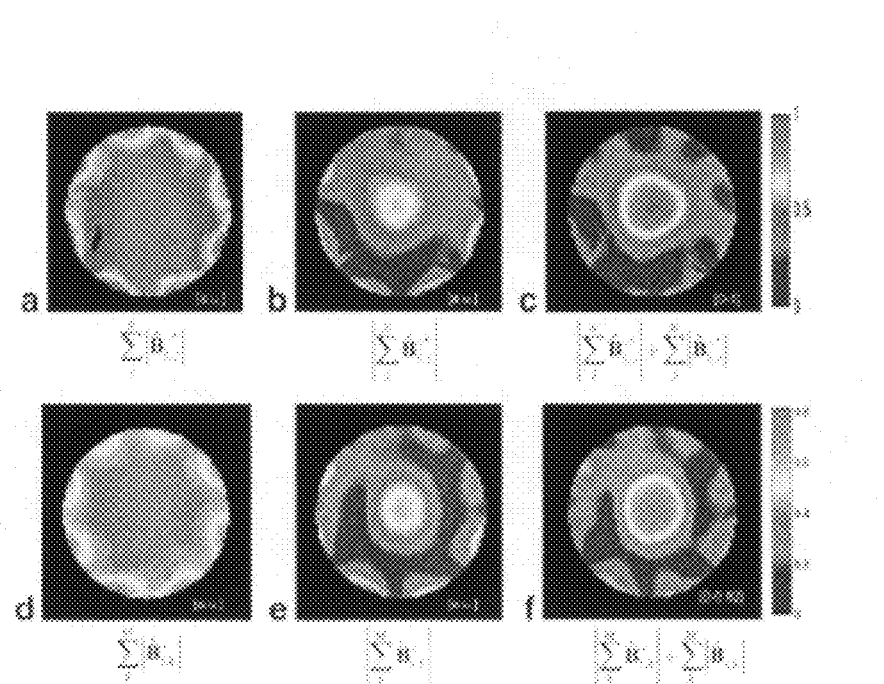
Figure 15:
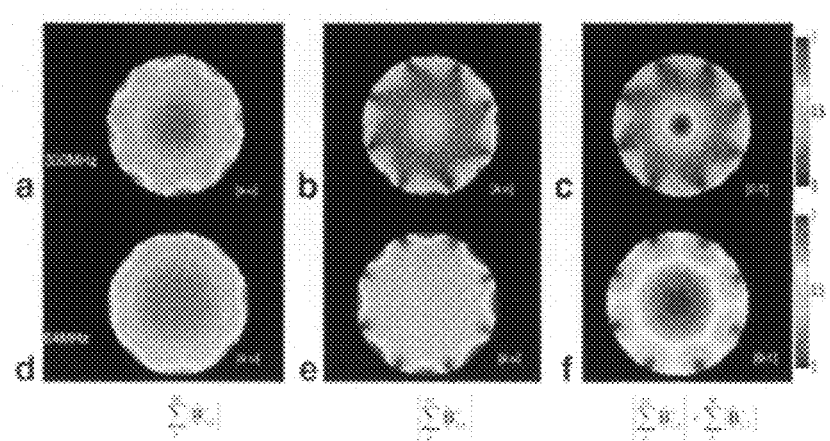
Figure 16:
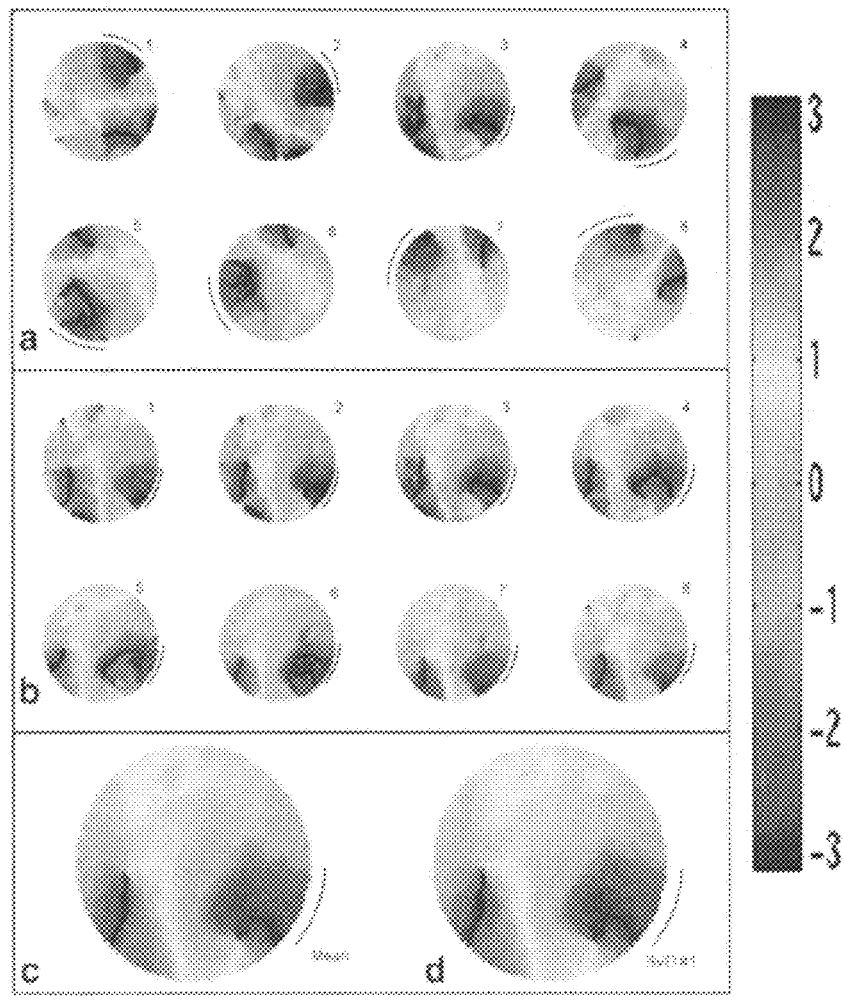
Figure 17:
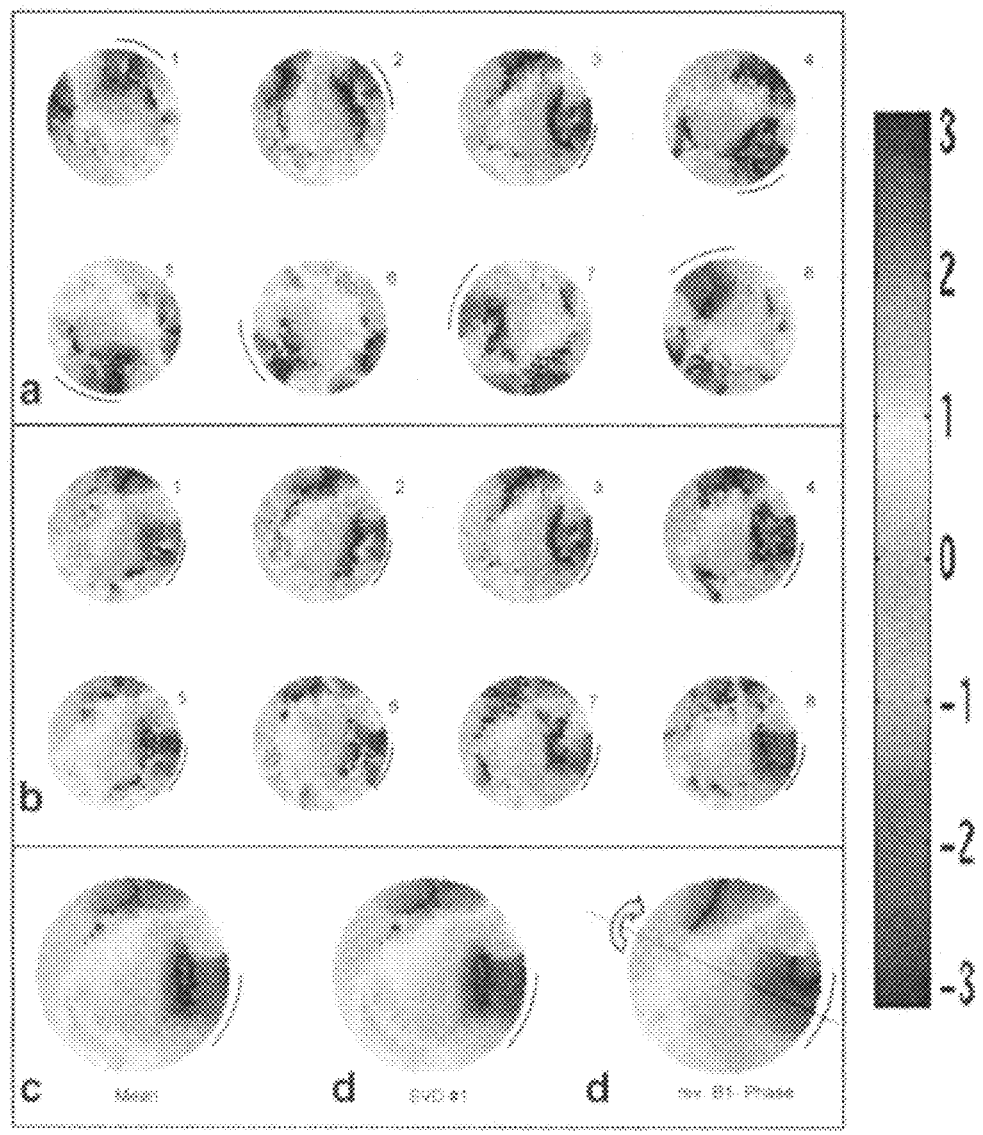
Figure 18:
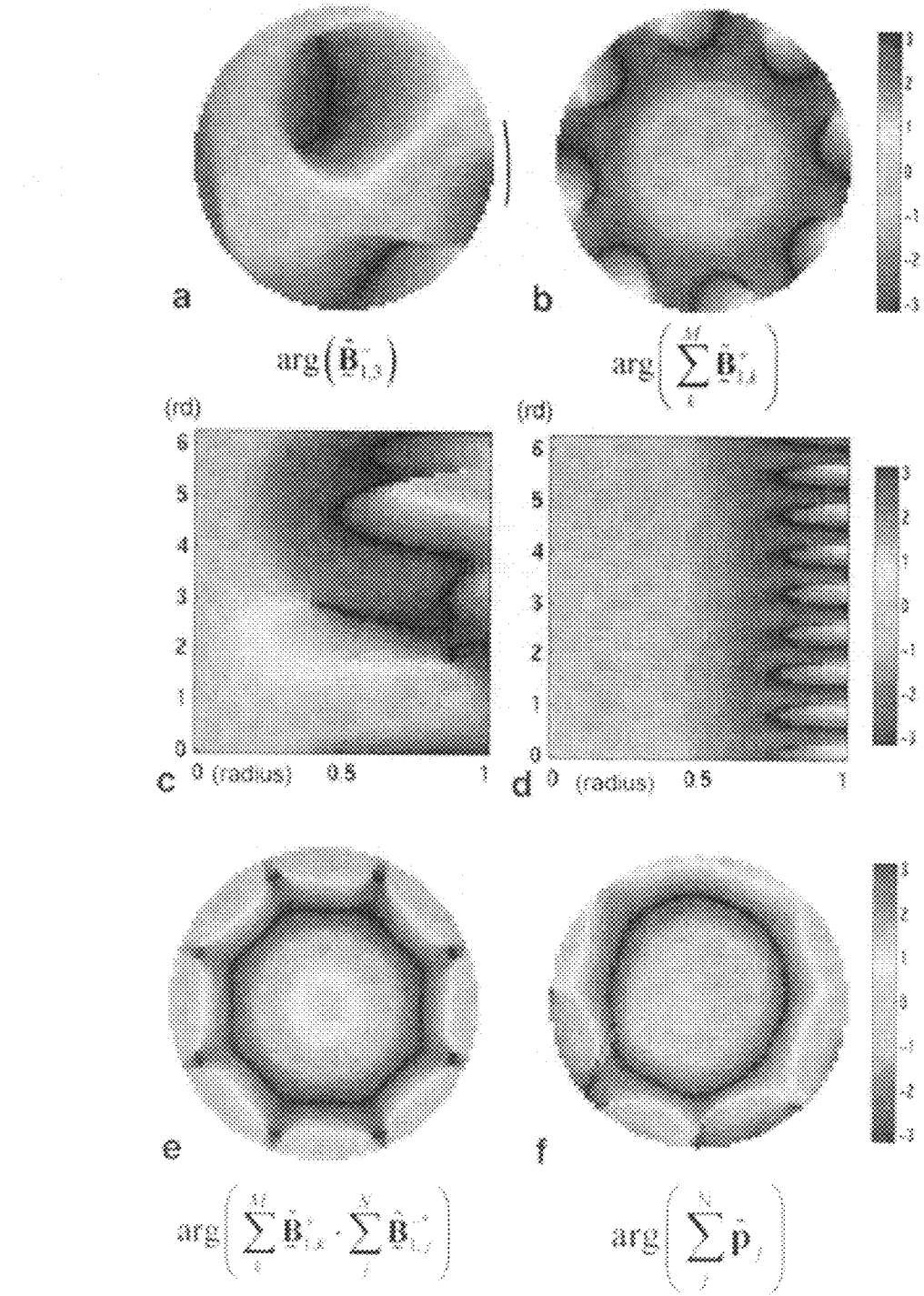
Figure 19:
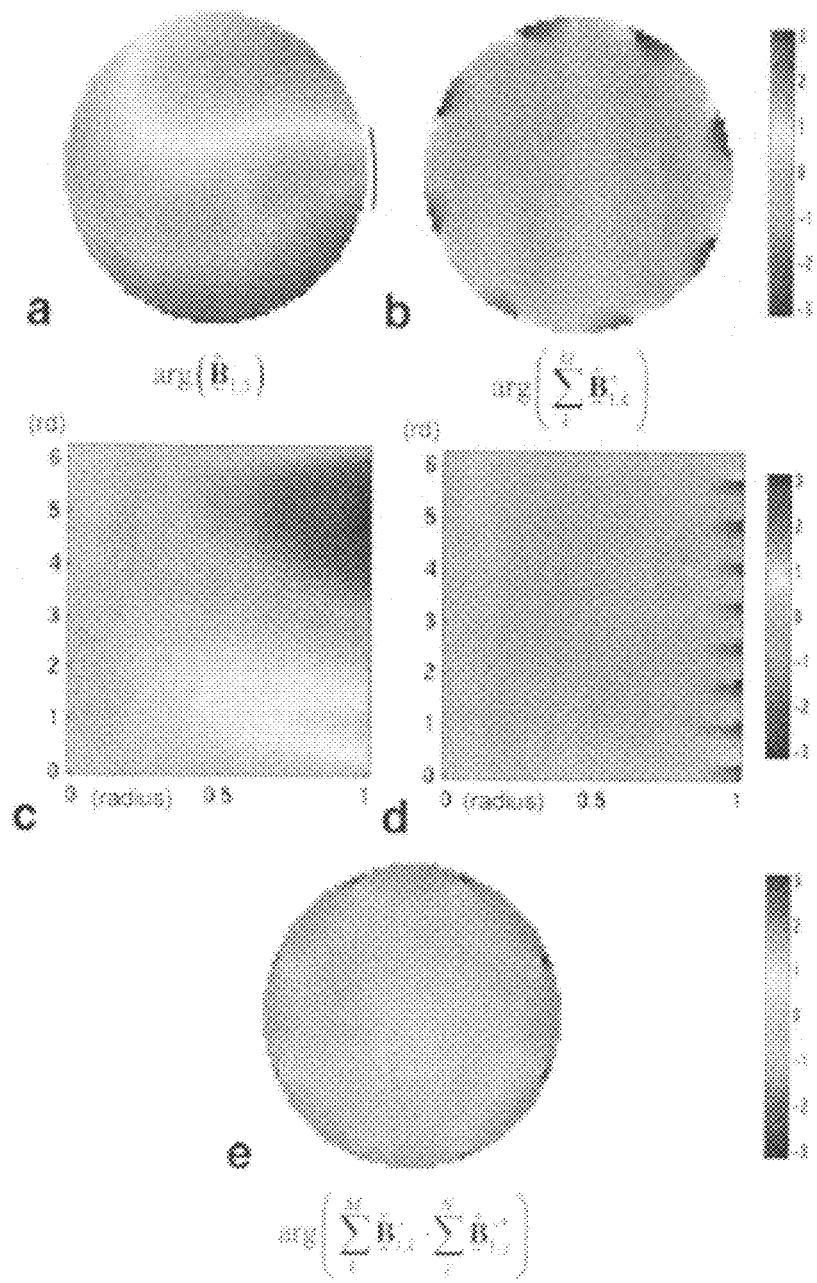
Figure 110:
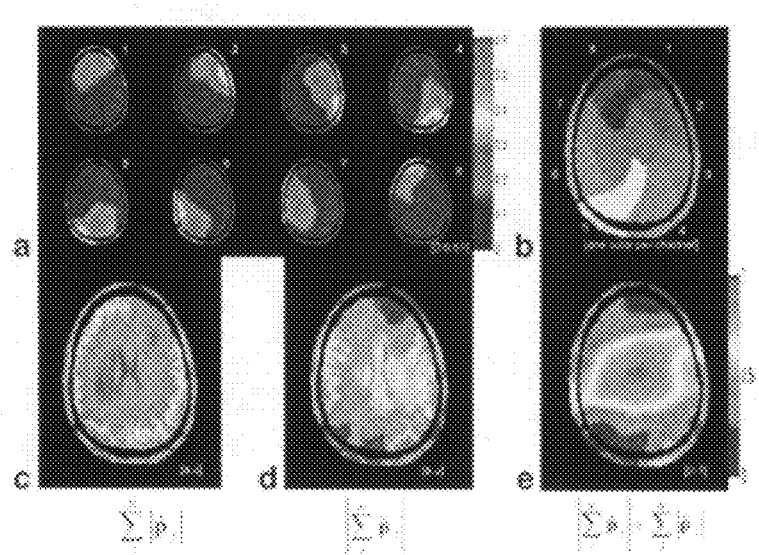
Figure 111:
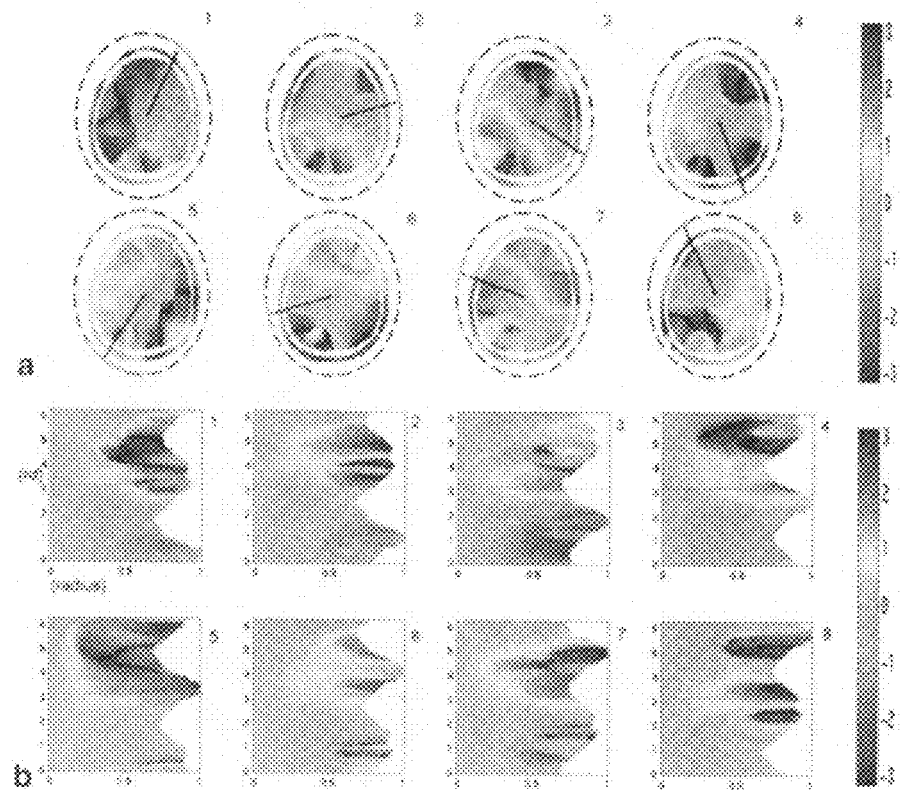

FIG. A2a. Slice signal vs. power gain, dB A2b. 4 T signal 7 T signal.

FIG. A3. 7 T images (a) intensity corrected (b) a. Transmit coil b. Receive coil c. 4 T image.

FIG. A4. A homogeneous transmit coil is nested with a local receive array to render apparent image homogeneity.

FIG. A5a. Multi-channel TEM volume coil 5b. Multi-channel TEM surface coil algorithms.

FIG. A6. 7 T images acquired with TEM line elements (left) and loop elements (right).

FIG. A7. B1 field models of a head loaded multi-channel TEM coil. A7a shows a close fitting coil with thin (blue circle) dielectric. A7c shows a thick dielectric with more spacious fit. A7b and A7d show respective models with head template removed for field visualization.

FIG. A8. Functional schematic of a multi-channel, parallel transceiver to control B1 transmit magnitude, phase, time (switching), and frequency per element of a multi-element coil.

FIG. A9. B1 Shimming of head at 9.4 T. Top row shows progressive shimming from left to right of B1 magnitude. Bottom row shows shimming of B1 phase.

FIG. A10 a, b, show 9.4 T gradient echo images acquired with the parallel transceiver driving an 8 channel transmit and receive, elliptical TEM head coil. The acquisition parameters were: TR/TE=40/5 ms, TI=1.55 sec, Thk=3 mm, matrix=256×128, SAR=0.4 W/kg. Simple magnitude addition was used to combine the images from eight receiver elements. No intensity correction was applied. FIG. A10 c, d, show a 9.4 T FLASH images, TR/TE=50/9 ms that contrast the medulary veins, Virchow-Robins spaces, possible tracts and other features. 10c is cropped and zoomed to right.

FIG. A11. $^{1}$H and $^{23}$Na images from double tuned TEM coil at 4 T.—courtesy, Bruker.

FIG. A12. TEM Body Coil for 4 T, 7 T. The 4 T cardiac image on the left shows an RF artifact in the right atrium. The image on the right shows the artifact removed by B1 shimming.

FIG. A13. 7 T Body Images.

FIG. A14. 7 T Breast Image. The sagittal slice is from a fat-suppressed, T1-weighted 3D FLASH image acquired in a normal subject. The box indicates the voxel in the fibroglandular tissue from whence the spectra were obtained. Clear peaks from taurine and tCho are visible.

FIG. A15. 9.4 T Predictions of non-uniformities in a head with a 16 element, homogeneous CP coil. Each color represents a 20 dB, B1 field contour.

FIG. A16. Influence of multi-channel TEM coil diameter and element count on B1+ uniformity at 300 MHz. For all of the FDTD B1 field simulations in physiologic, head sized samples, significant B1 inhomogeneities are present. But for a given number of coil elements the 32 cm diameter coil is more uniform than the 23 cm coil. For a given size, the coil with 16 elements is more uniform than the 8 element coil.

FIG. A17. sin(flip angle) (b), receptivity (c), and signal intensity (d) distributions for a head in an 8-element coil at 300 MHz after optimization.—courtesy collaboration with U. Penn (Smith/Collins) a. 9.4 T magnet b. Multi-channel transmitter c. Multi-channel receiver.

FIG. A18. Instrumentation used for 9.4 T head imaging. For functional diagram, see FIG. A8.

FIG. A19. RF transmit signal phase and magnitude (gain) modulator with power FET (amp).

FIG. A20. The patent drawing of the multi-channel TEM coil is shown in "a". T/R line terminals and control points are lettered. (15) FIG. A18b shows an actively detonable, multi-channel TEM transmit coil. FIG. A18c and A18d show multi-channel TEM receive coils. FIG. A18e shows a multi-channel TEM transmit and receive coil which imparts a "z" B1 gradient per channel.

FIG. A21: The left most image of "a" is the reference image. The images following are the same as the reference, except a 180° phase shift is added to the transmit RF of the first coil, second coil, and so on. FIG. A1b shows the magnitude of the $B1^+$ sensitivity profiles, as calculated from the images above.

FIG. A22: Using the $B_1^+$ maps from above, the homogeneity of the transmit RF can be numerically optimized. The top images are the magnitude of the resulting global transmit field; the bottom images are the relative phases. The first column is the starting (reference) point; its phase is set to zero everywhere. The second column is the linear solution. The last column demonstrates a non-linear optimization routine, which allows the phase of the $B_1^+$ to vary over the head. This produces a more homogeneous $B_1^+$ magnitude over the majority of the slice, leaving just a rim of higher amplitude excursions on one side.

FIG. A23. RF model of B1 localization (FIG. A23a) of a target region (FIG. A23b) in a cylindrical phantom. B1 magnitude optimization was achieved by iteratively varying both phase and magnitude of each of 16 line currents in a simulated annealing approach. A B1 field maximum was localized (FIG. A23a) in the center slice of the head sized cylindrical phantom to match the target B1 distribution shown in FIG. A23b.

FIG. A24. Maxwell model of adult human male positioned within a TEM body coil generating a uniform, circularly polarized transverse field resonant at 300 MHz. (7 T, 1H Larmor frequency). 20 dB color contours were numerically calculated by the FDTD method. (Remcom, St. College, Pa.).

In the body, yellow is 20 dB higher in RF field intensity (T/m) than green, and blue is 20 dB lower than green in B1 magnitude. The central dark line of RF destructive interference in the loaded model is observed in the images of FIG. A13.

FIG. A25. 300 MHz, four port driven, 24-element TEM body coil "a" is shown together with optically triggered, active detuning circuits for both transmit coil and receive coils. FIG. "b" shows a four line element receiver array, often paired with a duplicate for targeting regions of interest in the trunk. FIG. "c" shows a dual, quadrature, stripline array for breast imaging and spectroscopy at 7 T.

FIG. A26. 7 T breast images acquired with transmit and receive body coil only "a", and with transmit only body coil plus strip line receive only breast coils "b". 7 T abdomen images acquired with transmit only body coil "c", and with body coil transmit plus 8 element TEM array "d".

FIG. A27. An example of "RF shimming" by manual phase and magnitude adjustments in body imaging is shown above. FIG. (a) is a FDTD model predicting a current density gradient induced B1 artifact in right atrium at 3 T, (b) predicts the power loss density (SAR) contours. FIG. c. shows a right atrium artifact, commonly observed in 4 T cardiac images. This artifact is removed (d) by a manual impedance (phase, magnitude) adjustment of strategic line elements in the TEM body coil used as the transmitter.

FIG. A28. FIG. A28a shows a laboratory set up for direct measurement RF protocol induced heating. FIG. A28b plots temperature vs. time measurements as obtained from fluoroptic probes placed at various and model guided positions in the head and brain. Each trace registers a different probe position in the tissue. In this experiment, SAR is correlated to heating for coil applications, using the porcine model for human studies planned.

FIG. B1a. 9.4 T prediction of nonuniformities in a head with a homogeneous CP coil. Each color represents a 5 dB field contour.

FIG. B1b. 9.4 T prediction of nonuniformities in a head with a homogeneous CP coil. Each color represents a 5 dB field contour.

FIG. B1c. 9.4 T prediction of nonuniformities in a head with a homogeneous CP coil. Each color represents a 5 dB field contour.

FIG. B2a. 9.4 T, 65 cm bore Magnex superconducting magnet.

FIG. B2b. The patent drawing of the multi-channel TEM coil used. Independent T/R line terminals and control points are lettered in this figure.

FIG. B2c. The 8-channel implementation of the multi-channel TEM coil used.

FIG. B3a. B1 gain (magnitude) driven optimization.

FIG. B3b. B1 phase angle driven optimization.

FIG. B4a. 9.4 T coronal GE.

FIG. B4b. 9.4 T transverse GE.

FIG. B4c. 9.4 T sagittal GE.

FIG. B5a. 9.4 T FLASH.

FIG. B5b. Zoomed 5a.

FIG. C1. 9.4 T, 65 cm bore magnet. Specifications include: 78 MJ stored energy, 354 km NbTi conductor, 27,215 kg weight, 3.14 m length×3.48 m height, 30 cm dsv imaging volume, 5 G line at 20.4 m on axis×16.9 m radius, supercon and passive shims, RT shims on the gradient.

FIG. C2. 9.4 T predictions of B1 nonuniformities in a head with a homogeneous CP coil. Each color change represents a 10 dB field gradient.

FIG. C3. Parallel transceiver. Phase and gain are controlled with 8-bit resolution on multiple, independent transmit channels. Transmit and receive functions are separated in time by a TR switch on each channel. Each receive channel incorporates a decoupling preamp, filters and receiver gain as needed. Each transmit channel includes a 500 W solid state power amplifier with feedback for the RF power monitor. The RF power amplifiers are broad banded to facilitate the addition of programmable frequency for multi-nuclear control.

FIG. C4. The multi-channel, parallel transmitter used in this study is shown in FIG. C4a. Specifications for this unit include: operating frequency range=50-550 MHz, input RF power=5 dBm max, input signal type=pulse or cw, gain=+5 dB, linearity (gain)=+/−0.25 dB, linearity (phase)=+/−2.5 degrees, input VSWR<20:1, 8 bit phase shifter, phase steps=1.4°, 2.0°, 5.6°, 11.25°, 22.5°, 45°, 90°, 180°, transmit attenuation steps: −0.25, −0.5, −1.0, −2.0, −4.0, −8.0, −16.0, −32.0 dB, digital attenuator=8 dB, switching speed=65 microseconds. The multi-channel receiver with TR protection is shown in FIG. C4b.

FIG. C5. The multi-channel TEM coil. FIG. C5a shows the patent drawing of a stripline, multi-channel TEM coil with lettered connection and control points for independent coupling, detuning, and other controls. (19) FIGS. C5b and C5c are high frequency head coil executions of this design.

FIG. C6. Multi-channel TEM head coil design considerations. FIG. C6a shows FDTD calculations of B1 for a head inside a close fitting, 8-channel TEM coil with a thin dielectric substrate (blue shaded ring) at 400 MHz. The head template overlay is removed from the FIG. C6b to better show the RF artifacts. Similarly, FIGS. C6c and C6d show B1 calculations for the head inside a roomier coil with a thicker dielectric substrate.

FIG. C7. B1 Shimming with the parallel transceiver and an 8 channel TEM coil at 9.4 T. FIG. C7a demonstrates a series of B1 field shimming steps, left to right, by adjusting the field magnitude only. FIG. C7b demonstrates B1 shimming by adjusting only the phase angle of the transmit signal. Both B1 magnitude and phase can be adjusted together to optimize image criteria by automated feedback driven algorithms.

FIG. C8. RF model of B1 localization (FIG. C8a) of a target region (FIG. C8b) in a cylindrical phantom. B1 magnitude optimization was achieved by iteratively varying both phase and magnitude of each of 16 line currents in a simulated annealing approach. A B1 field maximum was localized (FIG. C8a) in the center slice of the head sized cylindrical phantom to match the target B1 distribution shown in FIG. C8b.

FIG. C8. RF heating and static field effects at 9.4 T. FIG. C8a shows averaged temperature vs time vs RF power input recorded from 12 human sized anesthetized porcine heads in a head coil tuned to 400 MHz. FIG. C8b tabulates remarkable comments from the first twenty healthy normal human volunteers studied at 9.4 T.

FIG. C9. Initial 9.4 T human head images demonstrating the potential for whole head imaging at this field strength. These T1 contrasted gradient echo images were acquired with the parallel transceiver and 8-channel TEM coil reported in this study. No intensity correction or other post processing was applied in these raw images.

FIG. C10. Initial 9.4 T FLASH images showing T2* contrasted venous structure and other features. The dark band at the top of FIG. C10a is an uncorrected B0 artifact.

FIG. C11. Initial 9.4 T FLASH images showing T2* contrasted venous structure and other features. The dark band at the top of FIG. C10A is an uncorrected $B_0$ artifact.

FIG. D1 Schematic of a parallel transceiver, which includes the combination of a multi-channel, parallel transmitter with a multi-channel digital receiver.

FIG. E1a. Lumped element "LC" loop, surface coil.

FIG. E1b. Divided lumped element surface coil

FIG. E2. Gastrocnemeous muscle imaged at 170 MHz (4 T) a, showing modeled magnetic vector potential (Webers) b, conduction current density (A/mm2) c, displacement current density (A/mm2) d, magnetic flux density (Webers/mm2) e, power loss density (W/kg) f, temperature (C) with perfusion g, and temperature (C) without perfusion h.

FIG. E3a. Phased Array coil
FIG. E3b. Parallel Array
FIG. E4. a) Inductively decoupled loops in a two element array. b) Single loop surface coil or array element with dedicated receiver circuit.
FIG. E5a. Series RLC circuit & TEM analog
FIG. E5b. Parallel RLC circuit & TEM analog
FIG. E6a. Coaxial transmission line, loop surface coil
FIG. E6b. Strip line or micro strip line surface coil
FIG. E7a. $B_1$ field generated by a single loop coil
FIG. E7b. $B_1$ field generated by single line element.
FIG. E8a. High Pass Birdcage
FIG. E8b. Band Pass Birdcage
FIG. E8c. Birdcage Shield
FIG. E9a. TEM Volume Coil (19)
FIG. E9b. TEM Volume Coil Element
FIG. E10. Parallel transceiver (64)
FIG. E11a. Linear element TEM volume coil
FIG. E11b. Loop element TEM volume coil
FIG. E12a. Linear element volume coil image.
FIG. E12b. Loop element volume coil image
FIG. E13. Simple FEM model of a) three-layer head inside linear element TEM volume coil, b) RF magnetic flux density "$B_1$ field", (Webers/mm$^2$) in head model with linear coil excitation, c) resultant power loss density (W/kg) in head model, and d) consequential temperature contours (C) in the perfused head model.

FIG. E14 a) An FDTD model of a head inside a uniform, circularly polarized TEM volume coil resonant at 300 MHz. b) A 7 T gradient echo head image.

FIG. E15. a) Model of TEM head coil with $B_1$ gradient b) TEM head coil with $B_1$ gradient and multi-element phase and magnitude control FIG. E16. a) Model of central sensitivity profile $\Sigma B_1-$ calculated to partially compensate for the $B_1$ field peak $\Sigma B_1+$ (b) in the center of the head coil of FIG. E15. The receive sensitivity is enhanced in the periphery of the head nearest the coil. The transmit profile is likely suppressed in the periphery of the head due to destructive interference. The two effects combine to compensate the apparent inhomogeneity of the image as modeled in FIG. E17a. In this image the central signal intensity is more uniform, though the periphery is still non-uniform due to head proximity to the coil elements where $B_1$ magnitude and phase angle gradients are greatest. Phase angle adjustment of the independent element currents can further improve this image as predicted in FIG. E17b. FIG. E17. Model of head with $B_1$ transmit magnitude optimization a) combined with phase angle optimization b) to render a more uniform head image at 300 MHz.

FIG. E18. $B_1$ field control. In FIG. E18a, $B_1$ gain (magnitude) control is shown. In FIG. E18b, $B_1$ phase control is demonstrated.

FIG. E19. a.) RF shimmed 7 T IR-turbo FLASH. b.) RF shimmed 9.4 T IR-gradient echo image. c.) RF shimmed 9.4 T FLASH image.

FIG. E20. Double tuned TEM head coil a) proton b) phosphorus and c) sodium at 4 T.

FIG. E21. a) Actively detunable TEM transmit head coil with local receiver coil. b) Signal-to-noise contours acquired with transmit-receive surface coil only c) Signal-to-noise contour of transmit volume coil combined with surface coil receiver. d) A local four loop receiver array used with a homogeneous transmit coil improves both SNR and homogeneity at 4 T and above.

FIG. E22. a) Body coil with active detuning and multi-port drive. In this drawing a simple network of 180 degree and 90 degree splitters establishes circular polarization for the transmit field. Actively switched, shunt detuning diodes are shown for each transmission line element of the coil. The segmented cavity serves as both a transmission line component and as an eddy current free shield for the coil. b) RF body imaging subsystem including body coil (a), surface array receiver (b), power supply and detuning control unit (c), detuning diode driver unit (d), multi-channel receiver preamp and bias tees (e), fiber optic diode control lines (f), data lines (g), and RF signal cables (h).

FIG. E23. a.) 4 T cardiac image acquired with a homogeneous TEM body coil transmitter and a four loop phased array receiver, with two loops on the anterior and posterior thorax respectively. EKG cardiac gating was employed in these breath-held acquisitions. b.) The right atrium artifact was corrected by interactive impedance adjustments coil elements (RF shimming). No intensity correction was applied to these images.

FIG. E24. a) $B_1$ field calculated for body loaded, homogeneous, circularly polarized TEM volume coil at 300 MHz (7 T). b) Sagittal images of human body at 7 T showing RF artifact predicted. Image acquisition parameters were: GE, TR/TE=50/4 ms, 2562, Thk=3 mm, FOV=35 cm$^2$, NT=2, 55 sec scan.

FIG. F1. Simulation. Left: MOS, Middle: SOM, right: ratio MOS/SOM with four different coils. [a,u] means arbitrary units for color display.

FIG. F2. Simulated B1+ for one stripline element.

FIG. F3. Flash images acquired with one stripline.

FIG. F4. B1+ calibration, 8 striplines, 23 cm Ø.

FIG. F5. B1+ calibration, 16 striplines, 23 cm Ø.

FIG. F6. B1+ calibration, 16 striplines, 32 cm Ø.

FIG. G1. $B^1$ magnitude of a single drive resonant head coil with centrally located phantom. Left shows total $B_1$ field. Middle shows Y-Directioned $B_1$ field and Right shows Y directional field phase.

FIGS. G2.1-G2.8. B1 magnitude optimization showing the simulated annealing approach. Optimization was done for 16 line currents varying both phase and magnitude of each drive element. The field was optimized over a centrally located slice of a phantom to match the target distribution shown in the upper half of each plot.

FIG. I1. (a) Relative intensity map $RI_j$ (sphere phantom) for the eight elements j (numbered from 1 to N=8) obtained by dividing each coil element magnitude image by the sum of all magnitude images (SOM). Color scale ranges from 0 to 0.56 (shown in brackets). The white arcs indicate the relative location of the coil elements (not scaled to their actual size). (b) Map showing, for each pixel at location r, which one of the eight channels (one arbitrary color per channel) contributes the most in signal intensity. Note the twisted shape of those amplitude maximum profiles, typical at ultrahigh magnetic field.

FIG. I2. Comparative image summations (sphere phantom). (a) Sum of magnitude (SOM) in arbitrary unit (a.u.). (b) Magnitude of sum (MOS) in a.u. Color tables are differently scaled for a and b in order to emphasize each spatial pattern. Note that, with approximately the same color level in the periphery in a and b, there is a significantly stronger signal in the center of b than in the center of a (in the center of the phantom SOM and MOS have actually the same absolute magnitude). (c) Ratio MOS/SOM. (d) Ratio MOS/NRSS. For images c and d, color table ranges from 0 to 1 (see brackets). While in the center of the phantom the ratio is 1 in c and d, MOS and NRSS exhibit considerable signal loss in the periphery compared with SOM. N is the number of coil elements (N=8) and $\hat{\rho}_j$ is the complex value from coil element j. Images in a, b, c, and d were derived from a single data set (eight-channel complex data).

FIG. I3. Individual coil element $B_1$ mapping (phantom data). (a) Single coil element receive $B_1$ maps (derived from one data set obtained transmitting through all coil elements). (b) Single coil element transmit $B_1$ maps (derived from eight acquisition transmitting through one coil element at a time). Color tables were adjusted independently for a and b (arbitrary units, a.u.) in order to emphasize part of the $B_1$ field penetration profiles through the phantom. Transmit and receive $B_1$ fields exhibit similar twisted amplitude pattern, but with opposite direction. Note that for each coil element there is a spatial shift between the highest spots obtained for $B_1^-$ and $B_1^+$.

FIG. I4. Comparative $B_1$ field summations (sphere phantom). (a) Sum of the eight individual $B_1$ receive magnitude maps. (b) $B_1$ receive magnitude map calculated from SOM in order to simulate a "one-channel volume coil." While both maps in a and b were obtained after the same raw data set, in a the signal is stronger in the periphery than in the center, a feature not observed in b. (c) Ratio of magnitude of the complex sum over the sum of the eight magnitude receive $B_1$ fields, showing the loss of receive $B_1$ field in the periphery when merging complex data from multiple coil elements. Color scales are independently adjusted, in arbitrary units, for a and b maps in order to emphasize spatial profiles. In c, the color scale ranges from 0 to 1. The performed calculations yield equal values in the center of the phantom for the maps shown in a and b. (d) Sum of the eight individual $B_1$ transmit magnitude maps obtained when transmitting one channel at a time ("surface coil case"). (e) $B_1$ transmit magnitude map obtained when transmitting through eight channels simultaneously ("volume coil case"). Note that, unlike for receive $B_1$ comparison, maps in a and b could not be obtained from a unique data set. (f) Ratio of the magnitude of "volume coil" transmit $B_1$ over the sum of the eight "surface coil" magnitude transmit $B_1$. Color tables were independently adjusted, in arbitrary units, for a and b maps. In c, the color scale ranges from 0 to 0.82 (see Results).

FIG. I5. Comparative transmit $B_1$ field summations from simulation data at 300 MHz (a, b, c) and 64 MHz (d, e, f). (a) and (d) Sum of the eight transmit magnitude maps $|\hat{B}_{1,j}^+|$ obtained when simulating transmission with one channel at a time ("surface coil case"). (b) and (e) $B_1$ transmit magnitude map obtained when simulating transmission through eight channels simultaneously ("volume coil case"). (c) and (d) Ratio of, respectively, the map in shown b over the map shown in a and the map shown in e over the map shown in d. Color tables were independently adjusted, in arbitrary units, for a, b, d, and e maps. In c and f the color scales range from 0 to 1.

FIG. I6. (a) Relative spatial phase pattern for the eight-coil elements (sphere phantom) Receive $B_1$ Field. (b) Same maps, each coil element relative phase patterns being aligned on element 3 by appropriate increments of 45° rotation. A similarity in spatial phase pattern through coil elements can be identified. (c) Phase of the average of the eight complex maps whose phase is shown in b. (d) Phase of the first singular value decomposition calculated from the eight complex maps whose phase is shown in b. The Color table ranges from −π to +π. Data are not unwrapped for 2π bounces; thus, borders between dark blue and dark red correspond to phase modulations without actual discontinuity. The gray arcs indicate the location of coil elements (not scaled to their actual size) relative to the maps.

FIG. I7. (a) Relative spatial phase pattern for the eight-coil elements (sphere phantom) transmit $B_1$ field. (b) Same maps, each coil element relative phase patterns being aligned on element 3 by appropriate increments of 45° rotation. A strong similarity in spatial phase pattern through coil elements can be identified. (c) Phase of the average of the eight complex maps whose phase is shown in b. (d) Phase of the first singular value decomposition calculated from the eight complex maps whose phase is shown in b[b]. (e[b]) Map of the average receive phase pattern shown in FIG. I5c, but flipped upside down about the dotted axis crossing both the center of coil element 3 and the center of the sphere phantom. Note the similarity between the transmit and the receive average phase pattern when the rotational direction is reversed for the latter. Color table ranges from −π to +π. Data are not unwrapped for 2π bounces; thus, borders between dark blue and dark red likely correspond to phase modulations without actual discontinuity. The gray arcs indicate the location of coil elements (not scaled to their actual size) relative to the maps.

FIG. I8. a-e: Spatial phase pattern with simulated data at 300 MHz. (a) phase of $\hat{p}_{i,3}^*$ from simulated data with one coil element. The coil element is at θ=0 rd in a trigonometric frame, i.e., at 3 h 00 min around the clock (an arc signals the coil element position). (b) Phase of simulated transmit $B_1$ from eight coils transmitting simultaneously. Note that close to the center the phase varies only with radius, while in the periphery strong phase variations occur close to each coil element. (c) and (d): cylindrical coordinates analysis of the phase maps shown respectively in a and b[b]. Abscissa (RÜ) is in fraction of the sphere radius. Coordinate (θ) is in radians. The position of the center of the coil element was set at θ=0 rd. For display purpose, a global phase offset was added in order to set the phase=0 rd at the origin of θ and ρ. (e) phase of simulated complex transmit $B_1$ multiplied by simulated complex receive $B_1$, considering the RF transmission performed through all eight coil elements ("volume transmit coil") and the complex signal from the eight receiver coil elements being merged together (addition of complex vectors) before being sampled ("single volume receive coil"). The phase varies mostly with the radius in the center of the phantom, while strong phase variations occur in the periphery close to the coil elements. (f) For comparison purpose, phase of the sum of each coil element data obtained with the sphere phantom (experimental data). Note the similarities between the phase patterns in e and f. In all maps color scale ranges from −π to +π rd. Data are not unwrapped for 2π bounces.

FIG. I9. Spatial phase pattern with simulated data at 64 MHz. (a) Phase of $\hat{p}_{i,3}^*$ from simulated data with one coil element. The coil element is at θ=0 rd in a trigonometric frame, i.e., at 3 h 00 min around the clock (an arc signals the coil element position). (b) Phase of simulated transmit $B_1$ from eight coils transmitting simultaneously. Note that those phase patterns are noticeably smoother than at 300 MHz. (c) and (d): Cylindrical coordinates analysis of the phase maps shown, respectively, in a and b[b]. Abscissa (ρ) is in fraction of the sphere radius. Coordinate (θ) is in radians. The position of the center of the coil element was set at θ=0 rd. For display purposes, a global phase offset was added in order to set the phase=0 rd at the origin of θ and ρ. (e) Phase of simulated complex transmit $B_1$ multiplied by simulated complex receive $B_1$, considering the RF transmission performed through all eight coil elements ("volume transmit coil") and the complex signal from the eight receiver coil elements being merged together (addition of complex vectors) before being sampled ("single volume receive coil").

FIG. I10. Upper row: (a) Relative intensity map (human brain) for the eight coil elements (numbered from 1 to 8). Display color table ranges from 0 to 0.62. (b) Map showing, for each pixel, which of the eight channels (on arbitrary color per channel) contributes at most in signal intensity. Note the twisted shape of those amplitude maximum profiles, typical at ultrahigh magnetic field. Bottom row: Comparative image summations. (c) Sum of magnitude (SOM) in arbitrary unit (a.u.). (d) Magnitude of sum (MOS) in a.u. Color scales are independently scaled in arbitrary units for c and d in order to emphasize each spatial profile (in the center of the brain SOM and MOS have actually the same absolute magnitude). (e) Ratio MOS/SOM with color scale ranging from 0 to 1. While in the center of the brain the ratio is ~1, MOS exhibits considerable signal loss in the periphery. N is the number of coil elements (N=8) and $\hat{p}_j$ is the complex value from coil element j.

FIG. I11. (a) Relative spatial phase pattern of $\hat{p}_{i,j}^*$ for the eight coil elements (human brain). Note that the array coil Teflon holder is now ellipsoid (dashed lines), with coil element location signaled with green plain arcs (not scaled to their actual size). Some similarities can be identified in spatial phase pattern through coil elements. (b) Same phase maps in polar coordinates. Abscissa is expressed as the ratio of ρ over the longest radius of the brain; ordinate (θ) is in radians. Only pixels within the brain are shown (pixels shown in Cartesian coordinates in (a) but which are in tissues located outside the skull are not shown in polar coordinate maps). In order to make comparisons easier, the origin of θ for each coil phase map is shifted in such a way that the radius that crosses the center of the corresponding coil element is at θ=π rd. By doing so, the horizontal black line in each of the maps in polar coordinates (b) corresponds to the black arrow shown in the corresponding Cartesian map in (a). The upper and lower plots in each column [1 and 5, 2 and 6, 3 and 7, 4 and 8] exhibit more pattern similarities, corresponding to coil elements 180° apart in space. Color scale ranges from −π to +π. Data are not unwrapped for 2π bounces.

FIG. J1. Maxwell model of adult human male positioned within a TEM body coil generating a uniform, circularly polarized transverse field resonant at 300 MHz. (7 T, 1H Larmor frequency). 10 dB color contours were numerically calculated by the FDTD method. (Remcom, St. College, Pa.) In the body, yellow is 10 dB higher in RF field intensity (T/m) than green, and blue is 10 dB lower than green.

FIG. J2. TEM volume coils used for body imaging at 7 T (left) and head imaging at 9.4 T (right). For this study, the 24 element body coil was driven at four symmetrically space ports, and the eight element head coil was driven at all eight ports.

FIG. J3. 7 T whole body images acquired with transmit and receive TEM body coil tuned to 300 MHz.

FIG. J4. Multi-channel linear element (left) and loop element (right) transmission line (TEM) receiver coils.

FIG. J5. 7 T Abdomen images acquired with transmit and receive body coil only (left), and with transmit only body coil plus linear strip line receive only surface coils (right).

FIG. J6. 7 T breast images acquired with transmit and receive body coil only (left), and with transmit only body coil plus strip line receive only breast coils (right).

FIG. J7. 9.4 T human head images. These images were achieved with a multi-channel TEM coil employing RF field shimming techniques.

FIG. L1 shows (color map [0, 0.75]) relative $B1^-$ sensitivity profiles for each transceiver.

FIG. L2 shows the relative $B1^-$ phase profile.

FIG. L3 shows the relative B1+ phase profile (color map [-□,+□□]). (Two crosses signal the 2 missing RFA's).

FIG. L4a shows an image obtained with some arbitrary set of $B1^+$ phases for all coil elements (shown is the sum of magnitude images (SOM) from the 16 channel images).

FIG. L4b shows SOM image obtained when data were acquired after setting the 14 transmitter channel $B1^+$ phases (derived from FIG. L3) in order to obtain the same absolute phase in the ellipse area.

FIG. L4c shows the ratio of FIG. L4b over FIG. L4a. The maximum increase in signal intensity is clearly localized in the ellipse area and exceeds ~20 at its maximum.

FIG. M1 illustrates an approach with a 4-coil system to collect the "Kseries".

FIG. M2 illustrates an option where instead of one coil transmitting at a time, all coil expect one at a time are now transmitting.

FIG. M3 illustrates all coils are transmitting together but one transmitting coil at a time has its input magnitude multiplied by two.

FIG. M4 illustrate all coils are transmitting for each acquisition, but one transmit coil at a time has its RF input dephased by 180 degrees.

FIG. N1 (top row): shows such relative $B1_k^+$ phases at 9.4 T (Varian™) in a human brain with 14 transmit/16 receive channels (16 transceiver coil with only 14 available RF amplifiers); (bottom row): shows (arrows) the target ROI before (A) and after (B) local B1 phase shim.

FIG. N2 shows the GUI with, (bottom row) DIR before (middle) and predicted after (right) phase adjustment in the center of a phantom @7 T.

FIG. O1 illustrates methods for B1+ mapping.

FIG. O2 illustrates an imaging sequence.

FIG. O3 illustrates an imaging sequence.

FIG. O4 illustrates imaging model.

DETAILED DESCRIPTION

The following detailed description includes references to the accompanying drawings, which form a part of the detailed description. The drawings show, by way of illustration, specific embodiments in which the invention may be practiced. These embodiments, which are also referred to herein as "examples," are described in enough detail to enable those skilled in the art to practice the invention. The embodiments may be combined, other embodiments may be utilized, or structural, logical and electrical changes may be made without departing from the scope of the present invention. The following detailed description is, therefore, not to be taken in a limiting sense, and the scope of the present invention is defined by the appended claims and their equivalents.

In this document, the terms "a" or "an" are used, as is common in patent documents, to include one or more than one. In this document, the term "or" is used to refer to a nonexclusive or, such that "A or B" includes "A but not B," "B but not A," and "A and B," unless otherwise indicated. Furthermore, all publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

A system of hardware and complementary software algorithms and protocols required to solve high field problems such as RF inhomogeneity, and to make use of the shorter RF wavelengths at higher magnetic field strengths for controlling RF fields in space, magnitude, phase angle, frequency, and time to achieve desired MR criteria over a sample region of interest.

Examples of the present subject matter include RF transmit signal modulation hardware making use of integrated circuit and microelectronics; miniaturized RF signal reception hardware; RF transmit field control algorithms; an dRF receive field control algorithms.

The present subject matter can be used with various magnetic resonance technologies including MRI, MRS, EPR, and ESR.

RF fields are currently manipulated by pulse sequence only to a single, passive coil. The technology and methods disclosed herein actively change RF currents in five degrees of freedom (magnitude, phase, frequency, space, time) on multiple, independent, actively controlled coil elements. The present technology does not consider or use short wavelengths in the sample as a result of high frequency RF signals required with high magnetic fields. The disclosed technology solves short wavelength related problems such as image inhomogeneity and high Specific Absorption Rate (SAR). The disclosed technology uses these short wavelengths for to effect and control the RF fields in the sample create RF shims, gradients and other conditions to bring of the five degrees of freedom in field control to the coil and sample interface. The disclosed technology facilitates new techniques and technology for parallel imaging as well.

Existing technologies generally do not address shortwave related problems, and do not use the shortwave related solutions proposed. Existing signal generation and field control algorithms and protocols do not allow five degrees of field control at the RF coil-sample interface.

The present subject matter addresses MRI, such as human MRI, at fields of 9.4 T and beyond. The present subject matter includes RF pulse and signal acquisition protocols using five degrees of freedom in signal excitation and detection at the NMR transduction (RF coil-tissue) interface. Time, space, frequency, phase angle, and magnitude are modulated to improve signal criteria over targeted regions of interest. The procedures use shortened Larmor wavelengths and signal levels using 9.4 T systems for human MRI.

In one example, the present subject matter is applied to the human head and trunk at high field strengths. This includes head imaging at 9.4 T and above, Body Imaging at 7 T and above, and RF Safety.

The Larmor wavelengths in the human tissue dielectrics at 300 MHz (7 T) and 400 MHz (9.4 T) are on the order of 12 cm and 9 cm respectively in high water content tissues such as muscle and brain. By conventional methods and technologies, these wavelengths preclude the possibility of achieving safe and successful human scale imaging. RF interference patterns from conventional, uniform field volume coils create severe RF field inhomogeneity in the anatomy. RF losses to the tissue conductor and the tissue dielectric result in heating for conventional pulse protocols.

The present subject matter uses short wavelengths to advantage. By controlling the currents in individual RF coil elements, in phase, gain, frequency, and time, the RF field can be manipulated to tailor the signal for a targeted region of interest for SNR, SAR, CNR, homogeneity, or other criteria.

RF field shimming can be automated much like magnetic field shimming.

RF Field ($B_1$) Propagation in Tissue

The RF coil's field penetration and losses in its human tissue load are described by the time-dependent field equations. A time-harmonic magnetic field $B1/\mu$ in a lossy, anisotropic, inhomogeneous coil-tissue system can be described by the differential form of the Maxwell-Ampere Law:

$$\nabla X B_1/\mu = J_c + \partial D/\partial t \quad [1]$$

By Ohm's Law the current density $J_c = \sigma E$, and by Euler's Law the electric field displacement $\partial D/\partial t = \partial \in E/\partial t = j\omega \in E$ so that equation [1] can be rewritten as:

$$\nabla X B_1/\mu = (\sigma + j\omega \in)E \quad [2]$$

The complex value of E can be written in terms of the magnetic vector potential A, and the electric scalar potential $\phi$, such that:

$$\nabla X B_1/\mu(J_e + J_d) = (\sigma + j\omega \in)(-j\omega A - \nabla\phi) \quad [3]$$

Influencing the $B_1$ distribution and loss in human tissues loading the coil are the $B_1$ field induced eddy current density $J_e$, $$J_e = \sigma E = -j\omega \sigma A \quad [4]$$

and the accompanying electric field displacement current density $J_d$ for tissue specific values of $\sigma$ and $\in$.

$$J_d = -j\omega \in E = \omega^2 \in A \quad [5]$$

The sum and distribution of RF eddy current losses to the tissue conductor, and RF displacement current losses to the tissue dielectric, are determined by the total power loss density $P_{t\,loss}$, $$P_{t\,loss} = 0.5 I_v (J \cdot J^*/\sigma) dv \text{ for } J = J_e + J_d \quad [6]$$

Note that the displacement current density $J_d$ increases with $\omega^2$ compared to the eddy current density's $J_e$ linear proportionality with frequency. This is consistent with the observations of interfering wave phenomena (commonly though inaccurately referred to as dielectric resonance) for head images at high $B_0$ fields. In contrast to initial concerns that $J_e$ would severely limit $B_1$ penetration and lead to excessive power absorption, $J_d$ related inhomogeneities and losses may dominate at fields of 3 T and higher in the human head and body, leading to B1, SNR, loss and heating patterns not predicted by Biot Savart, quasi-static, or otherwise over simplified models.

RF Heating

RF loss induced temperature contours in the human anatomy can be calculated by equating the total losses Pt loss from the coil's RF field Equation [6] to the bio-heat (perfusion) equation below. Table values can be used to supply tissue specific thermal parameters for perfusion rate R, tissue and blood densities $\rho$ and $\rho_b$, blood temperature Tb, blood specific heat cb, and tissue thermal conductivity K.

$$P_{t\,loss} = R\rho\rho_b c_b[T_b - T] - \nabla KVT \quad [7]$$

With the increased RF losses Pt loss expected in higher field studies, the potential for excessive RF heating increases. A non-invasive means of monitoring heating in tissue is needed. Temperature contours in human anatomy at higher fields have not been reliably predicted or measured by NMR methods. Indirect method of assuring RF safety by correlating average RF coil input power with heating data (FDA guidelines) determined a priori, are used. Practical aspects of high frequency field propagation and losses in MRI head and body applications follow.

RF Problems

Inhomogeneity

"High field" for human imaging currently ranges from 3 T clinical imaging to 9.4 T imaging research. The Larmor band for proton imaging over this span of field strengths ranges from 30 cm tissue wavelengths at 3 T to 9 cm wavelengths at 9.4 T. Shortened wavelengths due to high tissue dielectric constants at high frequencies result in wave interference patterns with consequential RF field gradients and resultant image inhomogeneities over a field of view of human anatomic dimensions. Using the Finite Element Method (FEM), FIG. A1a models RF magnetic vector potential [Eq. 3] (flux) distortions through a head inside a homogeneous volume coil. Resulting FEM calculated flux density (RF field contours) or gradients are shown in FIG. A1b. FIG. A1c shows the consequential $B_1$ inhomogeneity in images acquired at 4 T (FIG. A1c) and 7 T (FIG. A1d) for a homogeneous TEM head coil. $B_1$ values were determined from the oscillation periods $\tau$ where $\Theta = \gamma B_1 \tau$, for a given $B_1$ generated by the RF coil. Averaged $B_1$ values standardized to a 1 kW RF pulse are shown on the central and peripheral regions from which they were measured.

SAR and SNR

SAR and SNR RF field dependent SAR and SNR also present problems at higher $B_0$ fields. As shown in FIG. A2a, the RF power (SAR) required to excite a 90° flip angle increases with the $B_0$ field non-uniformly across the brain. This SAR increase may be linearly proportional to $B_0$ in the center of the brain, to quadratically proportional in the brain periphery with a homogeneous RF coil. Similarly, the signal-to-noise ratio (SNR) is also dependent on the B1 contour as well as B0, increasing at a better than linear proportion in the brain center and at a less than linear rate in the brain periphery when a homogeneous head coil is used. In FIG. A2b, the SNR from five locations in a center slice of a fully relaxed gradient echo image acquired at 4 T is compared to SNR values from the same slice acquired at 7 T. The 7 T image includes 7 T/4 T SNR ratios respective to the five locations as well. SAR and SNR as well as image homogeneity and contrast vary with the B1 contours in the anatomy.

RF Solutions

A variety of solutions can be used for addressing the problems associated with MR imaging of human anatomy at high magnetic field strengths. Some solutions are as follow.

Image Processing

To achieve uniform appearance of an image, apply image signal intensity correction or other post signal acquisition processing algorithms. See FIG. A3. While such image processing can be applied in most clinical imaging applications, this approach does not solve the fundamental RF problems associated with non-uniform B1 contours discussed above.

Nested Transmit Coils and Receive Coils

Local transmit coils of conventional, circularly polarized birdcage or TEM design generate uniform, transverse B1 fields. However, a high field human head image from such a coil used for both transmission and reception results in an inhomogeneous image with signal bias to the center of the head as described in FIG. A1. Alternatively, the sensitivity of close fitting receiver arrays favors the periphery of the head.

By nesting a close fitting receive array together with a volume transmit coil, a more homogenous image can be achieved. While apparently uniform images can be gained by super posing non uniform excitation and reception fields, optimal B1 uniformity, contrast, SAR efficiency, and SNR are still compromised by this approach alone.

Results

Strengths of high field human head and body imaging are outlined and described in this section.

Multi-Channel Transmit and Receive Coils

Alternatively, transmit and receive coils can be configured such that the B1 field of a coil can be optimized for image homogeneity or other criteria by controlling the RF currents on multiple, independent coil elements. One multi-channel example particularly well suited for high field use is the multi-channel TEM coil composed of transmission line elements which can be independently driven, controlled, and received efficiently at high frequencies. See FIG. A5.

Lines Vs. Loops

One choice to be made in multi-channel coil design is whether to use line elements or loop elements in the coil construction. While both element choices can be made more efficient by transmission line design, the line element is the shortest and therefore the most efficient. Optimization schemes are simplified with the uni-directional currents on the line elements. Line element or "runged" coils such and the birdcage and TEM resonators are inherently more homogeneous than loop arrays as well. See FIG. A6.

Design Execution

Specific execution of any coil design can be used to determine performance criteria. For the multi-channel TEM volume coil, as with other designs, a closer fitting coil can improve the efficiency of transmission and reception. Interference patterns leading to image inhomogeneity are more extreme when elements are spaced closely to each other and to the anatomy. See FIG. A7a, b. This problem can be mitigated by the choice of dielectric material and dimension between the inner and outer conductors of the TEM elements, and by the number and dimension of elements. Homogeneity can be improved by making the coil physically larger, although at the expense of efficiency as in FIG. A7c, d.

RF (B1) Shimming

To control the phase, magnitude, timing and frequency of B1 field generating currents on independent coil elements of multi-channel coils, multiple spectrometer transmit and receive channels are used. RF signals on each channel are independently modulated to effect the desired field control. This modulation is in turn controlled from the console by user interaction, programmed algorithms, or automated, feedback driven optimization protocols. See FIG. A8.

Parallel Transceiver

In one example, a parallel transceiver was configured to accomplish this level of RF control. The parallel transceiver schematized in FIG. A8 combines a multi-channel, parallel transmitter together with a multi-channel digital receiver. A low level, transmit (carrier) signal from the console is split into multiple, equal phase and magnitude signals. Each of the split signal paths can then be independently modulated via console control by programmable digital phase shifters and attenuators. Each of the independently modulated signals is then amplified by multiple, channel dedicated broadband solid-state RF Power Amplifiers (Communications Power Corporation, Hauppauge, N.Y.). The independently modulated transmit signals then pass through transmit receive switches to their respective multi-channel coil elements. Receive signals from the same, or different, coil elements are then fed to a multi-channel digital receiver. In one example, the programmable transmitter phase and magnitude information is accessed from values stored in a lookup table. Upon reception of an optional trigger signal, the phase shifters and attenuators are updated to the next values. The user can prescribe and review phase and magnitude settings through either a web page interface or through a command language that can be scripted or incorporated into the spectrometer's software.

Applications

Head Imaging

Results from the application of some of the RF solutions presented, follow. FIG. A9 demonstrates B1 shimming on a head at 9.4 T. In this example, a multi-channel TEM volume coil per FIG. A5a, designed by considerations of FIG. A7a, was driven by the parallel transceiver of FIG. A8. B1 magnitude (top row) and B1 phase (bottom row) were respectively optimized for best homogeneity. Phase and magnitude shimming were used together to produce the images of FIG. A10.

Multi-Nuclear Imaging

Signal-to-noise and spectral resolution gains greatly benefit multi-nuclear NMR at high field strengths. By tuning alternating elements of a TEM coil to two frequencies, and transmitting and receiving at these two frequencies, multi-nuclear image acquisition can be simultaneously accomplished. See FIG. A11. Alternatively frequency can be shifted per channel over time to acquire interleaved results in a "frequency hopping" scheme for two or more frequencies.

Body Imaging

4 T

The methods described herein for head imaging at high fields apply to full body imaging as well. Because human trunk dimensions are larger than in the head, significant RF artifacts become problematic at proportionately lower field strengths. The TEM body coil as shown in FIG. A12 (a) was used together with two surface coil arrays (b) fitted to the chest and back of a volunteer to acquire the adjacent gated cardiac images at 4 T. The RF artifact in the atrium of the left image was corrected by B1 shimming as evidenced in the right image.

7 T

For an initial mapping of the RF "landscape" in the body at 300 MHz (7 T), coronal, saggital, and transaxial scout images were acquired with a TEM body coil as in FIG. A12, activated in transmit and receive mode without the use of additional receiver coils. When using a 4 kW power amplifier, the parameters used for acquiring the gradient echo, whole body images of FIG. A13 were: 256×256 matrix, 3 mm thick slice, 2 ms windowed sinc pulse, flip angle=25 degrees, TR/TE=50/4 ms, 50×35 cm, NT=2, scan time=55 sec. These images illustrate both RF problems and opportunities. Marked RF artifacts are noted, especially sharp destructive interference band (signal void) in the center of the trunk. Note, however the penetration through the trunk obtained with moderate SAR levels. Many of these artifacts were minimized or eliminated when receiver coils were used to localize specific ROIs.

Localized Imaging and Spectroscopy

Whereas whole body imaging at the highest fields still presents some challenges, high quality images and spectra from localized regions of interest in the head, extremities, and superficial anatomy such as breasts can be easily measured with little complication.

Conclusions

RF artifacts due to extremely short brain and muscle tissue wavelengths of 12 cm at 7 T and 9 cm at 9.4 T can become the increasingly powerful RF shims and gradients used to localize ROIs and to optimize selected criteria therein by new families of RF protocols and feedback driven optimization algorithms. Shorter wavelengths bring the new ability to "steer" RF fields to targeted anatomies and acquisition mechanisms. New RF shimming, localization and optimization techniques can solve many of the RF problems encountered at high field strengths, but will further amplify the SNR benefit already gained.

EXPERIMENTAL SECTION

In one example, the objective is to develop human brain imaging at 9.4 T and body imaging at 7 T. In so doing, groundwork is laid for determining the feasibility of head and body imaging to 11.74 T and 9.4 T respectively. To that end, the physical and technical problems noted previously are solved.

Strategy 1. Head Imaging at 9.4 T and Beyond.

Overview

Advancing human head imaging at 9.4 T and higher fields entails modeling, instrumentation, B1 optimization algorithm development, and validation of these technology and methodology advancements through applications testing.

Modeling

Initial modeling for the purpose of RF coil design and B1 optimization methods development uses the Remcom Inc, Finite Difference Time Domain method to numerically predict RF field magnitude and loss contours in the NLM Visual Human digital atlas of the adult male head. FIG. A15 shows a scale model of a head within a homogeneous, circularly polarized TEM head coil. The dimensions of the coil are: i.d.=28 cm, o.d.=34 cm, length=20 cm. These models of conventional "homogeneous" coils and applications indicate the need for new methods and technologies for 9.4 T.

Coil Design

Modeling is used for optimal coil design. B1 transmit (B1+) uniformity is a concern at the highest magnetic fields. Destructive B1+ interference between complex B1+ vectors from coil elements result in "bright center, dark periphery" patterns in axial images of the brain with various head coils at 7 T. FDTD modeling with the Remcom segmented and meshed human head model (as in FIG. A15) is used to select optimal coil geometries based on element count, spacing, length, distance from head, and other physical and electrical circuit parameters. FIG. A7 gives one example of how modeling is used to aid coil design. FIG. A16 gives another example.

B1 Field

Modeling is used for B1 optimization algorithm simulation. The finite-difference time-domain method is used to model heads and bodies with 5 mm resolution in different locations within head coils at 400 MHz and 500 MHz, and in body coils at 300 MHz and 400 MHz. This is accomplished by calculating the field produced by each tuned element using the FDTD method. Then the results are loaded into a Matlab routine where the phase and magnitude of the driving voltage of each element is varied until a configuration yielding an optimal (defined in various ways) image intensity distribution in a region of interest. Image intensity is calculated as for parallel acquisition, but with full k-space sampling. Image intensity at one location is then calculated as $|\sin(\gamma\tau\Sigma N BN^+)| |\Sigma N| BN^-|$ where $BN^+$ and $BN^-$ are the circularly-polarized components of the RF magnetic field created by element N that rotate with and counter to nuclear precession respectively, $\gamma$ is the gyromagnetic ratio, $\tau$ is the pulse duration, $\Sigma N$ indicates a summation over the N elements of the coil, and pairs of vertical bars indicate that a modulus is to be taken. For an example of this approach as applied to optimization of homogeneity in the head at 7 T, a 3D model of a head in an 8-element coil of the type given in FIG. A5a. FIG. A17 shows the sin(flip angle), receptivity, and signal intensity distributions for a head in an 8-element coil at 300 MHz after optimization. Results indicate that greater homogeneity is achievable at high fields by using parallel imaging methods due to the centrally enhanced transmit field combined with the peripherally enhanced receive field.

For B1 Field "Autoshim"

High speed modeling is developed for B1 optimization automation. The Finite Difference Time Domain (FDTD) method can be used to solve Maxwell's equations for the case of the head loaded TEM coil, and has yielded excellent results. The FDTD method is one method of modeling the B1 fields in the human head and body. However, the computational resources for high resolution, high detail modeling are large, and run times even with a code modified to run on a multiprocessor machine are still very long (hours). Computational speed is especially a concern when the addition of image feedback criteria are contemplated for automated B1 field optimization routines. Consider the process of modeling high fidelity, anatomy loaded coil topologies, especially those driven by dynamic excitation protocols by the FDTD method. One example of a modeling method for high frequency RF solutions for high field MR is presented. One modeling scheme provides a fast solution of Maxwell's equations for the coil-tissue model. This facilitates numerous changes in coil configuration, excitation, or other parameters to rapidly find optimized results. The FDTD technique is iterative and cycles until convergence occurs, defined by the residual errors. This explains the long run times even in multiprocessor machines. For large problems, such as radar cross section calculations which are scattering problems, the FDTD method can be superseded by integral equation methods.

The integral equation method (IEM) can be used for electromagnetic problems. These formulations result in the Electric Field Integral Equation (EFIE), or the Magnetic Field Integral Equation (MFIE), or the Combined Field Integral Equations (CFIE) which is the weighted sum of the first two equations. The formulations are in terms of the Green's function, which is the free space version of the form $e^{-jk_o r}/(4\pi r)$ for the unloaded coil, where $k_o$ is the free space propagation constant. For the loaded coil, this method places hypothetical sources at the interface of each homogeneous region. The Green's function in each region is of a similar form as given above with the permittivity of the region written as $k=\omega\sqrt{\mu_0 \epsilon}$.

In this case the formulation considers that the human tissue model be subdivided into regions which are piecewise homogeneous. The effect of loss in each region considers that the homogeneous region Green's function be modified. These equations are then solved by the method of moments, leading to a complex matrix equation and subsequent solution. In contrast to the FDTD and FEM methods in this section, the integral equation method considers that only the fields/sources at the interfaces be stored, and fields at interior points are not stored. Thus, computer data storage requirements are much reduced, but matrices are full. Two dimensional problems with this formulation are extended to the present three dimensional coil and anatomy models. A Green's function that accounts for the loss in homogeneous regions of tissue models is generated. The significant increase in solution speed expected with implementation of the integral equation method for MR modeling facilitates the number and complexity of the time dependent, interactive, RF models considered.

Instrumentation

A 9.4 T, 65 cm bore Magnex superconducting magnet with a 40 cm i.d., asymmetric gradient head coil and shim set is used for human head imaging and for porcine models proposed. This magnet system is interfaced to a Varian Inova console, and to a custom RF front end including a new parallel transceiver to drive a number of multi-channel TEM coils as pictured in FIG. A18.

RF Subsystem

The parallel transceiver includes a multichannel receiver, and a multichannel transmitter including programmable attenuators, phase shifters, power amplifiers and T/R switches. Demonstration of a transceiver is presented elsewhere in this document (FIGS. A9,A10). Selected performance specifications for this system are found in Table A1. The 16 channel transceiver interfaces RF signal and control lines to independent coil elements that can be electronically configured for transmit, receive, current magnitude and phase settings. The individual coil elements can be independently switched on (in) or off (out). This console based control over the RF field in the MR experiment allows MR imaging. Spatially selective (per element) phase and magnitude control for the RF transmit mode, and phase and gain control for each element of the receive mode afford the ability to "shim" the RF excitation and receptivity profiles for a target region of interest. The temporal switching components (TR switches) facilitate the switched RF gradients as well as dynamic shims. Both RF shims and gradients are interactively controlled from the console. With image driven feedback, macros are programmed for the automation of optimization routines. In the high field RF environment where anatomic constitution, geometry and position adversely affect B1 uniformity and B1 dependent SNR, SAR, Contrast, etc., this is one approach to B1 dependent criteria optimization for a targeted ROI.

TABLE A1

Parallel Transceiver Specifications

| | | |
|---|---|---|
| RF Amp: | Power | 500 W/channel |
| | Channels | 16 |
| | Total Power | 8 kW |
| | Freq. Range | 30-405 MHz |
| Phase: | Range | 0-358.6° |
| | Resolution | 1.4° |
| Magn: | Range | 0-63.75 dB |
| | Resolution | 0.25 dB |
| Max. Table size | | ~600 steps |
| Reconfiguration time | | 66 μs |
| Digital Receiver speed | | 64 MHz |
| Intermediate Freq. | | 20 MHz |
| ADC depth | | 14 bits |

Parallel Transceiver

A high speed parallel transceiver is developed and implemented for automated B1 shimming transmit SENSE, and other "on the fly" applications at 9.4 T. The 66 μs command cycle of this first generation transceiver is sufficient for controlling phase and gain settings for interactive RF shimming. But this is too slow for other applications. The present subject matter reduces this time delay to a sub-microsecond control cycle to facilitate Transmit SENSE, automated shimming and other high speed applications using on-the-fly waveform modulation and feedback control. The broadband power amplifiers and other system components also allow for simultaneous or interleaved multi-nuclear applications, swept frequency methods, and other frequency dependent protocols.

One element of an example of the parallel transceiver is a transmitter module including a single chip modulator, and a single Field Effect Transistor (FET) power amp. The compactness of this unit (approximately 1 cm×2 cm×3 cc) allows integration of this unit with its dedicated coil element, which also serves as the heat sink for the FET. Together with a similarly compact PIN diode protected preamp, this parallel transceiver is integrated at the probe head (coil) for improved RF speed, performance and flexibility.

The present subject matter device, includes an adjustable integrated circuit designed to allow for frequency shifting over 100 kHz of bandwidth, phase shifting over 360 degrees, and amplitude adjustment over 30 dB. The circuit architecture includes the blocks shown in the figure. The incoming signal is amplified to a known output value through an automatic gain control (AGC) circuit to maintain optimal operating conditions for the mixer. This signal is mixed with a low frequency signal to adjust the input signal around the center frequency. The low frequency signal is produced by a voltage-controlled oscillator (VCO) controlled through the frequency adjustment line. The output of the mixer is then supplied to the phase adjustment circuitry. The phase of the signal is modified according to the phase control signal from zero degrees to 360 degrees through capacitors that are switched into the system. In addition, the signals' amplitude is adjusted by the system, taking into account the fixed input amplitude supplied via the AGC.

In one example, a bipolar junction transistor (BJT) process such as IBM's 0.35 um SiGe is used because of the linear, high voltage signals. One example of a design is verified in simulation against the system specifications. From the specifications, a system architecture is selected and blocked out. Each circuit block is designed and simulated to the specifications of the architecture and then combined into the full architecture for system simulation. From here, the circuits are laid out, checked, and extracted. Using the extracted decks, the system are re-simulated to ensure that parasitics of the chip are not affecting the system performance. These simulations can be performed with Analog Artist, Spectre, and Spectre RF; layout can be performed with Vituoso XL; and checking can be done with the appropriate checking decks for the process.

RF Coils

The parallel transceiver diagramed in FIG. A8 and shown in FIG. A18 above generates independent phase angle, magnitude, frequency, and time (switching) control to each independent element of the coils as shown below in FIG. A20a-e. RF coils using high frequency transmission line (TEM) principles can be used with the aid of high speed numerical, full wave modeling described above and with integrated channel dedicated transmitters and receivers also described above.

B1 Optimization

B1 field dependent phenomena associated with high field MRI and the parallel transceiver and multi-channel coil technology are addressed with B1 optimization algorithms. By controlling the currents in individual RF coil elements, in phase, gain, frequency and time, the RF field can be manipulated to optimize signal from a targeted region of interest for SNR, SAR, CNR, homogeneity or other criteria. The RF (B1) shimming is automated, similar to $B_0$ magnetic field shimming. However, unlike magnetic field shimming, RF coil elements in a transmit array are typically not orthogonal; thus constraining the solution set as compared to $B_0$ shimming options. A two step approach is taken to B1 shimming. The first entails mapping the $B1^+$ profile for every coil element within an array; the second step uses the $B1^+$ map to optimize an RF shimming routine for a specific criteria (i.e. SNR, SAR, CNR, homogeneity, etc).

$B1^+$ Mapping Routine

In an array the total B1+ at any given pixel is the summation of all the RF coil's $B1^+$ at that pixel.

$$B^+_{1,pixel} = \sum_{n=1}^{N} B^+_{1,coil\ n} \quad [8]$$

Methods for mapping the individual $B1^+$ fields for individual coil elements within an array are too slow for routine use. The results from the routine described below, have shown $B1^+$ mapping can be achieved in approximately one minute. If an array is transmitting the same waveform, but the phase and magnitude for individual coils can be varied, then the individual coil's $B1^+$ can be decomposed into two components. The first component, m, is the complex-valued scalar representing the phase and magnitude of the RF waveform. The second component, B, is a map that describes the relative distribution of the complex valued $B1^+$ at each pixel. FIG. AX may help to visualize the variable B. When the flip angle generated by the $B1^+$ is small, the net $B1^+$ at any point is approximately proportional to the received image pixel, P. Now equation [8] can be restated as $$P_{voxel} = \sum_{n=1}^{N} m_n B_n \quad [9]$$

or, in matrix notation $$P = mB \quad [10]$$

To map the relative distribution of the $B1^+$ fields for each coil, this equation must be solved for B. A least squares solution is possible by collecting several different types of images; these images must have different, non-degenerate sets of m. In this example, m is varied by adding 180° to the transmit phase to one channel at a time. Using linear algebra reductions, m for a n-element RF coil using this pattern is most simply expressed as $$M = \begin{bmatrix} 1 & 1 & \cdots & 1 \\ -1 & 1 & \cdots & 1 \\ 1 & -1 & \cdots & 1 \\ \vdots & \vdots & \ddots & 1 \\ 1 & 1 & \cdots & -1 \end{bmatrix} \quad [11]$$

Correspondingly, P is enlarged to reflect the data from the additional images, and B is solved for in this system of equations by a linear least squares formulation. FIG. A21a shows grayscale images generated by varying m, while FIG. A21b shows the eight transmit sensitivity profiles that result from solving for the matrix B. Transmit sensitivity profiles are images generated by dividing each coil's $B1^+$ by the net $B1^+$. Coil coupling during transmit is a consideration, but the effects of this are automatically included in the $B1^+$ maps.

Mapping is evaluated by varying m and collecting a global $B1^+$ map with a two flip-angle method. This map is then compared with a simulated map produced by $|m \times B|$. The two maps should be proportional to one another, within ±5%. These trial FLASH data sets were acquired with a resolution of 256×256, but tests have shown that resolutions as low as 32×32 are sufficient for mapping.

$B_1$ Shimming Routine

The $B_1$ shimming algorithm described below is designed to optimize RF homogeneity. The algorithm is general however, and can be used to optimize other distributions by changing the criteria or targets. A linear solution may not provide an optimum result. If using equation X+2, with B known, then P becomes the target distribution and is set to unity. This creates a situation where the magnitude is set to unity and the phase is implicitly set to zero (since the first grayscale image is used as a reference, its phase is defined as zero everywhere). Therefore, the linear solution finds a compromise between two opposing goals: find a homogeneous magnitude, and keep the same global phase distribution as the original image. FIG. A22b foreshadows a more complex algorithm.

In one example, a non-linear algorithm is used. In this algorithm, a penalty function is created that returns a single value describing the appropriateness of the result for each m. One solution will be the values of m that return the lowest penalty value. Because each element has two variables, phase and magnitude, there are 2*N degrees of freedom. To ensure the solution is the global and not a local minimum, the optimization routine is restarted along several values of m. For each starting point the routine follows the path of steepest decent to the local minimum. The lowest local minimum is the global minimum. Although the search space is large, the efficient global search routine finds the global solution in about one minute for an eight channel coil as described in section C.

FIG. A22c shows the optimized RF shimming algorithm. Excursions still exist, most notably the rim of enhanced $B_1^+$ near the left side of the brain. This is the one solution for the chosen penalty function. The penalty function rewards uniform $B_1^+$ magnitude while penalizing local excursions and null solutions. A null solution is one that produces almost no $B_1^+$. Although destructive interference across the entire brain is homogeneous, it may not be desirable.

The accuracy of the solutions is evaluated by adjusting the phase and magnitude of each coil in accordance with calculated solution. The magnitude of the calculated and realized solution should be proportional to one another to within ±5%. If the solution is verified to be accurate, and the penalty function is reliable, but the resulting homogeneity is still insufficient, the coil itself can be modified to change the constraints. By using the data collected to guide coil alterations, the coil can be physically modified.

A single solution may not satisfy the entire brain. The hardware is suited for dynamically changing $B_1$ shim settings between slices in multislice experiments. There are several potential methods for determining a multislice RF shim. Each slice can be individually mapped for optimization. One example includes mapping the outer slices in a multislice set and interpolating solutions for the interior slices. Several complete multislice sets are mapped to analyze the usefulness of interpolation. Coarse 3-D transmit field maps are also collected so that individual slices can be extracted for shim calculations.

Gradient Waveforms for Multi Dimensional RF Pulses

By designing independent RF waveforms for each channel and adding gradient waveforms, the distribution of transmit $B_1$ can be controlled. This is usually referred to as Transmit SENSE, where SENSE is in reference to the receive-only encoding algorithm with which Transmit SENSE shares a conceptual framework. This section describes the background of this technology, drawing parallels between it and receive encoding schemes. Additional receive strategies explore the use of non-standard k-space trajectories that no longer fall into categories of Cartesian or spiral to optimize reception. Non-standard gradient waveform trajectories are expected to be more efficient in shaping the distribution of transmit fields.

Multidimensional pulses select an arbitrary volume by designing an RF waveform to be transmitted while gradients transverse k-space. A previously developed k-space perspective may provide a fairly accurate linear Fourier relationship between the time-varying gradient and RF waveforms, and the resulting transverse excitation pattern. An approach to small-tip-angle RF pulse design is to predetermine the gradient waveforms and thus the k-space trajectory, and then obtain the complex-valued RF waveform by sampling the Fourier transform of the desired excitation pattern along the trajectory $$B_{1+,comb} = B_{1+}(\vec{x}) \int_0^T b(t) e^{-i\gamma \vec{x}\cdot\vec{k}(t)} dt, \quad [12]$$

here b(t) denotes a phase an amplitude modulation of the RF transmit channel, and k(t) denotes the gradient waveform. In the large-tip-angle regime the non-linearity of the Bloch equation does not permit a closed-form solution, complicating the corresponding derivation of appropriate 2D RF excitation profiles.

One drawback of multidimensional pulses is as the target excitation pattern becomes more sharply defined, the RF pulses to generate the pattern become longer. These long pulses are limited by SAR guidelines and transverse and longitudinal relaxation. To shorten the pulses, the multi-segmentation approach from MR imaging can be applied to the shaping of spatially selective RF pulses. Using 16 different RF pulses, each traversing distinct interleaved rectilinear trajectories, the transmit field can be shaped with a spatial resolution of 2.5 mm. One example uses a 1.5 T magnet using a single RF transmit coil. This resolution can be used to create curved excitation profiles that follow human anatomy. Multidimensional pulses are incorporated with multichannel transmit systems in a method called Transmit SENSE, in which each channel can transmit independent waveforms while a gradient trajectory is applied, $$B_{1+,comb} = \sum_{n=1}^N B_{1+,n}(\vec{x}) \int_0^T b_n(t) e^{-i\gamma \vec{x}\cdot\vec{k}(t)} dt. \quad [13]$$

The spatially distinct $B_1^+$ profiles from individual channels are used to reduce the duration of multidimensional RF pulses by using the channel specific encoding to reduce the required gradient spatial encoding. There are some similarities between parallel reception and parallel transmission, including the progression of their development. Gradient waveforms used in Transmit SENSE track with developments that SENSE and GRAPPA image reconstructions have followed for k-space sampling during reception. The k-space trajectories have advanced from Cartesian to spiral, and so on. The present subject matter applies to parallel transmission, advanced receive algorithms.

Compressive sampling is a one imaging approach to use the least possible information for accurate image representation. It is different than Wavelets and other compression algorithms such as JPEG that may be used to reduce the information needed to represent images. For MR applications, wavelet and other non-fourier compression approaches have been considered for image acquisition. One inherent limitation is the need for a-priori knowledge of image structures. Image compression techniques in magnetic resonance images are therefore typically confined to the retrospective evaluation of which k-space components are representative of the image, after the entire k-space has been acquired.

With multi-channel techniques such as SENSE and GRAPPA some of the gradient encoding is replaced with spatial encoding from the sensitivity profiles. The k-space is sampled in some regular fashion to ensure consistent aliasing, which can be utilized to generate complete images using image un-aliasing, SENSE, k-space interpolation, GRAPPA, or hybrid space deconvolution, SPACE RIP. Compare the regular sampling to variable density sampling. One approach entails predicting for a given number of k-space samples, which samples are most important. The determination of the samples is dependent on the object and the sensitivity profiles. This leads to a more dense sampling of the central k-space and a sparser sampling of the higher parts of k-space. The variable density sampling utilizes the full frequency range, and offers increased signal stability. In this regard, using the compressive sampling approach for SENSE un-aliasing, the feasible reduction factor may improve.

Several differences exist between parallel transmission and parallel reception, including noise amplification, that make Transmit SENSE feasible where the receive algorithms face restrictions. For image reconstruction the (thermal) noise in the individual channels is amplified during the reconstruction, whereas for the Transmit SENSE the desired $B_1^+$ profile is multiplied with the channel's specific profile without inducing a similar noise amplification. A further distinction is that the resultant image in SENSE and GRAPPA has natural variations, whereas Transmit SENSE constructs smooth profiles. Initial numerical simulations indicate that spiral trajectories are superior to Cartesian trajectories for Transmit SENSE, but with conjugate phase techniques these differences may be diminished. At ultra-high field (7 T and higher), rather than using spiral imaging, conjugate phase techniques are used to improve Cartesian trajectories.

For Transmit SENSE, the use of spiral and Cartesian trajectories may lead to a shortening of the duration of multidimensional pulses. In one example, the predetermined k-space trajectory is abandoned and both the RF waveforms and gradient waveforms are simultaneously optimized, that is to formally solve $$\min_{T,k(t),b_n(t)} \left\| B_{desired} - \sum_{n=1}^N B_{1+,n}(\vec{x}) \int_0^T b_n(t) e^{-i\gamma \vec{x}\cdot\vec{k}(t)} dt \right\|. \quad [14]$$

The simultaneous solution of both time duration and gradient trajectory may allow an additional 50% reduction of the time compared with e.g. Cartesian "undersampling" patterns for multidimensional pulses. Initially Cartesian sampling can be used due to its stability, but the gradient waveform lines may be spaced at non-equidistant intervals.

To summarize; for multidimensional RF excitation one aim is to generate $B_1^+$ profiles which sharply define the outline of a user defined ROI, and another is to create homogeneous B1+ over the interior of that ROI. Compressive sampling techniques are well suited for this application.

To investigate these techniques several intermediate steps are taken. First, standard multidimensional Cartesian Transmit SENSE are implemented. Spiral trajectories can be implemented for comparison with Cartesian trajectories and algorithms. Numerically optimized trajectories can be selected. One method includes calculating optimal gradient waveforms to shorten multidimensional pulses. One example includes using seed trajectories like Cartesian, spiral or skewed, numerical optimization of the gradient waveform together with the RF waveform. Differences are noted for different geometries and ROIs including, for example, efficacy of these waveforms in both the low and high flip angle regimes. One consideration is the sparseness of the trajectory and still satisfy the purpose of the pulse such as outer volume suppression or image homogeneity.

B1 Localization

As modeled in FIG. A2, 9 cm wavelengths in the human brain imaged at 9.4 T lead to pronounced $B_1$ field contours and consequential image inhomogeneity. Control of the $B_1$ field gradients over a volume allows for steering a constructively interfering field node to spatially correlate with an anatomic region of interest. Through control of these $B_1$ field gradients images of selected regions of interest can be optimized for higher signal to noise ratios, lower power deposition (SAR), and other criteria. One such technique for localization of a region of interest is modeled by the following methods.

The 16 element, multi-channel TEM head coil of FIG. A5a was modeled together with a cylindrical phantom of physiologic electrical parameters for 400 MHz. The coil measured 28 cm i.d.×34.5 cm o.d.×18 cm long, and the phantom centered within the coil was 20 cm diameter by 20 cm long. Maxwell solutions for the 3D model were numerically calculated by the finite element method (FEM). Simulations driving each coil element independently were first performed to determine the phantom response to individual drives. The $B_1$ field at a point in the phantom due to nth current element is broken into x and y components where the x component value is denoted $$B1_{xn} = A_n e^{j(\omega t + \phi_n)} a_{nx} e^{jbnx}, \quad [15]$$

where $A_n$ and $\phi_n$ represent the $n^{th}$ element's current magnitude and phase respectively, $\omega$ is the Larmor Frequency, and the term jbnx anxe describes the remainder of the steady state geometrical phase shift and magnitude relation between the nth drive and the x direction $B_1$ magnitude at a given point in the phantom. A similar equation can be written for the y component of the $B_1$ field. The final x and y directional B field may then be calculated as the sum over n of $B1_{xn}$. The overall field is found from these two quantities. Using the finite element simulations, the quantities jbnx anxe and jby anye are found for each point on a grid in the phantom placed on the selected field of view and for each current element on the coil. With this information, field distributions were calculated from arbitrary elemental current magnitudes and phase angles. The final step was to determine each $A_n$ and $\phi_n$ to obtain a distribution approximating a desired distribution. To accomplish this a cost function was defined for a fit to the desired distribution and then an iterative optimization algorithm was applied. Such an approach was implemented and results obtained by using the simulated annealing approach. Simulation results in the figure show a convergence to an arbitrarily chosen, off axis B1 contour reached through current element phase and magnitude control.

Verification of this RF localization method is in two forms. With drive parameters determined by the $B_1$ field distribution tailoring technique described above, verification by means of additional finite element simulation is performed. Drive amplitude and phase values is fed back to verify the expected distributions. A coil and a phantom are used in one example, Target distributions can be selected and proximity of match is reported at 9.4 T.

The simulated annealing optimization technique yields relatively slow convergence and a suboptimal solution to the problem of tailoring an RF field distribution to a desired shape. To understand the difficulty in optimizing a field distribution within the load object, begin by imagining a three dimensional mountainous terrain distribution where the height represents the field intensity within the slice of interest caused by each drive element. In terms of the above problem this field is represented mathematically as $$A_n e^{j(\omega t + \phi_n)} * Z_n(x) \quad [16]$$

where Zn(x) represents a complex function. Changing the amplitude of the nth drive element varies the amplitude of the distribution and varying the phase morphs the distribution into other shapes. The final field intensity is then the magnitude of the sum of the distributions caused by each elemental drive, $$\left| \sum_n A_n e^{j(\omega t + \phi_n)} * z_n(x) \right|. \quad [17]$$

The goal of the optimization is to form a distribution into a desired shape by morphing the distributions into shapes that sum to a localized distribution of interest. This is stated in an optimization program as $$\min \int_x \left\{ \int_t \left| \sum_n A_n e^{j(\omega t + \phi_n)} * z_n(x) \right| dt - D(x) \right\}^2 dx \quad [18]$$

where D(x) is the desired distribution. In general this type of optimization is difficult.

To solve this problem, various solutions are considered, including the following two. These approaches fall within the field of convex optimization. The first is to define an upper bounding function that is convex. That is to say, define a function that is at all places less optimal than the actual distribution for all phases and amplitudes but itself has no local minima. Because there are no local minima, efficient gradient decent techniques can be used to find the most optimal solution in the space of distributions. Using the optimum of the bounding function as a starting point, traditional optimization techniques can then be used to improve on the actual solution.

Another example is to define an approximating function that roughly follows the shape of the original distribution but also has no local minima in the 32 (16 elements*2 degrees of freedom) dimensional space. By guaranteeing no local minima, algorithms can be employed to optimize the solution. This approximate solution can then be used as a starting point for efficient minimization of the original problem. These techniques can yield solutions to these optimization problems in real time, with benefits for MRI and MRS applications.

Head (and Body) Imaging

Human studies are considered for testing, validating, characterizing, improving, and determining the practical limits for head and body imaging at the highest fields currently available. The RF dependent parameters (SNR, SAR, $B_1$, temperature, etc.) are measured and mapped for head and body imaging initially at 7 T and 9.4 T respectively.

Strategy 2. Body Imaging at 7 T to 9.4 T

Overview

The methods for exploring 7 T and higher field body imaging require high frequency modeling, hardware development, and data acquisition similar to those for head imaging at still higher frequencies. Because some of the methods and technologies considered and discussed for the head are used for highest field body imaging as well, only body specific components of the plan are discussed below.

Modeling

Initial modeling of highest field human body applications used the FDTD method to numerically predict RF field equipotentials in the National Library of Medicine's Visual Human digital atlas with segmented anatomy adjusted to conductivity and permittivity of 300 MHz. To lay the groundwork for higher field imaging, 400 MHz models are performed as well. FIG. A24 gives an example $B_1$ calculated unloaded (left) and loaded (right) body coil at 300 MHz. The RF field, circularly polarized and uniform in the unloaded condition, was generated by a TEM body coil of the dimensions: i.d.=57.5 cm, o.d.=62.5 cm, element length=33 cm, cavity length=100 cm.

Instrumentation

As with 9.4 T head imaging, the equipment and sequences specific to 7 T human body imaging are not commercially available. Therefore the hardware, controls and pulse protocols required for this study are developed. The MRI system used is a Magnex 7 T, 90 cm bore magnet with Magnex whole body gradients and shims (i.d.=63 cm). A Varian (Palo Alto, Calif.) Inova console is used, together with an 8 kW solid state RF power amplifier from Communications Power Corporation (Hauppauge, N.Y.). An actively detuned, 300 MHz RF body coil of the model dimensions was built together with its PIN detuning circuits and system control interface as shown in FIG. A25a. 300 MHz receiver coil circuits such as the eight element strip line array, half of which is shown in FIG. A25b, and the four element strip line dual breast array shown in FIG. A25c were also developed together with the necessary PIN decoupling circuits and multi-channel, digital receivers displayed also in FIG. A25a.

Body Coil

A 7 T body coil of TEM design is driven at every element by a parallel transceiver as for head imaging at 9.4 T. The multi-channel 32-element TEM body coil has the same control functions and flexibility as for the multi-channel TEM head coils. Before making NMR measurements body coil performance is first verified by bench measurements. Unloaded and loaded conditions are verified to 1) tune to the correct Larmor frequency, 2) match to 50 ohms at each element, 3) meet free space (unloaded) homogeneity specifications above, 4) generate an efficient B1 gain over the FOV, 5) withstand a peak power rating of 16 kW (32×500 W) for body coils, (8 kW(16×500 W) for head coils at 5% duty), 6) withstand an average power of 600 W for body coil, and 200 W for head coil, 7) sustain 10,000 WVDC isolation between coil conductive elements and human tissue, 8) actively switch between tuned and detuned states and vice-versa within 10 µsec., 9) decouple from local receiver coils by >40 dB, 10) have >25 dB isolation between quadrature modes, 11) meet all electrical power, control, RF, and mechanical interface specifications for host MRI system, and 12) include fully functional RF power monitoring, fault detection, and failsafe feedback circuits.

Receiver Coils

Specialty receiver coils as pictured in FIG. A25 are built to accompany body coil transmitters. Multichannel TEM head coils are built as receiver, as well as breast and torso receivers. For body MRI, a close fitting, eight element array is used within the body coil to maximize reception sensitivity for cardiac imaging. Before NMR measurements are made, receiver coil performance is verified by bench measurements. All coils in unloaded and loaded conditions are verified to 1) tune to the correct Larmor frequency, 2) match to 50 ohms at RF receive ports, 3) cover the application FOV, 4) generate an efficient $B_1$ gain over the FOV 5) withstand a peak power rating of 5 kW at 5% duty, 6) withstand an average power of 250 W, 7) sustain 5,000 WVDC isolation between coil conductive elements and human tissue, 8) actively switch between tuned and detuned states and vice-versa within 10 µsec., 9) decouple from local transmitter coils by >40 dB, 10) have >20 dB isolation between quadrature modes, 11) meet all electrical power, control, RF signal, and mechanical interface specifications for host MRI system, and 12) include fully functional fault detection, and failsafe feedback circuits.

Body Imaging

The models predicted significant RF artifacts with at least one sharp line running longitudinally through the body, primarily due to destructive interference of the short (12 cm) wavelengths in the high water content tissue dielectrics at 300 MHz. Imaging proved these predictions generally correct. See FIG. A13. Also shown in the FIG. A13 images are what appear to be susceptibility artifacts possibly due to gas pockets in the bowel. Artifacts are also noted near the bodies, between the breasts in female subjects. See FIG. A26a. The RF power (SAR) used to acquire the whole body images was estimated by: average SAR=996 W peak power×0.2789 (sinc Se power ratio)=277.7 Watts×2 ms/50 ms=11.1 W per slice in each TR. 11.1×5 slices=55.5 W, or less that 1.0 W/kg for most adults, well within the FDA guideline for human torso imaging. The body coil is used as an actively detuned, homogeneous transmitter for imaging with local receiver arrays. Two blocks of four TEM strip line elements each (FIG. A25b) were placed above and below the torso to receive the signal summed by simple magnitude addition to create the image shown in FIG. A26d. To facilitate the evaluation of RF non uniformities, no intensity correction was applied. This higher signal, receive only image compares to the body coil transmit and receive image shown in FIG. A26c. A breast coil configured of four strip line loops in a pair of quadrature arrays is shown in FIG. A25c. This dual breast array was used to acquire the breast image of FIG. A26b to apparently, partially correct for an artifact often seen at the sternum and between breast as n 26a. The acquisition parameters for the gradient echo sequence were: 256×128 matrix, 42 cm/25 cm, 3 mm thick slice, 2 ms windowed sinc RF pulse, TR/TE=50/5 ms, flip angle=20 degrees, scan time 12 sec. Again, no intensity corrections were applied to this image.

Observed artifacts and RF power requirements do not appear to preclude the possibility of useful whole body imaging for at least some applications at 7 T. Improvement in both signal and homogeneity appear to be gained by using the body coil for excitation together with separate receiver coils for higher sensitivity, local image signal reception. Breast imaging and spectroscopy appears to be an early, obvious application of 7 T body imaging. See FIG. A14. Scout imaging combined with low gamma spectroscopy of almost any organ or tissue can be successful at 7 T. Furthermore, results indicate that at least some of the artifacts observed at 7 T can be manipulated or removed by RF field shimming for targeting regions of interest. See FIG. A27.

B1 Shimming

As with head imaging at 9.4 T, B1 shimming with the proposed 32-channel, multi-nuclear body coil can be useful in correcting for RF related artifacts and optimized criteria selection in targeted regions. An example of the potential utility of B1 shimming is revisited in FIG. A27. RF models (FIG. A27a, b) predict an RF artifact in the atrial heart wall at 3 T. 4 T gated cardiac images (FIG. A27c) show this artifact clearly. B1 shimming of the heart region by adjusting the relative impedance (phase and magnitude) of TEM transmit body coils elements, corrected for this artifact, which was unaffected by B0 shimming. By the proposed combination of B1 transmit shimming with target dedicated receiver coils, successful body imaging at 7 T can be accomplished.

Strategy 3. RF Safety.

Temperature Calculation, Measurement

RF heating can be calculated and measured in porcine models of adult human weight to identify the RF power level limit that can be safely transmitted from the head and body transmit coils tested. The FDA has specified guidelines for RF energy dosimetry to the human body in two ways. 1) Average and local specific absorption rates (SAR) are discussed above and 2) RF power deposition must be insufficient to cause a core temperature increase in excess of 1° C. and localized heating to greater than 38° C. in the head, 39° C. in the torso and 40° C. in the extremities. Equating the power loss density [Eq. 6 of this section] to temperature through the bioheat equation [Eq. 7 of this section], temperature contours are calculated for 3D head and body models. Contours are calculated for the NLM human head and body for each RF head and body transmit coil used, for each frequency. The result can be xy, xz, and yz temperature maps for each coil configuration, for each frequency 300, 400, 500 MHz.

Because the thermal criteria most directly target the safety issue (localized thermal tissue damage), because local temperature can be directly measured, and because temperate contours are more extreme due to shorter wavelength losses in tissue at higher frequencies, it is prudent to validate temperature models by direct temperature measurement. Temperature can be measured on the xy, xz, and yz planes modeled, and also adjacent to receiver coils placed on the porcine model within the head and body coils, and rectally. In this way any power coupled to receiver loops is monitored for local heating, in addition to core heating measured. FIG. A28 illustrates the technique of fiber optic probe placement in a perfused porcine model, within a coil field.

To secure a minimum of N=3 measurements per study, six, 120 lb. farm pigs can be used to test one head or body coil with and without separate receiver coils per year to assure RF safety with all coils, coil combinations and field strengths planned. A total of thirty pigs are required for the five year study (with a half dozen spare). To most accurately simulate the RF portion of the NMR experiment, anesthetized pigs are placed on a patient table bridge, inside the head or body coil. The receiver coil array is placed about the pig's head or chest depending on the coil. The receiver coil can be detuned. RF power is set to the SAR guideline limit for humans. Temperature vs. time is measured for multiple locations inside the pig model until the temperature reaches steady state, or until the FDA temperature limit is reached locally or globally. The head or torso is instrumented with seven temperature probes from the eight channel Luxtron thermometer to be used. The eighth channel probe remains in a thermometer referenced control cell (water bath) outside the coil. For transmit power input from the coil, temperature is measured in the anesthetized pig's head or chest.

The present subject matter seeks to identify the location and magnitude of "hot spots", then to correlate the RF coil input power with hard to detect, RF coil specific heating patterns and limits in tissues.

A more detailed explanation of the methods is provided below. Fluoroptic probes from a Luxtron 3000 unit can be inserted via an 18 gage hypodermic needle, into the drilled head or chest wall muscle. A linear probe with transducers 1-4 spaced at 1 cm intervals can be positioned in the brain, or subcutaneous fat and intercostal muscle, centered beneath the receiver coil, to a depth of 0 to 4 cm. Two more single transducer probes can be inserted into the scalp, or chest wall immediately beneath the receiver coil elements to measure local heating adjacent to the coil conductors. A seventh transducer can be inserted rectally to monitor the core temperature of the animal, outside the body coil. The eighth remaining probe is dedicated to a water calibration bath apart from the animal measurements. The heart rate, h.r., can be monitored. $B_1$ for each power setting and frequency can be measured at the head or chest wall with a field probe, after the animal is sacrificed. The coil input power P can be determined by MRI system means provided using a four port directional coupler and a power meter. The line losses to the coil can be calibrated, as can any reflected power. Past experience with surface coils indicates that each heating study from resting state to steady state heating, and back to resting state, takes about 4 hours. Two studies per pig can require a minimum of 8 hours each.

The predicted sources of error from the experiments above can be attributed to the anesthetically suppressed thermoregulatory reflexes of the pigs. Resulting errors can be conservative (safe), predicting slightly more heating than will occur in non-anaesthetized, healthy humans. The body of data can tabulate a priori information correlating RF power input to maximum local temperature contours for the different coil combinations, applications, and frequencies studies. Also in the data are the heating rates for these parametric variations.

9.4 T Human Imaging: Preliminary Results

Objective: To investigate the feasibility of human head imaging at 9.4 T.

Introduction: Brain imaging has been increasingly used in research applications at 7 T and 8 T since 1999. This study examined whether the human brain can be imaged safely and successfully at still higher field strengths.

Methods: The methods consisted of modeling, hardware development and data acquisition.

Modeling: Initial modeling used the Remcom Finite Difference Time Domain method to numerically predict RF ($B_1$)

field magnitude and loss contours in the Visual Human digital atlas of the adult male head. FIG. B1 shows a scale model of a head within a homogeneous, circularly polarized TEM head coil. The dimensions of the coil are: i.d.=28 cm, o.d.=34 cm, length=20 cm. These models of conventional coils and applications indicate the need for new methods and technologies for 9.4 T.

Hardware Development: A 9.4 T, 65 cm bore Magnex superconducting magnet (FIG. B2a) with a 40 cm id., assymetric gradient head coil and shim set was used for this study. This hardware was interfaced to a Varian Inova console, and to a custom RF front end including a parallel transceiver with multi-channel TEM coil pictured in FIGS. B2b, B2c. The transceiver was composed of a multichannel receiver built in-house, and a multichannel transmitter including programmable attenuators, phase shifters, power amplifiers and T/R switches were designed in-house and manufactured by Communications Power Corporation (CPC). The parallel transceiver gave independent phase angle and magnitude control to each independent element of the coils as drawn in FIG. B2b, and used for this study in FIG. B2c.

Measurement: For initial results, an eight element coil was used (FIG. B2c.). RF magnitude (FIG. B3a) and RF phase (FIG. B3b) were interactively controlled from the console to optimize the homogeneity across the head. Initial head images were then acquired. FIG. B4 is a gradient echo image set acquired by the parameters: TR/TE=40/5 ms, TI=1.55 sec, Thk=3 mm, matrix=256×128, SAR=0.4 W/kg. FIG. B5 shows a FLASH image, TR/TE=50/9 ms, Thk=6 mm, matrix=512×512, flip ~7°.

Results: With IDE and IRB approval, and in compliance with FDA guidelines, NMR data and interviews were obtained from an initial 10 healthy normal volunteers; 14 males, and 4 females. Of the 9.4 T imaging experience, 10 subjects reported "sleepiness", 8 reported "light headedness or dizziness", 4 reported metallic taste, two got cold, one got warm, and one reported "body numbness". There were no requests to conclude studies early with some lasting two hours, and no other remarkable incidents or long-term effects reported. FIGS. B4 and B5 were acquired by the new 9.4 T technology and methods above and are representative of the images acquired to date. FIG. B4 shows three dimensions of the brain with fair uniformity and good T1 contrast. FIG. B4a shows eddy current artifacts not resolved at abstract time. FIG. B4 images are 8-channel magnitude composites only, without intensity correction or other post-processing. The FLASH image of FIG. B5 shows apparent T2* contrasting of the medulary veins together with other features not generally observed at lower fields. FIG. B5a shows a superior B0 artifact and a bright peripheral intensity correction artifact.

Discussion and Conclusions: Human MR imaging to field strengths of 9.4 T can be accomplished, according to these results. The Larmor wavelength in the human tissue dielectric at 400 MHz is approximately 9 cm. By conventional methods and thinking, this wavelength would preclude any possibility of achieving safe and successful human scale imaging. RF interference patterns from a conventional, uniform field volume coil would create severe inhomogeneities in the anatomy, as shown in FIG. B1. RF losses to the tissue conductor and the tissue dielectric at 400 MHz would result in severe heating for conventional pulse protocols. Additional methods and technologies can solve some of these problems, and actually use the short wavelength to great advantage. By controlling the currents in individual RF coil elements, in phase, gain, frequency, and time, the RF field can be manipulated to optimize signal from a targeted region of interest for SNR, SAR, CNR, homogeneity, or other criteria. Such "RF shimming" can be automated much like B0 magnetic field shimming. Transmit SENSE can be similarly facilitated.

9.4 T Human MRI: Initial Results

The following discloses human images generated using a high field of 9.4 T. A 65 cm bore magnet was used together with an asymmetric 38 cm i.d. head gradient and shims set. A multi-channel transmission line (TEM) head coil was driven by a programmable RF front-end to control the relative phase and magnitude of each channel independently. The RF field control methods facilitated compensation of RF artifacts attributed to destructive interference patterns in order to achieve homogeneous 9.4 T head images, or to localize anatomic targets. Preliminary RF safety studies were performed on porcine models.

Introduction and Background

Images at 9.4 T can be obtained using a large male cynomolgus macaque. The SNR at 9.4 T more than doubled the SNR at 4 T. RF uniformity and SAR for the monkey study were high and low respectively. The technology and methodology can be used for achieving successful 9.4 T results in larger animals. Based on these preliminary results and the need to double the SNR and spectral resolution in laboratory primates, from the 4.7 T field strength, analysis was conducted using 65 cm bore, 9.4 T system.

The macaque head measures approximately ½ the volume of an adult human head. While SNR and spectral resolution predict human results, the uniform RF field contours in the monkey head at 9.4 T do not indicate the B1 field in the human head of significantly greater electrical dimension. Predictions of human images at 400 MHz Larmor frequencies can be extrapolated upward from 7 T data, downward from 11.1 T images of fixed brains ex-vivo, or directly from head coil bench studies and numerical models at 400 MHz. Data from all four sources can be used to predict RF artifacts for images achieved by the conventional means of placing a human head inside a homogeneous, circularly polarized volume coil resonant at 400 MHz. These high frequency RF artifacts can be described as dielectric resonance. The artifacts can relate to regions of signal deficit in a brain image due to regions of destructive interference enhanced and exacerbated by the increasingly shortened wavelength of the incident RF (B1) field in the brain dielectric. Means for correcting these RF artifacts have been considered, including adiabatic excitation, dielectric lensing, and B1 shimming.

Materials and Methods

The 9.4 T magnet is installed in a facility designed to house it. Surrounding the magnet is a rectangular box shield comprised of 350 tons of welded plate steel 8" thick at the magnet center and tapering to 1" thick at the end plates. The end plates include a window and a door on the system user end, balancing a brass plate bulk head (patch panel) access on the opposite end. Also enclosing the magnet and incorporating the steel magnet shield is an RF enclosure (Lindgren RF Enclosures, Inc., Glendale Heights, Ill.) to isolate the magnet environment from outside signals by 110 dB at 400 MHz. Within the magnet are an asymmetric head gradient and shim set, also of Magnex design and manufacture. Subject access to the magnet is provided by a motor driven, cantilevered table (High Field NMR Systems, Inc, Birmingham, Ala.). Interfacing the magnet is a custom RF system featuring a multichannel, parallel transceiver system of in-house design. Sixteen 500 W RF power amplifiers are used for one example of the system. Controlling and processing the system data acquisition functions is a console. Specifications of the magnet, gradients, shims, and RF systems follow.

Magnet Subsystem

The 9.4/650 magnet (Magnex model MRBR 9.4 T/650) shown in FIG. C1 is a complete superconducting magnet system intended primarily for laboratory primate and human research. The system includes a highly homogeneous superconducting magnet (9.4 tesla) housed in a 650 mm horizontal room temperature bore, low-loss helium cryostat. Magnet field shimming includes using superconducting shim coils. Final shimming is performed with a small amount of passive shim material and very fine use of the room temperature shims. The system is also configured with twin cryo refrigerators to minimize helium consumption and to eliminate the necessity for a liquid nitrogen reservoir. The multi-coil, superconducting magnet is constructed with multi-filament NbTi conductor carrying 218 amps of current and wound on a machined former. Field drift is less than 0.05 ppm/hr. Field homogeneity over a 30 cm sphere with superconducting shims is +/−2.5 ppm, and with passive shims added is +/−1.5 ppm. The 5 gauss fringe field of this unshielded magnet extends to 20.2 m axially and 16 m radially from the magnet center. The magnet coils are protected from quench damage by a resistor and diode network in the helium reservoir. The superconducting shim coils are positioned on a non-conducting former surrounding the main coil in the helium reservoir. Each coil set is fitted with a super-conducting switch for persistent mode operation. The shim coils included are: Z1, Z2, Z3, X, Y, ZX, ZY, X2−Y2, XY, Z2X, Z2Y, Z(X2−Y2), ZXY. Each coil is rated to carry a maximum current of 25 amps. All shims are designed to be de-coupled from main coil.

FIG. C1.

Cryostat

The cryostat includes a central all-welded stainless steel helium vessel which is surrounded by two aluminum gas-cooled radiation shields. The cryostat measures 3.15 m long and 3.48 meters high with a 0.65 meter clear bore. It weighs 30 tons without cryogens. The complete assembly is contained in a stainless-steel outer vacuum vessel with a vertical service turret located centrally on top of the cryostat. The turret provides access to the helium reservoir for the demountable magnet leads, helium level probe, and helium transfer siphon. The system is equipped with two Leybold model 5100 2-stage cryocoolers with CP6000 compressor units. The helium reservoir contains 2500 litres of liquid helium with 1600 liters volume above the refill level. The liquid helium evaporation rate is 0.2 liters/hour, and the refill interval is six months.

Gradients and Shims

The 9.4 T, 65 cm bore magnet is fitted with an asymmetric, torque compensated, self shielded "head" gradient and shim set (Magnex model: SGRAD III 640/400/SP). The dimensions include 160 cm length, 64 cm o.d., and 40 cm i.d. with the isocenter displaced 18 cm from the utility end to give ample access for human head and laboratory primate imaging and spectroscopy. The peak operating voltage is 1 kV and the peak current is 500 amps with 180 A RMS. At 80% peak, the strength and 98% rise-time for X, Y, and Z gradients are 40 mT/m and 150 µs respectively. The water cooled gradients can dissipate 10 kW, ΔT=10K at a flow rate of 15 liters/min. To limit the vibration, the space between inner and outer gradients is filled with a "concrete" of epoxy resin and alumina aggregate. The gradient set includes an actively shielded Z0 shim for B0 correction, a set of high power, second order resistive shims, and a 24 tray passive shim system.

Console

A Varian console is interfaced to the 9.4 T magnet system and used to generate the data presented herein. The console configuration includes a Sun Blade 2500 as a host workstation to control the transmit excite signal and data acquisition through single proton frequency transmit and receive channels respectively. (Sun Microsystems, Inc., Santa Clara, Calif.). The console is configured to transmit and receive on 8 channels or 16 channels. Each of the multiple receiver channels is mixed to an intermediate frequency (IF) signal of 20 MHz and then oversampled at 64 MHz by 14 bit ADCs on Echotek ECDR-814 digital receiver boards for an effective 20 bits after filtering and decimation to a spectral width of 10 kHz. (Echotek, Inc., Huntsville Ala.). The digital receiver boards are housed in a VME64x card cage chassis with a Motorola MVME5500 single-board computer (Motorola Embedded Communications Computing, Tempe, Ariz.) as the bus master that runs control software under the VxWorks operating systems (Wind River, Alameda, Calif.). A second Sun Blade 2500 workstation was added to increase the data handling capacity to process and store the data from the multiple receive channels. Active diode protected, decoupling preamplifiers were used for the multi-channel TEM coil interface.

The console's single proton frequency transmit channel is split into multiple, parallel paths at the 1 mW level. Programmable phase shifters and attenuators are included in each transmit path to provide for console controlled phase and magnitude control for each channel. Each channel is then amplified by 500 W broadband amplifiers and independently switched in time by channel dedicated TR switches. Other details of the RF parallel transceiver system and applications follow.

RF Methods

Modeling

RF related artifacts are noted with human imaging at 7 T. At 9.4 T, XFDTD models of a human head inside a conventional inductively driven, circularly polarized TEM head resonator are constructed. The coil was of clinical standard 27.5 cm i.d. and generates a uniform B1 field in free space. When the NLM Visual Human male head was added to the model, the B1 field uniformity across the head was degraded as shown in the three center planes of the 3D model below. The patterns of non-uniformity are similar to those seen in 7 T, but more severe. These exploratory models and other data indicate that coils of conventional circularly polarized, uniform field generating volume coil designs as used at lower frequencies will be sub-optimal for use at 9.4 T. Other coil designs and applications methods are available.

FIG. C2.

Parallel Transceiver

Adjusting the relative magnitude and phase of independent current elements in a coil structure can be used to compensate for high field, RF artifacts by means described as B1 shimming. Controlling the phase angle and magnitude of the RF signal on separate coil elements can be accomplished using manual means such as trimming coaxial cable lengths and adding coax attenuators. These mechanical approaches to coil field control are laborious, time intensive, and do not lend themselves to feedback driven algorithms for interactive and automatic image optimization. To solve these problems an electronic, computer controlled parallel transceiver is used for the RF front end of the 9.4 T system.

The parallel transceiver schematized in FIG. C3 and photographed in FIG. C4 combines a multi-channel, parallel transmitter together with a multi-channel digital receiver into one integrated system. In FIG. C3, a low level, shaped transmit signal from the console is split into multiple, equal phase and magnitude signals. Each of the split signal paths can then be independently modulated via console control by programmable phase shifters and attenuators. Each of the independently modulated signals is next amplified by multiple, channel dedicated RF power amplifiers. Transmit-receive (TR) switches temporally isolate transmit from receive signals at each coil element. Each coil element interfaces a decoupling, digital receiver in this scheme. In static operational mode the phase and magnitude can be set to a fixed value. In the dynamic mode, phase and magnitude information is currently accessed from values stored in a lookup table and is changed on reception of an update trigger signal. Interfacing is done through 10/100 base T connectivity using TCP/IP access through an Ethernet port. In one example, separate transmit elements and receive elements are used. One example foregoes the RF signal source splitter and generate 16 shaped RF signals at the console. B1 field phase, magnitude, time, frequency, and spatial degrees of freedom are controlled at the coil by the multi-element control method. The present subject matter provides dynamic control of multiple coil elements for ultra high field human head imaging. Conversely, the short wavelengths of high field MRI applications facilitate these selective control at the coil.

FIG. C3.

RF Coils

Transmission line (TEM) coils can be used for high frequency RF coils. Independent TEM elements can be driven, received, and controlled with the parallel transceiver described above. Both linear and loop transmission line elements can be used with 400 MHz head coil construction. The linear element generates a flux vector typically parallel to the sample surface, and the loop generates a perpendicular vector. The linear element is shorter for a given coil length, and therefore electrically more efficient at high frequencies. The coil comprised of linear elements also generates a more uniform field, especially in the periphery of its volume. The current phase angles on the linear array mimic those of other TEM or birdcage coils, incrementally phased over 360 degrees to generate a theoretically uniform transverse field through the coil volume. In the loop array however, currents in adjacent element legs are in approximate phase opposition, resulting in severe phase gradients in the RF field near the elements of the coil. Accordingly, a TEM coil with linear elements demonstrated certain properties for the 9.4 T head coil design.

FIG. C5.

While RF non-uniformities can be actively controlled by methods described thus far, there are a number of considerations for the passive coil design. For the multi-channel TEM head coil design parameters include the length, i.d., o.d. and shape of the coil, the number, dimensions, and spacing of the TEM elements, the choice of dielectric material properties and dimension, the relative degree of coupling or decoupling between the elements, and the positioning of the head within the coil. The coil model of FIG. C6 gives examples of these criteria. The eight element coil model of FIG. C6a was configured to closely fit for strongest coupling to the head, and decoupling with neighboring elements. Also promoting the decoupling of neighboring elements is a thin layer of efficient, non protonated, high dielectric constant substrate such as Teflon. Teflon doubles the electrical distance between elements relative to air. Keeping the dielectric region thin further minimizes flux coupling between elements. The resulting coil is suited for high SNR, parallel imaging applications. RF uniformity suffers however due to steep B1 field magnitude and phase gradients and interference patterns close to the coil elements. RF artifacts are seen as the sharp, asymmetrically positioned field null in the upper left-hand quadrant of FIG. C6b. Conversely, greater RF uniformity can be had by spacing the elements further from the head and with a thicker dielectric region of lower dielectric constant as shown in FIG. C6c. The resulting B1 field is more uniform and symmetric as shown in FIG. C6d, though with greater mutual inductance between elements, and with less sensitive coupling to the head. Such tradeoffs are correlated to the applications requirements.

FIG. C6.

RF Safety 9.4 T is above the 8 T and one consideration is RF heating at 400 MHz. The limit for RF induced temperature elevation vs. RF input power vs. time was analyzed in a porcine model of the human head In vivo. For power settings of 12-20 Watts, temperature vs. time was directly measured by fluoroptic thermometry, and recorded for human adult sized farm pigs (50-100 kg). Anesthetized pigs were instrumented with fluoroptic probes inserted through burr holes over an array of model guided positions in the porcine scalp and brain. The pig was then fitted with a head coil of the design and dimension to be used in human studies. RF power was then applied at continuous wave (CW) power level increments starting at 12 W. The pigs' heads weighed approximately 4-6 kg, similar to human head and necks. Temperature vs. time was then recorded until the FDA guideline limit of 1° C. above core temperature was reached. See FIG. C8a. An approximate correlation can be made between monitored RF power and FDA thermal limits for 400 MHz power input to a human sized model with perfusion, metabolic heating, and the other thermo-regulatory reflexes intact.

RF Shimming

Data for programmable B1 phase and magnitude control are shown in FIG. C7. To acquire the images, an eight element TEM coil (FIG. C5b) was driven by eight channels of the parallel transceiver (FIG. C4). Behind TR switches, eight digital receivers are used as in the FIG. C3 configuration. To execute RF (B1) shimming, desired values for RF transmit signal phase and magnitude were programmed by entering them into a web table for the coil-transceiver channel matrix. This process could be interactive, or automated. Demonstrating this programmable B1 field magnitude control capability, FIG. C7a shows a 9.4 T FLASH image data set with TR/TE=50/5 ms, matrix=256×128, FOV=22×19 cm, slice thickness=5 mm. Each image in the FIG. C7a series shows a different gain setting, starting with the amplifiers disabled on the far left, and then incrementally adding equal gain to each element in a clockwise pattern until all channels are driven on the far right. The element phase angles traverse 360 degrees in equal increments to circularly polarize the coil. The images are constructed by simple sum-of-squares magnitude addition without intensity correction. Phase control is demonstrated in FIG. C7b. Driving all elements with iso-magnitude RF signal, the phase angles of all eight coils elements were set to iso-phase "0o" at the far left. Progressing to the right in FIG. C7b, incrementally increasing 45° phase angles were added to each element around the coil in clockwise direction until the coil was circularly polarized at the far right. The homogeneity (or other criteria) for these images can be further refined by algorithm and feedback driven optimization routines. Transmit magnitude and phase control per coil element can steer the B1 field for shortwave NMR.

FIG. C7.

RF Localization

As modeled in FIG. C2, 9 cm wavelengths in the human brain imaged at 9.4 T lead to pronounced B1 field contours and consequential image inhomogeneity. Controlling B1 field gradients over a volume allows for steering a constructively interfering field node to spatially correlate with an anatomic region of interest. Through control of these B1 field gradients images of selected regions of interest can be optimized for higher signal to noise ratios, lower power deposition (SAR), and other criteria. One such technique for localization of a region of interest was modeled in this study by the following methods.

The 16 element, multi-channel TEM head coil of FIG. C5c was modeled together with a cylindrical phantom of physiologic electrical parameters for 400 MHz. The coil measured 28 cm i.d.×34.5 cm o.d.×18 cm long, and the phantom centered within the coil was 20 cm diameter by 20 cm long. Maxwell solutions for the 3D model were numerically calculated by the finite element method (FEM). Simulations driving each coil element independently were first performed to determine the phantom response to individual drives. The B1 field at a point in the phantom due to nth current element may be broken into x and y components where the x component value is denoted $B1_{xn} = A_n e^{j(\omega t + \phi_n)} a_{nx} e^{jb_{nx}}$, where $A_n$ and $\phi_n$ represent the nth element's current magnitude and phase respectively, $\omega$ is the Larmor Frequency, and the term $a_{nx} e^{jb_{nx}}$ describes the remainder of the steady state geometrical phase shift and magnitude relation between the nth drive and the x direction B1 magnitude at a given point in the phantom. A similar equation can be written for the y component of the B1 field. The final x and y directional B1 field may then be calculated as the sum over n of B1xn. The overall field may be found from these two quantities. Using the finite element simulations, the quantities $a_{nx} e^{jb_{nx}}$ and $a_{ny} e^{jby}$ were found for each point on a grid in the phantom placed on the selected field of view and for each current element on the coil. With this information, field distributions were calculated from arbitrary elemental current magnitudes and phase angles. Next, was to determine each $A_n$ and $\phi_n$ to obtain a distribution approximating a desired distribution. To accomplish this a cost function was defined for a fit to the desired distribution and then an iterative optimization algorithm was applied. Such an approach was implemented and results obtained by using the simulated annealing approach. Simulation results in FIG. C8b show a convergence to an arbitrarily chosen, off axis B1 contour reached through current element phase and magnitude control.

FIG. C8.

Results and Discussion

B1 and B0 bio effects were monitored in terms of subject safety. For a given RF excitation sequence, increased energy is lost to the tissue conductor and dielectric due to the very short Larmor wavelength at 400 MHz, compared to lower field strengths. A consequence of this energy loss is RF heating, a potential safety concern. While no safety concerns were interpreted from subchronic exposure of rats to 9.4 T, the use of 9.4 T for human studies compels close observation of subject experience from exposure to this field. Results from initial animal models and human studies follow.

RF Heating

The FDA maximum temperature guideline limit of 1 μC. above core temperature is first reached in the brain where calculations have shown SAR and ΔT to be minimum. See FIG. C8a. Depending on the animal, between 2.4 and 4.0 W/kg RF power input to a head coil would require three hours or more to raise the temperature of the perfused pig brain to the guideline limit. See FIG. C8a. The time and temperature data taken together was considered. For example, 20 W RF power applied to the coil and head elevated the temperature in the brain by only 0.2° C. during a 30 minute time period more typical of an NMR scan.

Maximum absolute temperatures are measured in the brain with SAR and ΔT values modeled and measured to be minimum in the brain compared to the scalp. Although maximum temperature change might occur in the scalp, the scalp is well perfused and adjacent to an infinite, 22° C. ambient heat sink. The healthy normal thermal profile of a head, human or porcine, peaks in the brain which is maintained at core body temperature. When energy is added from a large surrounding head coil at a low rate such as in an NMR study, the subject's core temperature and thermal profile across a head is raised as if a fever. In a well perfused subject the absolute temperature first reaches the FDA thermal limit in the brain as opposed to the scalp. This response assumes low power input to the head from a uniform incident field inducing a heat load distributed and dissipated by healthy, normal, thermoregulatory reflexes.

9.4 T Experience

FIG. C8.

Imaging

Using the parallel transceiver and RF coils of FIGS. C3-C5, high frequency field optimization methods employing console driven, multi-channel RF field magnitude and phase shimming have been practiced to produce surprisingly homogeneous head images at 9.4 T. FIG. C9 shows 9.4 T gradient echo images acquired with the parallel transceiver driving an 8 element, multi-channel, transmit and receive, elliptical TEM head coil. The acquisition parameters were: TR/TE=40/5 ms, TI=1.55 sec, Thk=3 mm, matrix=256×128, SAR=0.4 W/kg. Simple magnitude addition was used to combine the images from eight receiver elements. Eddy current artifacts are observed in the coronal image. No intensity correction was applied to these images. Being low tip angle acquisitions, SAR was kept low. FIG. C10 shows a 9.4 T FLASH image, TR/TE=50/9 ms that contrasts the medulary veins, Virchow-Robins spaces, possible tracts and other features.

FIG. C9.

FIG. C10.

RF artifacts due to short brain and muscle tissue wavelengths of 7 T (12 cm) and 9.4 T (9 cm) MRI correspond to increasingly powerful RF shims and gradients used to localize ROIs and to optimize selected criteria therein by various RF protocols and feedback driven optimization algorithms. Shorter wavelengths allow steering of RF fields to targeted anatomies and acquisition mechanisms. A TEM coil is independently tuned (as opposed to monolithic birdcage resonators) becomes a solution for B1 field control because every element can be tuned to manipulate the B1 field component of each with high sensitivity. Implementation of phase and magnitude control is served by a multi-channel TEM coil interfaced to the parallel transceiver reported.

Conclusions

Preliminary results from initial 9.4 T studies indicate successful human head imaging at this field strength. A 9.4 T superconducting magnet of human bore size was developed. A parallel transceiver front end was used to give console control to new methods of RF shimming and parallel imaging. This transceiver is employed to the development of feedback driven, interactive and automated ROI targeting and image optimization algorithms. 9.4 T Larmor wavelengths significantly shorter than anatomic dimensions allow image localization and optimization.

A Parallel Transceiver for Human Imaging at 9.4 T

Objective: The present subject matter includes a parallel transceiver for automated B1 shimming and other applications at high field strength, including for example, 9.4 T.

Introduction: In ultra-high field MRI, the incident RF transmit field becomes non-uniform in human anatomy due to short wavelength interference patterns in tissues. The consequential image inhomogeneities can be at least partly compensated by B1 shimming. This is a process by which the RF field is actively controlled by adjusting the relative impedances (magnitude and phase) of independent elements in a coil structure. Control of the phase angle and magnitude of an RF signal can be conducted by RF shimming using manual means such as trimming coaxial cable lengths and adding coax attenuators. These mechanical approaches to coil field control are laborious, time intensive, and do not lend themselves to feedback driven algorithms for interactive and automatic image optimization.

The present subject matter includes an electronic, computer controlled parallel transceiver for an RF front end of a 9.4 T system for human studies and other applications.

Design: The parallel transceiver schematized in FIG. D1 includes a multi-channel, parallel transmitter with a multi-channel digital receiver. A low level, transmit (carrier) signal from the console is split into multiple, equal phase and magnitude signals. Each of the split signal paths is independently modulated via console control by programmable digital phase shifters and attenuators (FIG. D1). Each of the independently modulated signals is amplified by multiple, channel dedicated broadband solid-state RF Power Amplifiers (Communications Power Corporation, Hauppauge, N.Y.). The independently modulated transmit signals then pass through transmit-receive switches to their respective multi-channel coil elements. Receive signals from the same, or different, coil elements are fed to a multi-channel digital receiver. In one example, the programmable transmitter phase and magnitude information is accessed from values stored in a lookup table. Upon reception of an optional trigger signal, the phase shifters and attenuators are updated to the next values. The user can prescribe and review phase and magnitude settings through, for example, a web page interface or through a command language that can be scripted or incorporated into the spectrometer's software.

Results and Discussion: The parallel transceiver performance is shown in Table D1. Human head 9.4 T images acquired with this parallel transceiver are presented elsewhere. In one example, the present subject matter includes four degrees of freedom in RF control at the front end of the MRI system: phase, gain, frequency, and time. The 66 microsecond command cycle of this transceiver allows controlling phase and gain settings for interactive RF shimming. In one example, the system reduces time delay to four microseconds to facilitate Transmit SENSE, automated shimming and other high speed applications requiring on-the-fly waveform modulation and feedback control. The broadband power amplifiers and other system components allow for simultaneous or interleaved multi-nuclear applications, swept frequency methods, and other frequency dependent protocols.

Conclusion: The parallel transceiver of the present subject matter allows magnetic resonance operations using shorter Larmor wavelengths of ultra-high field MRI. In one example, with four new degrees of freedom at the RF front end, new algorithm and feedback driven protocols for high field imaging methods are used.

TABLE 1

Parallel Transceiver Specifications

| | | |
|---|---|---|
| RF Amp: | Power | 500 W/channel |
| | Channels | 16 |
| | Total Power | 8 kW |
| | Freq. Range | 30-405 MHz |
| Phase: | Range | 0-358.6° |
| | Resolution | 1.4° |
| Magn: | Range | 0-63.75 dB |
| | Resolution | 0.25 dB |
| Max. Table size | | ~600 steps |
| Reconfiguration time | | 66 µs |
| Digital Receiver speed | | 64 MHz |
| Intermediate Freq. | | 20 MHz |
| ADC depth | | 14 bits |

Ultra High Field MRI: High Frequency Coils

Abstract

The following is directed to RF volume, array, and surface coil modeling, design, construction, control, safety and human In vivo application examples for field strengths from 4 T to 9.4 T. While a variety of coils are included, some portions focus on the transmission line (TEM) technology head, body, surface, and array coils.

Introduction

High frequency coils are used with high field magnets for high signal MRI. High signal clinical MRI can be performed with magnets of 3 T (tesla) field strength. Magnets of 7 T, 8 T, 9.4 T and 11.74 T or greater field strengths can be used for research. Radio frequency (RF) coils are used to inductively couple to human anatomy at Larmor frequencies of 500 MHz (or more or less) to make these magnets useful. RF coil efficiency is inversely proportional to wavelength, both the wavelength of the coil circuit itself and the wavelength(s) of the media (air, plastic, anatomy, etc) through which the RF field propagates. To improve coil efficiency by minimizing its electrical wavelength dimension ($\lambda$), the physical dimension of the coil can be reduced, and/or the coil circuit elements can be more highly distributed. Practical considerations such as the image field of view (FOV), field homogeneity, count and control of transmit elements, count and control of receive elements, and RF safety features are applications dependent. Surface coils can be designed for more localized and topical applications such as imaging a superficial organ or tissue. By contrast, volume coils can be used to encompass a head or body for global imaging. Surface and volume coils can be tuned to two or more Larmor frequencies for multi-nuclear, metabolic imaging. Volume coils can be used to transmit a uniform excitation field, in combination with surface coils applied for receiving the excited NMR signal from a local region of interest with high sensitivity. Global FOV coverage and local sensitivity can be acquired by receiving with arrays of surface coils. Parallel reception from surface coil arrays can achieve imaging speed benefit as well. Multi-channel control over the coil transmit functions can be used to interactively or automatically control the nuclear excitation field in magnitude, phase, time, and/or frequency to effect a number of imaging optimization criteria.

RF Coil Losses

Increased signal-to-noise (SNR) and its dependent spatial resolution, temporal resolution and contrast, are among the chief reasons for performing NMR studies at higher magnetic field strengths. In theory the SNR increases to the power of 7/4 with field strength for "ideal" lossless samples. However, for biomedical MRI of lossy tissue, RF dependent losses, defined as energy dissipated or signal reduced, diminish the theoretical SNR $\sim B_1/\sqrt{R}$, where $B_1$ is the strength of the RF magnetic field generated by a unit current in the coil, and R is the effective resistance of the coil and load. In human studies SNR is thus reduced by decreasing the numerator while increasing the denominator in RF coils and in human tissues. Additionally, much of the coil generated RF energy is dissipated in the tissues as thermal energy. The potential safety risk of excessive heating is increasingly present at higher fields. One objective in high field coil design therefore is to reduce the RF tissue and circuit losses.

Increased SNR can be achieved by making NMR measurements at higher magnitude $B_0$ magnetic fields. However, magnetic field strength is only one of several parameters affecting the NMR signal-to-noise ratio. RF coil and tissue losses can limit the potential SNR gains to be realized at higher field strengths. SNR and transmit efficiency will suffer when any one of the parameters in the following proportionality is not optimized.

$$SNR \alpha (\omega^2 B_1)/\sqrt{(R_\Omega + R_r + R_{tissue})} \quad [1]$$

$R_\Omega$, $R_r$, and $R_{tissue}$ are the coil's ohmic resistance, radiation resistance, and coupled tissue losses respectively.

RF losses in the NMR experiment can be categorized as coil losses, and as tissue losses $R_{tissue}$. Coil losses can be further divided into resistive losses to the coil circuit $R_\Omega$, and radiative $R_r$ losses to the coil's field. Tissue losses result from $B_1$ field induced eddy current losses to the tissue conductor, and radiated E field displacement current losses to the tissue dielectric. The physical nature of these RF losses is presented in more detail following.

At higher frequencies the phase change due to the finite propagation velocity of transmit and receive signals on coil conductors is no longer negligible. As coils approach wavelength dimensions, the performance of the conventional lumped element designs succumb to 1) non uniform current distributions resulting in decreased homogeneity, decreased fill factor, and increased radiated field losses, 2) increased ohmic losses in the coil circuit inductors due to decreased 1/e skin depths, 3) increased dielectric losses in the coil circuit capacitors due to decreased conductance efficiency compounded by an increased requirement for series capacitance to achieve high frequency resonance, and 4) self resonance below the desired frequency of operation. An RF coil conserves energy in its circuit and its surrounding field. A typical coil loses some of its energy at the average rate of $P_{loss}$, the power dissipated to ohmic resistance $R_\Omega$ of the coil circuit, and to radiation resistance $R_r$ of the coil field. The peak RF current I in the coil loss equation [2] (in this section) below is measured at the coil's terminals. The equation applies reciprocally to transmit and receive conditions for the resonant coil whose reactance is tuned to zero at the desired Larmor operating frequency. The "Q" factor, used as a figure of merit for a resonant coil's efficiency, is defined by the ratio of the average energy conserved over the energy lost per cycle to $R_\Omega + R_r$. These two RF coil loss sources together with their impact on the NMR experiment is presented below.

$$P_{loss} = (I^2/2)(R_\Omega + R_r) \quad [2]$$

Coil Resistive Losses

The ohmic resistance $R_\Omega$ in the coil circuit is the sum of the real resistance of the coil conductor (inductor) $R_L$ and the real capacitor loss $R_C$. The $R_\Omega$ dissipates RF power $P_{\Omega\ loss}$ as heat in the coil circuit. Because RF currents tend to flow near the surface of a conductor, $R_{\Omega L}$ is dependent on the resistance $R_s$ of a coil conductor's surface area. For an arbitrary coil loop with wire length (, cross sectional perimeter $w_p$, conductivity $\sigma$, and permeability $\mu$, the ohmic resistance at the resonant frequency $\omega$, is given by, $$P_{\Omega\ loss} = (I^2/2) R_\Omega \quad [3]$$

$$R_\Omega = R_L + R_C \quad [4]$$

$$R_L = R_s(l/w_p) \quad [5]$$

$$\text{for, } R_s = \sqrt{(\omega\mu/2\sigma)} = 1/\sigma\delta \quad [6]$$

$$R_C = 1/(\omega Q C)$$

The skin depth $\delta$ is defined as the depth below the conductor surface at which the current density has decreased 1 neper below its surface value. By the relationships, $R_\Omega$ losses increase with $\sqrt{\omega}$, and $\omega$, for conductor and capacitor losses respectively. The consequences of this loss source for the NMR signal are a coil circuit wavelength (frequency and size) dependent erosion of both the RF transmit efficiency and received signal-to-noise. Ohmic losses of a head or body coil can be reduced by increasing the skin (surface) area and decreasing the inductance of the coil conductors. In a distributed circuit (vs. lumped element circuit), this resistance will contribute a diminishing fraction of the total loss accumulating with increasing field strength.

Coil Radiation Losses

The RF energy loss to the radiated field of the coil is termed "radiation resistance". This field loss is to the coil environment including loss to the human subject, the magnet bore conductors, and to free space. The radiated power can be broadly defined as the difference between the input power $P_{in}$ to the coil and the ohmic losses in the coil.

$$P_{r\ loss} = P_{in} - (I^2/2) R_\Omega \quad [7]$$

The general field equation describing the complex power lost (flowing out) through closed surfaces encompassing a coil is Eq. [8] in this section where the quantify $S = 0.5 E \times H^*$ is the complex Poynting vector.

$$P_{r\ loss} = 0.5 \|_s (E \times H^*) C ds \quad [8]$$

For an electrically small coil loop enclosing area S, the radiation resistance $R_r$ is found by calculating the power radiated using Eq. [9] in this section which can be shown to yield $$P_{r\ loss} = 10 I^2 (\beta^2 S)^2, \text{ for the phase constant } \beta = \omega\sqrt{(\mu\in)} \quad [9]$$

The radiation resistance $R_r$ for an arbitrarily shaped wire loop such as an NMR surface coil is then $$R_r = 2 P_{r r}/I^2 = 20(\beta^2 S)^2 \approx 31,200(S/\lambda^2)^2 \quad [10]$$

The radiation resistance for the cage type volume coil can be approximated by substituting $I = \Sigma_{n/2} I_0 \cos \theta$, into Eq. [10] in this section and the length-width product for S.

In equation [10] in this section the radiation resistance and associated losses of an NMR coil are proportional to $\omega^4$ and to $S^2$. For high field, clinically dimensioned NMR coils, $\omega^4$ and $S^2$ respectively can increase the coil's $P_{r\ loss}$. At higher NMR frequencies, clinical sized RF circuits begin to behave less like energy conserving coils, and more like energy radiating antennas. Decreased RF transmit power efficiency, increased RF power absorption in the human subject, and decreased signal-to-noise of highly radiative coils can potentially limit the efficacy of high field human NMR experiments. Problematic RF radiation resistance can potentially be decreased by TEM coil design. Such designs apply Transverse Electro-Magnetic (TEM) theory, also referred to as transmission line theory, to reduce high frequency radiation losses.

Coil-Tissue Losses

RF losses in the tissue loading the coil become even more significant at higher frequencies. Loss to the tissue conductor increases with frequency due to a proportional increase in tissue conductivity and resulting eddy currents. Loss to the tissue dielectric increases with frequency due to a proportional increase in displacement currents. The Larmor wavelength becomes significantly shorter in the tissue dielectric as well. At 128 MHz (3 T) the wavelength in high water content anatomy is on the order of 27 cm. At 300 MHz (7 T) this wavelength decreases to 12 cm. Consequently a homogeneous RF coil can no longer generate a uniform $B_1$ field in the head or body at higher the higher magnet field strengths. The high frequency coil's field propagation and losses in its human tissue load are described by the time-dependent field equations. A time-harmonic magnetic field $B_1/\mu$ in a lossy, anisotropic, inhomogeneous coil-tissue system can be described by the differential form of the Maxwell-Ampere Law:

$$\nabla \times B_1/\mu = J_c + \partial D/\partial t \qquad [11]$$

By Ohm's Law the current density $J_c = \sigma E$, and by Euler's Law the electric field displacement $\partial D/\partial t = \partial \in E/\partial t = j\omega \in E$ so that equation [9] in this section can be rewritten as:

$$\nabla \times B_1/\mu = (\sigma + j\omega \in)E \qquad [12]$$

The complex value of E can be written in terms of the magnetic vector potential A, and the electric scalar potential $\phi$, such that:

$$\nabla \times B_1/\mu = (J_e + J_d) = (\sigma + j\omega \in)(-j\omega A - \nabla \phi) \qquad [13]$$

Influencing the $B_1$ distribution and loss in human tissues loading the coil are the $B_1$ field induced eddy current density $J_e$, $$J_e = \sigma E = -j\omega A \qquad [14]$$

and the accompanying electric field displacement current density $J_d$ for tissue specific values of $\sigma$ and $\in$.

$$J_d = -j\omega \in E = \omega^2 \in A \qquad [15]$$

The sum and distribution of RF eddy current losses to the tissue conductor, and RF displacement current losses to the tissue dielectric, are determined by the total power loss density $P_{t\,loss}$, $$P_{t\,loss} = 0.5|_v(J \cdot J^*/\sigma)dv \text{ for } J = J_e + J_d \qquad [16]$$

Note that the displacement current density $J_d$ increases with $\omega^2$ compared to the eddy current density's $J_e$ linear proportionality with frequency. This is consistent with the observations of interfering wave phenomena (commonly though inaccurately referred to as dielectric resonance) for head images at high $B_0$ fields. In contrast to early concerns that $J_e$ would limit $B_1$ penetration and lead to excessive power absorption, $J_d$ related inhomogeneities and losses may dominate at fields of 3 T and higher in the human head and body, leading to $B_1$, SNR, loss and heating patterns not predicted by Biot Savart, quasi-static, or otherwise over simplified models.

Coil-Tissue Heating

As noted, sub-optimal SNR is not the only consequence of lossy coils. RF loss induced temperature contours in the human anatomy can be calculated by equating the total losses $P_{t\,loss}$ from the coil's RF field of equation [16] in this section to the bio-heat (perfusion) equation below. Table values can be used to supply tissue specific thermal parameters for perfusion rate R, tissue and blood densities $\rho$ and $\rho_b$, blood temperature $T_b$, blood specific heat $c_b$, and tissue thermal conductivity K. (28-30)

$$P_{t\,loss} = R\rho\rho_b c_b[T_b - T] - \nabla \cdot K\nabla T \qquad [17]$$

With the increased RF losses $P_{t\,loss}$ expected in higher field studies, the potential for excessive RF heating increases.

Coil Design

RF signal losses to the coil circuit and its magnet bore environment can be minimized by coil design. Similarly, RF field propagation and losses in the tissue load of the coil can be controlled by coil design. The RF field can be optimized over a region of interest for homogeneity, SNR, or other criteria. The specific absorption rate (SAR) and consequential RF heating can be reduced by proper RF coil design and excitation. Examples of coil designs and approaches to control RF loss and penetration for human biomedical applications from 3 T to 9.4 T and beyond are presented below.

Surface Coils

One approach toward limiting RF losses and controlling RF fields in high frequency applications is to limit the electrical length of the coil, for example, to less than $\lambda/10$. The electrical length of a coil can be limited by reducing its physical dimensions. So doing reduces the coil's ohmic and radiative losses (Eq. 3-10 in this section). The low inductance of a small coil also extends the upper frequency limit at which the coil will resonate. The most common small coil is exemplified by an LC circuit loop (FIG. E1a) whose current generates an RF magnetic dipole which inductively couples to a nuclear spin system for NMR excitation and reception of the FID signal. This coil is referred to as a "surface coil." While small loop coils ($\lambda < 2\pi\sqrt{(LC)/10\upsilon}$) are efficient at high frequencies, they couple to only superficial fields of view (FOV) of limited range. Series capacitance can be used to divide the loop into smaller resonant sections thereby reducing voltage node peaks and consequential E field radiative losses, and improving current and $B_1$ field uniformity around the loop. See FIG. E1b. Series capacitance can also increase the size or operational frequency of the coil by reducing the total capacitance achievable with common capacitor values. Summed series capacitance however can be lossy, each capacitor being both an E field radiator and a source of ohmic (conductance) loss. These losses add algebraically for the number of lumped capacitors and inductors used and are shown in FIG. E1b as "R". Single loop coils of this design of a few centimeters diameter are suitable for relatively efficient use at 7 T or above.

Surface Coil Tissue Losses

To better visualize RF tissue losses and resultant SNR, $B_1$ penetration, SAR, and heating from simple surface coils, Equations 11-17 are graphically solved for a simple, symmetrical model by the Finite Element Method (FEM). In the example a small, 7 cm diameter surface coil as in FIG. E1 can be used to acquire the human calf image in FIG. E2a at 4 T (170 MHz). The RF field propagation and loss phenomena for this simple experiment were calculated by the FEM and presented in FIG. E2b-h. The model constructed for this demonstration included a small, circular LC current loop adjacent to the bottom of a larger, two layer tissue load. The thin layer nearest the coil was assigned the frequency dependent, low relative permittivity ($\in'$) and low conductivity ($\sigma$) typical of skin and subcutaneous fat. The skull might also be considered a part of this layer for head models. The more extensive, upper layer was assigned the frequency dependent electrical parameters for high water content, high conductivity properties of muscle, or brain. Tissue specific, static and dynamic thermal properties were also assigned per Eq. 17 in this section. FIG. E2b shows the RF magnetic dipole "flux lines" generated by the iso-current coil model. This flux is presented as RF magnetic vector potentials in Webers. The shielding flux induced by the counter-rotating eddy and displacement currents in the muscle tissue is visible in this 170 MHz model. Increasing with frequency, this flux shielding tends to limit and distort the $B_1$ field penetration in tissue compared to the free space field profile. FIG. E2c,d, illustrate the eddy current density and the displacement current density log equipotentials, ($A/mm^2$), respectively. It can be seen here that both current sources generate distinct current patterns, with each having independent effect on the superposed $B_1$ field. In this model for an electrically small iso-current coil, both eddy currents and counter rotating displacement currents are generated in approximately the same region in the muscle layer. For this case, both tissue current sources generate shielding fields opposing the coil dipole. Displacement current losses to the tissue dielectric increase quadratically with frequency compared to a linear loss increase from dissipated eddy currents (Eq. 14, in this section). In this model displacement current losses approximately equal eddy current ohmic losses in magnitude. RF tissue heating can be attributed to ohmic losses of induced eddy currents and, at high frequency losses derive from displacement currents as well. The primary displacement current loss mechanism may be due to the lossy cyclic charging of cell membranes and tissue planes. FIG. E2e shows two log cycles of the $B_1$ field penetration, (magnetic flux density, $Wb/mm^2$) in the two layer tissue model. The practical, tissue dependent $B_1$ field penetration at high frequencies ranges between a radius and a diameter for a small coil (<$0.1\lambda$). The $B_1$ contours in FIG. E2e are nearly the same within the tissue and without at this range. Beyond a diameter however, the on-axis penetration tends to flatten due to shielding as the tissue RF skin depth is reached. Off axis field broadening also occurs. Note also the abrupt $B_1$ interface between low water and high water tissues where the permittivity steps by an order of magnitude.

Surface Coil Safety

The total tissue losses from the combined eddy current losses and the displacement current losses in the tissue model are plotted in FIG. E2f as power loss density contours (W/kg). This represents the power loss or specific absorption rate (SAR) used by the FDA to specify guidelines for RF safety assurance in the human MRI study. The MRI industry monitors this power loss to the patient (and coil) by means of negative feedback to automatically limit excessive RF power output from the power amplifier to the coil. Whereas the FDA guidelines specify both temperature and RF power loss (SAR) limits, commercial MRI consoles typically monitor average power loss only. The model shows that power loss is not uniform over the tissue volume, but is a very localized event for the surface coil application. In the four cycle log plot for the 170 MHz coil the power loss density can be four orders of magnitude higher at the coil elements than at coil center one radius away. RF safety concerns might more appropriately consider predicting and monitoring RF heating rather than the SAR. As the models in FIG. E2g,h illustrate, RF heating like the SAR is a localized event in tissue. However, thermal "hot spots" rarely occur in the same physical locations as do maximum SAR values. Because excessive temperature and not SAR, is the cause most directly linked to tissue damage, the local RF heating potential of a coil and its excitation protocol need to be known prior to high field human application. By equation [17] in this section, the power loss density (FIG. E2f) for the model was equated to temperature in perfused (E2g) and unperfused (E2h) tissues. The temperature models include an additional layer for the thermally insulating acrylic coil package. All layers were assigned table values for the appropriate electrical properties, thermal properties including perfusion rates, and physical properties. The top of the model was clamped to a constant 37° C. core temperature "plate". Physical dimension and mass were chosen to mimic a 160 pound human. The ambient boundary conditions were those of air at 22° C. Whereas the SAR contours (FIG. E2f) show highest magnitudes in tissue immediately adjacent to the small surface coil with a second intensity at the conductive muscle boundary, the highest temperature magnitudes are not spatially coincident with these maximum SAR values. The thermal hotspots were displaced into the tissue by a centimeter or two depending on the tissue parameters and frequency. Note that with a surface coil at high frequencies, this model predicts and measurements validate that it is possible to exceed local SAR guidelines without exceeding the average guidelines as monitored on the MRI system power meter. Further, it is possible to exceed local heating guidelines in tissue regions not easily monitored. RF safety for a surface coil study is improved by knowing the thermal contours in neighboring tissue for a given experiment. These loop models and conclusions can be used with loop elements of phased and parallel arrays for high field applications.

Arrays

The small surface coil maximizes SNR by minimizing RF losses. The electrically small coil circuit minimizes resistive and radiative losses. The small tissue volume to which the coil field is coupled limits tissue losses, but also limits the field of view. To extend the FOV while maintaining small coil efficiency, an array of small coils can be composed. In phased arrays (FIG. E3a) and parallel arrays (FIG. E3b), array loops or elements are mutually decoupled and operated as independent coils in typically multiple channel receiver configurations. Signal from these arrays is received in parallel, digitally detected at the RF or IF level, and then added by a variety of algorithms to render the desired image or other data format. A popular approach to coil design at all field strengths, arrays can be configured for and fitted to any surface or volume on the human body.

Mutual Decoupling

The loop elements for the phased array extend directly from FIG. E1. So that the tuned circuit elements may operate in close proximity without tight mutual inductance shifting the resonance frequencies of both coils off center, this inductance is reduced to or below the critical coupling value. This may be accomplished reactively through cancellation of over-critical inductance by inductive overlap (FIG. E3a) or capacitive bridging between loops in the array. Alternatively the elements of an array may be geometrically decoupled by orienting the element dipoles for critical phase cancellation, or by increasing the distance between array elements until critical coupling or less is reached. This distance, measured in wave lengths, can be manipulated by the dielectric constant of the substrate on which the array elements are assembled. Teflon for example with a dielectric constant of more that 2 will double the electrical spacing between elements packaged within a teflon substrate, allowing for more compact array structures and continuous FOV coverage between decoupled array elements. Non overlapping arrays such as depicted in FIG. E3b are suitable for parallel imaging applications benefiting from a minimum of FOV overlap between the array elements.

System Integration

Surface coils and arrays can be used as local, receive only coils together with more larger head or body transmit coils. In this arrangement, the small loop surface coil or array improves reception sensitivity (SNR) from a local region of interest (ROI). The larger head or body coil improves excitation uniformity over the same ROI, and beyond. Additional to mutual flux decoupling through reactive, geometric, or material means, most array receivers are temporarily decoupled from larger volume coil transmitters. The local receiver array is decoupled or detuned when a head or body coil is tuned for transmit. The receiver is then tuned, and the body coil detuned during FID signal reception. This switching between tuned and detuned states for receive and transmit coils is accomplished quickly and efficiently with PIN diode circuits imbedded in the coil circuit. (FIG. E4a). PIN diodes are electronic gates that can be switched "on" or "off" by switching bias voltages and/or currents to the diodes. The diodes are used to connect or disconnect a small circuit within a coil, tuned to present a high impedance to effectively "open" the receiver coil circuit when the transmit coil is tuned. To improve the SNR from the receiver and to facilitate imaging processing strategies, each receiver array element is interfaced to the MRI system through a tune and match network, for example, a phase shifter or phased line with diode protection, and a low noise preamplifier. (FIG. E4) Coupling between coils is reduced by using a low noise preamplifier and a transforming network between coil output circuitry and preamplifier. The circuit components can be nonmagnetic, miniaturized, and mounted in or very near to the coil circuit. Baluns in the coaxial RF signal lines from the array elements attenuate sheath currents due to unbalanced receiver coils and load dependent coupling between the coil elements.

Transmission Line (TEM) Coil Circuits

High frequency coil circuit design can include improving coil efficiency by reducing coil size. The resonant lumped element (LC) loop can be described as a surface coil and as an array element. This fundamental LC loop can be improved upon however, especially when larger coil dimensions are used such as in head or body coils at 3 T and above. For example, lumped element circuits can be replaced with distributed circuits in the form of transmission lines. Transmission line circuits can be used to limit radiation loss and to preserve current uniformity in circuits exceeding one tenth the wavelength of its carrier signal. When circuit length exceeds 0.1λ, use a transmission line.

Two or more parallel conductors capable of supporting a transverse electromagnetic (TEM) mode of energy propagation define a transmission line. Examples of TEM or transmission line circuits include coaxial lines, strip lines or micro strip lines, wave guides and other conductive cavities for which two or more walls can support the TEM mode. An RF coil for biomedical applications at 3 T and above can benefit from TEM design. In one example, an RF coil, includes a coaxial line cavity resonator such as that used for centimeter band radar applications. A transmission line resonator can be used for NMR. The following describes TEM or transmission line design and high frequency circuits.

The building blocks of an RF coil is shown in the circuits of FIG. E5. Series and parallel lumped element (RLC) coil circuits have respective open and short circuit transmission line analogues. The lumped elements of a conventional RF circuit become integrally distributed coefficient quantities in a transmission line or TEM circuit.

Lumped element circuit theory can be used to write equations for the time harmonic series and parallel lumped element circuits (FIG. E5a,b) in terms of R, L, C and the input impedance $Z_{in}$ and admittance $Y_{in}$:

$$Z_{in} = R + j(\omega L - 1/\omega C) \quad [18]$$

$$Y_{in} = j\omega C + 1/(R + j\omega L) \quad [19]$$

The resonance frequency f for each circuit is:

$$f = \omega/2\pi = 1/[2\pi\sqrt{(LC)}] \quad [20]$$

Transmission line theory is used to write analogous equations for the TEM circuits. For a voltage V, and current I, varying at angular frequency ω along a general transmission line, the input impedance is:

$$Z_{in} = V/I = (V_1 e^{-\gamma z} + V_2 e^{+\gamma z})/(I_1 e^{-\gamma z} + I_2 e^{+\gamma z}) \quad [21]$$

$$\text{for } \gamma = \alpha + j\beta = \sqrt{(R + j\omega L)(G + j\omega C)} \quad [22]$$

The parameter G is defined as the conductance, 1/Ω of the transmission line's dielectric layer. The phasors $V_1$ and $I_1$ propagate in the forward +z direction, while $V_2$ and $I_2$ are reflected in the −z direction. The propagation constant γ is the complex sum of the attenuation constant α, nepers/m and the phase constant β=2π/λ, radians/m. In the absence of reflected waves, the characteristic impedance $Z_0$ of a line is defined as:

$$Z_0 = V_1/I_1 = (R + j\omega L)/(\alpha + j\beta) = \sqrt{[(R + j\omega L)/(G + j\omega C)]} = R_0 \pm jX_0 \quad [23]$$

For high frequency, low loss, resonant lines where ωL>>R and ωC>>G, and the reactance $X_0$=0, $$Z_0 \approx \sqrt{(L/C)}, \alpha \approx R/2Z_0 + GZ_0/2, \text{ and } \upsilon \approx \omega/\beta 1/\sqrt{(LC)} \quad [24]$$

In the air dielectric transmission line the phase velocity υ=3.0(10$^8$), the free space velocity of light. The lossless coaxial transmission line's characteristic impedance can be specified by its outer conductor i.d.=2b, its center conductor o.d.=2a, and its dielectric material ∈ separating the two conductors.

$$Z_0 = \sqrt{L/C} = (\eta/2\pi)(\ln(b/a)) \text{ for } \eta = \sqrt{(\mu/\in)} \quad [25]$$

For the intrinsic TEM mode wave impedance η of the coaxial line, the typical permeability μ closely approximates that of free space, $\mu_0$=4π(10$^{-7}$), H/m. The permittivity ∈, of the free space (or air) dielectric is $\in_0$=8.854(10$^{-12}$), F/m. The input impedance for the general transmission line of length l terminated in $Z_T$ can be written:

$$Z_{in} = [Z_T + Z_0 \tan h((\alpha + j\beta)l)]/[1 + (Z_T/Z_0)\tan h(\alpha + j\beta)l)] \quad [26]$$

When $Z_T$=∞, the general open circuited line input impedance becomes:

$$Z_{in} = Z_0 \cot h((\alpha + j\beta)l) \quad [27]$$

The open quarter wave line (l=λ/4) shown in FIG. E5a is analogous to the series resonant circuit of FIG. E5a, Eq. [18]

in this section. When α=0, the lossless line approximation for the input impedance to the open line is:

$$Z_{in} = -jZ_0 \cot \beta l \quad [28]$$

For $Z_T=0$, the short circuited line input impedance is:

$$Z_{in} = Z_0 \tan h((\alpha+j\beta)l) \quad [29]$$

The shorted quarter wave line shown in FIG. E5b is analogous to the parallel resonant circuit of FIG. E5b, Eq. [19] in this section. For α=0, the lossless approximation for the input impedance to the shorted line is:

$$Z_{in} = jZ_0 \tan \beta l \quad [30]$$

Expansion of Eq. [29] by a standard identity gives:

$$Z_{in} = Z_0(\sin h2\alpha l + j \sin 2\beta l)/(\cos h2\alpha l + \cos 2\beta l) \quad [31]$$

Assuming $Z_0$ is real, the input impedance of a line segment will be real at all frequencies for which $\beta l = n\pi 2$, where n is an integer. The frequencies for which the shorted (or open) lines will be resonant are $$f_r = \omega_r/2\pi = \beta v/2\pi = nv/4l = n/[4\sqrt{l(LC)}], \, n \equiv \text{integer} \quad [32]$$

For the resonance frequency of a quarter wavelength (n=1) shorted (or open) transmission line segment, Eq. [32] in this section reduces to the analogue of Eq. [20] in this section where L and C are the distributed reactance coefficients for the resonant line segment. If line losses are attributed entirely to R, (G=0), the resonant $Q_r$ value for a section of low loss line terminated in an open or short can be shown to be:

$$Q_r = \beta/2\alpha = \omega_r L/R \quad [33]$$

TEM Surface Coil Examples

Examples of high frequency, transmission line surface coils are seen in FIG. E6. In FIG. E6a, semi-rigid coaxial line is used to form a double balanced, double tuned, 8 cm diameter surface coil for 4 T, 1H and 31P frequencies. This coil can be used in transmit and receive mode. A four element array using linear strip lines is shown in FIG. E6b. This 20×25 cm array includes four line elements using parallel copper conductors separated by 2 cm teflon dielectric, and capacitively tuned to 300 MHz with terminal chip capacitors. Two of these four element strip line receive arrays are employed together with a body transmit coil for body imaging at 7 T.

These examples open the question of the relative merits of a loop coil vs. a linear element coil. A FDTD model in FIG. E7 shows the RF magnetic field vectors of a single element of each type. In each model, the red colored horizontal base line represents the copper ground plane in the model. A Teflon dielectric is shown as the horizontal green layer in each model. Conductive strip lines, also red, are centered in the vector fields. There are two such strip line conductors in the cross section model of a loop, and one for the linear transmission line element. Both elements were excited with equal magnitude, 300 MHz signals. Both loop and line penetrate as deeply into the black space above them. The loop element vector field is broader, by two elements. Among the differences between the two is the vector phase in the FOV above the coils. The loop's dipole is perpendicular to a sample surface, the line's vector field is horizontal. Use of the loop and the line element together produces geometrically decoupled coils generating a circularly polarized field. Considerations for using each of these element types in arrays further discussed below.

Volume Coils

In one example, a surface coil or array for high field biomedical applications are receive only coils. Large head or body sized volume coils can be used for uniform excitation of the ROI to which the receiver is applied. In one example, a head coil operates in transmit and receive modes without an independent receiver. Head and body coil are relatively large circuits and include lossy electrical loads.

Birdcages

In one example a lumped element LC circuit, such as a high pass cage structure, such as the bird cage resonator are shown in FIG. E8a. The birdcage, having about twice the length of its diameter, is a highly homogeneous coil circuit. Locating capacitance in the end rings where they are in series with end ring currents, allows for very small net capacitances to be summed from readily available lumped values to elevate the resonant frequency of this circuit. The band pass bird cage circuit (FIG. E8b) is also contemplated. In one example shown, lumped capacitance is distributed in the axial elements "rungs" and in the rings. The conductors are made wide to minimize inductance and ohmic resistance. Some capacitors are placed in parallel to minimize conductance losses, and placed in series to improve current uniformity, to divide peak voltages thereby minimizing radiative losses and to achieve lower net capacitance making higher frequency resonance possible. The length of the coil is also shortened to achieve lower inductance, higher efficiency and frequency, and less load coupling at the expense of a reduced and less homogeneous FOV. The high frequency performance of high pass and band pass birdcage circuits is improved by the addition of a Faraday shield, thereby creating a multi-element coaxial transmission line of sorts with the combined structure. The combination of coil and shield can be tailored to achieve desired results. A Faraday shield between the coil and the gradients in the magnet bore can affect the coil's performance. By configuring the cage and shield together as a transmission line with characteristic impedance matched to load conditions, the shielded band pass birdcage can be used to achieve body images at 3 T and head images to 7 T.

TEM Volume Coils

An NMR coil, including a coaxial line cavity resonator is an example of a TEM design using transmission line principles. A shielded birdcage design can be viewed as a transmission line coil where its foil strip rungs (strip-lines or center conductors) define a load matched, characteristic impedance with its shield (ground plane or outer conductor). In one example, a TEM coil design can be used at frequencies for human head and body imaging at the high field strengths.

A TEM volume can be designed to resonate at high frequencies and with a large volume. The coil includes multiple, electrically short transmission line elements (FIG. E9b). As with TEM surface coils, these line elements can be coaxial, strip line or micro strip, waveguides, or other transmission line executions. Being both electrically short and shielded, these elements lose little energy to ohmic or radiation resistance compared to larger, more inductive, lumped element structures. Because this design can be built without lumped elements, capacitor losses can be low and the current on the elements highly uniform. And because this design is not dependent on end ring currents, there are no losses to end ring paths or to the non productive E and B fields they generate. Independent of inductive end ring return paths, the resonance frequency of the TEM volume coil is established by the resonance achieved by its individual short transmission line elements. Accordingly, a TEM volume coil of a given length can be built to arbitrarily large diameters without lowering its resonant frequency or circuit Q.

The independent line elements can be directly driven, inductively excited, or a combination of both. The line elements and the field generating currents they carry can be independently controlled as well. Each line current can be used as a transmit element, a receive element, or both. Independent elements can be switched on or off, tuned or detuned. The currents on each element can be independently modulated in magnitude, phase angle, frequency, or time. Points of attachment for these independent drive or control lines and circuits are marked A, B, C, on the drawing in FIG. E9a. This control at the coil provides for RF gradients and RF shimming for improving performance including SNR, SAR, homogeneity, etc. for a targeted ROI. This control may be preset, interactive, or automated through negative feedback. The TEM coil provides increased degrees of freedom in the high field NMR experiment.

By reactive decoupling of its elements the TEM coil effectively becomes a line element array. In this form it can be used for parallel imaging applications. Its SENSE performance improves with an increasing element count. A one dimensional reduction factor of approximately of 5.2 has been achieved with a 16 element coil and 6.3 with a 32 element coil TEM "array" for example.

Multi-Channel Coil Interface

The multi-channel TEM coil described above is the transducer of a more complex, multi-channel transceiver as depicted in FIG. E10. In this example, a low level, shaped transmit signal from the console is split into multiple, equal phase and magnitude signals. Each of the split signal paths can then be independently modified via console control by programmable phase shifters and attenuators. Each of the independently modulated signals is then amplified by multiple, channel dedicated RF Power Amplifiers. Transmit-receive (TR) switches temporally isolate transmit from receive signals at each coil element. Each coil element interfaces a decoupling, digital receiver. One example uses separate transmit elements and receive elements. One example foregoes the RF signal source splitter and generate 16 shaped RF signals at the console.

TEM Arrays

As with surface coils, transmission line approaches render both linear elements and loop elements. Both can be addressed as independent elements, one difference being that the linear element generates a flux vector parallel to the sample surface, and the loop generates a perpendicular vector. To describe the performance of line and loop elements as high frequency arrays, an eight element head coil is considered. (FIG. E11.) The linear element is shorter for a given coil length, and therefore electrically more efficient at high frequencies. The coil comprised of linear elements also generates a more uniform to the periphery of its volume. The current phase angles on the linear array mimic those of other TEM or birdcage rungs, incrementally phased over 360 degrees to generate a theoretically uniform transverse field through the coil volume. In the loop array however, currents in adjacent element legs are in approximately phase opposition. This results in severe phase gradients in the RF field near the elements of the coil.

To demonstrate, the two coils of FIG. E11 were built on equal sized teflon cylinders (15 cm long×23 cm i.d.×25 cm o.d.). The transmit and receive, gradient echo head images of FIG. E12 were acquired at 7 T. All pulse protocol parameters were controlled, and the same head was imaged. Homogeneity is better in the image acquired with the linear element coil compared to the image acquired with the loop element coil. The homogeneity is especially degraded in the periphery of the head for the loop array as predicted. The SNR (circled) of the loop array image appears to have suffered as well, possibly also due to phase cancellations (destructive interference).

TEM Coil Fields, Losses, and Safety

A Maxwell model of an eight element TEM coil with a three layer head model diagrams a discussion of RF fields and losses affecting the success and safety of human imaging with volume coils at high frequencies. The head model includes a layer for low water content, low conductivity skin, scalp, skull; a layer for high water content, high conductivity brain, and a layer mimicking the aqueous humor in the eyes. All layers were adjusted to frequency dependent electrical parameters and temperature dependent thermal parameters consistent with the conditions and tissue layers modeled at 170 MHz (4 T). The homogeneous coil was linearly excited to generate the non uniform $B_1$ field contour shown in FIG. E13b. This field profile, due to constructive interference of independent element field contributions coinciding in the center of the head and destructively interfering elsewhere, is typical of a high field head imaging. SAR contours are shown in FIG. E13c. Maximum SAR is shown in the conductive brain layer at the periphery of the head nearest the coil elements. Maximum temperature is reached in the center of the head however, where SAR is minimum. This result is not to be confused with maximum delta T, which occurs typically in or near regions of maximum SAR in the head periphery. Although maximum temperature change might occur in the scalp, the scalp is well perfused and adjacent to an infinite, 22 C ambient heat sink. Within the FDA guideline power limits, superficial head tissues do not reach or exceed the core temperatures of the head center. Therefore the normal profile of the head is similar to FIG. E13d. Added energy raises the whole profile proportionately, as would a fever. This response assumes low power input to the head from a uniform incident field inducing a heat load distributed and dissipated by healthy, normal, thermoregulatory reflexes.

Image Optimization by Coil Design and Control

Design

Ultra-high field head imaging can produce the signal-to-noise sought. As modeled in FIG. E13 above, inhomogeneity is caused by a $B_1$ field contour generated by field attenuation and interference in the head even though a homogeneous volume coil is used. These high field, radiofrequency related image nonuniformities are noted. FIG. E14a shows a FDTD head-in-coil model predicting the inhomogeneity observed in the 7 T head image of FIG. E14b. Signal loss, contrast loss, flip angle errors, unwanted echoes, and quantification errors are but a few of the consequences of this non uniform $B_1$ field. The following sequence of models, coil examples, and images demonstrates a coil design and control approach for improving image uniformity and other criteria at the high fields available for human MRI.

To mitigate the RF non-uniformity issue in high field imaging, "RF field shimming" techniques have been considered. The multi-channel TEM coil of FIG. E9 lends itself well to this approach. The impedance (magnitude and phase angle) of each element can be independently adjusted to establish sensitive control over the $B_1$ field with the coil. In the coil of FIG. E15 b, a $B_1$ field magnitude contour ($B_1$ gradient) was designed into the coil. This was accomplished by coil geometry, element-to-shield spacing, and specification of dielectric material between the inner elements (rungs) and the outer elements (shield). Both dielectric constant and physical spacing of the region ∈ in FIG. E9b determine the electrical distance between the rung and the shield of the TEM element. This electrical dimension controls both the transverse $B_1$ gradient in the coil volume and the mutual inductance (coupling) between the elements. Narrowing the dielectric space between the conductors and/or increasing the dielectric constant imparts a $B_1$ gradient to partially compensate the artifact of the image in FIG. E14. The rung element to shield spacing modeled in FIG. E15a shows the resultant $B_1$ gradient for a 16 element coil (E15b). The central receive sensitivity deficit $\Sigma B_1-$, (FIG. E16a) balances the transmit $B_1$ field peak $\Sigma B_1+$, (E16b). The $B_1$ field magnitude of this gradient can be further adjusted by changing the symmetry of the coil (e.g. to elliptical) to better fit the long axis of the head for example.

Control

The artifacts due to short tissue wavelengths of 7 T (12 cm) and 9.4 T (9 cm) MRI will be the increasingly powerful RF shims and gradients used to localize ROIs and optimize selected criteria therein by a new family of RF protocols and feedback driven algorithms only now being imagined. Each element of a TEM coil is independently tuned (as opposed to monolithic birdcage resonators) and becomes a solution for $B_1$ field control because every element can be tuned. Every element in the TEM coil can be independently controlled, driven and received unlike the endring-bound cage, although the homogeneity advantages of the cage structure are preserved. Implementation of phase and gain control can be performed with a TEM coil (FIG. E9) interfaced to the MR system by a parallel transceiver. (FIG. E10)

A programmable $B_1$ phase and gain control is shown in FIGS. E18 and E19 below. To acquire the images, an eight element TEM coil (FIG. E11) was driven by an eight channel parallel transceiver (FIG. E10) with 500 W per channel RF power amplification. The solid state RF power amplifiers are broad banded to facilitate the addition of programmable frequency shifters to the FIG. E10 system for multi-nuclear control (FIG. E20). Behind TR switches, eight digital receivers were used as in the FIG. E10 configuration. Phase and gain values were entered on a web table for the coil-transceiver channel matrix. Demonstrating this programmable $B_1$ field magnitude (gain) control capability, FIG. E18a shows a 9.4 T FLASH image data set with TR/TE=50/5 ms 256×128 22×19 cm thk=5 mm. Each image shows a different gain setting, starting with the amplifiers disabled on the far left, and then adding equal gain to each element, one at a time in a clockwise pattern until all channels are driven on the far right. The element phase angles traverse 360 degrees in equal increments to circularly polarize the coil. The images are constructed by sum-of-squares magnitude addition without intensity correction. Phase control is demonstrated in FIG. I8b. Driving all elements with iso-magnitude RF signal, the phase angles of all eight coils elements were set to iso-phase "0°" at the far left. Progressing to the right in FIG. E18b, incrementally increasing 45° phase angle were added to each element around the coil in clockwise direction until the coil was circularly polarized at the far right. Gain and phase control per coil element can steer the $B_1$ field for shortwave NMR.

High frequency coil optimization methods employing RF field gradients together with RF field magnitude and phase shimming can be used to produce fairly homogeneous head images at 7 T and 9.4 T. (FIG. E19.) The inversion recovery turbo FLASH image in FIG. E19a is an example from 7 T, where TR/TE=14/5 ms, TI=1.45 s, Thk=5 mm, and matrix=10242, with intensity correction. FIG. E19b shows a first 9.4 T gradient echo image from an 8 element TEM coil acquired by the parameters: TR/TE=40/5 ms, TI=1.55 sec, Thk=3 mm, matrix=256×128, SAR=0.4 W/kg. A 9.4 T FLASH image, TR/TE=50/9 ms nicely contrasts the medullary veins, Virchow-Robins spaces, possible tracts and other features is shown in FIG. E19c.

Multinuclear Coils

In addition to magnitude and phase angle, the independent TEM coil elements can be tuned to multiple frequencies for multi-nuclear imaging at ultra high fields. One method of tuning this coil for simultaneous operation at two or more frequencies is to tune independent elements to dedicated frequencies in a periodic pattern. For example, a dual frequency coil of 24 total line elements uses 12 even count elements tuned typically to the $^1$H frequency, alternating with 12 odd count elements tuned to the "X" nucleus Larmor frequency. This design approach enjoys a number of advantages. The double tuned TEM coil behaves essentially as two independent coils of the same form factor and field profile. Decoupling between circularly polarized $^{31}$P, $^{13}$C or $^{29}$Na and $^1$H Larmor operational modes at 3 T and 4 T for example typically exceeds 20 dB in a double tuned head coil. The dual tuned head coil couples to the same FOV at each frequency facilitating $^1$H shimming on the same volume from which X nuclei signal is acquired. The double tuned TEM head coil couples to the same FOV with approximately equal transmit efficiency and receive sensitivity at each frequency. The coil efficiency at each frequency approaches 90% that of a single tuned TEM coil at either frequency. Results from double tuned TEM head coils are shown in FIG. E20 below. TEM coils can be simultaneously tuned to three or more frequencies. The TEM coil can be mechanically or electronically switched between two or more frequencies as well. The means of frequency switching provides multi-nuclear facility for interleaved studies and for two or more frequencies in close spectral proximity such as $^{19}$F and $^1$H.

Actively Detuned Coils

The TEM coil can be actively detuned for use with local surface coils and receive arrays. In one example, imaging uses a larger volume coil, such as a body coil to uniformly excite a region of interest. A smaller "specialty" receiver coil, such as an array, can be used to maximize sensitivity from a localized region of interest. FIG. E21a shows a homogeneous head coil transmitter with a surface coil receiver. Use of a head coil rather than a body coil for a transmitter can conserve nearly an order of magnitude in RF transmit power required for some head imaging applications. FIG. E21b profiles the highest signal field of view to which the surface coil couples when used in transmit and receive mode. When the same surface coil is used in receive only mode together with the homogeneous transmit coil of FIG. E21a, the high SNR profile is extended. Alternatively, a smaller receive only surface coil would increase the SNR over the transmit and receive surface coil field of view of FIG. E21b. In addition to enhanced sensitivity, an array of surface coil receivers can be used to compensate the image intensity gradient observed in high field head images. As discussed earlier, destructive interference in the head periphery and constructive interference of the excitation field in the center of a head in a homogeneous volume coil results in a region of high image signal intensity in the head center. See FIG. E14. The sensitivity profile of phased or parallel receivers however favors the head periphery. The combination of a transmit volume coil and an array receiver coil can be therefore be used to acquire an image of more uniform intensity, if not uniform transmit field dependent contrast. See FIG. E21d. Similar results have been found with a shielded, band-pass birdcage at 4 T.

Body Coils

The TEM volume coil can be used as an ultra-high field body coil to 7 T and higher. Because the TEM coil can be viewed as an array of independent transmission line elements its achievable frequency and performance are dependent on the line elements and their geometric arrangement about a volume. The resonant frequencies achievable with TEM volume coils are independent of coil diameter because there are no inductive end rings limiting frequency and performance. Full sized TEM body coils can resonate at the Larmor frequencies for 8 T and higher. A number of degrees of freedom in coil control are another advantage of independence from "hard wired" end ring connections. The current elements of the TEM volume coil can be inductively driven, or capacitively driven by one or more signal lines. Because of increasing energy loss to large loads (e.g., body) at high frequencies, driving four or more elements is often required as demonstrated in FIG. E22. As with the head coil in FIG. E15b or the surface coil in FIG. E6b, individual TEM elements can be independently and interactively controlled in magnitude, phase, frequency, and time. Dynamic spatial adjustment of individual coil elements is adds another degree of control. The TEM elements may be reactively coupled or decoupled, and arranged or manipulated in a variety of geometries. These five degrees of freedom of control at the coil provide the capability to manipulate the $B_1$ field in these dimensions to compensate for high field problems such at $B_1$ inhomogeneity and excessive SAR, and to optimize performance criteria such as SNR for a targeted region of interest in the body.

Cardiac imaging at 4 T offers one example of how a high field problem is presented, and how it is then corrected by RF shimming. Human body dimensions are measured in multiple wavelengths at ultra-high fields. Accordingly, $B_1$ field penetration is highly non-uniform. RF related image artifacts result as exemplified by the sharp signal drop out in the right atrium shown in FIG. E23a. By adjusting the relative impedance (magnitude and phase) of the TEM elements, the RF field of the coil is manipulated to compensate for this artifact as shown in FIG. E23b.

At 7 T, body imaging artifacts become more severe. As the FDTD model in FIG. E24a and the images in FIG. E24b indicate, sharp RF gradient artifacts are observed. A number of approaches can be used to remove artifacts. The artifacts due to destructive interference and eddy current shielding can be removed from or minimized in local regions of interest by RF shimming with the body coil and signal reception with local receiver coils. Local transmit and receive arrays can couple well to local regions, and are more efficient than the body coil. Dielectric materials can be strategically placed to change the boundary conditions of the incident RF field. Coil geometry and placement gives more latitude in the possible solution set. Various anatomic regions can be safely and successfully imaged at 7 T with some combination of coils and approaches.

Conclusion:

RF coil solutions exist for various magnets and field strengths for human imaging. This includes 9.4 T and above. Human head and body dimensioned coils resonant at the highest Larmor frequencies for these magnets can be demonstrated using TEM (transmission line) design approaches and principles. Transmission line volume coils and arrays can be used separately in transmit and receive mode, and together where one coil excites a uniform field and the other receives from a localized area with high sensitivity. High frequency anatomic loading conditions require current control at the coil element level to compensate RF artifacts, minimize RF power requirements and to optimize NMR performance criteria per subject in localized regions of interest. This control is enabled by new programmable transceivers together with interactive feedback. In one example, a particular pulse sequence and automated optimization algorithm is used.

Impact of Coil Diameter and Number of Coil Elements on B1 Destructive Interferences with Stripline Coil Arrays at 7 Tesla.

Introduction

B1 transmit (B1+) inhomogeneity is a major concern at ultra high magnetic field. It has been shown that destructive B1+ interferences (DB1I) between complex B1+ vectors from coil elements result in "bright center, dark periphery" patterns in axial images of the brain with coil arrays at 7 T. The following example (with 1, 8 and 16 stripline coil arrays) illustrates how B1+ profile is impacted by altering a) the distance between the coil elements and the imaged sample and b) the number of coil elements.

Material and Methods

Experimental data were obtained at 7 Tesla (Magnex, Varian) with a 3 liter 90 mM NaCl sphere phantom (90 mM NaCl saline). Three cylindrical transceiver array coils were utilized, using 7 cm wide and 14 cm long stripline elements (StEl). Coil diameter and number of StEl were respectively 23 cm/8StEl, 23 cm/16StEl, 32 cm/16StEl. RF power was split with an 8-way or 16-way splitter, with incremental phases (45° or 22.5°). Signal was sampled with a multichannel digital receiver and magnitude images from all channels were summed together. We acquired B1+ calibration series consisting in 12 TurboFlash images with a preparation RF pulse (PP) of increasing duration. Additional experiments were performed with a single StEl positioned at 0 cm, 2.5 cm or 7 cm from the phantom.

In all experiments StEl were used both for transmission and reception. Simulation data were obtained with XFDTD software (Remcom, Pa.). Model designs reproduced the 3 coil arrays used with the phantom (permittivity 80, conductivity=1.17 Siemens/m) as well as an 8 channels, 32 cm Ø coil. For each coil, 2D Complex B1+ profiles were generated for each individual StEl. Those complex profiles were then combined either as Sum of Magnitude (SOM) or as Magnitude of Sum (MOS). In MOS, the sum of complex profiles allows to reproduce the DB1I which occur when pulsing through all StEls, while in SOM B1+ magnitude profiles are added as positive scalar, which does not reflect the experimental reality. The Ratio MOS/SOM estimates the amount of destructive B1+ interferences: it equals one without DB1I, and falls within the range [0,1] with DB1I.

Results and Discussion

Simulated Data

Overall (FIG. F1), strong DB1I are present in the periphery with all coil combinations, but: a) for a given number of StEls, DB1I are significantly more homogenous in the periphery for the larger coil than for the smaller. b) for a given coil diameter, DB1I are more homogeneous in the periphery with 16 rather than with 8 StEls. Combined together, those effects considerably reduce the variation of B1+ at various angular positions for a given radial position in the phantom periphery. In FIG. F2, B1+ phase and magnitude for a single coil element (on the right side in FIG. F2 display), at different distances from the phantom (d=2.5 cm or 7 cm) demonstrate a smoother pattern in phase (as well as in amplitude), when the StEl is further away from the phantom, consistent with the smoother destructive patterns with larger diameter coils.

Experimental Data

Experimental data confirm with Flash images obtained with a single StEl (FIG. F3), that the signal pattern becomes smoother as the coil/sample distance (d) increases. FIGS. F4, F5 and F6 demonstrate with a phantom the smoother DB1I pattern in the periphery with more numerous StEls and with larger coil diameter (image signal is nulled[1] when RF PP reaches 90°+n*180°).

Discussion

Our investigation demonstrates, at 7 Tesla, experimentally as well as with simulated data, that larger diameter head coil arrays as well as more numerous coil elements result in much smoother patterns of B1 destructive interferences in the periphery of a phantom (even though those destructive interferences still have large amplitude). The determination of how such geometric properties can be integrated into global RF shimming approaches is valuable, and includes multiple levels of correction: coil design, RF phase/amplitude modulation for each coil elements, multidimensional RF Pulses, Transmit SENSE.

Region of Interest Localization Through B1 Field Tailoring

Nine centimeter wavelengths in the human brain at the 400 MHz Larmor frequency for 9.4 T lead to pronounced B1 field contours and consequential image inhomogeneity. The B1 gradients can be controlled over a volume, and thus, allow steering of a constructively interfering field node to spatially correlate with an anatomic region of interest. The present subject matter includes independently controlling the phase and magnitude of TEM current element in a transmit head coil to target a local region of interest with a desired B1 distribution.

Background

For high field MRI, the degradation of B1 field homogeneity is a problem that affects image quality, among other things. Through control of the field gradients, images of selected regions of interest can be optimized for higher signal to noise ratios, lower power deposition (SAR), and other criteria.

Field control measures can be applied to achieve increased homogeneity and provide localization. The present subject matter describes a specific technique for localization of a region of interest. The present subject matter has been verified with simulation, and will be empirically validated.

Methods

A 16 element 9.4 T head TEM coil used in the laboratory has been drawn and tuned to approximately 400 MHz by the finite element method (FEM). Simulations with a centrally located cylindrical phantom were performed. The coil rung to rung diameter is 28.8 cm, shield diameter 34.5 cm and rung length 17.8 cm. The phantom diameter is 20 cm, length 20 cm, relative permittivity 81 and conductivity 2 S/m. Simulations with each rung driven independently were performed to determine the phantom response to individual drives. The RF field (B1) at a point in the phantom due to nth current element is broken into x and y components where the x component value is denoted B1 $xn = A_n e^{j(\omega t + \phi_n)} a_{nx} e^{jb_{nx}}$, where $A_n$ and $\phi_n$ represent the nth element's current amplitude and phase, $\omega$ is the Larmor Frequency, and the term $a_{nx} e^{jb_{nx}}$ describes the remainder of the steady state geometrical phase shift and amplitude relation between the nth drive and the x direction B1 magnitude at a given point in the phantom.

A similar equation can be written for the y component of the RF field. The final x and y directional B1 field can then be calculated as the sum over n of B1 xn. The overall field is found from these two quantities.

Using the finite element simulations, the quantities $a_{nx} e^{jb_{nx}}$ and $a_{ny} e^{jb_{ny}}$ are found for each point on a grid in the phantom placed on the selected field of view and for each current element on the coil. The linear $a_{ny}$ and $b_{ny}$ values extracted from simulation are shown in FIG. G1. The values within the load are of primary interest but values throughout a slice of the simulation space are shown. With this information, field distributions may be calculated from arbitrary elemental current amplitudes and phase. Finally each $A_n$ and $\phi_n$ is chosen to obtain a distribution approximating a desired field contour. One way to accomplish this is to define a cost function for the distribution fit to the desired field, and to apply an iterative optimization algorithm.

Results

Simulation results in FIGS. G2.1-G2.8 show a convergence to an arbitrarily chosen, off axis B1 contour reached through current element phase and magnitude control. Successively improving matches as calculated by sum of least squares difference are shown sequentially in steps 1 through 8 shown in FIGS. G2.1-G2.8 respectively, demonstrating the algorithm's convergence to a solution improvement as compared with a uniform field.

Conclusions

The feasibility of automated B1 field localization of anatomic regions of interests has been demonstrated. A new technique for independently controlling the phase and magnitude of TEM current elements in a transmit head coil to target a local region of interest with a desired B1 distribution has been provided.

Some Notes.

An example of the present subject matter uses information about the phase variation of the receive sensitivity profiles of individual coils over a specified region, and the SNR of individual coils over that region, in order to calculate target variations in the phase and amplitude of B1+ to improve the resulting SNR when the receiver channels are properly combined.

After this target variation is calculated, the B1+ transmit maps are used to calculate the phase and magnitude of individual coils required to achieve this phase. In one example, the present subject matter includes varying the waveforms of individual elements with or without concurrent B0 gradients to achieve the target variation of B1+.

An example usage includes Single Voxel Spectroscopy with larger voxels. In SVS, the phase of the spins from the entire volume are averaged together by each coil. Then each coil is phased and combined by weighting the individual signals by their respective SNR. Voxel position determines which coils have better SNR. The goal is then to produce a phase variation across the voxel during transmit that will counter the destructive phase combination that is experienced during receive.

B1 Destructive Interferences and Spatial Phase Patterns at 7 T with a Head Transceiver Array Coil RF behavior in the human head becomes complex at ultrahigh magnetic fields. A bright center and a weak periphery are observed in images obtained with volume coils, while surface coils provide strong signal in the periphery. Intensity patterns reported with volume coils are often loosely referred to as "dielectric resonances," while modeling studies ascribe them to superposition of traveling waves greatly dampened in lossy brain tissues, raising questions regarding the usage of this term. The present subject matter includes a transceiver coil array used in volume transmit mode, multiple receiver mode, or single transmit surface coil mode. An appropriately conductive sphere phantom shows destructive interferences are responsible for a weak $B_1$ in the periphery, without a significant standing wave pattern. The relative spatial phase of receive and transmit $B_1$ proved remarkably similar for the different coil elements, although with opposite rotational direction. Additional simulation data closely matched the phantom results. In the human brain the phase patterns were more complex but still exhibited similarities between coil elements. The results suggest that measuring spatial $B_1$ phase can help, within an MR session, to perform RF shimming in order to obtain more homogeneous $B_1$ in user-defined areas of the brain.

With the advent of ultrahigh magnetic field (UHF) human scanners (4 T and higher), RF interactions with the human body become a critical challenge as RF wavelength approaches the size of the target object. Unlike at lower fields, human head images acquired at 7 T with a volume coil display a much stronger $B_1$ magnitude and signal intensity in the center than in the periphery. This is not a direct consequence of coil design or geometry because the same volume coil, when empty, produces a uniform magnetic field. Surface coils, on the other hand, provide at 7 T a bright signal in the periphery (close to the coil) that decays toward the center, as is observed at lower magnetic fields, albeit with a different spatial profile. Interferences between dampened RF traveling waves may be responsible for the characteristic image intensity distributions in the brain at UHF. The present subject matter considers the significance of dielectric resonances or standing waves for the characteristic nonuniform signal intensities observed with transmit RF volume coils at ultrahigh magnetic field.

Multiple channel transmit array coils can be used to develop "RF shimming" techniques aimed at counterbalancing the typical, strong transmit $B_1$ inhomogeneities at UHF, or multidimensional RF shaping with transmit SENSE. Some of the designs used for building such arrays produce multielement coils that are virtually identical in construction to volume coils most frequently used in UHF human head imaging except that the multiple elements are now highly decoupled. These array coils provide the opportunity to examine the $B_1$ phase pattern of individual coil elements in order to better understand the global $B_1$ profile generated in the corresponding volume coil.

RF penetration in the human head at UHF has been noted with volume coils or with surface coils. Such data can be obtained with a single transmit channel applied to the coil at one, two, or four ports and a single receiver channel (signal from all coil elements being merged hardware-wise experimentally or in simulations). This has been the case even when utilizing coils made out of multiple elements such as TEM and quadrature surface coils. It is feasible to use transceiver array coil at UHF when not considering the issue of coil-specific spatial phase profiles in RF transmission and reception.

In the present subject matter, in a 7 T field, the RF interferences between coil elements in a volume coil are considered, with an emphasis on $B_1$ spatial phase distribution. An eight-channel transceiver coil array was used that allows the use of an identical coil structure as a volume transmit coil, multichannel receive coil, or multiple single transmit surface coils, making possible a direct comparison between transmit and receive $B_1$ profiles. Comparisons are made both in phantoms and in the human head. Experimental results compare favorably for 300 or 64 MHz.

Rationale

Transmit and Receive $B_1$ Fields

The elliptical RF magnetization inside the sample can be written as $$\hat{B}_1^+ = (\hat{B}_x + \hat{B}_y) \div 2 \qquad 1$$

$$\hat{B}_1^- = (\hat{B}_x - \hat{B}_y)^* \div 2, \qquad 2$$

where $i=\sqrt{-1}$, $\hat{B}_1^+$, $\hat{B}_1^-$, $\hat{B}_x$, and $\hat{B}_y$ are complex vectors (as identified with the circumflex accent), and the symbol * indicates the conjugate of a complex quantity. Consider that $\hat{B}_1^+$ is in the direction of the nuclear precession, so that it is the component that determines the excitation. Consider a rectangular, constant amplitude RF pulse of duration $\tau$, the RF flip angle is $V|\hat{B}_1^+|\gamma\tau$, where V is a dimensionless scaling factor proportional to the coil driving voltage, and $\gamma$ is the gyromagnetic ratio. The measured image signal intensity (SI) also depends on the local receive field $\hat{B}_1^{-*}$, so that $$SI \propto \rho|\hat{B}_1^{-*}|\sin(V|\hat{B}_1^+|\gamma\tau), \qquad 3$$

where $\rho$ is proton density. SI and $\hat{B}_1^+$ are a function of space, i.e., x and y when considering an axial slice. Image signal has a sinusoidal dependence to $B_1^+$ and a linear dependence to $B_1^-$ (where $B_1^+ = |\hat{B}_1^+|$ and $B_1^- = |\hat{B}_1^{-*}|$). Differences in spatial distribution between $\hat{B}_1^+$ and $\hat{B}_1^{-*}$ become significant at high magnetic field and result in spatially distinct transmission and reception profiles.

Transmission Versus Reception

During signal reception, the MR signal from one source is seen by multiple detectors and single versus multiple channels data sampling strategies affect signal detection efficiency. Sampling each coil element on a different digital receiver, rather than hardware-wise merging those voltage sources before sampling, avoids $B_1$ cancellation between signal sources exhibiting unbalanced differences in phase.

When using RF transmission through all coil elements, which constitutes a single volume coil transmission, RF from multiple sources (each coil element) are merged at each point in the sample. Thus, there is a unique merged transmit $B_1$ seen by the sample while there are as many distinct receive $B_1$ components as the number of receive coil elements. However, since the principle of superposition dictates the resultant $B_1$ field of multiple element coils, the sum of individual receive $B_1$ patterns of each element must reproduce the effect of using the array coil as a single volume coil receive as well.

For the eight-channel array coil used in this example, to mimic numerically a "single volume coil receive," a complex addition of the data recorded from the eight receive channels is performed with an appropriate phase shift for each coil element. Alternatively, merging the individual coil elements can be done hardware-wise by using RF combiners with appropriate cable lengths. The result can then be compared with the sum of the eight individual magnitude images obtained with the eight different receivers. This comparison provides information on the spatial patterns of signal addition or cancellation in the single volume coil receive mode due to the reception profile of each element in the coil.

For RF transmission, however, the analogous flexibility does not exist. It is easy to achieve the single volume coil transmit mode by dividing the RF power into eight transmit lines with an RF splitter, with proper cable lengths to adjust the phase of each coil element. However, the transmit $B_1$ fields generated by each coil element cannot be summed as magnitude quantities in a single excitation because transmitting through more than one coil element involves summation of complex transmit $B_1$ vectors. Still, it remains possible to transmit through one coil element at a time in a "single surface coil transmit" mode and acquire the resultant signal through all coil elements in a "multiple receiver coil" mode with the eight digital receivers. This way, pulsing each coil element alone, individual transmit profiles are obtained over the entire sample and their magnitude can then be summed to perform indirectly a comparison with the volume transmit coil mode.

Materials and Methods

Hardware

Experiments were performed with a 90-cm-bore magnet operating at 7 T (Magnex Scientific, Abingdon, UK), driven by a Varian Inova console (Palo Alto, Calif., USA). As for the coil, it is an eight-element linear stripline array of 16 cm length, constructed on a 12-mm-thick cylindrical Teflon substrate. For RF excitation, a single 8-kW RF amplifier was used (CPC, Brentwood, N.Y., USA), and the RF power was split with equal amplitude and phase with an eight-way power splitter (Werlatone, Inc., Brewster, N.Y., USA). Further transmit phase increments of ~45° between neighboring coil elements were obtained by cable length adjustment in the transmit path. Performance can be demonstrated using an eight-channel digital receiver system that was developed in house, based on an Echotek (Huntsville, Ala., USA) ECDR-814 board oversampling the 20-MHz IF at 64 MHz and 14-bit resolution, with digital band pass filtering.

Phantom Data

Performance was demonstrated using a spherical flask of 3 liter capacity, filled with 90 mM NaCl solution in water. Note that a mixture of NaCl can match the average conductivity but not the average permittivity of the brain at 7 T. There is a tradeoff based on coil behavior: with 90 mM NaCl, coil loading (and thus tuning and matching adjustments) approximates that which is observed with a human head.

In this example, data were obtained in an axial slice crossing the center of the phantom. The center of the spherical flask was positioned close to the isocenter of the gradient coil. At the beginning of the session, shimming was performed for X, Y, Z, and Z2 with the FASTESTMAP technique and the reference resonance frequency was determined at the center of the phantom. Transverse axial images crossing the center of the phantom were obtained with TE/TR=5 ms/1 s, flip angle=15°. Measurement of noise was performed with same imaging parameters, except RF pulsing was blanked.

$B_1$ Mapping

Transmit $B_1$ profiles were mapped using magnetization preparation followed by ultrafast gradient recalled echo imaging. Magnetization preparation was accomplished with a variable-duration rectangular pulse ranging from 0 to 3000 μs (300-μs steps). Imaging parameters were TR/TE=18 ms/5 ms, FOV=25.6×19.2 cm², matrix=256×64, flip angle=3° (in phantom center). Images were acquired 16 s apart.

The transmit $B_1$ was mapped under two conditions: first, transmitting through the eight coil elements simultaneously, the "volume coil transmit mode," and second, transmitting through one element of the coil at a time, the "surface coil transmit mode." In both cases signal was received through eight channels. The surface coil transmit mode was repeated for each of the eight elements, resulting in eight different $B_1^+$ maps. When transmitting through one channel only, the power output of the RF amplifier was reduced by 9 dB (~eightfold reduction) in order to maintain the same final RF power delivered to a single coil element to achieve the same $B_1^+$ amplitude per coil element as in the volume coil transmit mode. Also, each transmit side of the other seven transmission/reception (T/R) switches was terminated with a 50-Ω terminator in order to maintain coil characteristics as closely as possible (match, tune, and coupling) between volume coil transmit and surface coil transmit situations.

Once $B_1^+$ maps are obtained, receive $B_1$ profiles can be derived from a GE image acquired with a known nominal flip angle. In order to do so, one additional GE image (TR/TE=1000 ms/5 ms) was obtained with the flip angle set to 15° in the center of the phantom.

$B_0$ Mapping

GE images were obtained at two different echo times (6 and 10 ms) in order to map the $B_0$ field.

Human Data

Human data were acquired. For human experiments, the coil was squeezed into an elliptical geometry (20 cm short axis, 24 cm long axis) in order to reduce heterogeneous distances between coil elements and the volunteer's head. Standard axial gradient echo images were obtained, transmitting through all eight elements (volume coil transmit mode), collecting data on the eight separate channels (receiver array).

Simulations

XFDTD software version 6.0 (Remcom, State College, Pa., USA) was used to perform simulation of $B_1$ field distributions in the sphere phantom at 300 MHz. All simulations were run with an Intanium-2 1.6-MHz processor (Intel Corp., CA, USA) hosted at the Minnesota Supercomputing Institute (University of Minnesota). The XFDTD software utilizes a finite difference time domain method to solve Maxwell's equations. The coil model design reproduced the transmission line coil array used in the experiments. The phantom model, a 3-liter sphere, was assigned permittivity ($\in_r$) of 80 and conductivity (σ) of 1.17 Siemens/m. Those numbers were interpolated from the literature for a saline solution of 90 mM at 300 MHz. Software calculations were obtained with a single coil element transmitting RF power, in order to reproduce comparisons performed with the phantom where either magnitude or complex data from coil elements were merged (see data analysis). $\hat{B}_1^{-*}$ and $\hat{B}_1^+$ maps (the lower tilde indicates simulated data) for one coil element were derived from $B_x$ and $B_y$ values generated by the XFDTD software and then properly combined as in Eqs. [1] of this section and [2] of this section. The resulting maps were then duplicated in order to get eight channel data sets, each of them subjected to in-plane rotation of appropriate increments of 45° in order to generate eight coil elements simulations (as obtained experimentally). Additional calculations were also performed with the frequency set at 64 MHz in order to reproduce 1.5 T conditions. Only steady-state values obtained in an axial slice crossing the center of the sphere were considered for this example.

Data Analysis

Prior to calculation, all data were rescaled to account for variable gain level between channels, derived from the noise SD acquired from each channel while RF power was blanked.

Relative Intensity Profiles

Assign $\hat{p}_{r,j}$ as the complex value signal obtained with coil element j in spatial coordinate r. In order to simplify the formalism, the subscript r will not appear in most of the mathematical expressions; thus, $\hat{p}_j$ will be used instead.

Relative intensity images (RI) maps were obtained as $$RI_j = |\hat{p}_j| + \sum_j^N |\hat{p}_j|. \qquad 4$$

Rooted sum of squares (RSS) and normalized rooted sum of squares (NRSS) were computed as $$RSS = \sqrt{\sum_j^N (|\hat{p}_j|)^2}, \qquad 5$$

$$NRSS = \sqrt{N \sum_j^N (|\hat{p}_j|)^2}. \qquad 6$$

The latter provides pixel values similar to the sum of the magnitude of each channel in the center of the phantom where all channels are expected to contribute for approximately the same amount of image intensity with equal phase.

For example, considering that in the center of the sample each coil $j \in [1, 2, \ldots, 8]$ contributes the same signal intensity $S_j=1$, then sum of magnitude is $\Sigma_j |S_j|=8$, root of sum of the squares is $RSS=\sqrt{\Sigma_j(|S_j|)^2}=\sqrt{8}$, and the normalized version is $NRSS=\sqrt{N\Sigma_j(|S_j|)^2}=8$.

Merged Versus Nonmerged Data

In order to evaluate the amount of signal cancellation due to phase differences between complex signals of different coil elements for a given pixel, we computed the sum of magnitude (SOM) of each coil complex image, $$SOM = \sum_j^N |\hat{p}_j|, \qquad 7$$

as well as the magnitude of the sum (MOS), $$MOS = \left| \sum_j^N \hat{p}_i \right|. \qquad 8$$

The ratio between SOM and MOS can be used to compare the two corresponding maps. Such comparison ratios between magnitude and complex sums were also calculated, although indirectly, for receive $B_1$ field maps and for transmit $B_1$ field maps.

Magnitude $B_1$ Mapping

For each pixel, SI modulation as a function of $\tau$, duration of the magnetization preparation pulse, is explained with $$SI(\tau) \propto M_{z0} \cos(V_0 |\hat{B}_1^-| \gamma \tau), \qquad 9$$

where $M_{z0}$ is the longitudinal magnetization at equilibrium. $|\hat{B}_1^+|$ maps were obtained by fitting SI modulation with a cosinusoidal function. First, calculate $|\hat{B}_1^+|$ when transmitting through all eight channels (volume coil transmit mode), and then calculate $|\hat{B}_{1,k}^+|$ maps for each element k when transmitting one channel at a time (surface coil transmit mode). Note that the subscript $k \in [1, 2, \ldots, M]$ refers to a particular coil element used for RF transmission while the subscript $j \in [1, 2, \ldots, N]$ refers to a particular coil element used for reception (N=M=8). In volume coil mode the transmit $B_1$ field vector $\hat{B}_1^+$ is written without a second subscript.

Once $|\hat{B}_1^+|$ map is known, next is the determination of the actual flip angle at each pixel location of a standard GE image. $|\hat{B}_{1,j}^{-*}|$ maps can be then derived for each channel data from the GE steady-state signal equation. Note that with the saline phantom, $\rho$ and $T_1$ are homogeneous through the sample and $TE \ll T_2$. In order to numerically mimic a volume coil receive, a $|\hat{B}_1^{-*}|$ map was also calculated from the MOS image obtained with the same data (see Eq. [8] of this section).

Relative Spatial Phase Patterns for Receive $B_1$ Field

Removing the common phase term is done to investigate coil-specific relative phase patterns. In a complex image obtained after 2D Fourier transformation the phase of the raw data from one channel at image coordinate r, $\phi_{r,j}^{raw}$, can be written as $$\Phi_{r,j}^{raw} = \underbrace{\underbrace{\varphi_{r,B_{1,j}^{-*}rel}}_{\text{coil-specific relative special phase}} + \underbrace{\varphi_{0,j}}_{\text{coil zero-order phase}}}_{\text{coil specific}} + \underbrace{\underbrace{\varphi_{r,B_1 com}}_{\text{common } B_1 \text{ phase}} + \underbrace{\varphi_{r,\Delta B_0}}_{\Delta B_0 \text{ phase}} + \underbrace{\varphi_{r,res}}_{\text{residual terms}}}_{\text{coil independent}} \qquad 10$$

$$\varphi_{r,B_1 com} = \varphi_{r,B_1^*} + \varphi_{r,B_1^{-*} com} \qquad 11$$

where j is the channel (or coil element) number. In Eq. [10] of this section, the "coil specific relative spatial phase" term $\varphi_{r,B_{1,j}^{-*}rel}$ varies with coil and spatial position and is to be estimated. The next term, $\varphi_{0,j}$, "coil specific zero-order phase," corresponds to a global phase shift for each channel that depends on the relative polar position of the element in the circle formed by the eight coil elements, as well as on other hardware components inducing phase shifts (e.g., receiver cable length). This spatially invariant term can be estimated from the averaged phase of a small ROI at the center of the phantom because all coils are expected to have the same phase in that location (arbitrarily set this phase to zero). It may be found more robust to first remove the contribution of other phase terms that are both coil independent and $B_1$ independent before estimating $\varphi_{0,j}$. Arbitrarily separate those "$B_1$ and coil independent" terms into $\varphi_{r,\Delta B_0}$, which accounts for $B_0$ inhomogeneities and is accessible to easy measurement, and $\varphi_{r,res}$, which reflects other residual terms such as eddy currents, offset of k-space center, etc. The term $\varphi_{0,j}$ can be estimated as $$\varphi_{0,t} = arg\left( \sum^{\omega 1} \frac{\hat{p}_f^{raw} a^{-i\gamma TE \Delta B_0} a^{-i\varphi_{r,tes}}}{|\hat{p}_j^{raw}|} \right), \qquad 12$$

where $\hat{p}^{raw}$ is the pixel raw complex value and $arg(\hat{p}_{raw})$ is its phase. The $\Delta B_0$ map can be derived from the phase of the complex ratio between two images obtained at 10 and 6 ms echo time, and $\varphi_{r,res}$ accounts here for a slight offset of k-space center (see Note 1). $\varphi_{0,j}$, $\Delta B_0$, and $\varphi_{r,res}$ were removed pixel-wise from each channel complex image before any further analysis. Thus, in these calculations, the pixelwise complex values $\hat{p}_j$ were defined by $$\hat{p}_j = \hat{p}_j^{raw} \cdot e^{-i\phi_{0,j}} \cdot e^{-i\gamma TE\Delta B_0} \cdot e^{-j\phi_{com}}, \qquad 13$$

with the phase of $\hat{p}_j$ corresponding to $$\hat{p}_j = \hat{p}_j^{raw} \cdot e^{-i\phi_{0,j}} - e^{i\gamma TEBo - e - i\phi_{r,res}},$$

The "common phase" term $\varphi_{r,com}$ in Eq. [11] of this section accounts for two coil independent sources of phase: a transmit $B_1$ phase $\varphi_{r,B1}^+$, which reflects the phase of the magnetization vector $M_{x,y}$ immediately after the RF pulse in the rotating frame (for a given location in the sample, this term is common for all receiver channels) and a common receive $B_1$ phase $\varphi_{r,B1}^-{}_{*com}$. (The angle of $\pi/2$ rd between the transmit $B_1$ vector and the plane of induced rotation of the magnetization vector during RF excitation is not explicitly mentioned). In order to estimate the common phase term, it is hypothesized that given the spherical symmetry of the phantom and the eightfold cylindrical symmetry of the coil structure, all coil elements would have spatial $\hat{B}_1^{-*}$ phase pattern similar in shape, but at different position in space (rotation increments of 45° every adjacent channel), whereas resulting common phase term components would be identical for all coils. An estimated $\varphi_{r,com}$ as $$\varphi_{r,B_0com} \doteq arg\left(\sum_j^N \frac{\hat{p}_{j,i}}{|\hat{p}_{j,i}|}\right), \qquad 15$$

where N is the number of coils. Since the interest is primarily in describing the relative spatial phase pattern of each coil element, the signal intensity weight (in Eq. [15] of this section) was not included. Intensity weight can also be used to obtain phase estimates with a low level of noise.

In order to evaluate the prominence of a reproducible phase pattern, each coil phase pattern of the phantom has also been subsequently rotated by an appropriate number of 45° increments in order to have all coil elements at the same location as channel 3 (arbitrary choice). Those eight rotated complex maps were then summed together; A single value decomposition (SVD) analysis was performed through those eight complex maps.

Although the human brain does not have the spherical symmetry of a sphere phantom, Eqs. [10] and [11] of this section were used to obtain a rough estimation of the relative spatial phase pattern of receive $B_1$ field in human data.

Phase maps were also obtained with simulated data, in which case some of the terms in Eqs. [10] and [11] of this section vanish because either they are absent from the simulation process or they reflect experimental imperfections (($\Delta B_0$, $\varphi_{r,res}$).

Relative Spatial Phase Patterns for Transmit $B_1$ Field

Each transmit or receive magnitude $B_1$ map, as well as the relative spatial phase pattern of the receive $B_1$ field for each coil element, was calculated from data sets acquired with only one transmit $B_1^+$ pattern (either volume coil transmit mode or surface coil transmit mode).

However, measuring the relative spatial phase pattern for each transmit $\hat{B}_{1,k}^+$ field entails utilizing the eight data sets obtained when pulsing RF through one transmit coil element at a time. The phase in complex data collected with coil element j when transmitting RF through coil element k becomes $$\Phi_{r,j}^{raw} = \underbrace{\underbrace{\varphi_{r,B_{1,l}^{-*}rel}}_{\text{coil-specific relative special phase}} + \underbrace{\varphi_{r,B_{1,k}^{-*}rel}}_{\text{transmit coil relative spatial phase}} + \underbrace{\varphi_{0,j}}_{\text{coil zero-order phase}}}_{\text{coil specific}} + \underbrace{\underbrace{\varphi_{r,B_1com}}_{\text{common }B_1\text{ phase}} + \underbrace{\varphi_{r,\Delta B_0}}_{\Delta B_0\text{ phase}} + \underbrace{\varphi_{r,res}}_{\text{residual terms}}}_{\text{coil independent}} \qquad 16$$

$$\varphi_{r,B_1com} = \varphi_{r,B_1^+} + \varphi_{r,B_1'^*com} \qquad 17$$

As described for the relative phase patterns of receive $B_1$, first remove $\varphi_{0,j,k}$, $\varphi_{r,\Delta B0}$, and $\varphi_{r,res}$ from the raw data, which simplifies the apparent phase expression $$\phi_{r,j,k} = \phi_{3.5} + \phi_{1.8} + \phi_{r,com}. \qquad 18$$

When transmitting through one coil element only, image SNR was very low in some areas.

Reducing the resulting phase noise entailed summing, pixelwise, the complex data of each channel j (j=1, 2 . . . , 8) obtained when transmitting through one coil element k. For each coil element k, this sum was used to estimate the phase expression $\varphi_{r,B1,k}^+{}_{rel} + \varphi_{r,com}$:

$$\varphi_{r,B_{1,l}^{-*}rel} + \varphi_{r,B_2com} \doteq arg\left(\sum_{j=1}^N \frac{\hat{p}_{r,j,k}}{|\hat{p}_{r,j,k}|}\right). \qquad 19$$

Those eight sums were then summed together in order to estimate $\varphi_{r,B1com}$, assuming (similarly to receive $B_1$) that the coil-specific relative phase terms $\varphi_{r,B1,k}^+{}_{rel}$ would tend to cancel each other:

$$\varphi_{r,B_2com} \doteq arg\left(\sum_{k=1}^M \sum_{j=1}^N \frac{\hat{p}_{r,j,k}}{|\hat{p}_{r,j,k}|}\right). \qquad 20$$

Finally, each relative coil transmit phase, $\varphi_{r,B1,k\ rel}^+$, was derived from the two previous equations:

$$\varphi_{r,B_{1,l}^-rel}^+ = arg\left(\left(\sum_{j=1}^{N} \frac{\hat{p}_{r,j,k}}{|\hat{p}_{r,j,k}|}\right) \cdot \left(\sum_{k=1}^{M}\sum_{j=1}^{N} \frac{\hat{p}_{r,j,k}}{|\hat{p}_{r,j,k}|}\right)^*\right) \quad 21$$

Additional phase calculations (rotation, sum, and SVD) were performed as described for the relative phase patterns of receive $B_1$ field.

Polar Coordinates Analysis

Additional analyses were performed in polar coordinates in order to evaluate phase components that are periodic about the center axis of the phantom (i.e., Z axis). In order to do so, complex $B_1$ maps were 2D interpolated at regular intervals along the radius ($\rho$) as well as along the angle ($\theta$) dimensions.

All data analyses were performed in Matlab (The Mathworks, Inc., Natick, Mass., USA).

Results

Phantom Studies

Coil Element Relative Intensity Profiles

Relative intensity profiles, shown in FIG. I1a, were obtained by dividing each channel magnitude image by SOM. The data are from a single measurement, transmitting in the single volume coil transmit mode, thus achieving excitation of the entire phantom but acquiring the data from the eight channels separately during signal reception. The ratio displayed in FIG. I1 a is experimentally found not to exceed 0.56, indicating that for every pixel in SOM images, a large amount of signal comes from coils other than the dominant one. This means that when data from different coil elements are summed as complex values (in MOS) rather than as magnitude values (in SOM), phase differences between coil elements could potentially lead to very large signal cancellation. The right-most image shows which of the eight channels contributes the most for image magnitude at a particular pixel (if $\hat{p}_j > \hat{p}_l$ for all $l \neq j$, this pixel is assigned the color code for channel j). This map is derived from measured data without filtering. The twisted shape in relative amplitude is typical at UHF; here, the focus is on the associated phase pattern.

Signal Loss in MOS Images

Using the same data from which FIG. I1 was generated, FIG. I2 compares signal intensities of MOS images obtained by adding the complex images from all eight channels (FIG. I2a) versus summing the corresponding magnitude images (SOM) (FIG. I2b). This mimics numerically a single volume coil receive behavior. FIGS. 2a and b display intensity patterns observed in the two different constructions in arbitrary units and cannot be directly compared with each other. The comparison is made in FIG. I2c and d using ratios. The ratio of MOS over SOM (FIG. I2c) emphasizes two features. First, the amount of signal loss in the MOS relative to SOM images is large, reaching up to ~80% in several locations. Second, this signal loss occurs in the periphery. That the signal stays the same in the center is implicit in such a calculation when a single volume coil mode is reproduced numerically, since the data from the individual elements of the coil are adjusted to have the same phase in the center before adding the corresponding complex images.

FIG. I2d demonstrates that utilizing NRSS, which can be employed to generate images from multielement coils instead of SOM, would not provide contradictory results: as can be seen in FIG. I2d, dividing MOS by NRSS yields even more signal cancellation in the periphery, although in the center data shown in FIG. I2c and d are about the same. Note that any spatial intensity variation due to the spatial nonuniformity in the flip angle is canceled out in the ratio image illustrated in FIG. I2c and d.

Magnitude $B_1$ Mapping for Individual Coil Elements

FIG. I3a and b display the magnitude of receive and transmit $B_1$ components independently for each channel. As expected, given the cylindrical symmetry of the sample, typical twisted amplitude profiles are observed with similar shapes but with opposite directions for transmit and receive components.

Sum of Magnitude Versus Magnitude of Sum

Signal Reception

Using the present subject matter, one can now directly reconstruct the sensitivity maps that would correspond to a single channel volume coil mode as $|\Sigma\hat{B}_{1,j}^-|$ (FIG. I4b), versus what would be expected when data from each element is sampled separately and summed in magnitude, i.e., $\Sigma|\hat{B}_{1,j}^-|$ (FIG. I4a). The data shown in FIG. I4a and b should be equivalent to those illustrated in FIG. I2a and b, respectively, except that the images in FIG. I2a and b involve the multiplication of the reception sensitivity with the sine of the local RF flip angle. Consistent with this, the small intensity increase that was visible in the center of SOM in FIG. I2a (even though much smaller than in MOS in FIG. I2b) is not seen anymore in the analogous $|\hat{B}_1^-|$ map in FIG. I4a. The influence of the flip angle is absent in the ratio image displayed in FIG. I2c. Thus, although derived using a different approach, FIG. I2c report the same information as the ratio of sensitivities explicitly calculated based on $\hat{B}_1^-$ maps (FIG. I4c).

As in FIG. I2c, the ratio of sensitivities reconstructed based on $\hat{B}_1^-$ maps corresponding to volume coil versus multichannel reception mode (FIG. I4c) again demonstrates that there exists substantial loss in the periphery in the volume coil mode.

Transmit $B_1$

FIG. I4d, e, and f provide an experimental demonstration that the same principles listed for signal reception applies for RF transmission as well. Indeed, the sum of the eight transmit magnitude $|\hat{B}_{1,k}^+|$ maps in FIG. I4c, constructed from individually measured transmit $B_1$ maps for each element (FIG. I3b), leads to much stronger values in the periphery than in the center of the phantom, while the transmit $B_1$ map in the volume coil mode exhibits a "peak" in the center (FIG. I4e). In fact, $|\hat{B}_1^+|$ does not increase in the center; it decreases in the periphery (FIG. I4e) as was observed with receive $B_1$ in volume coil mode (FIG. I4b), and the ratio shown in FIG. I4e also reproduces very closely the pattern observed in FIG. I4c.

Note, however, in FIG. I4e that the maximum ratio value in the center, instead of being equal to 1, is close to 0.82. Several experimental features can contribute to this apparent divergence from the expected unity ratio that is reported otherwise in the center of the phantom for the receive $B_1$ maps. First, receive $B_1$ maps relied on only one data set with multiple reconstructions. Furthermore, because the phase of all channels is first equalized in the center, by definition SOM must be equal to MOS in the center of the phantom. Opposite to this case, the transmit $B_1$ maps required nine separate experiments. Also, some hardware differences existed between the eight sessions with one single surface transmit coil and the session where RF was transmitting through all coil elements: the eight-way RF power splitter was not used during the single surface transmit coil session; while the same transmit RF cable was used to feed each coil element during the single coil sessions, all coil elements were getting RF cables of different lengths when transmitting through eight channels; any residual transmit phase error between coil elements would translate into some degree of destructive interference in the center of the phantom only when transmitting through all elements; data were noisier when transmitting through one coil element only.

FIG. I5 displays simulated transmit $B_1$ data for the phantom and the eight channel coil. Three main features, which were also observed with experimental data in FIG. I4d, e, and f are present: the sum of the eight magnitude transmit $B_1$ maps is stronger in the periphery than in the center, the transmit $B_1$ magnitude when transmitting through eight coil elements exhibits a peak in the center, and the ratio between the two drops quickly when moving away from the center. Although the transmit $B_1$ gradient from the center to the periphery is somewhat steeper with simulated data than with experiments, the degree of similarity is noticeably high. Residual discrepancies may come from some of the approximations made to design the experimental setup in the simulation software (e.g., coil element geometry, sample conductivity, etc.). Another source of divergence between simulated and experimental data potentially relies in the coupling between coil elements that was not included in the simulation model. Even though the coil used in this study, when loaded, has a reasonably low level of coupling (~14-16 dB) between elements, it is not zero as it was in the simulations.

FIG. I5 also displays simulations obtained with Larmor frequency set at 64 MHz in order to mimic a 1.5 T experiment. It can be seen in FIG. I5e and f that, indeed, signal cancellation in the periphery at 64 MHz occurs at a much smaller scale than at 300 MHz.

Relative Coil Spatial Phase Patterns

Receive $B_1$

Relative spatial phase $\phi_{r,B1,j}^{-}{}_{*rel}$ was calculated as described under Methods. Three main characteristics can be noted about this spatial phase distribution (FIG. I6). First, in FIG. I6a, the relative spatial phase pattern of each coil element exhibits large phase excursions through the sample (more than $2\pi$ within one channel image). Second, in the periphery, in some of the areas very close to one element, there is a phase difference of up to about $\pi$ radians with respect to the nearest neighboring elements, a natural situation for maximum destructive interferences between neighboring coils. Third, when aligning all elements on channel 3 by appropriate rotations, a highly reproducible relative phase pattern is found (FIG. I6b).

FIG. I6c illustrates the sum of the eight complex maps obtained for each channel after the appropriate rotation to align them. This map is virtually identical to the phase of the first SVD complex vector (FIG. I6d), accounting for the maximum variance, suggesting that phase map rotations after removal of an estimated common phase is a practical way to estimate a relative spatial phase pattern (with a phantom and a multielement coil exhibiting cylindrical symmetry).

Transmit $B_1$

FIG. I7 shows, with a phantom, the relative phase patterns for the transmit $B_1$ field of each coil element. Although the level of phase noise was high in single surface coil transmit data (see Appendix B), the fundamental features previously observed with the relative receive $B_1$ phase pattern are reproduced. Indeed, significant similarities can be found in the pattern of each coil element, easier to identify when the corresponding maps are rotated to reach the same position around the clock (FIG. I7b), and the phase of the sum of the rotated maps (FIG. I7c) is extremely close to the phase of the first SVD vector (FIG. I7d). Furthermore, strong similarities are found between the average receive relative phase pattern (FIG. I6c) and the average transmit relative phase pattern (FIG. I7c), except for a reversed rotational direction, in good agreement with theoretical predictions.

Phase Patterns in Polar Coordinates

This subject matter considers that summing the eight complex coil phase patterns obtained with the sphere phantom, regularly distributed around a cylinder—thus with circular periodicity—yields a common phase map, which reflects two kinds of terms. The terms of the first kind, such as $\Delta B_0$, are not linked to the actual $B_1$ field. Although they are constant for a given pixel for all coil elements, they are typically sensitive to rotations about the center. On the other hand, $B_1$ specific common terms are insensitive to rotations by increments of 360/8=45° for a circular sample and an eight-element coil geometry; these terms are easier to consider in polar coordinate: for a given $\rho$, those terms are either constant along $\theta$ or have a periodic distribution along $\theta$ at frequencies that are harmonics of the number of coils (eight in our case).

Such a representation is shown in FIG. I8 for simulated data. The receive $B_1$ phase for one coil element at 300 MHz, shown in Cartesian coordinates in FIG. I8a, is represented in polar coordinates in FIG. I8c, the center of the coil element being set a $\theta=0$ rd. A strong radial gradient of the phase of receive $B_1$ field is evident. Whereas the phase is relatively uniform in the center as a function of $\theta$, it varies dramatically with $\theta$ toward the periphery ($\rho=1$). FIG. I8b in Cartesian coordinates and FIG. I8d in polar coordinates show the same analysis for the transmit $B_1$ field obtained when transmitting through eight coils. Two major features can be noted: first, the phase distribution is now very smooth from the sphere center up to about two thirds of the radius. Then, a local pattern is clearly repeated eight times along $\theta$.

Verification that the model in Eqs. [10] and [11] of this section could account for most of the measured phase components, entailed comparison of a phase map derived from experimental data (FIG. I8f) with a phase map obtained by simulating transmission through eight channels followed by complex averaging among eight receive element signals (FIG. I8e). Although the slope of the radial phase gradient is not as strong with experimental data as with simulated data, a similar pattern can be identified in both images.

The same polar analysis was performed with simulated data at 64 MHz. The results, shown in FIG. I9, demonstrate a smoother phase pattern at lower magnetic field, for the single coil receive $B_1$, the volume transmit coil mode $B_1$ with eight transmit elements, and the radial phase gradients.

Human Data

FIG. I10 shows that with human data, merging complex images from the eight channels also yields signal cancellation in the periphery of the brain, and two main characteristics of the ratio MOS/SOM that we observed with the phantom in FIG. I2c are also present here: signal cancellation can reach very large amplitudes in some locations, and the signal drops mostly when moving away from the center. A noticeable difference with the sphere phantom data are that coil elements here have more differences when compared to each other. This is naturally expected, because, unlike the phantom, the human head does not have the symmetry of a sphere and includes a variety of different tissues with different electromagnetic properties. Also, as can be seen in FIG. I10a and b, the "RF penetration" is heterogeneous among different coil elements.

However, despite such visible differences, it is important to note that certain similarities can still be identified between relative phase profiles of the different coil elements as shown in FIG. I11 a. Interestingly, locations in the brain where MOS/SOM ratio stay relatively high in the periphery (channels 2, 4, and 6 in FIG. I10e) seem to correspond to coil elements whose relative RF penetration exhibits a larger angular coverage at the head periphery than their neighboring elements (see FIG. I10b). It must be reiterated that for human head experiments the coil was made elliptical by squeezing its cylindrical Teflon holder. (This was obtained without modifying the metric distance between coil elements on the surface of the ellipse, which led to unequal distribution in term of angular coverage.)

Analysis of the phase maps obtained with the human head in FIG. I11a becomes complex if rotated as in the phantom (FIG. I5b) because the head section is not a circle. However, using the polar coordinate representation to try to identify some degree of repetitive phase pattern in the human head as well. As can be seen in FIG. I11b, some similarity can be observed among channels, although the more reproducible components are rather the slowly varying components (large blue area close to the origin of θ becoming yellowish or reddish as θ increases) that the faster changes. Note that more resemblances can be found between coil element pairs corresponding to elements that are 180° apart in space (such pairs are in each columns 1 and 5, 2 and 6, 3 and 7, 4 and 8).

Discussion

The benefits of using multiple receive coils sampled individually have been well established, first for increased SNR and later for spatial encoding with parallel imaging techniques. Subsequently, it was demonstrated that parallel imaging performance increases with magnetic field strength beyond ~4 T, justifying even larger numbers of receive coil elements to be used at high magnetic fields. These multiple coil elements are usually operated in the receive only mode while a larger volume coil is employed for RF transmission. However, it has also been shown recently that there are advantages to using multiple element array coils for RF transmission as well, especially at high field. In this work, the RF characteristics in signal excitation and reception are examined in greater detail at an ultrahigh field for a coil operating in a single volume coil mode or a multielement array coil mode.

With a sphere phantom and a cylindrical multiple transceiver array coil, it was possible to demonstrate a relative spatial phase pattern, both for transmit and for receive phases. These phase maps utilized a phase model that distinguishes between common and coil-specific phase components. Even though such relative components will differ in different coil arrangements, this model proves efficient in identifying reproducible relative phase patterns. The phase patterns measured were highly reproducible between coil elements, and the corresponding transmit and receive average $B_1$ patterns were remarkably similar both in amplitude and in phase, except for their anticipated opposite rotational direction. When viewed in polar coordinates, it was noted that, as a function of the polar angle, the phases varied slowly in the center and rapidly in the periphery of the sample, close to the coil elements. This phase behavior was responsible for large $B_1$ cancellation at the phantom periphery in the single volume coil mode both for the transmit $B_1$ field as well as for the receive $B_1$ field.

The situation becomes much more complex with a human head, which is heterogeneous and has a complicated 3D shape that cannot be approximated with a sphere phantom. Furthermore, each coil element has now a different load and interacts with a differently shaped portion of the head with variable head to coil distances. In experiments with a human brain, it was found that the relative phase patterns for receive $B_1$ fields were significantly more variable between coil elements than was observed with a phantom. However, the data illustrates strong, destructive $B_1$ interferences in the periphery as well as similarities in the spatial phase patterns of the coil elements. Some features observed (less destructive interferences for coil elements with higher sensitivity in larger brain areas; higher phase pattern similarity for coil elements 180° apart) could help improve RF shimming or RF coil design.

Simulation data obtained with the XFDTD software confirmed an experimental finding, reproducing large destructive interferences in the periphery of the sample as well as large $B_1$ phase modulation through the sample within one coil element, even though a slightly steeper gradient of destructive interference was observed in the simulated data.

There is a disparity between signal reception and RF transmission in a MR experiment aimed at volume coverage of the brain. On the receiver side, collecting the signal from each element separately on multiple receiver channels overcomes the deleterious complications of the complex phase patterns. Moreover, in the case of parallel imaging, where coil sensitivity profiles are used for spatial encoding, complex patterns in coil sensitivities are an advantage; hence, parallel imaging performs better at UHF because of the approach to far-field conditions for radiofrequency waves. RF transmission, on the other hand, as it is used so far, becomes much more challenging because the same underlying electrodynamic mechanisms result in a much weaker $B_1^+$ in the periphery of the brain when all the elements are utilized to excite the spins in the entire volume of the sample, as in a single volume coil. This can be overcome, in principle, using the transmit side in an analogous fashion to the receiver side, constructing pulses that utilize the spatial phase and amplitude profiles of each element and applying an element specific RF pulse pattern to the coil, as in transmit sense.

Besides the general pattern of peripherally weak $B_1$ in the volume coil transmit mode, the cancellation can also be severe enough to result in very little $B_1^+$ in some regions compared to others and hence in dark spots in the image at power levels that attain maximal excitation in other regions. Such inhomogeneities will also be different for the same head but positioned differently with the coil so that the distances between the current carrying elements and the sample are altered. Aside from hardware modification, options are limited with a single volume coil. A hardware modification might entail current carrying elements to compensate for commonly occurring inhomogeneities, without having recourse to adjustments for each individual study. With a multiple element transmit coil, however, control of the phases and amplitudes of each individual element is possible, enabling routine use of RF shimming techniques. In this regard, the present subject matter a method and system for calculating RF adjustments "on the fly," quickly enough to be compatible with the time frame of an actual patient MR exam.

No observations were made as to significant standing-wave-like pattern that could explain the weak transmit $B_1$ amplitude (i.e., $B_1^+$) or the reception sensitivity (i.e., $B_1^-$) at the periphery relative to the center of the conductivity adjusted phantom or the brain. In the human brain or equivalent phantoms, relatively high intensity center observed with volume coils previously is not really a consequence of a dielectric resonance per se; such dielectric resonances are observed in a phantom of distilled water but are greatly damped when conductivity is increased. Either with conventional volume coils or in an array operating in the volume coil mode, the center-bright pattern either in reception or in transmission is a consequence of cancellation in the periphery rather than some sort of enhancement in the center. This cancellation is larger at higher magnetic fields (FIG. I5) and consistent with this claim, larger differences between the center and the periphery both in transmit $B_1$ and signal magnitude were experimentally measured previously at 7 T versus 4 T. This has significant implications on SNR comparisons at different field strengths. Using a single TEM volume coil, a more than linear gain in SNR for protons was reported in the center of the brain when going from 4 to 7 T; this gain, however, was only about linear in the periphery. Here we demonstrate that the periphery suffers from partial signal cancellation, more pronounced at the higher field (FIG. I5). Thus, if this peripheral signal cancellation is avoided, as in the case when multiple receivers are used, then more than linear signal gains with magnetic field would be applicable for the entire brain.

Conclusion

The results show experimental evidence at 7 T with a head eight-element transceiver coil array that destructive $B_1$ interferences between coil elements are responsible for typical image intensity profiles at ultrahigh field, often reported as "bright center," without significant dielectric resonance pattern contribution. Simulated data were in agreement with those experimental findings and reproduced similar $B_1$ destructive interferences, larger at 7 than at 1.5 T. The results also demonstrate that reduced SNR gains with increasing field magnitude in the periphery compared to the center of the brain measured with a volume coil are not inherent to the field strength per se but are recoverable using multichannel receiver arrays.

Note 1

Practically, a slight offset of k-space center subsequent to the digital receiver triggering interface was responsible for a linear phase shift along the readout direction in reconstructed images, which was systematically removed before any other processing step. This term was not explicitly include in the equations in order to avoid overloaded expressions.

Note 2

When transmitting RF through the eight coil elements, each is expected to contribute for the same amount of $B_1^+$ in the center of the phantom, i.e., each element contributes to ⅛th of the total $B_1^+$ amplitude. Keeping the same RF power per coil element, the nominal flip angle of 3° in the center of the phantom obtained with eight transmitting coil elements becomes about 0.375° with only one transmitting coil element. Note that when transmitting through one element only, $B_1^+$ amplitude becomes much stronger in the periphery, close to the coil, because there is no more $B_1^+$ cancellation from neighboring elements. Considering this feature, together with the fact that our $B_1$ transmit approach assumes a very small flip angle all over the phantom for the fast GE images following the MPP, it was decided to keep the same RF power per coil element for the small flip angle in the fast GE images used to map $B_1^+$ (i.e., reducing RF power by 9 dB). (Note also the reduction in the RF power by 9 dB for MPP for the purpose of keeping a constant $B_1^+$ amplitude delivered to the sample per coil element). Because of the resulting low SNR, some degree of spatial filtering was used to process the transmit $B_1$ mapping data (2D median filter, kernel size=3 pixels), which can explain the apparent smoother pattern for transmit $B_1$ than for receive $B_1$ mapping (see FIGS. I3 and I4).

Highest Field Human MR Imaging

Abstract—Magnetic resonance imaging (MRI) is a tool for observing the human body in health and disease. Its speed and resolving power increase with the strength of the magnetic field required for the MR signal transduction. The present subject matter includes body imaging at 7 T, and of head imaging at 9.4 T.

New radio frequency methods and technologies for high frequency MRI signal stimulation and detection, human imaging at these unprecedented field strengths are disclosed. Preliminary results of 7 T body images and 9.4 T head images together with the new RF technologies and methods to achieve them are included in this report.

I. Introduction

Whole body imaging and its clinical applications are developed at 3 T. Body imaging can be conducted at 4 T. A number of 7 T MRI systems can be used in the development of human head imaging. Consider using 7 T systems for human body imaging. Consider human head imaging at higher field strengths. Results from selected tests of 7 T human body imaging and 9.4 T human head imaging are presented and discussed.

There are technological and physical challenges to human imaging at these high field strengths and accompanying Larmer resonance frequencies. The Larmor wavelengths in the human tissue dielectric at 300 MHz (7 T) and 400 MHz (9.4 T) are on the order of 12 cm and 9 cm respectively in high water content tissues such as muscle and brain. These wavelengths may challenge safe and successful human scale imaging. RF interference patterns from uniform field volume coils can create severe RF field inhomogeneity in the anatomy. RF losses to the tissue conductor and the tissue dielectric can result in severe heating for conventional pulse protocols. The present subject matter includes methods and technology to solve some of these problems, use the short wavelengths to advantage. By controlling the currents in individual RF coil elements, in phase, gain, frequency, and time, the RF field can be manipulated to optimize signal from a targeted region of interest for SNR, SAR, CNR, homogeneity, or other criteria. Such RF field shimming can be automated much like magnetic field shimming. 7 T body imaging and 9.4 T head imaging is presented.

II. 7 T Human Body Images

Methods for conducting 7 T body imaging entails high frequency modeling, hardware development, and data acquisition.

A. Modeling

Modeling can use a Finite Difference Time Domain (FDTD) method to numerically predict RF field equipotentials in the National Library of Medicine's Visual Human digital atlas with segmented anatomy adjusted to conductivity and permittivity of 300 MHz. The RF field, circularly polarized and uniform in the unloaded condition, was generated by a TEM body coil of the circuit dimensions: i.d.=57.5 cm, o.d.=62.5 cm, active element length=33 cm, cavity length=100 cm. FIG. J 1 shows a scale model of a body loading a TEM body coil as pictured in FIG. J 2.

B. Hardware Development

The equipment and sequences specific to 7 T human body imaging are presented. The hardware, controls and pulse protocols are presented. The MRI system can include a Magnex 7 T, 90 cm bore magnet with Magnex whole body gradients and shims (i.d.=63 cm). A Varian (Palo Alto, Calif.) Inova console can be used, together with an 8 kW solid state RF power amplifier from Communications Power Corporation (Hauppauge, N.Y.). An actively detuned, 300 MHz RF body coil of the model dimensions can be configured with PIN detuning circuits and system control interface as shown in FIG. J 2. 300 MHz receiver circuits such as the eight element strip line array, half of which is shown in FIG. J 4a, and the four element strip line dual breast array shown in FIG. J 4b are configured along with PIN decoupling circuits and multi-channel, digital receivers.

C. Measurement

Human measurements can be performed. In light of the peak power (approximately 4 kW at the coil) and high frequency load losses predicted, certain measurements used low tip angle sequences of long pulse widths. For mapping of the RF landscape in the body at 300 MHz, coronal, saggital, and transaxial scout images can be acquired with the body coil activated in transmit and receive mode, without the use of additional receiver coils. The parameters used for acquiring the gradient echo, whole body images of FIG. J 3 were: 256×256 matrix, 3 mm thick slice, 2 ms windowed sinc pulse, flip angle=25 degrees. Specific to the coronal images: TR/TR=60/4 ms, FOV=50×35 cm, NT=4, time=110 sec. The sagittal images can be acquired by: TR/TE=50/4 ms, 50×35 cm, NT=2, scan time=55 sec., and the transaxial images: TR/TE=50/4 ms, 35×35 cm, NT=4, and scan time=110 sec.

The body coil can be used with an actively detuned, homogeneous transmitter for imaging with local receiver arrays. Two blocks of four TEM strip line elements each (FIG. J 4, left) can be placed above and below the torso to receive the signal summed by simple magnitude addition to create the image shown in FIG. J 5, right. In one example, to facilitate the evaluation of RF non uniformities, no intensity correction was applied. This higher signal, receive only image compares to the body coil transmit and receive image shown in FIG. J 5, left. A breast coil configured of four strip line loops in a pair of quadrature arrays is shown in FIG. J 4, right. This dual breast array can be used to acquire the breast image of FIG. J 6, right. The acquisition parameters for the gradient echo sequence can be: 256×128 matrix, 42 cm/25 cmY 3 mm thick slice, 2 ms windowed sinc RF pulse, TR/TE=50/5 ms, flip angle=20 degrees, scan time 12 sec. No intensity corrections were applied to this image. A transverse chest image can be acquired with the body coil only in FIG. J 5, left for comparison.

D. Results and Discussion for 7 T Body Imaging

The data predicted significant RF artifacts with at least one sharp line running longitudinally through the body, primarily due to destructive interference of the short (12 cm) wavelengths in the high water content tissue dielectrics at 300 MHz. Imaging proved these predictions generally correct. See FIG. J 3. Also shown in the FIG. J 3 images are what appear to be susceptibility artifacts possibly due to gas pockets in the bowel. Apparent susceptibility artifacts were also noted near the body, between the breasts in female subjects. See FIG. J 6, left. $B_0$ phenomena were not modeled for this investigation. The RF power (SAR) used to acquire the images was estimated by: average SAR=996 W peak power× 0.2789 (sinc Se power ratio)=277.7 Watts×2 ms/50 ms=11.1 W per slice in each TR. 11.1×5 slices=55.5 W, or less that 1.0 W/kg for most adults, well within the FDA guideline for human torso imaging.

Observed artifacts and RF power requirements do not appear to preclude the possibility of useful whole body imaging for at least some applications at 7 T. Improvement in both signal and homogeneity appear to be gained by using the body coil for excitation together with separate receiver coils for higher sensitivity, local image signal reception. FIG. J 5, right acquired with a local receiver for example recovers the signal void seen in the center of the body from body coil only images of FIGS. J3 and J5 left, and modeled in FIG. J 1. The image signal of FIG. J 5 right is improved over the body coil only images of FIGS. J3 and J5 left as well. A signal void observed between the breasts in the body coil transmit and receive image of FIG. J 6 left, appeared to mostly vanish for the body coil transmit plus breast array received image of FIG. J 6 right. Breast imaging and spectroscopy is one application of 7 T body imaging. Scout imaging combined with low gamma spectroscopy of almost any organ or tissue can be conducted at 7 T. Furthermore, some of the artifacts observed at 7 T can be manipulated or removed by RF field shimming for targeting regions of interest.

III. 9.4 T Human Head Images

A 9.4 T system has been used for human mind/brain and primate research. The system includes a 65 cm bore Magnex magnet, a Varian Inova console, a High Field NMR Systems patient table, and a multi-channel RF transceiver designed and developed with Communications Power Corp (CPC) power amplifiers. In one example, the parallel transceiver incorporates 16,500 W transmit channels, each channel with programmable gain, phase, and time (switching) control of 16 independent TEM coil elements which in turn feed 16 diode protected receive channels. Results from an eight channel version are reported here.

RF non uniformities due to extremely short tissue wavelengths (9 cm) of 9.4 T (400 MHz) MRI preclude the possibility of homogeneous head images by conventional means. Both constructive and destructive RF interference over the whole head FOV create highly non uniform excitation and reception from a conventional, homogeneous, circularly polarized head coil. Treatment of these high field non uniformities by manipulating and compensating RF field interference patterns through impedance control (phase and magnitude) of independent current elements, used at 4 T, can be modeled and demonstrated in head imaging at 7 T and 9.4 T. The short wavelength relative to anatomic geometry enhances the effectiveness of RF shims and gradients to localize ROIs and optimize selected criteria therein by selected RF protocols and feedback driven algorithms. To this end, individual elements in the TEM coils or loop arrays are independently controlled unlike the end ring-bound cages. Implementation of RF phase and gain control is performed with multi-element coils interfaced to the MR system by a parallel transceiver described herein.

Results of programmable RF phase and gain control are shown in FIG. J 7. These images were acquired with an eight element TEM coil (FIG. J 2) driven by an eight channel parallel transceiver with 500 W per channel RF power amplification. The solid state RF power amplifiers are broad banded to facilitate the addition of programmable frequency shifters for multinuclear control. Behind TR switches, eight digital receivers are used. Phase and gain values are entered on a web table for the coil-transceiver channel matrix. High frequency coil optimization methods employing RF field gradients together with RF field magnitude and phase shimming are used to produce homogeneous head images at 9.4 T. FIG. J 7 shows 9.4 T gradient echo images from an 8 element TEM coil and acquired by the parameters: TR/TE=40/5 ms, TI=1.55 sec, Thk=3 mm, matrix=256×128, SAR=0.4 W/kg. The images are eight channel magnitude addition composites without intensity correction.

IV. Conclusion

Results demonstrate whole body imaging at 7 T and human head imaging at 9.4 T.

Fast Mapping of Relative B1+ Phase in the Human Head at 9.4 Tesla with a 14 Channel Transceive Coil Array Introduction In the human brain, at 9.4 T for example, mapping of the relative phase of Transmit B1 ($B1^+$), for each coil element of a head array coil, can be done in just a few tens of seconds. This mapping can be used to reduce destructive $B1^+$ interferences. For illustration, a straightforward correction of any local B1+ spot chosen in a brain image can be obtained (for one location at a time) with proper B1+ phase correction derived from this mapping. In this study, only RF phases were modulated, RF power being constant for any given RF amplifier when used.

Methods

Data were obtained with healthy volunteers at 9.4 Tesla (Magnex, Varian). A 16 channel cylindrical stripline transceiver array was used, as well as a 16 channel digital receiver. RF power was delivered through fourteen RF 500 Watt-Amplifiers (RFA) (CPC™). Only 14 RFA's were available for this study, thus only 14 transceivers were used for RF transmission. A programmable unit (CPC™) allowing individual phase/amplitude modulation was used to split RF input through 14 channels. $B1^+$ phase mapping was based on complex vector formalism which requires Receive B1 ($B1^-$) phase mapping as well. Fifteen consecutive FLASH images of an axial plane (matrix: 128×80, TR=50 ms) were obtained: one image while pulsing through all 14 RFA simultaneously, and 14 images while pulsing with each RFA (one at a time). The resulting 210 complex images (14 channels×15 repetitions) were utilized to obtain common, relative $B1^-$ and $B1^+$ phase maps.

Results and Discussion

FIG. L1 shows (color map [0, 0.75]) relative $B1^-$ sensitivity profiles for each transceiver (note the twisted shapes). FIG. L2 shows the relative $B1^-$ phase profile and FIG. L3 shows the relative B1+ phase profile (color map [−□,+□□]). (Two crosses signal the 2 missing RFA's). FIG. L4a. shows an image obtained with some arbitrary set of $B1^+$ phases for all coil elements (shown is the sum of magnitude images (SOM) from the 16 channel images). Visible localized dark spots result from low B1+ areas due to destructive B1+ interferences. Overlaid ellipse shows an ROI used to illustrate $B1^+$ phase mapping accuracy. Indeed, FIG. L4b shows SOM image obtained when data were acquired after setting the 14 transmitter channel $B1^+$ phases (derived from FIG. L3) in order to obtain the same absolute phase in the ellipse area. The dark spot disappeared in the ellipse area, while other dark spots occurred in other locations. FIG. L4c shows the ratio of FIG. L4b over FIG. L4a. The maximum increase in signal intensity is clearly localized in the ellipse area and exceeds ~20 at its maximum. Color map in FIG. L4c is in $log_{10}$ scale (colors would be too compressed in linear scale). Our results show that a reliable mapping can be obtained in less than one minute in one axial slice. This constitutes one step towards a variety of RF shimming techniques under development.

Note that the B1+ phase mapping is a subcomponent within the fast |B1+| magnitude mapping technique for multiple channels. The actual B1+ mapping technique is described elsewhere in this document.

Calibration Tools for RF Shim at Very High Field with Multiple Element RF Coils: Ultra Fast Local Relative Phase to Absolute Magnitude B1+ Mapping Introduction:

At very high magnetic field, strong B1 heterogeneities occur in human MR images as RF wavelength becomes equal to, or smaller than, the size of the imaged target, interacting with lossy and dielectric properties of biological tissues. Different RF Shim techniques can be used in order to mitigate B1 inhomogeneities, which have considerable differences in their respective hardware and B1 calibration requirements, especially with large numbers of elements in a transmit coil array. In this document, a comprehensive B1 phase shim strategy is disclosed. In addition, this document considers gradual solutions for increasing B1 Shim demands and for different hardware setups as shown in Table N1. The present subject matter introduce fast B1 calibration tools utilizing some linear algebra formalism with transmit coil arrays, ranging from simple (relative B1 phase) to more demanding measures (absolute B1 magnitude). This document shows that local B1 Phase Shim can be performed in less than one minute with a 16 elements transmit coil array, with dramatic gain in local B1+ magnitude.

$$S_{k,j} = R_j \cdot T_k \cdot C = \underbrace{|\hat{B}^-_{1,j}|e^{i\varphi^*_j}}_{R_j} \cdot \quad \text{Eq. 1}$$

$$e^{i\varphi^*_k}\underbrace{\frac{\sin(V|\hat{B}^+_{1,k}|\gamma\tau)}{1-\cos(V|\hat{B}^+_{1,k}|\gamma\tau)\cdot e^{-TR/T1}}}_{T_k}\cdot\frac{M_{z0}(1-e^{-TR/T1})e^{-t/T2^*}}{C}$$

Principle, Methods and Results:

Considering K transmit coils k and J receive coils j, the complex signal $S_{k,j}$ obtained in receive coil j in a GE image obtained when transmitting with only coil k is shown in Eq. N1, where B1− and B1+ are complex transmit and receive B1 vectors with phase $\phi_j$ (receive) or $\phi_k$ (transmit), and $M_{z0}$ reflects proton density. $R_j$, $T_k$ and C are respectively Receive, Transmit and Common (non coil dependant) terms. Flip angle is given by $\theta_k = V|B1_k^+|\gamma\tau$ where $\tau$ is a square pulse equivalent duration. Note the distinction between relative phase, relative magnitude and absolute magnitude of $B1_k+$, corresponding to measures A, B and C in Table N1. Note that in this section, B1+ phase refers to the phase in the transverse XY plane.

TABLE N1

Table 1. Required Measures and Hardware in RF Shim Techniques

| | | NEEDED RF HARDWARE PER COIL | | | MINIMUM MEASUREMENT | | |
| | | | | | Relative B1+ Mapping | | Absolute B1+ |
| | | Phase Shifter | Magnitude Modulation | Shaped Pulse + RF Amplifier | Phase | Magnitude | Magnitude |
|---|---|---|---|---|---|---|---|
| GOAL | Mapping B1+ Destructive Interferences | | | | + | + | |
| LOCALIZED B1+ SHIM | B1+ Phase Only | + | | | + | | |
| | w/B1+ Magnitude | + | + | | + | | + |
| REGIONAL B1+ SHIM | B1+ Phase Only | + | | | + | | + |
| | w/B1+ Magnitude | + | + | | + | | + |
| FLIP ANGLE SHIM (2D/3D RF PULSE) | Single RF Coil | | | | | | + |
| | Parallel Excitation | | | + | + | | + |
| | | | | | A | B | C |

Measure A: Relative B1+ Phase mapping and Local B1 Phase Shim: If one acquires a quick GRE image when transmitting only with one coil, for each coil k (k:1→K), and taking k=1 as a reference, from Eq. 1 it will be noted that for any receive coil j the phase of the complex ratio $S_{k,j} \div S_{1,j} = T_k \div T_1$ is independent to T1, TE, TR or θ(θ<π). Thus, each image can be acquired in less than 3 seconds at Ernst angle for best SNR. Local B1 phase shim then includes choosing an ROI (a dedicated Matlab™ GUI was developed) and computing from the K complex ratios the phase to add to each coil k for all $B1_k^+$'s to be in phase at this location. The top row of FIG. N1 shows such relative $B1_k^+$ phases at 9.4 T (Varian™) in a human brain with 14 transmit/16 receive channels (16 transceiver coil with only 14 available RF amplifiers). The bottom row shows (arrows) the target ROI before (A) and after (B) local B1 phase shim. The Ratio A/B shows a local signal gain of about 20 (log scale). Such phases can be adjusted with as little hardware as various RF cable lengths or passive phase shifters, with only one RF amplifier and a multichannel power splitter. In the case of FIG. N1, phase changes were done with a remotely adjustable multi RF amplifier unit (CPC™), so that results were obtained in less than one minute. Many organs of limited size can already benefit dramatically from such simple approach @7 T and above, improving local B1 homogeneity and lowering RF power requirement, thus SAR. This also applies to localized spectroscopy studies.

Measure B: Relative B1+ Magnitude and avoiding "dark holes": Mapping B1+ destructive interference ratio (DIR) is useful to determine where, and by which fraction, complex $B1_k^+$'s are cancelling to each other. This measure can be obtained with $DIR_j = |\Sigma_k S_{k,j}| \div \Sigma_k S_{k,j}|$, which simplifies into $|\Sigma_k B1_k^+| \div \Sigma_k |B1_k^+|$. DIR can take values from zero (total cancellation) to unity (no cancellation) (note that $R_j$ and C terms vanish in DIR so that, $\forall_j$, $DIR_j \sim DIR$). However, two conditions must now be obtained: 1) small flip angles (<10°) must be used to be in a regime where signal intensity is ≈ proportional to flip angle (and thus to |B1+|), and 2) TR chosen accordingly to reduce T1 relaxation bias. In such conditions, superposition algebra allows to predict relative destructive interference patterns for any set of $B1_k^+$ phases and magnitudes, and iterative algorithms can be used to avoid or minimize "dark or black holes" in resulting B1+ profiles. At 7 T, low resolution images can be obtained in this regime in about 10 seconds per coil in order to not introduce T1 relaxation bias in this index (3 times longer than relative phase mapping only, still about only ≈3 minutes for 16 coils). If the conditions above are fulfilled, then, $\forall j: SK_j = R_j \cdot C \cdot \Sigma_k(T_k)$, which is the sum through K of $S_{k,j}$, is comparable to an image obtained when actually pulsing through all coils together with the reference set of phases an magnitudes and we suggest this verification as an integrant part of standard B1 shim calibration. FIG. N2 shows the GUI with, (bottom row) DIR before (middle) and predicted after (right) phase adjustment in the center of a phantom @7 T.

Measure C: Hybrid Absolute B1+ Magnitude Mapping for multiple Transmit Coils: Although useful, other solutions may not provide flattening B1+| solutions over larger spatial scales (regional/global B1 Shim), which require absolute |B1+| mapping. At high field there is no homogenous B1+ volume coil reference. Opposite to the previous requirements for superposition formalism, absolute |B1+| mapping requires sinusoidal dependence between signal intensity and |B1+|, thus large flip angles, making |B1+| mapping typically very long because T1 relaxation bias has to be avoided (furthermore, T1's are longer at higher field). For a faster technique, the present subject matter includes a hybrid approach, including merging the previously collected relative information for each coil (small flip angle linear regime), with a unique, classic |B1K+| mapping acquisition obtained when pulsing through all K coils together (large flip angle sinusoidal regime). Indeed, for a given set of phase and magnitude: $|B1K^+| = |\Sigma_k B1_k^+| = |\Sigma_k\{|B1_k^+| \cdot e^{i\phi k}\}|$. Having measured |B1K+| and all $S_{k,j}$'s, it becomes possible to generate each individual coil magnitude with, $\forall j$: $|B1_k^+| = \{|S_{k,j}| \div |\Sigma_k S_{k,j}|\} \cdot |BK1^+|$. The image acquisition time to map B1k+ magnitude in a phantom with this technique at 7 Tesla was 16 times 10 s (the 16 $S_{k,j}$ data) plus two times 6 minutes (two flip angles for $|B1_k^+|$), which is considerably shorter than mapping $|B1_k^+|$ 16 times. Practically, any B1+ mapping technique could be utilized for the large flip angle case. Knowing $|B1_k+|$ as well as each relative phase $\phi_k$, one can now calculate phase and/or magnitude sets for larger scale B1 shim with appropriate optimization algorithms. If equipped with multiple shaped RF pulse channels, it is also then possible to utilize Parallel Transmission techniques to obtain a homogenous flip angle within a predefined target with multidimensional RF pulses.

Additional Multichannel Methods

Rather than developing an RF coil and then utilize model and experiment to evaluate performance, the present subject matter operates in reverse in tools which design multiple transmitter RF coil based on target field configuration.

RF coils which are producing a B1 field (for example, the head or the body) and the object is, in some cases, to produce a relatively flat B1 field through the region to be imaged (homogenous).

At very high field, the homogeneity can be compromised. In one example, rather than developing RF coil designs with a lot of mathematical tools, the present subject matter uses the target field parameters to develop parameters for configuring the RF coil.

In one example, based on a desired field parameter, (for example a homogenous field within the coil), design the coil to satisfy that field parameter.

Typically, coils are designed to produce a homogenous field in the empty space. Coils are not built as a function of the field distortion that arises from tissue effects (when a human or other specimen) located inside the coil.

For each single RF coil, define the complex B1 profile and SAR, and then define the gain, and derive from it with optimization which combination fits best.

To summarize those writing—there are four concepts.

First, a faster technique to make B1 mapping for multiple coil elements. Mapping in the sense of calibrating. For each coil, measure for each individual coil what is the produced B1, transmit B1 field in the head or the body. There are a number of techniques to do that with one RF coil, any one of which requires at least a few minutes. In the case of multiple channel RF coils, such techniques are too time consuming.

Also, for certain multiple channel high field techniques, mapping of the B1 field will be helpful.

In one example, an acquisition technique includes a combination of relative and absolute measurements.

For magnetic resonance, the present subject matter includes making an absolute measurement of the transmit B1 field as well as a relative measure of, for example, for example, 16 or 32 coils. For example, if coil number 1 is selected as a reference, then for every single voxel, it's can be determined what is the contribution for each other coil. For example, one coil may have 3 times more or 2 times less B1 than another coil. The relative contribution of each of the coils, relatively quick to generate. Then knowing the contribution of each, final absolute amount for every single voxel in one location, generate, for example, a total of 100, and for each of the 16 coils, knowing the percentage of the contribution, then multiply this percentage by the final total to generate the absolute value for each of the individual.

In one view, the calculation scales the relative measures based on the relative contributions of each coil.

A single absolute measure allows such scaling of all other coils when all the coils are pulsing together.

Also allows determination of the field when the pulses are together, relative. There can be a number of differences. For example, when the individual coils are not in phase, the B1 of one coil can destroy the B1 of another coil. The present system allows measurement of this contribution. Knowing the absolute measurement, the contribution of each, as a percentage of that when pulsing all the coils together, able to determine the contribution of each of the coils will have contributing.

There are various options to obtain the information of one coil at a time. In FIG. O1A, ("only one") one such method is illustrated. In the figure, assuming 16 coils, quickly acquire one image while pulsing with one coil at a time. So this produces get 16 data where only one of the actual 16 coils were transmitting at a time. This data can be obtained quickly.

In FIG. O1B, ("all minor one"), with 16 coils, pulse, 16 coils (as with musical chairs), switch off one coil at a time to produce a collection of 16 data sets where, for each data set, one coil is missing.

In FIG. O1C, ("all, one×2"), vary the intensity for one coil. For example, multiply by 2 the power for one of the channels (sometimes referred to as a coil).

In FIG. O1D, adjust a phase of one of channel one at a time.

In sum, the various methods described above are directed to increase the signal to noise ratio of quick images.

The first data set is directed to small flip angle, quick images (one coil transmitting at a time). For the second data set, FIG. O1A, illustrates all the coils (channels) transmitting together. This can be generated in a single measurement and captures the absolute B1 mapping where all the coils are transmitting together The B1+ for the large flip angle provides a scaling factor to rescale the relative measure from the small flip angle. Note that the images generated based on a sin function as noted in the figure. This corresponds to a difference between small and large flip angle. In small flip angle it is possible to make like no sin and large flip angle it is not.

The disclosure concerns a faster method to make the global map.

The present subject matter can be used to expedite T1 mapping techniques when used with B1+ mapping techniques as described herein.

Knowing the local T1 parameter and the transmit B1, then the relative quick images can be expedited.

To make it utilizable, or like for example in a clinical field, those techniques really need to go very fast.

Utilizing quick T1 mapping with a small flip angle in the steady state (based on high SNR at high field and parallel imaging) in order to be able to map B1+ coil profile with short TR and large flip angle (where T1 impact is strong).

This will enable techniques utilizing long acquisition to be run much faster.

One application example includes the ability to acquire multislice absolute B1+ for all coils transmitting together if a non-selective magnetization preparation module is used.

In one example, a database is used for B1. A database is built based on acquired data from a subject or patient. The data corresponds to transmit B1 map obtained with a given coil for, for example, the head or the body. To optimize, in light of length calculation times, begin with the best guess based on building a data base. This will reduce the amount of time to calculate a new solution. This is an iterative process.

With a comprehensive and accurate database, estimates can be made without measurements. With sufficiently good data, the estimated parameters may be adequate.

For example, data may correspond to a particular shape of a head or the body, and based on a categorization, the effects on the coil can be estimated. The specimen is classified based on stored data in the database.

3. Utilizing a priori knowledge (database) from experiments and/or from modeling studies to anticipate B1+ adjustment sets (phase and amplitude for each element of a coil array) for a given patient and a given organ/target. For example, a head is classified according to size or shape and body mass for coil load as well. Fuzzy logic, expert systems and other technologies can be used to classify and determine parameters.

The coil load itself has an impact and can be derived from each coil's Q measured with the patient in position.

Next, consider B1 mapping filtering. To expedite mapping of B1 transmit, and when using the minimum SNR. The faster, then the less signal to noise. With noisy data, based on this database, able to guess such information. This may include information as to how to operate the array based on the signal to noise.

This may allow operation with less signal to noise ratio

For example, if there are relatively reproducible shapes in the distortion, and with two heads that are the same, then, knowing two or three quarter of the transmit B1 profile, the present subject matter can guess what the rest of it.

B1+ mapping filtering including in the a prior array knowledge.

Expected lower SNR for each relative measure in (a) areas removed from the coil (what is measured very close to the one coil has a strong SNR and that measured very remotely has a weak SNR), (b) no tissues within an image. For example, a slice of the brain that crosses a cavity, there will be a location where there is just air and it does not produce signal). Some algorithms allow acquisition for a location having noise.

To expedite with low SNR for the relative measure, there will be a lot of noise either when there is no tissue. "A" is specific—to measure the transmit B1 of a given coil (if you are far away from it in the brain, for example on the other side), the signal is low which ordinarily requires more time. However, if the database of previously measured the B1 map for the same kind of head and coil arrangement, then able to predict, with a fairly reasonable accuracy, the completed extent of B1 profile if able to measure a portion (for example, two-third or three-quarter of the map).

Then there was masking. Masking with morpho-mathematical (mathematic utilizing morphology information).

Fill in the values of low signal noise ratio (known typical feature of the transmit B1 spatial smoothness constrain interpolating solutions.

At bottom, the location having a low signal to noise ratio is enhanced based on a prior knowledge of the database and allow filling in to replace the noisy part with valuable information.

Database and/or model—the source of data (for interpolating)

Next, consider reciprocity. Utilizing reciprocity B1+/B1− in coils with relatively regularly distributed channels (for example, head) to estimate peripheral center in order to derive images.

Chart showing what coil elements, depending on their size, placement.

For RF coil design, objective is generally in generating a homogenous B1 field on the bench when the coil is empty. With a body in place, in a very high field, there is a lot of distortion of the transmit B1 field. It is possible to adjust the phase and amplitude of individual coils to improve the homogeneity. The present subject matter includes a method to reverse this procedure and use information that such distorted B1 is produced by a particular coil. Then, assume the data is in a database, the task becomes that of modeling which is based on a large number of experimental data. The analysis includes determining which combination will make the transmit B1 profile more homogenous in order to determine how to configure the RF coil.

Coil parameters include the size, each element and the distance to the biological target. Rather than building/modeling a multi-element coil as whole, rather (measure/model) complex B1+ and SAR profile for each single RF element as a function of its size, (thickness, width, length) and of its distance to the target.

Then, define the imaging/spectroscopic aim (means how to configure B1 approximately) and device from it, with optimization algorithms, which combination fits best considering a given number of available independent transmit channels.

Optimization can be either constraining or not constraining the final transmit B1 phase through space. In some case such constrain should not be needed yet.

Optimization tools constraining or not constraining on the phase are different tools.

Defining successive sets of RF amplitude/phase with different focuses for different temporal sections of an MR sequence. See the timeline noted. Times go from the left to right Next, consider FIG. O2 and FIG. O3. The first event illustrated is fat suppression (the brain includes a substantial fat signal) to generate a good strong B1 signal on the skin surrounding the brain.

Then switch and, as shown in the next box, illustrates a rather strong B1 one in the image box to be excited (target). These represent different spatial targets.

In sum, use fat suppression to mitigate the skin coming up, and then target a specific location (localized spectroscopy, (ellipse represents the head and the box represents the target location for spectroscopy)

At right is an oval region for imaging (good B1 everywhere).

An additional routine one more step now.

A and B which is either spectroscopy or imaging, and now we consider 3 different events for localized spectroscopy (fat suppression, and B is able to saturate, want a B1 strong everywhere else except for the target box). The surrounding tissue is uniform (OVS is outer volume suppression) so then you want to target what is not the goal and, in C generate a good B1 in the box which is in the center of sequence.

These are general schemes of sequences which are used in spectroscopy and imaging.

The next section considers skin tissue classification.

A derivative is used here.

The previous material in this section is directed to transmit B1. The following material in this section is directed to receive B1 (at very high field).

Signal intensity correction in multi-coil images based on multi-directional derivatives.

When considering a location in the brain, for example the right hemisphere in small box, the received B1 profile of the coil with vary in space when traversing the box. It will not have the same direction—there will be peaks and valleys having different orientation and slope. The underlying information, if the signal exhibits a staircase, then those staircases will still be there so from every single coil, the results will include a signal having the combination of the staircase plus homogenous sensitivity profile of the coil. For example, at a first step in the staircase, the results may be lower than it should be with one coil but perhaps another step will be stronger than it should be. By utilizing the information of multiple channels, (multiple receive coils) able to derive what resists to the signal variation due to the sensitivity profile of the coils.

Ordinarily unable to measure absolute sensitivity profile of the coils.

The technique includes calculating, in 2-D space, derivative information obtained from the same target (part of the brain) using different coils, and then remove from the data, all components that do not yield the same derivative. In other words, removing derivative information that is not collaborated by other coils for that same target.

The derivative technique herein includes calculating gradients (2-dimensional) of the image and then, for each receiver coil, a certain map in space of the local derivative. For each, there will be a certain direction and certain slope (positive or negative) and with a certain intensity.

So, for each coil, a derivative map is generated. From the multiple derivative maps, the present subject matter extracts the common elements and the differential elements. The differences between the maps then relates to the coil sensitivity profile. Those portions that are the same for each coil will correspond to the structure of the object being imaged. This can be viewed as a masking function where masking is in the sense of keeping or removing some value of special variation of the signal intensity.

This routine facilitates removal of intensity variation which is due to the coils instead of due to the tissue imaged by that coil.

So for each receive coil channel, there is a separate derivative map. This can include 2-dimensional or 3-dimensional images.

The procedure described here will remove what is different between the individual coil profiles. But even those profiles do have, to certain extent, some resemblance to each other.

The procedure includes removing the common (the shared) components between the coils. This entails using a priori knowledge regarding the kind of functional shapes which are shared by such coils High pass 2D filtering (actually a derivative process) the image obtained from each coil elements through In one example, the present subject matter includes parameterizing. Other information includes the gradient information (direction of the derivative and its intensity)

Each different coil will be expected to have a different local gradient, so expect to be able to detect at least as many different components as the number of coils.

Brain tissue classification includes two components.

The high pass filter (derivative) is part of this classification technique.

High pass filtering—based on the idea of classification (grey and white matter).

Based on the spatial variation of the signal intensity, it is difficult to have an algorithm which automatically detects those edges. To utilize the information of multiple coils, a high pass 2D filtering—the addition of the structure being imaged and local variation of the RF coils. This is a matter of correlation. In other words, where edges are found between two tissues with all the coils, even though all the coils don't see the image with the same local intensity, the consistency between finding edges from all the different coils shall provide a much more robust classification. This routine can be used for detecting edges with different detectors that have different sensitivities and based on whatever the detector, some local edges will show for some substantial (may be not 100% of the time but perhaps 70% of the time). This will facilitate classification when relying on a global image. This routine benefits from the use of multiple receive coils.

An example of an image having boxes is in a figure and each box has an edge between those different components.

The upper portion is directed to intensity correction.

The lower portion is directed to brain classification.

Transmit B1 mapping for coil arrays at high field in vivo.

B1+ Mapping for Each Coil Element

The following describes mapping of the B1 transmit field for each coil elements in coil arrays in order to address B1+ inhomogeneity at very high field, no matter which technique is used:

a) RF coil design improvement or alteration a) B1 Shim (static phase and amplitude modulation)

b) Dynamic B1 modulation with different temporal B1+ profile for each coil element (this includes Transmit SENSE)

As the number of transmit RF coils increases (e.g. 16 channels for some coils, and up to 32 channels transmit channels at 7 T, for example), the time needed to map B1+ for each individual coil element becomes a limiting factor. Typical B1+ mapping requires about 5 minutes or more for one coil, because T1 is long, especially at high field, which is burdensome for numerous coil elements.

Furthermore, B1+ mapping techniques rely on fitting with trigonometric functions, which have a reasonable sensitivity to flip angle changes only in a limited range of flip angles (typically for example, sin(x) based functions will provide reliable numbers mostly in the range of 60 degrees to 120 degrees, then from 240 to 300 degrees etc. . . . ). This is acceptable for a volume coil with a reasonable flat B1+ profile but not for individual coil elements of a coil array which typically have a very large dynamic range of B1+ amplitude through space.

One Relative B1+ Mapping for Each Coil Element and One Absolute B1+ Mapping for all Coils Transmitting Together The present subject matter uses a measure of relative complex B1+ mapping for each coil element (altering one transmitting coil element at a time), and one absolute B1+ only at once, with all coils transmitting simultaneously.

Note that this concept extends to the B1+ amplitude the formalism introduced for the phase of B1 profiles: the common absolute amplitude information shared by all coils in a given location in space can be ignored when altering one coil element at a time and comparing each coil element contribution to the complex sum of all coil elements. With |B1+| the measured MR signal is linearly proportional to the |B1−| coil profile, it varies trigonometrically with the flip angle, the latter being proportional to |B1+|. This requires large flip angles to make accurate B1+ absolute measurements. Also, as noted above, each coil element, like a surface coil, requires a large range of flip angle to establish the entire B1 profile through space.

The Present Subject Matter Addresses:

A) Low Flip Angle for Fast Relative B1+ Profile of Each Coil Element (Altering One Transmit Channel at a Time) (Still Making Sure with Simulations that T1 Effect is Limited)

b) Large Flip Angles for Absolute B1+ Profile of all Coil Transmitting Together

The signal obtained with very small flip angle is almost proportional to the flip angle which itself is directly proportional to B1+ (simulate T1, TR and flip angle within a range where T1 effect is limited). Thus comparing the signal obtained with each channel for one pixel at small flip angle (i.e. a few seconds scan) provides a relative B1+ estimation. The absolute magnitude of the complex B1+ sum can be measured in a classic B1+ mapping technique (i.e. a few minutes scan) obtained by transmitting through all channels. Then, to obtain individual quantitative mapping, multiply the individual relative B1 profile of each coil element with the amplitude of the global B1 profile corresponding to the complex sum of the individual profiles.

The high signal to noise ratio at UHF provides reasonable SNR for very small flip angle utilized for relative transmit B1 mapping without spending too much time in such acquisitions.

Alternatives:

The relative B1+ profile of each coil element typically requires acquiring one image with all channels transmitting together, and then one image for each channel transmission altered individually. The image where all channels are transmitting together can be used to confirm the equivalence between numeric and hardware complex summation, thus validating the small flip angle approximation, and/or as a reference of the sum in the calculation.

Several options exist for the individual altered channels. The following are some examples: 1) to acquire one single channel transmitting at a time, 2) to acquire all channels transmitting together except for the concerned channel that is blanked, 3) to acquire all channels transmitting together, with twice the current amplitude for the concerned channel, 4) to acquire all channels transmitting together with phase rather than amplitude modulation for the concerned channel.

The technique selected will depend on SNR issues as well as on how to constraint the acquisition to stay within small flip angles in order to keep the linear approximation valid. One practical advantage of the single element at a time is the absence, by definition, of any destructive B1 interference, but even if black holes were forming in the case of transmitting all coils all the time, they might be moving in each different configuration, thus not disturbing too much the calculation.

Example of an Acquisition Scheme:

Data is acquired with all channels and complex data from each is collected for the analysis. This way, the phase and amplitude of individual B1− (receiver) will not compromise the results.

1) very fast low flip angle relative B1+ calibration.

2) Calculation from the later of a set of phases and amplitudes that will provide a more flat global B1+ profile. This requires optimization routines that in most cases will not need phase constraints for the solution. In some cases, (such as in imaging), the pixel size will be small enough to neglect significant intra-voxel signal cancellation due to the combination of B1+ phase and B1− phase.

Thus, non linear least square approaches for example can be used.

2) with this set of phase that is needed to avoid "black holes" or too dark areas in the final images, acquire B1 mapping sequence covering large flip angles where trigonometric fits can be obtained with good accuracy.

Alternative Technique for the Large Flip Angles: Utilizing Quick T1 Measurement in the Steady State and with Small Flip Angle in Order to Map B1+ with Large Flip Angle but with Short TR fast, small flip angle T1 measurement at high field since a) higher SNR and b) better parallel imaging performances.

This can be extended to multiple slices B1+ mapping at high flip angle if a non selective preparation module is utilized.

RF Field Localization Through Convex Optimization

Abstract

As MRI B0 field strength increases, the Larmor frequency increases causing the assumption of uniform B1 field magnitude throughout an imaged load to become a poor approximation. Because of non-uniformity, ad hoc methods can be used to adjust antenna drive element's phase and magnitude with the goal of improving uniformity. Other approaches to controlling B1 field magnitude to achieve a desired B1 magnitude distribution are considered. Desired distributions can be chosen to improve uniformity, or can be used to achieve field localization.

Introduction

In the MRI process a nuclear magnetic resonance is used to probe a load (a human body for example) in a noninvasive and nondestructive way. The received signals from different atoms are slightly different allowing imaging of the load. To setup a resonance, a z directioned DC field called the B0 field is created with a powerful electromagnet. The B0 field strength assumed in this project is 9.4 Tesla. Other values of DC magnetic field may also be used ranging from 1.5 Tesla to 11.7 Tesla and beyond. Additionally a transverse RF field called the B1 field is used to drive the resonance from various RF antennas. The B1 field lies principally in the x, y plane. z directional components are neglected in this project as their effect is small compared with the much larger B0 field strength. Additionally, several gradient (quasi DC) coils are used in the imaging process and are neglected here.

B1 field frequency is related to B0 field strength through the Larmar relationship: $\omega = \gamma_g B_0$ where $\gamma_g$ is the gyrometric ratio and $\omega$ is the angular frequency. Thus B0 field strength determines the required B1 frequency and the wavelength decreases. The B1 field phase and magnitude are assumed to be uniform for simplicity. However as frequency increases, this assumption breaks down. This can manifest itself as spurious contrast in the MRI image due to constructive and destructive interference of B1 fields.

To alleviate this problem, installations have employed ad hoc techniques to adjust phase and magnitude of the RF signal strength fed to the RF antenna elements. This technique can involve increasing signal strength to antenna elements near dark parts of the load as seen in the image to attempt to brighten the image. These techniques are collectively known as RF shimming.

Problem Formulation

The present subject matter makes use of additional data obtained from RF field simulation or measurement. Using an RF field simulation or measurement technique (examples include FDTD, Finite Element, Integral Equation, Analytical Solution, B Field Mapping, etc.) or combination thereof, the B1 response to a single RF antenna element is calculated for a x, y slice of the load. Repeating this process for each antenna element gives the B1 field effect data for each point in the x, y slice caused by each antenna element. The combine effect of all antennas at all signal strength levels and phases can then be calculated at each point in the load. Then, using a desired x, y field map as the objective target, an optimization formulation can be made to control phase and magnitude of the signal to each antenna element.

A convex optimization technique is used to determine the magnitude and phase of each antenna element to obtain a desired field distribution. The advantages of convex optimization over other types of optimization formulations are numerous. Problems that can be cast as convex problem have efficient and accurate solution techniques that lead to global optimality with polynomial effort. These results can also be found to a desired level of accuracy.

Problem Solution

The non-convex quadratically constrained quadratic program is an NP (nondeterministic polynomial)-hard problem and thus intractable. However, through relaxation and/or formulation manipulation a good solution can be found with a deterministic suboptimality in polynomial time. This relaxation may be solved by the interior point method. Through suitable manipulation, the problem can be recast for solution by, for example, SeDuMi. Any code capable of solving a Semidefinite Program could, in principle, be used.

Problem Size

In practice, m can be 2, 4, 8, 16, 32, etc. but for the sake of this project an RF antenna set (RF coil) including 16 elements was examined. n is allowed to vary to fit computer capacity. Data can be calculated for arbitrarily many points inside the load with arbitrary geometry with a practical upper limit of 40000 points (corresponding to 1 mm point spacing on a grid 20 cm square grid) or more. However, given that the wavelength of B field variation is on the order of 9 cm at 400 MHz in a human load, one point every 1-2 cm should be sufficient to satisfy the sampling criterion.

Results Considered

As time progresses, the trend toward higher B0 field strength and higher B1 field frequency becomes necessary. Unlike attempts to maintain uniformity exclusively, the present subject matter benefits from added spatial freedom to use in the optimization allowing better conformity to desired distributions with sharp variations. The present subject matter also benefits from RF coils with increased numbers of uncoupled radiating elements. These too introduce additional degrees of freedom increasing the size and dimension of the algorithm's search space.

This technique is not limited to antenna weight design for an x, y directional plane. Weights can be found for skew planes or, more generally, any 3 dimensional volume or surface. The procedure allows for a 'closed loop' imaging process not previously possible. Closed loop imaging involves taking an image of a load using a standard MRI imaging process. From the image, using suitable mathematical manipulation, the Bij matrix can be derived. Using this data as input to the algorithm, antenna drive weights can be calculated improving resolution in parts of the image. Using the improved resolution images, a more accurate Bij matrix can be derived. In turn, more accurate drive weights can be calculated iteratively improving resolution. Designing antenna drive weights essentially closes the loop.

Highest Field Human MR Imaging

Abstract—Magnetic resonance imaging (MRI) is a tool for observing the human body in health and disease. Its speed and resolving power increase with the strength of the magnetic field required for the MR signal transduction. The present subject matter includes body imaging at 7 T, and of head imaging at 9.4 T.

New radio frequency methods and technologies for high frequency MRI signal stimulation and detection, human imaging at these unprecedented field strengths are disclosed. Preliminary results of 7 T body images and 9.4 T head images together with the new RF technologies and methods to achieve them are included in this report.

I. Introduction

Whole body imaging and its clinical applications are developed at 3 T. Body imaging can be conducted at 4 T. A number of 7 T MRI systems can be used in the development of human head imaging. Consider using 7 T systems for human body imaging. Consider human head imaging at higher field strengths. Results from selected tests of 7 T human body imaging and 9.4 T human head imaging are presented and discussed.

There are technological and physical challenges to human imaging at these high field strengths and accompanying Larmer resonance frequencies. The Larmor wavelengths in the human tissue dielectric at 300 MHz (7 T) and 400 MHz (9.4 T) are on the order of 12 cm and 9 cm respectively in high water content tissues such as muscle and brain. These wavelengths may challenge safe and successful human scale imaging. RF interference patterns from uniform field volume coils can create severe RF field inhomogeneity in the anatomy. RF losses to the tissue conductor and the tissue dielectric can result in severe heating for conventional pulse protocols. The present subject matter includes methods and technology to solve some of these problems, use the short wavelengths to advantage. By controlling the currents in individual RF coil elements, in phase, gain, frequency, and time, the RF field can be manipulated to optimize signal from a targeted region of interest for SNR, SAR, CNR, homogeneity, or other criteria. Such RF field shimming can be automated much like magnetic field shimming. 7 T body imaging and 9.4 T head imaging is presented.

II. 7 T Human Body Images

Methods for conducting 7 T body imaging entails high frequency modeling, hardware development, and data acquisition.

A. Modeling

Modeling can use a Finite Difference Time Domain (FDTD) method to numerically predict RF field equipotentials in the National Library of Medicine's Visual Human digital atlas with segmented anatomy adjusted to conductivity and permittivity of 300 MHz. The RF field, circularly polarized and uniform in the unloaded condition, was generated by a TEM body coil of the circuit dimensions: i.d.=57.5 cm, o.d.=62.5 cm, active element length=33 cm, cavity length=100 cm. FIG. J 1 shows a scale model of a body loading a TEM body coil as pictured in FIG. J 2.

B. Hardware Development

The equipment and sequences specific to 7 T human body imaging are presented. The hardware, controls and pulse protocols are presented. The MRI system can include a Magnex 7 T, 90 cm bore magnet with Magnex whole body gradients and shims (i.d.=63 cm). A Varian (Palo Alto, Calif.) Inova console can be used, together with an 8 kW solid state RF power amplifier from Communications Power Corporation (Hauppauge, N.Y.). An actively detuned, 300 MHz RF body coil of the model dimensions can be configured with PIN detuning circuits and system control interface as shown in FIG. J 2. 300 MHz receiver circuits such as the eight element strip line array, half of which is shown in FIG. J 4a, and the four element strip line dual breast array shown in FIG. J 4b are configured along with PIN decoupling circuits and multi-channel, digital receivers.

C. Measurement

Human measurements can be performed. In light of the peak power (approximately 4 kW at the coil) and high frequency load losses predicted, certain measurements used low tip angle sequences of long pulse widths. For mapping of the RF landscape in the body at 300 MHz, coronal, saggital, and transaxial scout images can be acquired with the body coil activated in transmit and receive mode, without the use of additional receiver coils. The parameters used for acquiring the gradient echo, whole body images of FIG. J 3 were: 256×256 matrix, 3 mm thick slice, 2 ms windowed sinc pulse, flip angle=25 degrees. Specific to the coronal images: TR/TR=60/4 ms, FOV=50×35 cm, NT=4, time=110 sec. The sagittal images can be acquired by: TR/TE=50/4 ms, 50×35 cm, NT=2, scan time=55 sec., and the transaxial images: TR/TE=50/4 ms, 35×35 cm, NT=4, and scan time=110 sec.

The body coil can be used with an actively detuned, homogeneous transmitter for imaging with local receiver arrays. Two blocks of four TEM strip line elements each (FIG. J 4, left) can be placed above and below the torso to receive the signal summed by simple magnitude addition to create the image shown in FIG. J 5, right. In one example, to facilitate the evaluation of RF non uniformities, no intensity correction was applied. This higher signal, receive only image compares to the body coil transmit and receive image shown in FIG. J 5, left. A breast coil configured of four strip line loops in a pair of quadrature arrays is shown in FIG. J 4, right. This dual breast array can be used to acquire the breast image of FIG. J 6, right. The acquisition parameters for the gradient echo sequence can be: 256×128 matrix, 42 cm/25 cmY 3 mm thick slice, 2 ms windowed sinc RF pulse, TR/TE=50/5 ms, flip angle=20 degrees, scan time 12 sec. No intensity corrections were applied to this image. A transverse chest image can be acquired with the body coil only in FIG. J 5, left for comparison.

D. Results and Discussion for 7 T Body Imaging

The data predicted significant RF artifacts with at least one sharp line running longitudinally through the body, primarily due to destructive interference of the short (12 cm) wavelengths in the high water content tissue dielectrics at 300 MHz. Imaging proved these predictions generally correct. See FIG. J 3. Also shown in the FIG. J 3 images are what appear to be susceptibility artifacts possibly due to gas pockets in the bowel. Apparent susceptibility artifacts were also noted near the body, between the breasts in female subjects. See FIG. J 6, left. $B_0$ phenomena were not modeled for this investigation. The RF power (SAR) used to acquire the images was estimated by: average SAR=996 W peak power× 0.2789 (sinc Se power ratio)=277.7 Watts×2 ms/50 ms=11.1 W per slice in each TR. 11.1×5 slices=55.5 W, or less that 1.0 W/kg for most adults, well within the FDA guideline for human torso imaging.

Observed artifacts and RF power requirements do not appear to preclude the possibility of useful whole body imaging for at least some applications at 7 T. Improvement in both signal and homogeneity appear to be gained by using the body coil for excitation together with separate receiver coils for higher sensitivity, local image signal reception. FIG. J 5, right acquired with a local receiver for example recovers the signal void seen in the center of the body from body coil only images of FIGS. J3 and J5 left, and modeled in FIG. J 1. The image signal of FIG. J 5 right is improved over the body coil only images of FIGS. J3 and J5 left as well. A signal void observed between the breasts in the body coil transmit and receive image of FIG. J 6 left, appeared to mostly vanish for the body coil transmit plus breast array received image of FIG. J 6 right. Breast imaging and spectroscopy is one application of 7 T body imaging. Scout imaging combined with low gamma spectroscopy of almost any organ or tissue can be conducted at 7 T. Furthermore, some of the artifacts observed at 7 T can be manipulated or removed by RF field shimming for targeting regions of interest.

III. 9.4 T Human Head Images

A 9.4 T system has been used for human mind/brain and primate research. The system includes a 65 cm bore Magnex magnet, a Varian Inova console, a High Field NMR Systems patient table, and a multi-channel RF transceiver designed and developed with Communications Power Corp (CPC) power amplifiers. In one example, the parallel transceiver incorporates 16,500 W transmit channels, each channel with programmable gain, phase, and time (switching) control of 16 independent TEM coil elements which in turn feed 16 diode protected receive channels. Results from an eight channel version are reported here.

RF non uniformities due to extremely short tissue wavelengths (9 cm) of 9.4 T (400 MHz) MRI preclude the possibility of homogeneous head images by conventional means. Both constructive and destructive RF interference over the whole head FOV create highly non uniform excitation and reception from a conventional, homogeneous, circularly polarized head coil. Treatment of these high field non uniformities by manipulating and compensating RF field interference patterns through impedance control (phase and magnitude) of independent current elements, used at 4 T, can be modeled and demonstrated in head imaging at 7 T and 9.4 T. The short wavelength relative to anatomic geometry enhances the effectiveness of RF shims and gradients to localize ROIs and optimize selected criteria therein by selected RF protocols and feedback driven algorithms. To this end, individual elements in the TEM coils or loop arrays are independently controlled unlike the end ring-bound cages. Implementation of RF phase and gain control is performed with multi-element coils interfaced to the MR system by a parallel transceiver described herein.

Results of programmable RF phase and gain control are shown in FIG. J 7. These images were acquired with an eight element TEM coil (FIG. J 2) driven by an eight channel parallel transceiver with 500 W per channel RF power amplification. The solid state RF power amplifiers are broad banded to facilitate the addition of programmable frequency shifters for multinuclear control. Behind TR switches, eight digital receivers are used. Phase and gain values are entered on a web table for the coil-transceiver channel matrix. High frequency coil optimization methods employing RF field gradients together with RF field magnitude and phase shimming are used to produce homogeneous head images at 9.4 T. FIG. J 7 shows 9.4 T gradient echo images from an 8 element TEM coil and acquired by the parameters: TR/TE=40/5 ms, TI=1.55 sec, Thk=3 mm, matrix=256×128, SAR=0.4 W/kg. The images are eight channel magnitude addition composites without intensity correction.

IV. Conclusion

Results demonstrate whole body imaging at 7 T and human head imaging at 9.4 T.

FAST B1+ Mapping Technique for Multiple Transmit Coil Elements and Fast Local B1+ Phase Shim Even in the Absence of Approximately Uniform Reference B1+ or B1− Map.

Theory and Overview

Presented below are MR acquisition and calculation tools that obtain fast absolute B1+ magnitude mapping and fast relative B1+ phase mapping for multiple transmit RF coils in the absence of an approximately uniform transmit B1+ or flat receive B1− reference map. This is typically encountered when imaging humans with Magnetic Resonance at very high magnetic field.

The tools allow for subsequently computing phase and/or magnitude modulation of the RF input for each transmit RF coil in order to obtain a more homogeneous transmit B1+ field within a slice, or within a volume, or within a user defined spatial target.

The tools also allow for subsequently computing independent shaped RF pulses to feed each RF transmit coil when utilizing parallel excitation techniques for multidimensional RF pulse and for Transmit SENSE such as techniques to obtain a predetermined 2D or 3D spatial pattern of excitation flip angle.

Consider an MR system equipped with K Transmit RF Coils (index k=1, . . . M) and J RF Receive Coils (index j=1, . . . J):

1. The present subject matter operates independent of the number of Receive RF coils, and there can be either one or any J>=1 number of receive RF coil(s).
   The present subject matter is compatible with the following configurations (non exclusive to each other):
   transceiver arrays (some or all of the RF transmit coils are also used as receive coils),
   distinct and independent transmit and receive coils.
2. The total acquisition can be of shorter duration than with standard B1+ mapping for a large number K of transmit RF coils.
   The present subject matter combines:
   a) K relative $B1_k+$ maps obtained with one coil transmitting at a time in the small flip angle regime (one acquisition per transmitting coil), and
   b) only one absolute B1+ magnitude B1+ map which can be obtained with a standard B1+ mapping sequence (when all transmit coils are transmitting together, this is equivalent to a unique large RF coil with a B1+ corresponding to the sum of individual B1+'s from each transmit RF coils).
3. This technique is compatible with a large variety of hardware solutions for MR systems with multiple transmit RF coil elements, including:
   a unique RF amplifier with the high power output split into multiple input lines to feed the transmit RF coils, with phase modulation on each channel obtained either with different cable lengths for the different transmit coil elements or with high power phase shifters;
   the same configuration with magnitude modulation on each channel additional to the phase modulation;
   individual RF amplifiers for each RF coil, with low power RF input modulated in phase and/or magnitude for each transmit coil;
   multiple Shaped RF Pulse board capable of feeding each of the RF amplifiers for each coil with a distinct RF pulse (phase and/or magnitude modulation for each time point with each RF shaped pulses). This configuration can be referred to as "multi transmit channel MR system".
4. The present subject matter can be accelerated further with parallel imaging techniques within the limit of the available SNR
5. The present subject matter includes a fast, efficient localized Phase B1+ Shim, based on measured data, including suppressing destructive B1+ interferences due to a lack of phase consistency between channels. This local Phase B1+ Shim can be performed with limited hardware equipment on existing commercial human MR systems.
6. The present subject matter includes a preliminary fast relative B1+ shimming component that limits or avoid (when possible) areas where destructive B1+ interferences between different transmit RF coil elements B1+ fields result in a low amount of resultant B1+ field.
   For certain studies, depending on the spatial target for B1+ Shim, the present subject matter can be a sufficient, very fast B1+ shimming technique.

Required Measures and Hardware in B1 Shim and Flip Angle Profile control

| | | | NEEDED RF HARDWARE PER COIL | | | MINIMUM MEASUREMENT | | | |
|---|---|---|---|---|---|---|---|---|---|
| | | | Phase Shifter | Magnitude Modulation | Shaped Pulse + RF Amplifier | Relative B1+ Mapping Phase | Relative B1+ Mapping Magnitude | Absolute B1+ Magnitude | PROPOSED B1 SHIM METHOD |
| B1 SHIM | LOCAL B1+ SHIM | Phase only | | | | | | | I |
| | | Phase/Magnitude | | | | | | | |
| | BIASED B1 RELATIVE INTERFERENCE SCORE | Phase Only | | | | | | | II A |
| | | Phase/Magnitude | | | | | | | |
| | UNBIASED B1 RELATIVE INTERFERENCE SCORE | Phase Only | | | | | | | II B |
| | | Phase/Magnitude | | | | | | | |
| | FULL B1+ SHIM | Phase only w/B1+ Magnitude | | | | | | | III |
| | FLIP ANGLE PROFILE (2D/3D RF PULSE) | Single RF Coil Parallel Excitation | | | | | | | |
| | | | | | | A | B | C | |

Table summarizing the context for utilizing the techniques presented hereby. The fast relative B1 phase and B1 magnitude mapping techniques correspond to measure A and measure B in the table. The absolute B1+ magnitude mapping technique for multiple transmit RF coils correspond to measure C. The "proposed B1 Shim methods" I, IIA, IIB and III correspond to actual B1 Shim First Step: Quick Relative Measurement of Relative B1+ Phase and Relative B+ Magnitude.

Data acquisition: fast Gradient Echo Images with one coil transmitting at a time. This Acquisition can be acquired within a few seconds per coils. For each acquisition, all raw images in the complex domain are collected from all receive channels.

With K transmit RF coils, K+2 images are acquired:
a) K images obtained when transmitting RF power only though one coil k (k=1, . . . K) with very small excitation flip angle (smaller than 10 degrees) in order to approximately obtain a linear relationship between flip angle and signal intensity, including a sufficient number of dummy scans to reach steady state. (refer to those images as "K series")
b) One image obtained when transmitting through all transmit RF coils, with same phase and magnitude as in a) for internal validation purpose.

c) one noise image obtained with the RF amplifier switched off to estimate the noise of each individual channel in order to optimize signal to noise ration in image reconstruction.

The complex signal $S_{k,j}$, obtained with a gradient echo sequence in the steady state when receiving the signal with receive coil j and transmitting with transmit coil k is given by the following equation:

$$S_{k,j} = R_j \cdot T_k \cdot C$$

$$= \underbrace{|\hat{B}_{1,j}^-|e^{i\varphi_j}}_{R_j} \cdot e^{i\theta_k} \underbrace{\frac{\sin(V|\hat{B}_{1,k}^+|\gamma\tau)}{1-\cos(V|\hat{B}_{1,k}^+|\gamma\tau) \cdot e^{-TR/T1}}}_{T_k} \cdot$$

$$\underbrace{\frac{M_{z0}(1-e^{-TR/T1})e^{-t/T2*}Ae^{iQ}}{C}}$$

Equation expressing the complex signal $S_{k,i}$ obtained when transmitting with coil $k$ and receiving with coil $j$ with an MR system equipped with $K$ transmit coils and $J$ receive coils

| | |
|---|---|
| $B_{1,k}^+$ | complex transmit $B1$ vectors |
| $B1_{,j}^-$ | complex receive $B1$ vectors |
| $\theta_k$ | $B1+$ phase |
| $\varphi_j$ | $B1-$ phase |
| $M_{z0}$ | proportional to proton density |
| $Ae^{iQ}$ | other sources of intensity ($A$) and phase ($Q$) variations ($\Delta B_0$, electronic components, etc.) |
| $R_j$ | only function of Receive coil $j$ |
| $T_k$ | only function of Transmit coil $k$ |
| $C$ | common term independentto coils |
| $V|B1_k^+|\gamma\tau$ | flip angle ($V$:scalar factor, $\gamma$ gyromagnetic ratio, $\tau$ square pulse equivalent duration) |

The K series acquisition yields K×J complex images. The complex signal $S_{k,j}$, which can be represented as a triple product:

$R_j$ varies only as a function of the receive coil j $T_k$ varies only as a function of transmit coil k C common term independent to the coils.

1. Measure A (see table): relative transmit B1+ phase mapping Images can be acquired at the shortest possible TR with a gradient echo sequence.

One transmit channel is chosen as an arbitrary reference (here we take number for illustration). Considering transmit coil k=1 as a reference, the relative B1+ phase of any coil k is, for each receive coil j, the phase of the ratio $$\frac{S_{k,j}}{S_{1,j}} = \frac{R_j \cdot T_k \cdot C}{R_j \cdot T_1 \cdot C} = \frac{T_k}{T_1} = \lambda_k e^{i(\theta_k - \theta_1)},$$

where λ is the magnitude of the ratio. In order to average this relative phase through the different receive channels, the magnitude is removed and the resulting relative B1+ phase becomes $\psi_k$ with:

$$\mu_k \cdot e^{i\psi_k} \square \sum_{j=1}^{J}\left(\sum_{j=1}^{K}\left(\frac{S_{k,j}}{S_{1,j}} \cdot \frac{1}{\lambda_{k,j}}\right)\right)$$

where μ is a positive scalar. Note that with this treatment, the relative phase of the transmit coil taken as a reference (#1 here) is zero.

In order to optimize the Signal to Noise Ratio (SNR) of the phase $\psi_k$ estimation the following optional filters are proposed:

weighting the term $e^{i(\theta_k-\theta_j)}$ from each receive channel j by the signal magnitude of the original images:

$$\mu_k \cdot e^{i\psi_k} \square \sum_{j=1}^{J}\left(|S_{k,j}|\sum_{k=1}^{K}\left(\frac{S_{k,j}}{S_{1,j}} \cdot \frac{1}{\lambda_{k,j}}\right)\right)$$

masking out pixels with a signal magnitude below a threshold defined from the noise image acquired within the K series.

utilizing the median value of the relative transmit phase through the different receivers:

$$\mu_k \cdot e^{i\psi_k} \square \underset{j}{\text{median}}\left[\sum_{k=1}^{K}\left(\frac{S_{k,j}}{S_{1,j}} \cdot \frac{1}{\lambda_{k,j}}\right)\right]$$

d) Measure B (see table): relative transmit B1+ phase magnitude For relative magnitude mapping with a small flip angle 3 options are possible:

option A: a minimum TR for each image with one coil transmitting at a time is determined as a function of a user chosen threshold for tolerance towards T1 bias in signal intensity in the steady state (parameters involved: estimated flip angle, expected T1's of imaged tissues, TR). (see equation in the steady state)

option B: the global, unique B1+ magnitude mapping obtained with all coils pulsing together is performed with a sequence that also allows for a concomitant measure of T1 together with B1+.

option C: fast gradient echo images are acquired at multiple flip angles in order to estimate T1 together with the results of the global B1+ map obtained later. This approach may suffer from low SNR at low field but would be feasible at higher field because of higher intrinsic SNR.

e) Biased and Unbiased B1 Relative Interference Score (B-BRIS and U-BRIS)

Mapping B1+ Relative destructive interferences. The percentage of B1+ loss due to destructive interferences is determined from the previous measurement, allowing for the removal of black or dark areas where transmit B1+ is weak or null based on For any coil j $$BRIS_j = \left|\sum_{k=1}^{K} S_{k,j}\right| \div \left|\sum_{k=1}^{K} |S_{k,j}|\right|.$$

The estimation is obtained by averaging the numbers through the receive coils:

$$BRIS \Box \sum_{j=1}^{J} \left(\left|\sum_{k=1}^{K} S_{k,j}\right| \div \left|\sum_{k=1}^{K} |S_{k,j}|\right|\right) \div J.$$

The options described above to improve the SNR in estimating BRIS can apply here as well.

Biased versus Unbiased BRIS.

When TR is very short, the term $(1-\cos(\text{alpha})*\exp(-TR/T1))$ in the denominator of gradient echo steady state equation introduces a bias which deviates from the superposition hypothesis under which BRIS would range from 0 to 1.

Thus, Biased BRIS corresponds to the fastest acquisitions where TR is not adjusted to limit T1w. Unbiased BRIS corresponds to acquisitions where TR has been adjusted to limit T1w within a user-defined error tolerance. Given the very small flip angle, this bias still is limited.

It is possible to utilize Biased BRIS, and even more Unbiased BRIS, to determine a set of phase (and/or magnitude) for each transmit coil RF input in order to avoid too weak B1+ areas. The later correspond to very low scores of BRIS. Then, with this set of phase and magnitude, the global quantitative B1+ magnitude can be measured.

f) Absolute global B1+ mapping: Measure C in table

One global B1+ map is obtained with all coil transmitting together with the phase or phase and magnitude set obtained at the previous step. Any standard B1+ mapping technique can be chosen. One example includes utilizing a technique allowing for measuring together B1+ and T1 relaxation time. Knowing both B1+ and T1 can allow with iterative calculation to determine an Unbiased BRIS even when only acquiring the fastest gradient echo images for the one coil transmitting at a time data ("K series").

g) Individual B1+ maps.

At this stage, individual B1+ maps are produced for each RF Transmit coil: the absolute magnitude is derived from a) the global absolute B1+ map, b) the Unbiased BRIS score for the corresponding set of phase (or phase and magnitude), and the relative score $RS_k$ of each transmit coil:

$$RS_k \Box \left[\sum_{j=1}^{J} \left(\frac{|S_{k,j}|}{\sum_{k=1}^{K} |S_{k,j}|}\right)\right] \div J.$$

Finally: $B_{1,k}^+ = B_{1,global}^+ \cdot \text{UBRIS} \cdot RP_k$. The relative phase has already been defined above.

h) Internal Validation: Biased or Unbiased Relative B1+ Magnitude

If BRIS is unbiased, then two maps should be equivalent:
  the one image obtained at low flip angle with all coil transmitting together
  and the magnitude of the sum of the complex individual images (for each receive coil)

Even though this arithmetic necessary condition is not sufficient to demonstrate that superposition is completely obtained, it is one way to detect evident errors (when the two results are not similar).

Local B1 Phase Shim Base on Measured B+ Phase

Based on the fast relative Phase Measure, in a region of interest of limited size, determine the average relative transmit B1+ phase for each channel. Then, by applying a phase correction of the corresponding amount (cable length, phase shifter, multi transmit console . . . ) for each channel, the maximum available B1+ can be locally obtained.

Multiple Options for Fast B1 Mapping with Multiple Coil Elements.

FIG. M1 illustrates the approach described here with a 4 coil system where images are obtained for each transmit coil transmitting with only one transmitting coil for each transmit coil to collect the "Kseries". Each bar with a colour represent a coil, and attached to the latter the thin line represents the input/output RF cable. The circle represent a phantom. One pixel was arbitrarily placed in the center of the phantom to illustrate the different B1+ vectors (thick arrows) generated by the different RF coils. Those cartoons are in a plane transverse to the main magnetic field.

FIG. M2 illustrates an option where instead of one coil transmitting at a time, all coil expect one at a time are now transmitting. The missing coil goes from k=1 to K.

FIG. M3 illustrates all coils are transmitting together but one transmitting coil at a time has its input magnitude multiplied by two.

FIG. M4 illustrate all coils are transmitting for each acquisition, but one transmit coil at a time has its RF input dephased by 180 degrees.

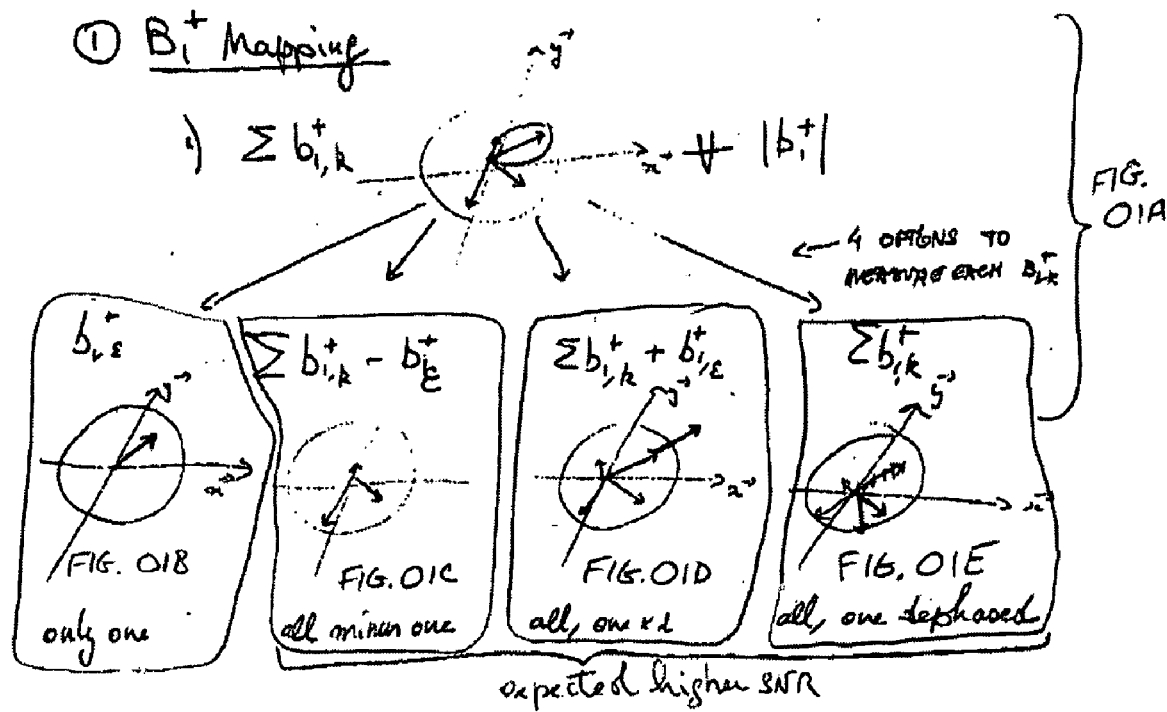

(1B) Quick $T_1$ mapping in the steady state [w/ small Flip Angle]
(thanks to High SNR at High Field and Parallel imaging) in order to be able to map $B_1^+$ coil profile with short TR and large flip angle (where $T_1$ impact is strong).

This would enable techniques requiring long acquisition to be run faster [much]

One Application example would be to acquire multi slice $|B_1^+|$ for all coils transmitting together if a non selective magnetisation preparation module is utilized.

③ Data based choices for $B_{1,k}$ adjustments for a given set of multi-element RF coil
→ algorithm to categorize [head/body] shape/size/load
(load could be obtained from Measurement?) in
order to utilize previously optimized sets of Amplit
and phases.

→ Also data based average $\sigma |B_1^-|$ profiles
in order to estimate the actual $|\Sigma B_1^+|$ profile from
a quick measurement.
→ relative sensitivity for $|B_1^-|$ can be utilized to also
validate the morphologically defined coil
behavior.
(→ if needed, fine adjustments could be obtained
with reduced amount of calculation)

③ Utilizing A priori knowledge (data base) from Experiments and/or from Modeling studies to anticipate $B_1^+$ adjustment sets (phase and Amplitude for each elements of coil arrays) for a given t patient and a given organ/target. Example: Head (considering size/shape, and body mass for coil load as well)

→ Coil load itself has an impact and could be derive from each coil's Q measured with the patient.

→

(2) B₁⁺ mapping filtering: including a priori knowledge
→ expected lower SNR for each relative measure in areas remote from coil.   b) no tissues
→ ?

→ masking with morphomathematical tools
→ filling the values of low SNR    utilizing
  known typical features of B₁⁺ smoothness to
                                      spatial
  constraint solutions   (data base and/or Model)
           interpolating (2B) Utilizing Reciprocity  B₁⁺/B₁⁻  in coils with rotating
     ~regularly distributed channels (head)
     to estimate ratio Periph/Center of
     Σ|B₁⁻|  in order to derive from images
         a centripetal intensity correction
                                    (B₁⁻)
     based on Σ|B₁⁺|·Σ|B₁⁻| might be usable for quick calibration purpose

Computerized RF Coil Design for Multi Element RF Coils utilizing individual $B_1^+$ (complex) and SAR profiles for loos lightly coupled coil elements. ("LEGO BUILDER")

→ Instead of Building/Modeling a multi Element Coil as a whole, rather [measure/model] complex $B_1^+$ and SAR profile for each single RF Coil Element as a function of its size (thk, width, length) and of its distance to the target.

Then defined the imaging/spectroscopic aim and derive from it, with optimization algorithms, which combination fits best, considering a number of available transmit channels.
  given              independent NB: optimization can be either constraining or not constraining the final $B_1^+$ phase through space (in most case such constraint should not be needed) (TBD??)

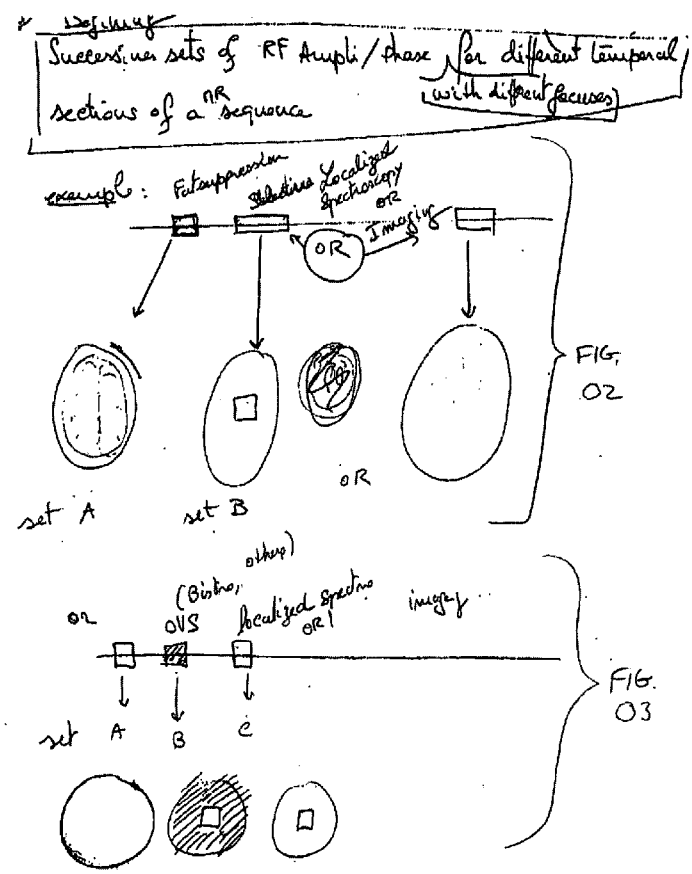

(6)    ⇒ Brain tissue classification

→ signal intensity correction in T1w or T2w multiCoil images based on multi directional derivatives.

Principle: given a tissue signal , this structure may have higher spatial frequencies than the different coil |B₁| profiles such as the 3 color plot.

Highpass 2D filtering the images obtained from each coil element through different directions (Typically as many directions as coil elements) would consistently find edges that would allow to classify brain images into subsets of [P, T₁, T₂] class. Then

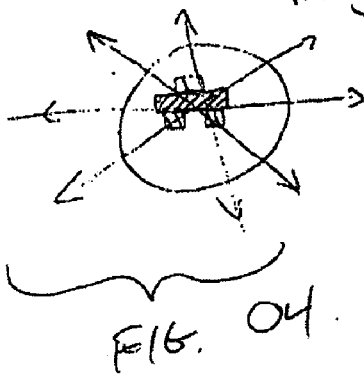

FIG. 04

CONCLUSION

All publications, patents and patent applications noted are incorporated herein by reference. While in the foregoing specification the subject matter has been described in relation to certain examples thereof, and many details have been set forth for purposes of illustration, it will be apparent to those skilled in the art that the subject matter is susceptible to additional embodiments and that certain of the details described herein may be varied considerably without departing from the basic principles described.

The above description is intended to be illustrative, and not restrictive. For example, the above-described embodiments (or one or more aspects thereof) may be used in combination with each other. Other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The Abstract is provided to comply with 37 C.F.R. §1.72 (b), which requires that it allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment.

What is claimed is:

1. A system comprising:
   a transceiver having a multichannel receiver and a multichannel transmitter wherein each channel of the transmitter is configured for independent selection of frequency, phase, time, space, and magnitude and each channel of the receiver is configured for independent selection of space, time, frequency, phase and gain;
   a magnetic resonance coil having a plurality of current elements, each element coupled in one to one relation with a channel of the receiver and a channel of the transmitter; and
   a processor coupled to the transceiver, wherein the processor is configured to execute instructions to control a current in each element and to perform a non-linear algorithm to shim the coil.

2. The system of claim 1 wherein the coil includes at least one of a transverse electromagnetic volume coil and a transverse electromagnetic surface coil.

3. The system of claim 1 wherein the processor executes instructions to perform dynamic RF field control of the coil.

4. The system of claim 1 further including a user input console coupled to the processor.

5. The system of claim 4 wherein the user input console is configured to receive a user selection for RF field optimization.

6. The system of claim 1 wherein the coil is configured for use with a coil of at least 3T.

7. A method comprising:
   receiving a user selected criteria for optimization;
   executing instructions using a processor to configure a multichannel transmitter and a multichannel receiver based on the criteria, the transmitter and the receiver each coupled to a multichannel coil wherein each channel of the coil includes a current element and each channel of the coil is coupled in one to one relation with a channel of the transmitter and a channel of the receiver;
   executing instructions using a processor to perform a non-linear algorithm to shim the coil; and
   acquiring magnetic resonance data based on a signal received from the coil.

8. The method of claim 7 wherein executing instructions includes performing an iterative algorithm.

9. The method of claim 7 wherein executing instructions includes configuring the coil for predetermined homogeneity within a particular region of the coil.

10. The method of claim 7 wherein executing instructions includes controlling a current in a transmission line as to at least one of magnitude, phase, frequency, space and time.

* * * * *

UNITED STATES PATENT AND TRADEMARK OFFICE
CERTIFICATE OF CORRECTION

PATENT NO. : 7,800,368 B2  Page 1 of 1
APPLICATION NO. : 11/707560
DATED : September 21, 2010
INVENTOR(S) : J. Thomas Vaughan et al.

It is certified that error appears in the above-identified patent and that said Letters Patent is hereby corrected as shown below:

On the Title Page, item [75]
Inventors:

Christopher C. Olson, delete "Minneapols, MN" and insert therefor -- St. Paul, MN --.

Heather Orser, delete "Farmington, MN" and insert therefor -- St. Paul, MN --.

Anand Gopinath, delete "Wayzata, MN" and insert therefor -- St. Paul, MN --.

Gregor Adiany, delete "Adiany" and insert therefor -- Adriany --.

Signed and Sealed this

Ninth Day of November, 2010

David J. Kappos
*Director of the United States Patent and Trademark Office*

UNITED STATES PATENT AND TRADEMARK OFFICE
CERTIFICATE OF CORRECTION

PATENT NO. : 7,800,368 B2  
APPLICATION NO. : 11/707560  
DATED : September 21, 2010  
INVENTOR(S) : J. Thomas Vaughan et al.

Page 1 of 1

It is certified that error appears in the above-identified patent and that said Letters Patent is hereby corrected as shown below:

In the Specification:

In Column 1, lines 12 to 19, delete the following:

"GOVERNMENT RIGHTS

The invention described herein was made with government support under Grant Numbers EB000895, R01 EB000895, R01 EB000895-04, P41 RR08079, P41 RR0807954, BTRR P41 008079, RR008079, RR08079, S10 RR139850, R33 CA94318, R01 CA94200, R42 RR13230, PAR 02-010, RO1 EB000331, and RO1MH55346, awarded by the National Institutes of Health. The United States Government has certain rights in the invention."

and add the following:

--GOVERNMENT INTEREST

This invention was made with government support under 3R42-RR013230-03S1, 1R33-CA094318-01, 5P41-RR008079, R01-CA094200, R01-EB000331, R01-EB000895, and R01-MH055346 awarded by the National Institutes of Health. The government has certain rights in the invention.--

Signed and Sealed this  
Twenty-third Day of April, 2013

Teresa Stanek Rea  
*Acting Director of the United States Patent and Trademark Office*